(12) United States Patent
Kimura

(10) Patent No.: US 8,710,505 B2
(45) Date of Patent: Apr. 29, 2014

(54) SEMICONDUCTOR DEVICE

(75) Inventor: Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/556,908

(22) Filed: Jul. 24, 2012

(65) Prior Publication Data

US 2013/0032806 A1 Feb. 7, 2013

(30) Foreign Application Priority Data

Aug. 5, 2011 (JP) ................. 2011-171476

(51) Int. Cl.
*H01L 29/04* (2006.01)
*H01L 31/20* (2006.01)
*H01L 31/036* (2006.01)
*H01L 31/0376* (2006.01)

(52) U.S. Cl.
USPC ........................ 257/59; 257/71; 257/E27.121

(58) Field of Classification Search
USPC ...................... 257/59, 71, E27.121
See application file for complete search history.

(56) References Cited

U.S. PATENT DOCUMENTS

| | | | |
|---|---|---|---|
| 5,684,365 A | 11/1997 | Tang et al. | |
| 5,956,011 A | 9/1999 | Koyama et al. | |
| 6,037,924 A | 3/2000 | Koyama et al. | |
| 6,229,506 B1 | 5/2001 | Dawson et al. | |
| 6,310,598 B1 | 10/2001 | Koyama et al. | |
| 6,362,798 B1 | 3/2002 | Kimura et al. | |
| 6,518,945 B1 | 2/2003 | Pinkham | |
| 6,577,302 B2 | 6/2003 | Hunter et al. | |
| 6,608,613 B2 | 8/2003 | Koyama et al. | |
| 6,611,130 B2 | 8/2003 | Chang | |
| 6,709,901 B1 | 3/2004 | Yamazaki et al. | |
| 6,768,348 B2 | 7/2004 | Shionoiri et al. | |
| 6,858,989 B2 | 2/2005 | Howard | |
| 6,891,356 B2 | 5/2005 | Kimura et al. | |
| 7,042,162 B2 | 5/2006 | Yamazaki et al. | |

(Continued)

FOREIGN PATENT DOCUMENTS

| | | |
|---|---|---|
| CN | 1799081 A | 7/2006 |
| EP | 0 717 446 A2 | 6/1996 |

(Continued)

OTHER PUBLICATIONS

Joon-Chul Goh et al.; "P-72: A Novel Pixel Circuit for Active-Matrix Organic Light-Emitting Diodes"; SID Digest '03 : SID International Symposium Digest of Technical Papers; 2003; pp. 494-497; vol. 34.

(Continued)

*Primary Examiner* — Phuc Dang
(74) *Attorney, Agent, or Firm* — Fish & Richardson P.C.

(57) ABSTRACT

Adverse effects of variation in threshold voltage are reduced. In a semiconductor device, electric charge is accumulated in a capacitor provided between a gate and a source of a transistor, and then, the electric charge accumulated in the capacitor is discharged; thus, the threshold voltage of the transistor is obtained. After that, current flows to a load. In the semiconductor device, the potential of one terminal of the capacitor is set higher than the potential of a source line, and the potential of the source line is set lower than the potential of a power supply line and the cathode side potential of the load.

23 Claims, 97 Drawing Sheets

(56) References Cited

U.S. PATENT DOCUMENTS

| | | |
|---|---|---|
| 7,068,246 B2 | 6/2006 | Yamazaki et al. |
| 7,091,750 B2 | 8/2006 | Shionoiri et al. |
| 7,129,917 B2 | 10/2006 | Yamazaki et al. |
| 7,317,429 B2 | 1/2008 | Shirasaki et al. |
| 7,327,168 B2 | 2/2008 | Kimura |
| 7,362,289 B2 | 4/2008 | Yamazaki et al. |
| 7,365,713 B2 | 4/2008 | Kimura |
| 7,429,985 B2 | 9/2008 | Kimura et al. |
| 7,456,810 B2 | 11/2008 | Kimura |
| 7,515,121 B2 | 4/2009 | Sato et al. |
| 7,518,580 B2 | 4/2009 | Kwon |
| 7,528,643 B2 | 5/2009 | Kimura |
| 7,671,826 B2 | 3/2010 | Kimura |
| 7,674,650 B2 | 3/2010 | Akimoto et al. |
| 7,679,585 B2 | 3/2010 | Kimura |
| 7,679,587 B2 | 3/2010 | Kwak |
| 7,710,368 B2 | 5/2010 | Chung |
| 7,714,813 B2 | 5/2010 | Uchino et al. |
| 7,800,565 B2 | 9/2010 | Nathan et al. |
| 7,817,117 B2 | 10/2010 | Kimura |
| 7,924,244 B2 | 4/2011 | Kimura et al. |
| 7,965,106 B2 | 6/2011 | Kimura |
| 7,982,696 B2 | 7/2011 | Kimura |
| 8,004,477 B2 | 8/2011 | Uchino et al. |
| 8,059,068 B2 | 11/2011 | Kimura |
| 8,063,859 B2 | 11/2011 | Kimura |
| 2001/0043168 A1 | 11/2001 | Koyama et al. |
| 2003/0090481 A1 | 5/2003 | Kimura |
| 2003/0095087 A1 | 5/2003 | Libsch et al. |
| 2003/0103022 A1 | 6/2003 | Noguchi et al. |
| 2003/0112208 A1 | 6/2003 | Okabe et al. |
| 2003/0117352 A1 | 6/2003 | Kimura |
| 2003/0132931 A1 | 7/2003 | Kimura et al. |
| 2003/0137503 A1 | 7/2003 | Kimura et al. |
| 2004/0070557 A1 | 4/2004 | Asano et al. |
| 2004/0080474 A1 | 4/2004 | Kimura |
| 2004/0174349 A1 | 9/2004 | Libsch et al. |
| 2004/0174354 A1 | 9/2004 | Ono et al. |
| 2004/0207614 A1 | 10/2004 | Yamashita et al. |
| 2005/0057459 A1 | 3/2005 | Miyazawa |
| 2005/0083270 A1 | 4/2005 | Miyazawa |
| 2005/0200618 A1 | 9/2005 | Kim et al. |
| 2005/0206593 A1 | 9/2005 | Kwon |
| 2005/0237273 A1 | 10/2005 | Ozawa et al. |
| 2005/0259051 A1 | 11/2005 | Lee et al. |
| 2005/0269959 A1 | 12/2005 | Uchino et al. |
| 2006/0066532 A1 | 3/2006 | Jeong |
| 2006/0156121 A1 | 7/2006 | Chung |
| 2006/0170628 A1 | 8/2006 | Yamashita et al. |
| 2006/0176250 A1 | 8/2006 | Nathan et al. |
| 2006/0208977 A1 | 9/2006 | Kimura |
| 2006/0221005 A1 | 10/2006 | Omata et al. |
| 2006/0238461 A1 | 10/2006 | Goh et al. |
| 2006/0255837 A1 | 11/2006 | Shionoiri et al. |
| 2006/0279499 A1 | 12/2006 | Park et al. |
| 2007/0002084 A1 | 1/2007 | Kimura et al. |
| 2007/0063993 A1 | 3/2007 | Shishido |
| 2007/0064469 A1 | 3/2007 | Umezaki |
| 2007/0085847 A1 | 4/2007 | Shishido |
| 2007/0103419 A1 | 5/2007 | Uchino et al. |
| 2007/0115225 A1 | 5/2007 | Uchino et al. |
| 2007/0120785 A1 | 5/2007 | Kimura |
| 2007/0120795 A1 | 5/2007 | Uchino et al. |
| 2007/0126664 A1 | 6/2007 | Kimura |
| 2007/0126665 A1 | 6/2007 | Kimura |
| 2007/0126668 A1 | 6/2007 | Kimura |
| 2007/0200793 A1 | 8/2007 | Kwon |
| 2007/0236424 A1* | 10/2007 | Kimura .......................... 345/76 |
| 2007/0247398 A1 | 10/2007 | Nathan et al. |
| 2008/0225061 A1 | 9/2008 | Kimura et al. |
| 2008/0284312 A1 | 11/2008 | Kimura |
| 2009/0009676 A1 | 1/2009 | Kimura et al. |
| 2009/0021539 A1 | 1/2009 | Kimura |
| 2009/0051674 A1 | 2/2009 | Kimura et al. |
| 2009/0096727 A1 | 4/2009 | Kimura |
| 2009/0134920 A1 | 5/2009 | Kimura |
| 2009/0167404 A1 | 7/2009 | Kimura |
| 2009/0225010 A1 | 9/2009 | Kimura |
| 2010/0079357 A1 | 4/2010 | Ozawa et al. |
| 2010/0149160 A1 | 6/2010 | Kimura |
| 2010/0156877 A1 | 6/2010 | Kimura |
| 2010/0220092 A1 | 9/2010 | Kimura |
| 2010/0220117 A1 | 9/2010 | Kimura |
| 2011/0115758 A1 | 5/2011 | Kimura et al. |
| 2011/0163320 A1 | 7/2011 | Kimura |
| 2011/0169008 A1 | 7/2011 | Kimura |
| 2011/0198599 A1 | 8/2011 | Kimura |
| 2011/0205144 A1 | 8/2011 | Kimura et al. |
| 2011/0205215 A1 | 8/2011 | Kimura |
| 2011/0210950 A1 | 9/2011 | Kimura |
| 2011/0248746 A1 | 10/2011 | Kimura |
| 2011/0260170 A1 | 10/2011 | Kimura |
| 2012/0287025 A1 | 11/2012 | Inoue |
| 2013/0003269 A1* | 1/2013 | Kimura .................... 361/679.01 |

FOREIGN PATENT DOCUMENTS

| | | |
|---|---|---|
| EP | 1 632 930 A1 | 3/2006 |
| JP | 08-234683 A | 9/1996 |
| JP | 2003-195810 A | 7/2003 |
| JP | 2004-280059 A | 10/2004 |
| JP | 2004-295131 A | 10/2004 |
| JP | 2005-189643 A | 7/2005 |
| JP | 2006-215275 A | 8/2006 |

OTHER PUBLICATIONS

J.H. Jung et al.; "49.1: A 14.1 inch Full Color AMOLED Display with Top Emission Structure and a-Si TFT Backplane"; SID Digest '05 : SID International Symposium Digest of Technical Papers; 2005; pp. 1538-1541; vol. 36.

European Search Report (EP Patent Application No. 07020230.4) dated Aug. 3, 2010, 8 pages.

Chinese Office Action (CN Patent Application No. 200710167938.2) dated Aug. 25, 2010, with English translation 17 pages.

Toshio Kamiya et al.; "Carrier Transport Properties and Electronic Structures of Amorphous Oxide Semiconductors: The present status"; Solid State Physics; Sep. 1, 2009; pp. 621-633; vol. 44, No. 9; AGNE GIJUTSU Center, with English translation.

* cited by examiner

● In
○ Sn
○ Zn
● O

● In
◐ Ga
◡ Zn
● O

- In
- Ga or Zn
- O

- In
- Ga
- Zn
- O

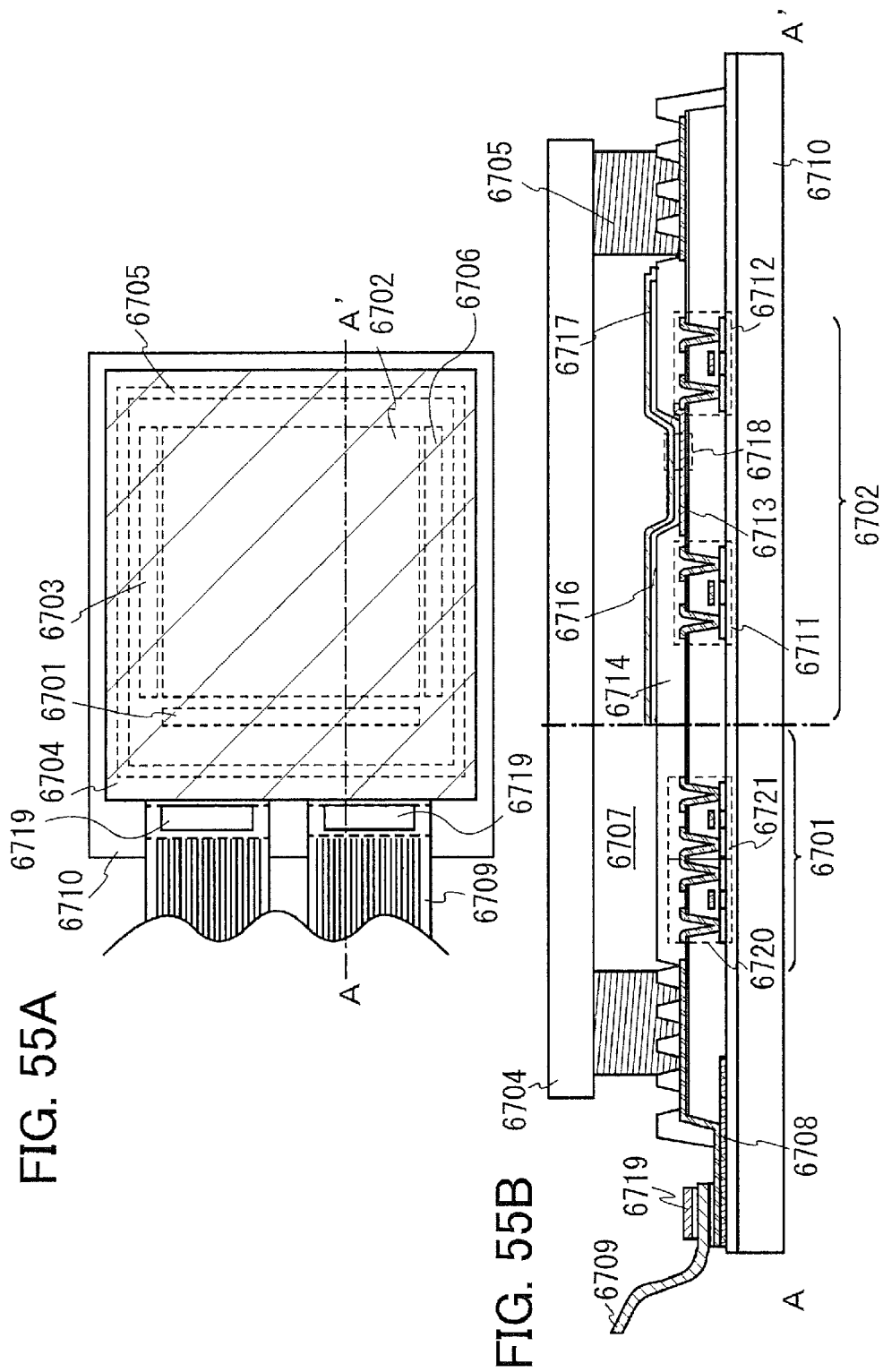

SEMICONDUCTOR DEVICE

BACKGROUND OF THE INVENTION

1. Field of the Invention

The present invention relates to a semiconductor device, a display device, a light-emitting device, methods for manufacturing these devices, and methods for driving these devices. In particular, the present invention relates to a display device including a current-driving-type light-emitting element which changes in luminance depending on current. Further, the present invention relates to an electronic device including the display device.

2. Description of the Related Art

In recent years, flat panel displays such as liquid crystal displays (LCDs) have been widely used. Researches on a display including an organic EL element (OELD), which is not an LCD, are actively carried out (Patent Document 1). The organic EL element is a current-driving-type light-emitting element which changes in luminance depending on current and is also referred to as an electroluminescent element, an organic light-emitting diode, an OLED, or the like. For example, a method for correcting variation in the threshold voltage of a transistor has been examined (see Patent Document 1).

REFERENCE

Patent Document

[Patent Document 1] Japanese Published Patent Application No. 2003-195810

SUMMARY OF THE INVENTION

An object of one embodiment of the present invention is to provide a structure with which adverse effects of variation in the threshold voltage of a transistor can be reduced. Another object of one embodiment of the present invention is to provide a novel structure with which adverse effects of variation in the mobility of a transistor can be reduced. Another object of one embodiment of the present invention is to provide a novel structure with which adverse effects of deterioration of a transistor can be reduced. Another object of one embodiment of the present invention is to provide a novel structure with which adverse effects of deterioration of a display element can be reduced. Another object of one embodiment of the present invention is to provide a novel structure with which display unevenness can be reduced. Another object of one embodiment of the present invention is to provide a novel structure with which an image can be displayed with high quality. Another object of one embodiment of the present invention is to provide a novel structure which can achieve a desired circuit with a small number of transistors. Another object of one embodiment of the present invention is to provide a novel structure which can achieve a desired circuit with a small number of wirings.

Note that the description of these objects does not preclude the existence of other objects. Note that one embodiment of the present invention does not necessarily achieve all the objects. Other objects will be apparent from and can be derived from the description of the specification, the drawings, the claims, and the like.

One embodiment of the present invention is a semiconductor device including a transistor a gate of which is electrically connected to one terminal of a first switch, one of a source and a drain of which is electrically connected to one terminal of a second switch and one terminal of a third switch, and the other of the source and the drain of which is electrically connected to the other terminal of the first switch and one terminal of a fourth switch; a capacitor one electrode of which is electrically connected to the gate of the transistor, and the other electrode of which is electrically connected to the other terminal of the third switch and one terminal of a fifth switch; a load one electrode of which is electrically connected to the one of the source and the drain of the transistor; a first wiring electrically connected to the other terminal of the second switch; a second wiring electrically connected to the other terminal of the fourth switch; a third wiring electrically connected to the other electrode of the load; and a fourth wiring electrically connected to the other terminal of the fifth switch. The first wiring is electrically connected to a circuit having a function of supplying a first potential. The second wiring is electrically connected to a circuit having a function of supplying a second potential. The third wiring is electrically connected to a circuit having a function of supplying a third potential. The fourth wiring is electrically connected to a circuit having a function of supplying a fourth potential. The first potential is lower than the third potential. The second potential is higher than the third potential. The fourth potential is higher than the first potential.

One embodiment of the present invention is a semiconductor device including a transistor a gate of which is electrically connected to one terminal of a first switch, one of a source and a drain of which is electrically connected to one terminal of a second switch and one terminal of a third switch, and the other of the source and the drain of which is electrically connected to the other terminal of the first switch and one terminal of a fourth switch; a capacitor one electrode of which is electrically connected to the gate of the transistor, and the other electrode of which is electrically connected to the other terminal of the third switch and one terminal of a fifth switch; a load one electrode of which is electrically connected to the one of the source and the drain of the transistor; a first wiring electrically connected to the other terminal of the second switch; a second wiring electrically connected to the other terminal of the fourth switch; and a third wiring electrically connected to the other electrode of the load and the other terminal of the fifth switch. The first wiring is electrically connected to a circuit having a function of supplying a first potential. The second wiring is electrically connected to a circuit having a function of supplying a second potential. The third wiring is electrically connected to a circuit having a function of supplying a third potential. The first potential is lower than the third potential. The second potential is higher than the third potential.

One embodiment of the present invention is a semiconductor device including a transistor a gate of which is electrically connected to one terminal of a first switch, one of a source and a drain of which is electrically connected to one terminal of a second switch and one terminal of a third switch, and the other of the source and the drain of which is electrically connected to the other terminal of the first switch and one terminal of a fourth switch; a capacitor one electrode of which is electrically connected to the gate of the transistor, and the other electrode of which is electrically connected to the other terminal of the third switch and one terminal of a fifth switch; a first wiring electrically connected to the other terminal of the second switch; a second wiring electrically connected to the other terminal of the fourth switch and the other terminal of the fifth switch; a load one electrode of which is electrically connected to the one of the source and the drain of the transistor; and a third wiring electrically connected to the other electrode of the load. The first wiring is electrically connected to a circuit having a function of supplying a first potential. The second wiring is electrically connected to a circuit having a function of supplying a second potential. The third wiring is electrically connected to a circuit having a function of supplying a third potential. The first potential is lower than the third potential. The second potential is higher than the third potential.

One embodiment of the present invention is a semiconductor device including a transistor a gate of which is electrically connected to one terminal of a first switch, one of a source and a drain of which is electrically connected to one terminal of a second switch and one terminal of a third switch, and the other of the source and the drain of which is electrically connected to the other terminal of the first switch and one terminal of a fourth switch; a capacitor one electrode of which is electrically connected to the gate of the transistor, and the other electrode of which is electrically connected to the other terminal of the third switch and one terminal of a fifth switch; a load one electrode of which is electrically connected to the one of the source and the drain of the transistor; a first wiring electrically connected to the other terminal of the second switch; a second wiring electrically connected to the other terminal of the fourth switch; a third wiring electrically connected to the other electrode of the load; and a fourth wiring electrically connected to the other terminal of the fifth switch. The first wiring is electrically connected to a circuit having a function of supplying a first potential. The second wiring is electrically connected to a circuit having a function of supplying a second potential. The third wiring is electrically connected to a circuit having a function of supplying a third potential. The fourth wiring is electrically connected to a circuit having a function of controlling the first to fourth switches. The first potential is lower than the third potential. The second potential is higher than the third potential.

In the semiconductor device according to one embodiment of the present invention, the first to fifth switches are preferably transistors.

In the semiconductor device according to one embodiment of the present invention, the transistors preferably have the same conductivity type.

The semiconductor device according to one embodiment of the present invention preferably further includes a sixth switch one terminal of which is electrically connected to the one of the source and the drain of the transistor, and the other terminal of which is electrically connected to the one electrode of the load.

The semiconductor device according to one embodiment of the present invention preferably further includes a seventh switch one terminal of which is electrically connected to the other of the source and the drain of the transistor, and the other terminal of which is electrically connected to a fifth wiring. It is preferable that the fifth wiring be electrically connected to a circuit having a function of supplying a fifth potential and the fifth potential be higher than the third potential.

In the semiconductor device according to one embodiment of the present invention, the load is preferably a display element having a rectifying property.

According to one embodiment of the present invention, adverse effects of variation in the threshold voltage of a transistor can be reduced. According to one embodiment of the present invention, adverse effects of variation in the mobility of a transistor can be reduced. According to one embodiment of the present invention, adverse effects of deterioration of a transistor can be reduced. According to one embodiment of the present invention, adverse effects of deterioration of a display element can be reduced. According to one embodiment of the present invention, display unevenness can be reduced. According to one embodiment of the present invention, an image can be displayed with high quality. According to one embodiment of the present invention, a desired circuit can be achieved with a small number of transistors. According to one embodiment of the present invention, a desired circuit can be achieved with a small number of wirings. According to one embodiment of the present invention, manufacture through a small number of steps can be achieved.

BRIEF DESCRIPTION OF THE DRAWINGS

In the accompanying drawings:

FIGS. 55A and 55B are a top view and a cross-sectional view, respectively, illustrating an example of a display panel cell according to one embodiment of the present invention;

DETAILED DESCRIPTION OF THE INVENTION

Figure 1A:
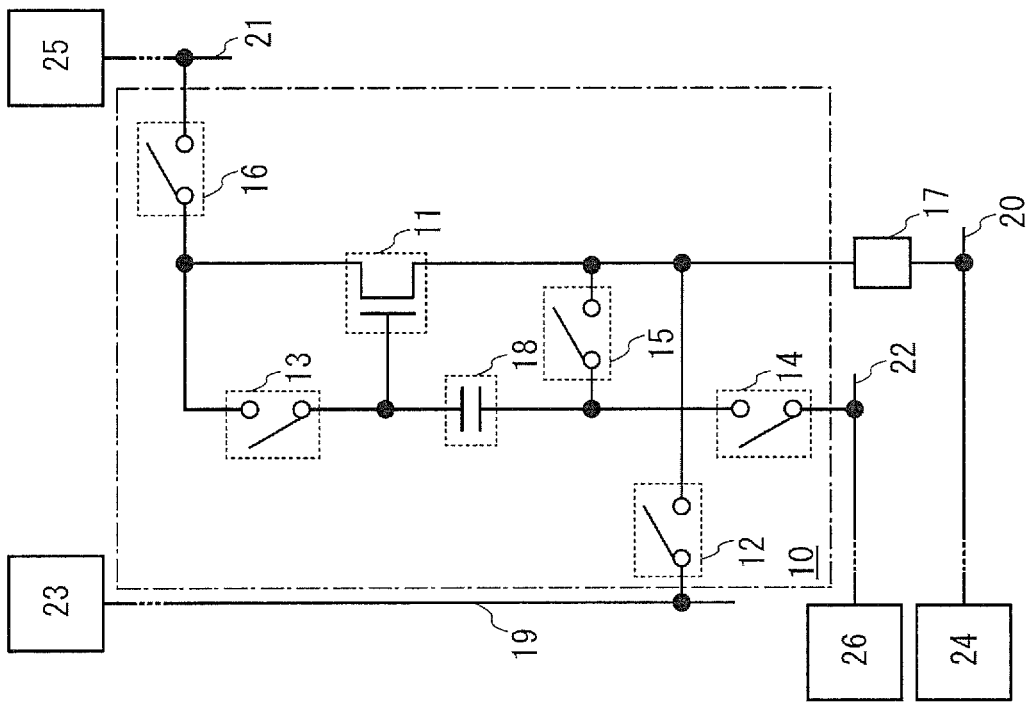
FIGS. 1A and 1B are each a circuit diagram illustrating an example of a circuit according to one embodiment of the present invention.

Hereinafter, embodiments of the present invention will be described in detail with reference to the accompanying drawings. Note that the present invention is not limited to the description below, and it is easily understood by those skilled in the art that a variety of changes and modifications can be made without departing from the spirit and scope of the present invention. Therefore, the present invention should not be construed as being limited to the description of the embodiments below. In structures given below, the same portions or portions having similar functions are denoted by the same reference numerals in different drawings, and explanation thereof will not be repeated.

Note that a content (or part of thereof) described in one embodiment can be applied to, combined with, or replaced with another content (or part thereof) described in the embodiment and/or a content (or part thereof) described in another or other embodiments.

Note that a structure illustrated in a drawing (or part thereof) in one embodiment can be combined with a structure of another part illustrated in the drawing, a structure illustrated in another drawing (or part thereof) in the embodiment, and/or a structure illustrated in a drawing (or part thereof) in another or other embodiments.

Note that size, thickness, or regions in the drawings are exaggerated for clarity in some cases. Thus, one aspect of an embodiment of the present invention is not limited to such scales. Further, the drawings are schematic views of ideal examples. Thus, one aspect of an embodiment of the present invention is not limited to shapes and the like illustrated in the drawings. For example, variation in shape due to a manufacturing technique or dimensional deviation can be included.

Note that an explicit description "X and Y are connected" can mean that X and Y are electrically connected, that X and Y are functionally connected, and that X and Y are directly connected. Here, each of X and Y denotes an object (e.g., a device, an element, a circuit, a wiring, an electrode, a terminal, a conductive film, or a layer). Accordingly, a connection relation other than connection relations illustrated in drawings and texts is also included, without limitation to a predetermined connection relation, for example, the connection relations illustrated in the drawings and the texts.

For example, in the case where X and Y are electrically connected, one or more elements which enable electrical connection between X and Y (e.g., a switch, a transistor, a capacitor, an inductor, a resistor, a diode, a display element, a light-emitting element, and/or a load) can be connected between X and Y. Note that a switch is controlled to be turned on or off. That is, the switch has a function of determining whether current flows or not by being turned on or off (being brought into an on state or an off state). Alternatively, the switch has a function of selecting and changing a current path. For example, the switch has a function of determining whether current can flow through a path 1 or a path 2 and switching the paths.

For example, in the case where X and Y are functionally connected, one or more circuits which enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that, for example, in the case where a signal output from X is transmitted to Y even when another circuit is interposed between X and Y, X and Y are functionally connected.

Note that an explicit description "X and Y are connected" can mean that X and Y are electrically connected, that X and Y are functionally connected, and that X and Y are directly connected. That is, when it is explicitly described that "X and Y are electrically connected", the description is the same as the case where it is explicitly and simply described that "X and Y are connected".

Note that, even when independent components are electrically connected to each other in a circuit diagram, there is a case where one conductive layer has functions of a plurality of components (e.g., a wiring and an electrode), such as a case where part of a wiring functions as an electrode. The "electrical connection" in this specification also means that one conductive layer has functions of a plurality of components.

Note that it might be possible for those skilled in the art to construct one embodiment of the invention even when portions to which all terminals of an active element (e.g., a transistor or a diode), a passive element (e.g., a capacitor or a resistor), or the like are connected are not specified. In particular, in the case where the number of portions to which the terminal is connected might be plural, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that it might be possible for those skilled in the art to specify the invention when at least a connection portion of a circuit is specified. Further, it might be possible for those skilled in the art to specify the invention when at least a function of a circuit is specified. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that various people can implement the invention described in this specification and the like. However, different people may be involved in the implementation of the invention. For example, in the case of a transmission/reception system, the following case is possible: Company A manufactures and sells transmitting devices, and Company B manufactures and sells receiving devices. As another example, in the case of a light-emitting device including a TFT and a light-emitting element, the following case is possible: Company A manufactures and sells semiconductor devices including TFTs, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. That is, one embodiment of the invention with which a patent infringement suit can be filed against Company A or Company B is clear and can be regarded as being disclosed in this specification or the like. For example, in the case of a transmission/reception system, one embodiment of the invention can be constituted by only a transmitting device and one embodiment of the invention can be constituted by only a receiving device. Those embodiments of the invention are clear and can be regarded as being disclosed in this specification or the like. As another example, in the case of a light-emitting device including a TFT and a light-emitting element, one embodiment of the invention can be constituted by only a semiconductor device including a TFT, and one embodiment of the invention can be constituted by a light-emitting device including a TFT and a light-emitting element. Those embodiments of the invention are clear and can be regarded as being disclosed in this specification or the like.

Note that a content which is not specified in any drawing or text in the specification can be excluded from the invention. When the number range of values indicated by e.g., the maximum value and the minimum value is described, the range may be freely narrowed or a value in the range may be excluded, so that the invention can be specified by a range resulting from exclusion of part of the range. In this manner, it is possible to specify the technical scope of the present invention so that a conventional technology is excluded, for example.

Specifically, for example, a diagram of a circuit including first to fifth transistors is described. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, a description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention. Note that, for example, it can be specified that the voltage is higher than or equal to 5 V and lower than or equal to 8 V in the invention. Note that, for example, it can be specified that the voltage is approximately 9 V in the invention. Note that, for example, it can be specified that the voltage is higher than or equal to 3 V and lower than or equal to 10 V but is not 9 V in the invention.

As another specific example, a description "a voltage is preferably 10 V" is given. In that case, for example, it can be specified that the case where the voltage is higher than or equal to −2 V and lower than or equal to 1 V is excluded from the invention. For example, it can be specified that the case where the voltage is higher than or equal to 13 V is excluded from the invention.

As another specific example, a description "a film is an insulating film" is given. In that case, for example, it can be specified that the case where the insulating film is an organic insulating film is excluded from the invention. For example, it can be specified that the case where the insulating film is an inorganic insulating film is excluded from the invention.

As another specific example, a description of a stacked structure, "a film is provided between A and B" is given. In that case, for example, it can be specified that the case where the film is a stacked film of four or more layers is excluded from the invention. For example, it can be specified that the case where a conductive film is provided between A and the film is excluded from the invention.

(Embodiment 1)

A circuit, a semiconductor device, a display device, or a light-emitting device described in one embodiment of the present invention can be used for a pixel circuit including a light-emitting element, for example. Note that the circuit, the semiconductor device, the display device, or the light-emitting device can be used for not only a pixel circuit but also a circuit functioning as a current source for supplying current to a load. In this embodiment, an example of a circuit for supplying current to a load is described first, and then an example of a circuit structure of a pixel in which a light-emitting element is used as the load is described.

First, FIG. 1A illustrates a circuit structure of one embodiment of the present invention. A circuit 10 functions as at least a current source, for example. Accordingly, for example, the circuit 10 has a function of supplying constant current even when the level of voltage applied to both ends of the circuit 10 is changed. For example, the circuit 10 has a function of supplying constant current to a load 17 even when the potential of the load 17 is changed.

Note that there is a voltage source as a power source different from a current source. The voltage source has a function of supplying constant voltage even when current flowing to a circuit connected to the voltage source is changed. Accordingly, the voltage source and the current source have a similar function. However, the function of the voltage source and the function of the current source are different in what is supplied at a constant level even when one factor is changed. The current source has a function of supplying constant current even when voltage of both ends thereof is changed. The voltage source has a function of supplying constant voltage even when current is changed.

The circuit structure illustrated in FIG. 1A has a circuit for discharging electric charge held in a gate of a transistor in order to correct variation in current characteristics due to variation in the threshold voltage of the transistor or the like. In practice, the circuit has a connection relation which enables variation in current characteristics of the transistor to be corrected by controlling the switching of a plurality of switches provided between wirings.

In FIG. 1A, the circuit 10 includes a switch 12, a switch 13, a switch 14, a switch 15, a switch 16, a capacitor 18, and a transistor 11, for example. The transistor 11 allows the circuit 10 to function as a current source. The circuit 10 is connected to the load 17, a wiring 19, a wiring 21, and a wiring 22. The load 17 is connected to a wiring 20. Note that, in this embodiment, the transistor 11 which allows the circuit 10 to function as a current source is an n-channel transistor, for example.

Note that FIG. 1A illustrates a structure where the load 17, the wiring 19, the wiring 20, the wiring 21, and the wiring 22, which are connected to the circuit 10, are provided outside the circuit 10. In an actual case, however, the wirings and the load are each electrically connected to the circuit 10 through a wiring at a boundary therebetween; therefore, the circuit 10 may be regarded as including the wirings and/or the load.

Next, a connection structure of components of the circuit 10 is described.

A gate of the transistor 11 is connected to one electrode (terminal) of the capacitor 18 and one terminal of the switch 13. A first terminal (one of a source and a drain, e.g., the source) of the transistor 11 is connected to one terminal of the switch 12 and one terminal of the switch 15. A second terminal (the other of the source and the drain, e.g., the drain) of the transistor 11 is connected to the other terminal of the switch 13 and one terminal of the switch 16.

The one electrode of the capacitor 18 is connected to the one terminal of the switch 13 and the gate of the transistor 11. The other electrode of the capacitor 18 is connected to the other terminal of the switch 15 and one terminal of the switch 14.

One terminal of the load 17 is connected to the first terminal of the transistor 11, the one terminal of the switch 15, and the one terminal of the switch 12. The other terminal of the load 17 is connected to the wiring 20.

The other terminal of the switch 12 is connected to the wiring 19.

The other terminal of the switch 16 is connected to the wiring 21.

The other terminal of the switch 14 is connected to the wiring 22.

Note that, in this specification, a semiconductor device means any device which can function by utilizing semiconductor characteristics; a light-emitting device, a display device, a semiconductor circuit, and an electronic device may be included in examples of the semiconductor device.

Note that, in this specification, a load means an object having a rectifying property, an object having capacitance, an object having resistance, a circuit including a switch, a pixel circuit, or the like. For example, a load having a rectifying property has current-voltage characteristics showing different resistance values depending on the direction of an applied bias, and has an electric property which allows most current to flow only in one direction. In the circuit structure in FIG. 1A, for example, the load 17 is provided so that current flows from the transistor 11 to the wiring 20.

Further, other examples of the load 17 are a display element (liquid crystal element), a light-emitting element (EL element or the like), and part of a display element or a light-emitting element (e.g., a pixel electrode, an anode electrode, or a cathode electrode).

Figure 28:
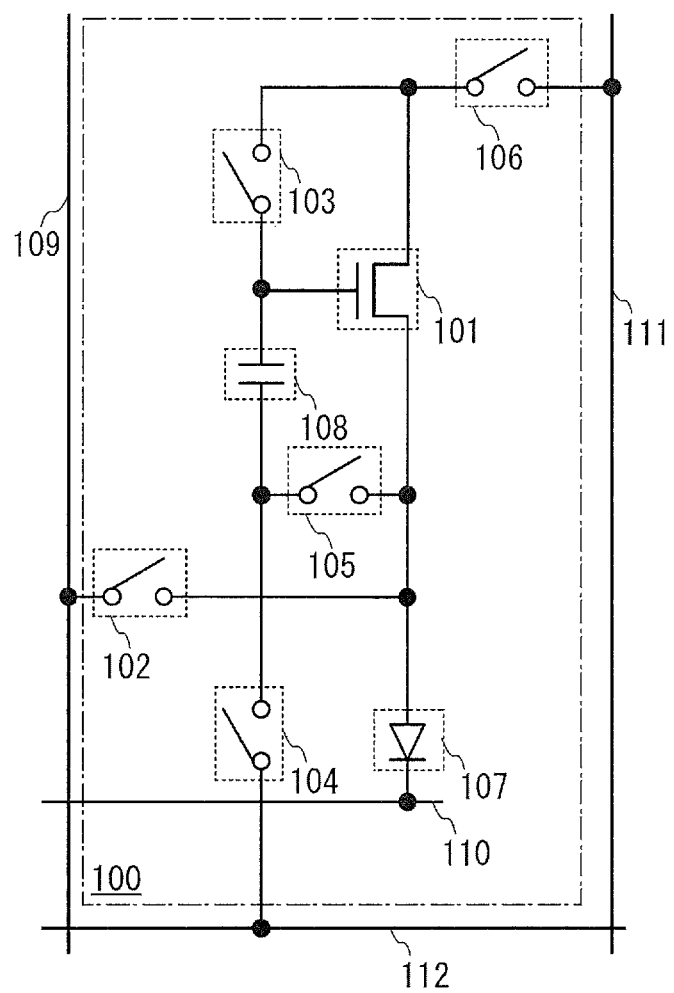
FIG. 28 is a circuit diagram illustrating an example of a pixel according to one embodiment of the present invention.

Note that, in FIG. 1A, the circuit 10 corresponds to a pixel in the case where the load 17 is a light-emitting element. FIG. 28 is a circuit diagram where the load 17 in FIG. 1A is a light-emitting element and the circuit 10 in FIG. 1A is a pixel. A pixel 100 in FIG. 28 includes a switch 102, a switch 103, a switch 104, a switch 105, a switch 106, a light-emitting element 107, a capacitor 108, and a transistor 101. The transistor 101 allows the circuit to function as a current source. The pixel 100 is connected to a wiring 109, a wiring 110, a wiring 111, and a wiring 112.

Note that the switch 102, the switch 103, the switch 104, the switch 105, and the switch 106 illustrated in FIG. 28 correspond to the switch 12, the switch 13, the switch 14, the switch 15, and the switch 16 illustrated in FIG. 1A, respectively. In addition, the capacitor 108, the transistor 101, the wiring 109, the wiring 110, the wiring 111, and the wiring 112 illustrated in FIG. 28 correspond to the capacitor 18, the transistor 11, the wiring 19, the wiring 20, the wiring 21, and the wiring 22 illustrated in FIG. 1A, respectively.

Note that a pixel in this specification corresponds to a display unit controlling the luminance of one color element (e.g., any one of R (red), G (green), and B (blue)). Therefore, in a color display device, the minimum display unit of a color image is composed of three pixels of an R pixel, a G pixel and a B pixel. Note that the color elements for displaying a color image are not limited to three colors, and color elements of more than three colors may be used or a color other than RGB may be used.

Note that a transistor is an element having at least three terminals: a gate, a drain, and a source. In addition, the transistor has a channel region between the drain (drain terminal, drain region, or drain electrode) and the source (source terminal, source region, or source electrode), and current can flow through the drain, the channel region, and the source. Here, since the source and the drain may change depending on the structure, the operating condition, and the like of the transistor, it is difficult to define which is a source or a drain. Therefore, in this document (the specification, the claims, the drawings, and the like), a region functioning as a source and a drain is not called the source or the drain in some cases. In that case, for example, one of the source and the drain may be referred to as a first terminal and the other thereof may be referred to as a second terminal. Alternatively, one of the source and the drain may be referred to as a first electrode and the other thereof may be referred to as a second electrode. Alternatively, one of the source and the drain may be referred to as a first region and the other thereof may be referred to as a second region. Alternatively, one of the source and the drain may be referred to as a source region and the other thereof may be referred to as a drain region.

Note that terms such as "first", "second", and "third" are used for distinguishing various elements, members, regions, layers, and areas from others. Therefore, the terms such as "first", "second", and "third" do not limit the number of elements, members, regions, layers, areas, or the like. Further, for example, "first" can be replaced with "second", "third", or the like.

Note that a switch is an element having a function of operating by bringing terminals into a conduction state (ON) or a non-conduction state (OFF) and a function of determining whether or not current flows. For example, an electrical switch or a mechanical switch can be used as the switch. For example, the switch may be formed using a transistor, a diode, or a switch formed by a micro electro mechanical system (MEMS) technology, such as a digital micromirror device (DMD). Alternatively, the switch may be a logic circuit in which transistors are combined. In the case of employing a transistor as the switch, there is no particular limitation on the polarity (conductivity type) of the transistor. Note that a transistor with small off-state current is preferably used and the polarity of the transistor is preferably selected in accordance with an input potential.

Examples of the transistor with small off-state current are a transistor provided with an LDD region, a transistor with a multi-gate structure, and a transistor in which an oxide semiconductor is used for a semiconductor layer. In the case where a combination of transistors operates as a switch, a complementary switch may be employed by using both an n-channel transistor and a p-channel transistor. A complementary switch achieves appropriate operation even when a potential input to the switch is changed relative to an output potential.

Note that, when a transistor is used as a switch, the switch includes an input terminal (one of a source and a drain), an output terminal (the other of the source and the drain), and a terminal for controlling conduction (gate) in some cases. On the other hand, when a diode is used as a switch, the switch does not have a terminal for controlling conduction in some cases. Therefore, when a diode is used as a switch, the number of wirings for controlling terminals can be reduced as compared to the case of using a transistor.

Note that, for example, a transistor with a structure where gate electrodes are provided above and below a channel can be used as a transistor. With the structure where the gate electrodes are provided above and below the channel, a circuit structure where a plurality of transistors is connected in parallel is provided. Thus, a channel region is increased, so that the amount of current can be increased. By employing the structure where the gate electrodes are provided above and below the channel, a depletion layer is easily formed; thus, subthreshold swing (S value) can be improved.

Note that, for example, a transistor with a structure where a source electrode or a drain electrode overlaps with a channel region (or part thereof) can be used as a transistor. By employing the structure where the source electrode or the drain electrode overlaps with the channel region (or part thereof), unstable operation due to electric charge accumulated in part of the channel region can be prevented.

Note that the capacitor 18 may have a structure where an insulating fi is sandwiched between wirings, semiconductor layers, electrodes, or the like, for example. The capacitor 18 has a function of holding voltage (e.g., voltage corresponding to threshold voltage or voltage corresponding to mobility) in accordance with characteristics of the transistor 11. Further, the capacitor 18 has a function of holding voltage (e.g., voltage of Vsig or a video signal) in accordance with the amount of current supplied to the load 17.

Figure 1B:
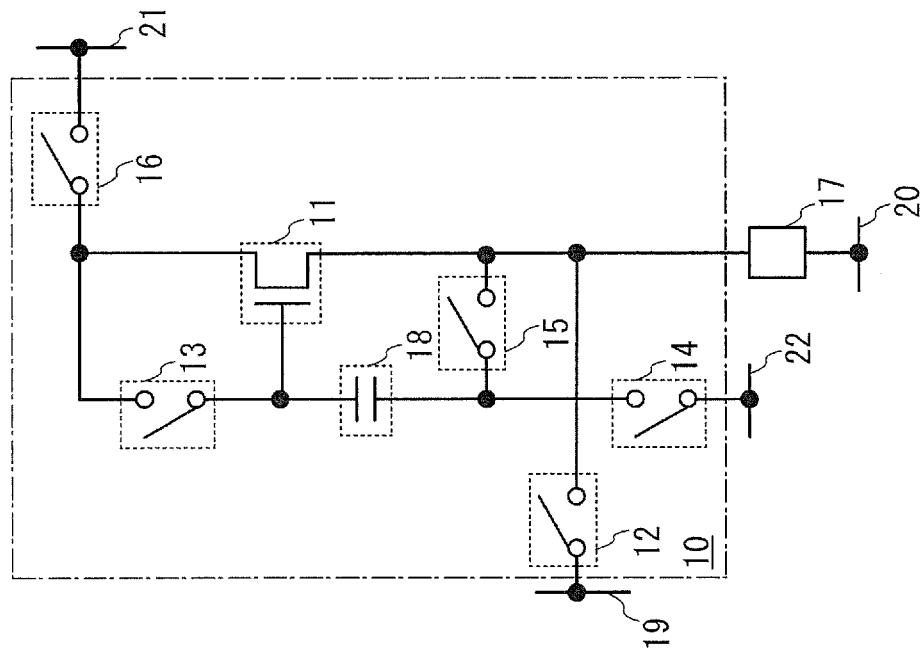

Note that, as illustrated in FIG. 1B, the wiring 19 is connected to at least a circuit 23 having a function of supplying Vsig, for example. An example of the circuit 23 is a source driver (signal line driver circuit). Accordingly, the wiring 19 has a function of transmitting or supplying Vsig. Further, for example, a precharge signal or the like is supplied to the wiring 19 in some cases.

An example of Vsig is a signal for controlling the amount of current flowing to the load 17. For example, Vsig corresponds to a video signal. Therefore, a potential to be supplied depends on the amount of current to be supplied to the load 17. For example, when current supplied to the load 17 is constant, Vsig is a signal with a constant potential. When current supplied to the load 17 is not constant, Vsig is a signal with a potential which changes over time depending on the amount of current supplied to the load 17.

Note that, as illustrated in FIG. 1B, the wiring 20 is connected to at least a circuit 24 having a function of supplying Vcat, for example. An example of the circuit 24 is a power supply circuit. Accordingly, the wiring 20 has a function of transmitting or supplying Vcat. Note that a constant potential is preferably supplied to the wiring 20. However, one aspect of an embodiment of the present invention is not limited thereto; the wiring 20 may be supplied with a non-constant potential such as a pulse signal.

Vcat is a potential set so that current flows from the first electrode side to the second electrode side of the load 17 in a period in which current flows to the load 17.

Note that, as illustrated in FIG. 1B, the wiring 21 is connected to at least a circuit 25 for supplying a potential VDD. An example of the circuit 25 is a power supply circuit. Accordingly, the wiring 21 has a function of transmitting or supplying the potential VDD. Further, the wiring 21 has a function of supplying current to the transistor 11. Further, the wiring 21 has a function of supplying current to the load 17. In some cases, a potential for setting the load 17 in a reverse bias state or a potential to be supplied to the capacitor 18 is supplied to the wiring 21, for example. Note that a constant potential is preferably supplied to the wiring 21. However, one aspect of an embodiment of the present invention is not limited to thereto; the wiring 21 may be supplied with a non-constant potential such as a pulse signal.

The potential VDD is set so that current flows from the first electrode side to the second electrode side of the load 17 through the transistor 11. Therefore, for example, the potential VDD is higher than Vcat.

Note that, as illustrated in FIG. 1B, the wiring 22 is connected to at least a circuit 26 for supplying a potential V1. An example of the circuit 26 is a power supply circuit. Accordingly, the wiring 22 has a function of transmitting or supplying the potential V1. Further, the wiring 22 has a function of supplying electric charge to the other electrode of the capacitor 18. Further, the wiring 22 has a function of fixing the potential of the other electrode of the capacitor 18 to the potential V1. Note that a constant potential is preferably supplied to the wiring 22. However, one aspect of an embodiment of the present invention is not limited to thereto; the wiring 22 may be supplied with a non-constant potential such as a pulse signal.

The potential V1 is set so that the transistor 11 operates normally when current flows to the load 17. For example, it is preferable that the transistor 11 operate in a saturation region. Therefore, the potential V1 is preferably higher than the potential of Vsig, though one aspect of an embodiment of the present invention is not limited thereto. As an example, the potential V1 may be Vcat or the potential VDD. The potential V1 is set to Vcat or the potential VDD, whereby the number of potentials needed can be reduced and thus the number of power supply circuits can be reduced.

While current flows through the transistor 11, the transistor 11 preferably operates in a saturation region for accurate operation of the circuit as a current source. Note that one aspect of an embodiment of the present invention is not limited thereto, and the transistor 11 may operate in a linear region while current flows through the transistor 11.

Note that each of the switch 12, the switch 13, the switch 14, the switch 15, and the switch 16 in FIG. 1A can be a transistor, for example. Thus, as an example, FIG. 2A illustrates the case where an n-channel transistor is used as each of the switch 12, the switch 13, the switch 14, the switch 15, and the switch 16. Note that components in common with those in FIG. 1A are denoted by common reference numerals, and description thereof is omitted. All of the transistors have the same polarity as illustrated in FIG. 2A, whereby manufacture through a small number of steps can be achieved. Thus, manufacturing cost can be reduced. Note that a p-channel transistor can be used as at least one of the switch 12, the switch 13, the switch 14, the switch 15, and the switch 16. For example, a p-channel transistor is preferably used as a transistor 16T because it operates at a high potential. The use of a p-channel transistor is preferable also for a reduction in the number of scan lines.

In FIG. 2A, a transistor 12T corresponds to the switch 12, a transistor 13T corresponds to the switch 13, a transistor 14T corresponds to the switch 14, a transistor 15T corresponds to the switch 15, and the transistor 16T corresponds to the switch 16.

A gate of the transistor 12T is connected to a wiring 31. A first terminal of the transistor 12T is connected to the first terminal of the transistor 11, a first terminal of the transistor 15T, and the one electrode of the load 17. A second terminal of the transistor 12T is connected to the wiring 19. Therefore, the transistor 12T is in a conduction state when the potential of the wiring 31 is at an H level, and the transistor 12T is in a non-conduction state when the potential of the wiring 31 is at an L level.

Further, a gate of the transistor 13T is connected to a wiring 32. A first terminal of the transistor 13T is connected to the gate of the transistor 11 and the one electrode of the capacitor 18. A second terminal of the transistor 13T is connected to a first terminal of the transistor 16T and the second terminal of the transistor 11. Therefore, the transistor 13T is in a conduction state when the potential of the wiring 32 is at an H level, and the transistor 13T is in a non-conduction state when the potential of the wiring 32 is at an L level.

Further, a gate of the transistor 14T is connected to a wiring 33. A first terminal of the transistor 14T is connected to a second terminal of the transistor 15T and the other electrode of the capacitor 18. A second terminal of the transistor 14T is connected to the wiring 22. Therefore, the transistor 14T is in a conduction state when the potential of the wiring 33 is at an H level, and the transistor 14T is in a non-conduction state when the potential of the wiring 33 is at an L level.

Further, a gate of the transistor 15T is connected to a wiring 34. The first terminal of the transistor 15T is connected to the first terminal of the transistor 11, the first terminal of the transistor 12T, and the first electrode of the load 17. The second terminal of the transistor 15T is connected to the first terminal of the transistor 14T and the other electrode of the capacitor 18. Therefore, the transistor 15T is in a conduction state when the potential of the wiring 34 is at an H level, and the transistor 15T is in a non-conduction state when the potential of the wiring 34 is at an L level.

Further, a gate of the transistor 16T is connected to a wiring 35. The first terminal of the transistor 16T is connected to the second terminal of the transistor 11 and the second terminal of the transistor 13T. A second terminal of the transistor 16T is connected to the wiring 21. Therefore, the transistor 16T is in a conduction state when the potential of the wiring 35 is at an H level, and the transistor 16T is in a non-conduction state when the potential of the wiring 35 is at an L level.

Note that, for example, the wiring 31 is connected to a circuit 27A, the wiring 32 is connected to a circuit 27B, the wiring 33 is connected to a circuit 27C, the wiring 34 is connected to a circuit 27D, and the wiring 35 is connected to a circuit 27E. The circuits 27A to 27E each have at least a function of supplying a signal at an H level or an L level, for example. Note that the circuits 27A to 27E may each be an individual circuit, or some of them may form one circuit collectively. An example of each of the circuits 27A to 27E is a gate driver (scan line driver circuit). Accordingly, the wiring 31 has a function of transmitting or supplying a signal at an H level or an L level. Further, the wiring 31 has a function of controlling the conduction state of the switch 12 or the transistor 12T. The wiring 32 has a function of controlling the conduction state of the switch 13 or the transistor 13T. The wiring 33 has a function of controlling the conduction state of the switch 14 or the transistor 14T. The wiring 34 has a function of controlling the conduction state of the switch 15 or the transistor 15T. The wiring 35 has a function of the conduction state of the switch 16 or the transistor 16T.

Note that the wiring 31, the wiring 32, the wiring 33, the wiring 34, and the wiring 35 can be provided as different wirings. However, one aspect of an embodiment of the present invention is not limited thereto. A plurality of wirings can be combined into one wiring; therefore, it is possible to form a circuit with a small number of wirings.

Figure 58:
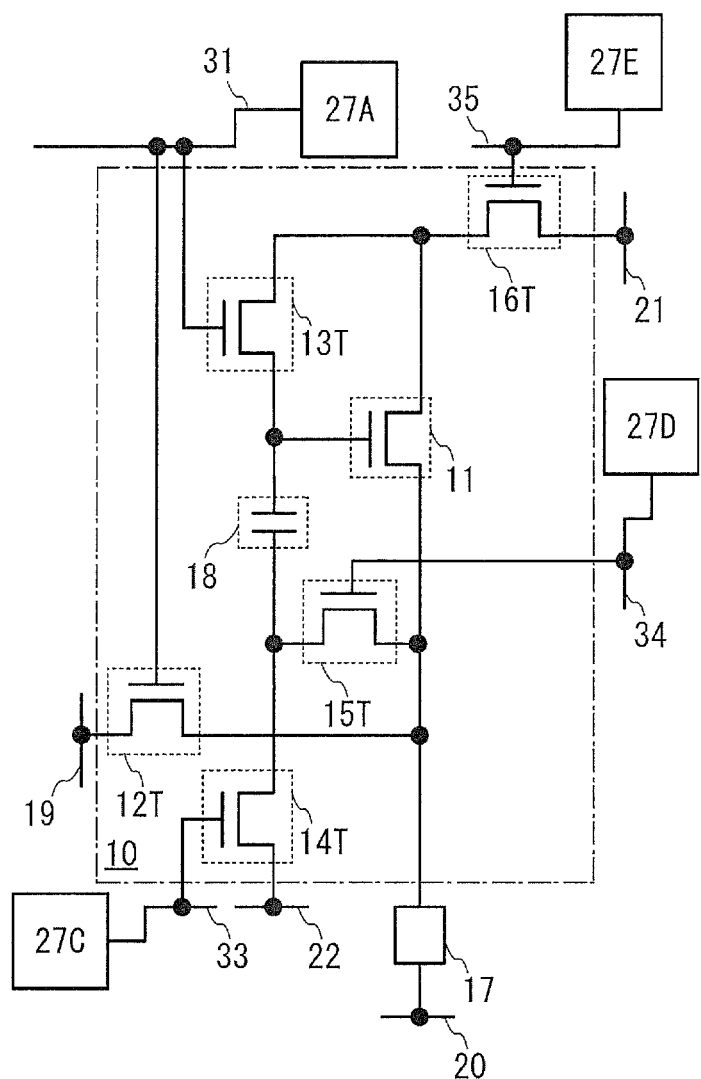
FIG. 58 is a circuit diagram illustrating an example of a circuit according to one embodiment of the present invention.

For example, the wiring 31 and the wiring 32 can be combined into one wiring. Therefore, the wiring 31 and the wiring 32 can be connected to be one wiring. At this time, the transistor 12T and the transistor 13T preferably have the same polarity. FIG. 58 is a circuit diagram in that case.

Figure 59:
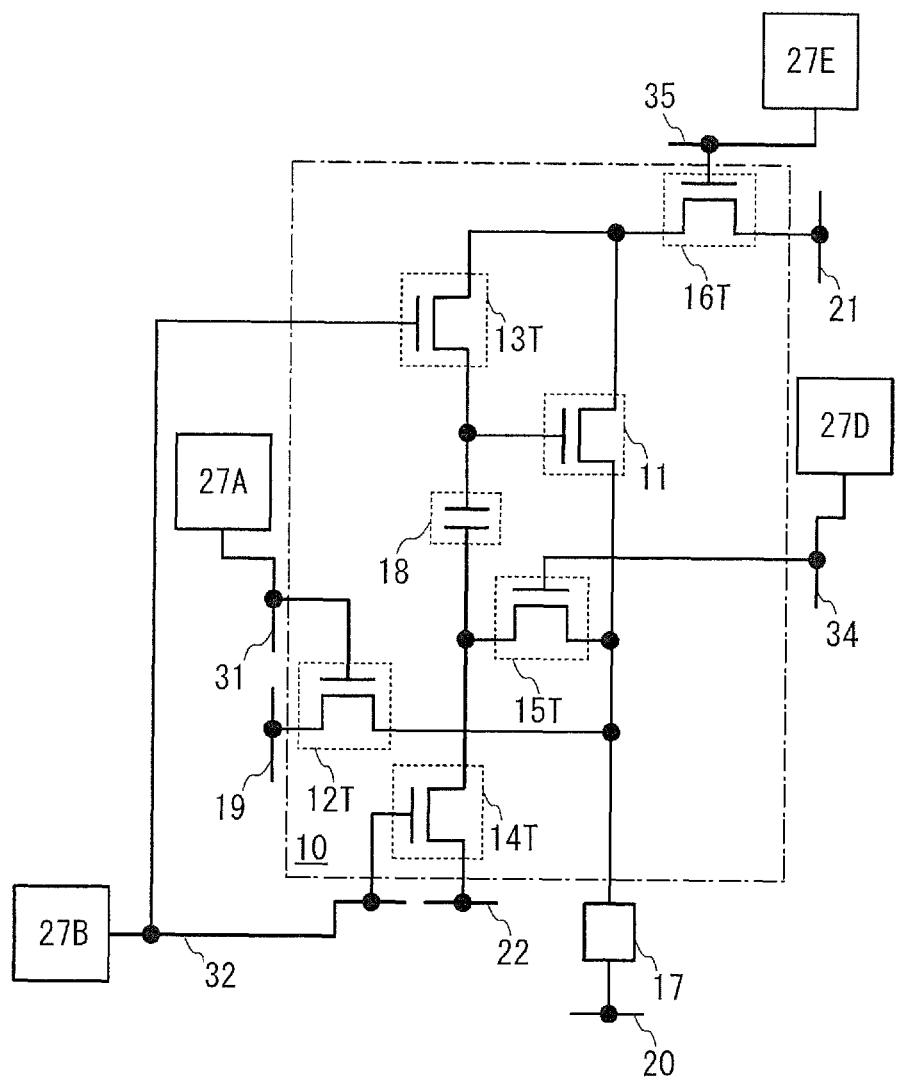
FIG. 59 is a circuit diagram illustrating an example of a circuit according to one embodiment of the present invention.

For example, the wiring 32 and the wiring 33 can be combined into one wiring. Therefore, the wiring 32 and the wiring 33 can be connected to be one wiring. At this time, the transistor 13T and the transistor 14T preferably have the same polarity. FIG. 59 is a circuit diagram in that case.

Figure 60:
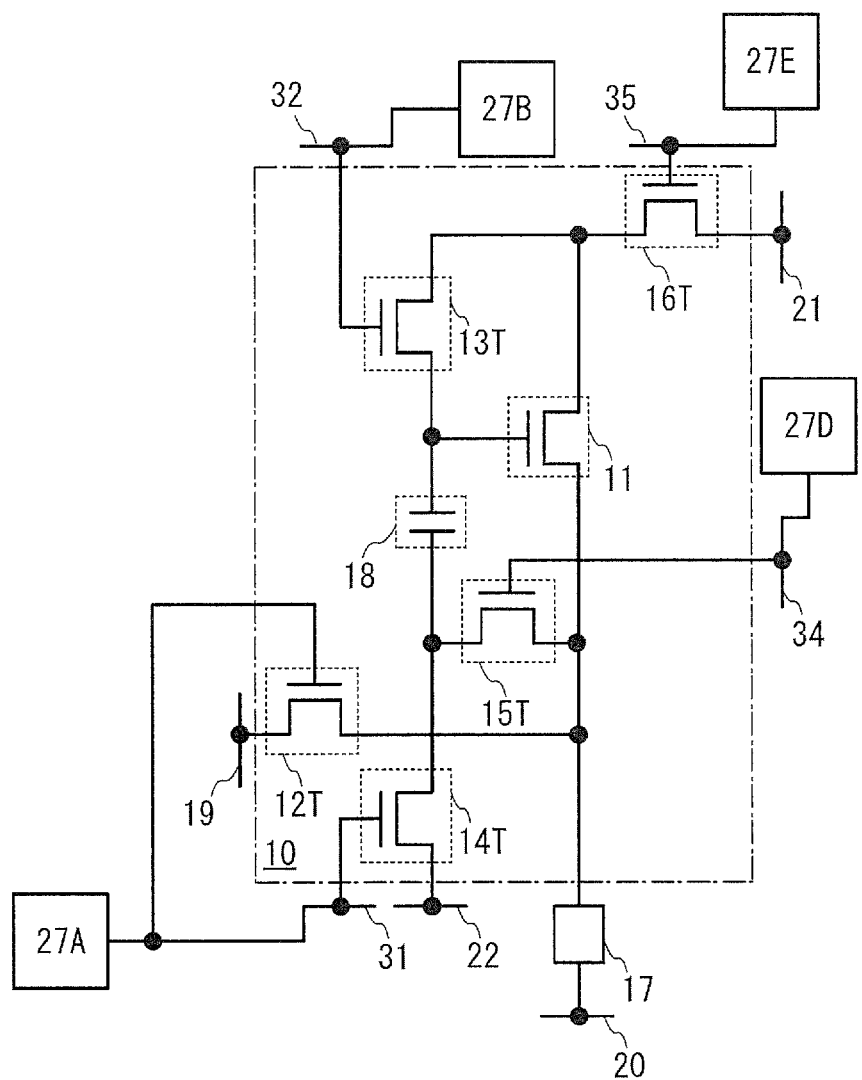
FIG. 60 is a circuit diagram illustrating an example of a circuit according to one embodiment of the present invention.

Note that the wiring 31 and the wiring 33 can be combined into one wiring. At this time, the transistor 12T and the transistor 14T preferably have the same polarity. FIG. 60 is a circuit diagram in that case.

Figure 61:
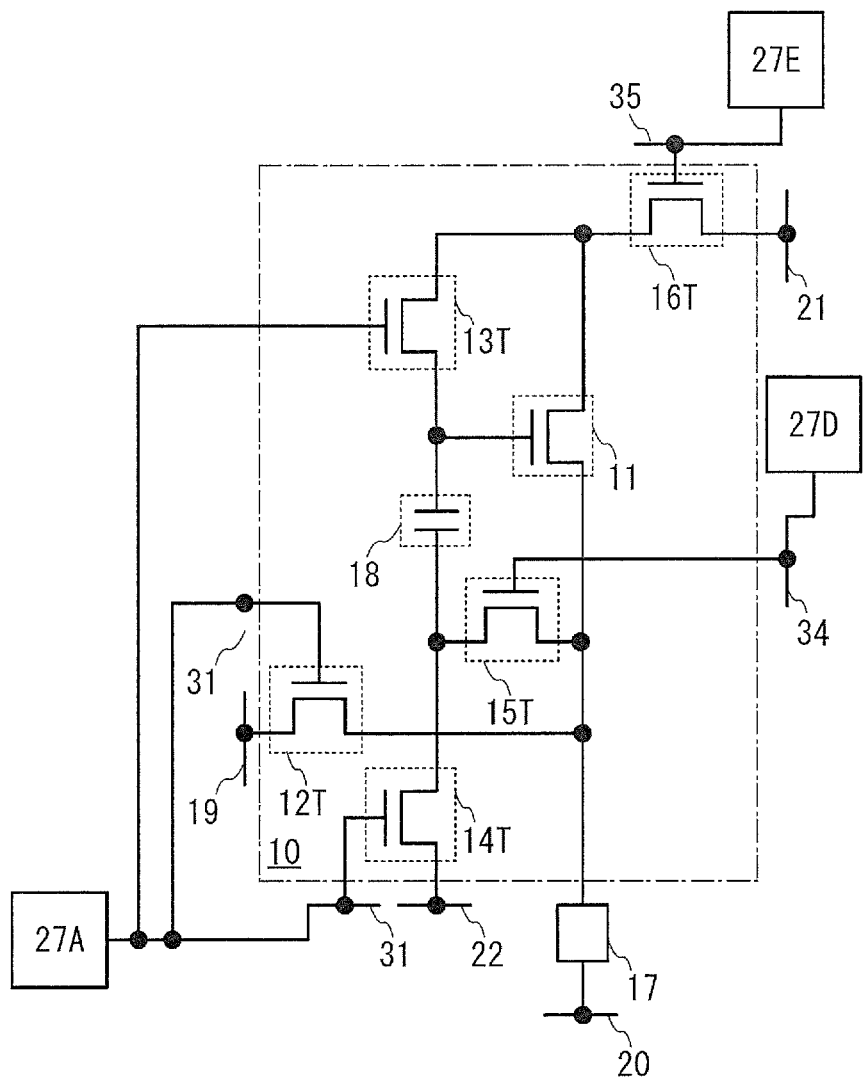
FIG. 61 is a circuit diagram illustrating an example of a circuit according to one embodiment of the present invention.

Note that the wiring 31, the wiring 32, and the wiring 33 can be combined into one wiring. At this time, the transistor 12T, the transistor 13T, and the transistor 14T preferably have the same polarity. FIG. 61 is a circuit diagram in that case.

Figure 64:
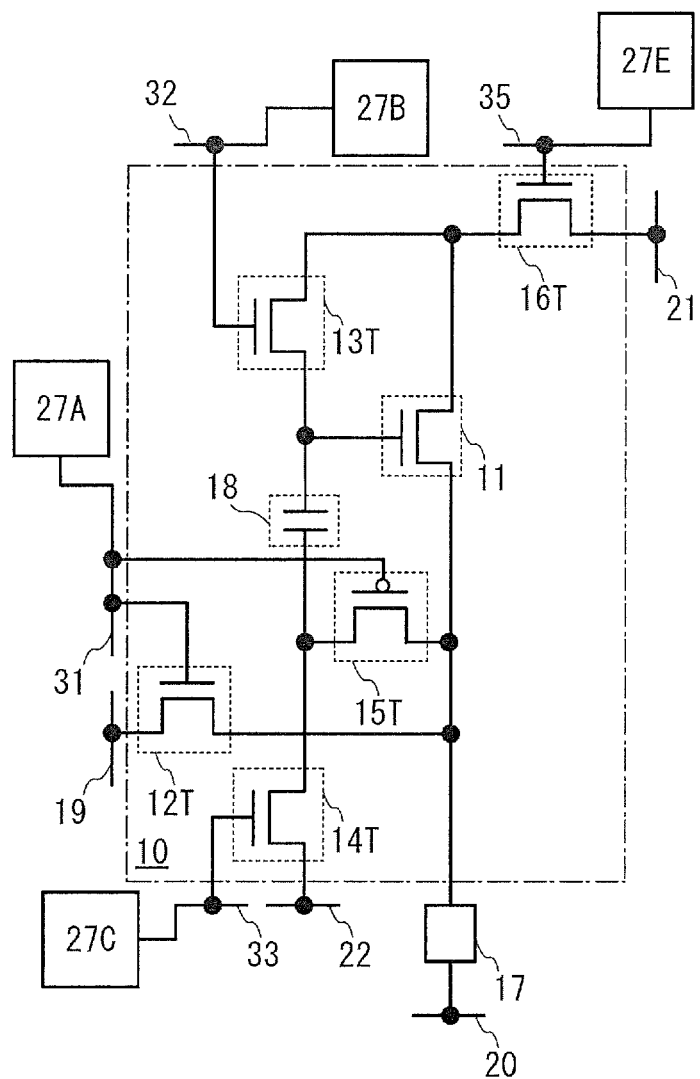
FIG. 64 is a circuit diagram illustrating an example of a circuit according to one embodiment of the present invention.

Note that the wiring 34 and the wiring 31 can be combined into one wiring. At this time, the polarity of the transistor 15T is preferably opposite to that of the transistor 12T. FIG. 64 is a circuit diagram in that case.

Figure 65:
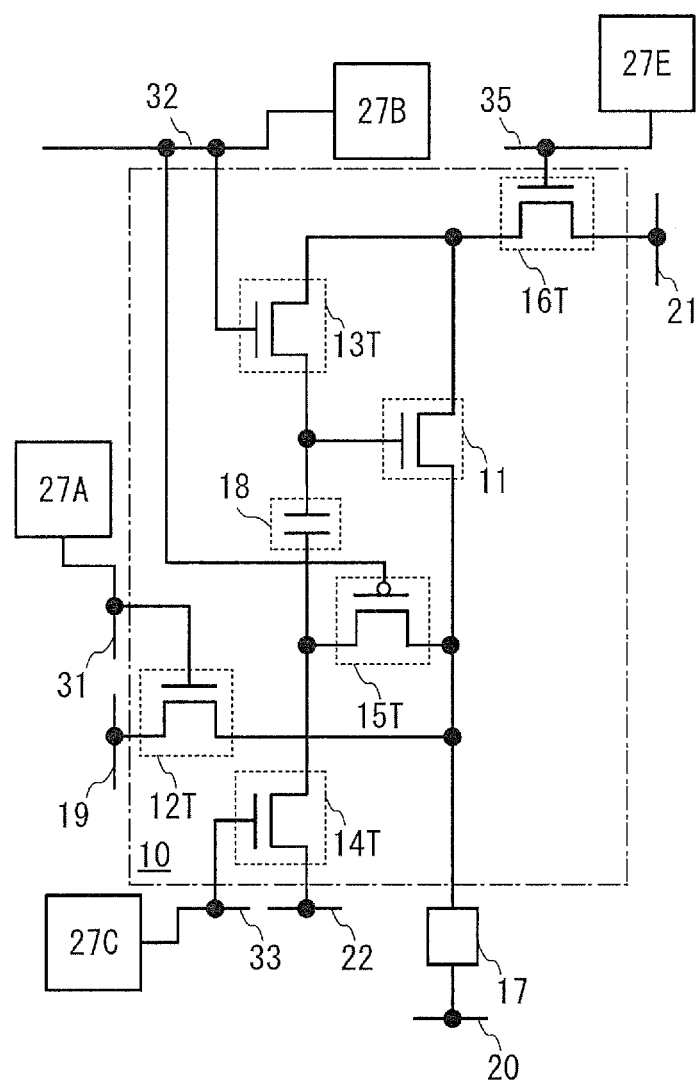
FIG. 65 is a circuit diagram illustrating an example of a circuit according to one embodiment of the present invention.

Note that the wiring 34 and the wiring 32 can be combined into one wiring. At this time, the polarity of the transistor 15T is preferably opposite to that of the transistor 13T. FIG. 65 is a circuit diagram in that case.

Figure 66:
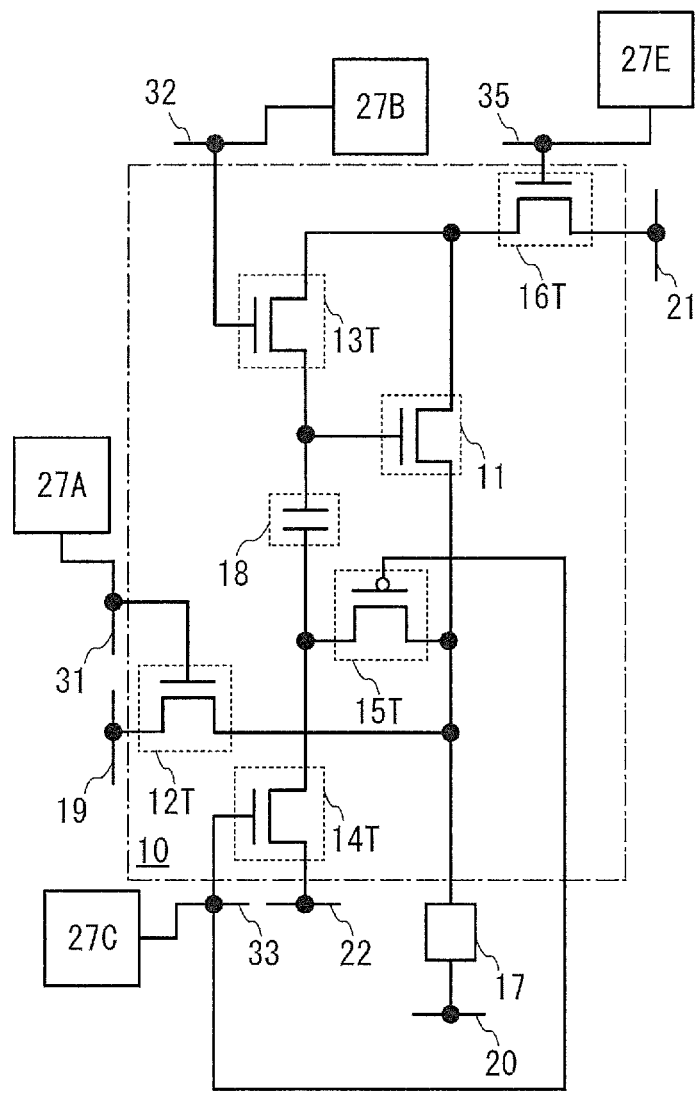
FIG. 66 is a circuit diagram illustrating an example of a circuit according to one embodiment of the present invention.

Note that the wiring 34 and the wiring 33 can be combined into one wiring. At this time, the polarity of the transistor 15T is preferably opposite to that of the transistor 14T. FIG. 66 is a circuit diagram in that case.

Figure 67:
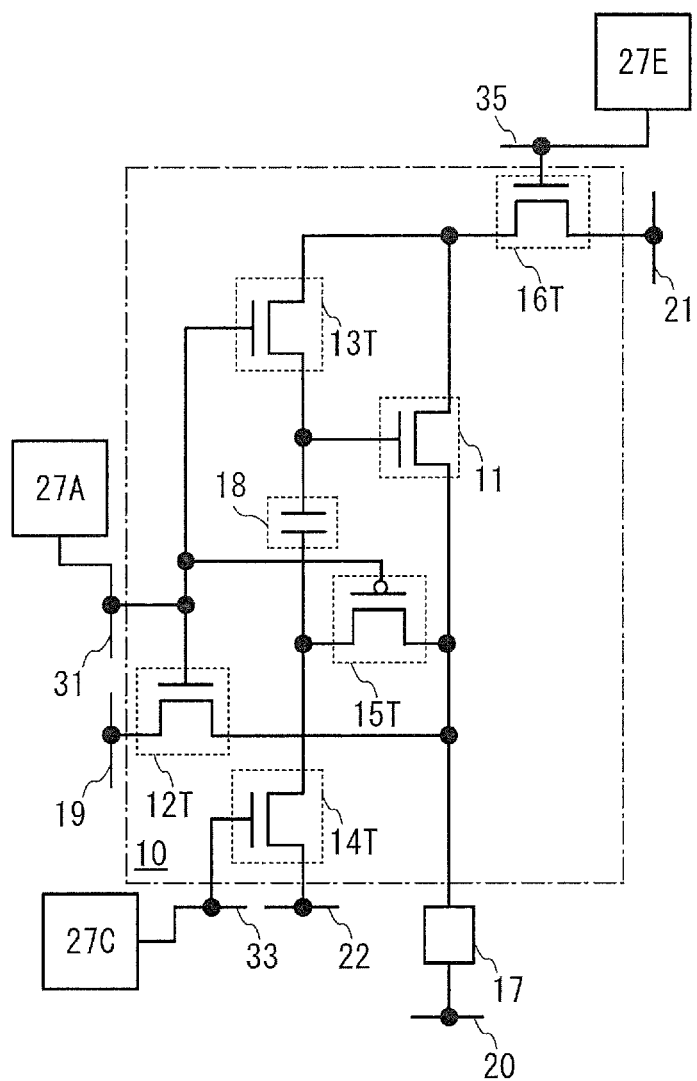
FIG. 67 is a circuit diagram illustrating an example of a circuit according to one embodiment of the present invention.

Note that the wiring 34 can be combined with the wiring 31 and the wiring 32 to form one wiring. At this time, the polarity of the transistor 15T is preferably opposite to that of the transistor 12T and the transistor 13T. FIG. 67 is a circuit diagram where the wiring 34 is combined with the wiring 31 and the wiring 32 to form one wiring.

Figure 68:
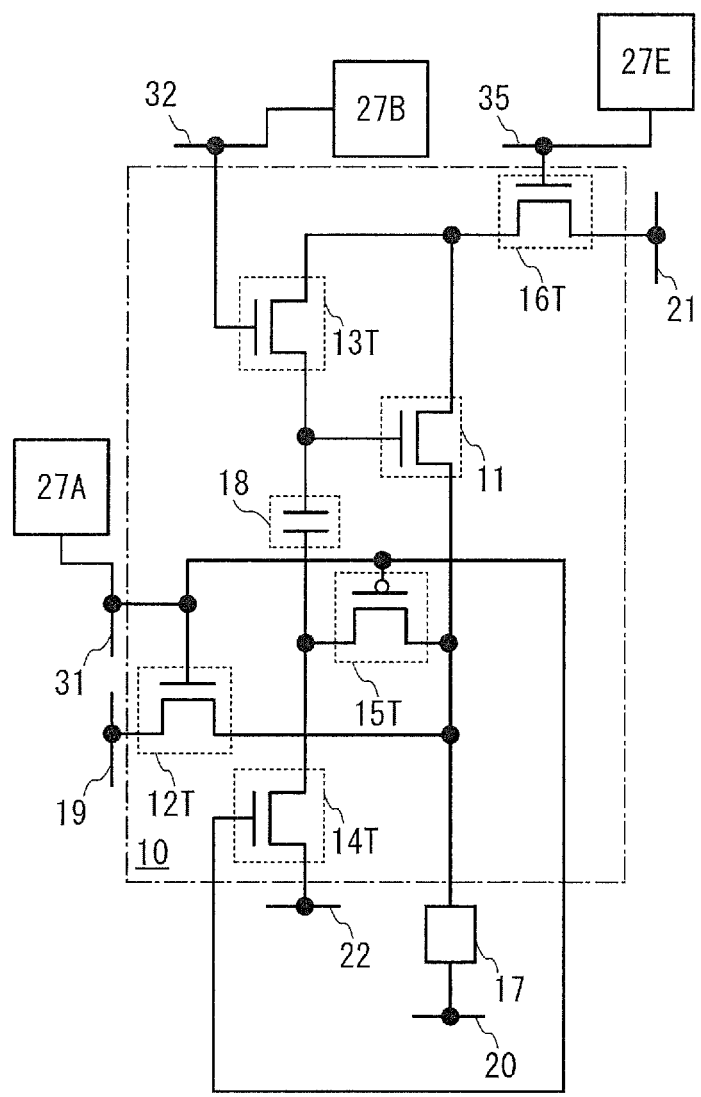
FIG. 68 is a circuit diagram illustrating an example of a circuit according to one embodiment of the present invention.

Note that the wiring 34 can be combined with the wiring 31 and the wiring 33 to form one wiring. At this time, the polarity of the transistor 15T is preferably opposite to that of the transistor 12T and the transistor 14T. FIG. 68 is a circuit diagram where the wiring 34 is combined with the wiring 31 and the wiring 33 to form one wiring.

Figure 69:
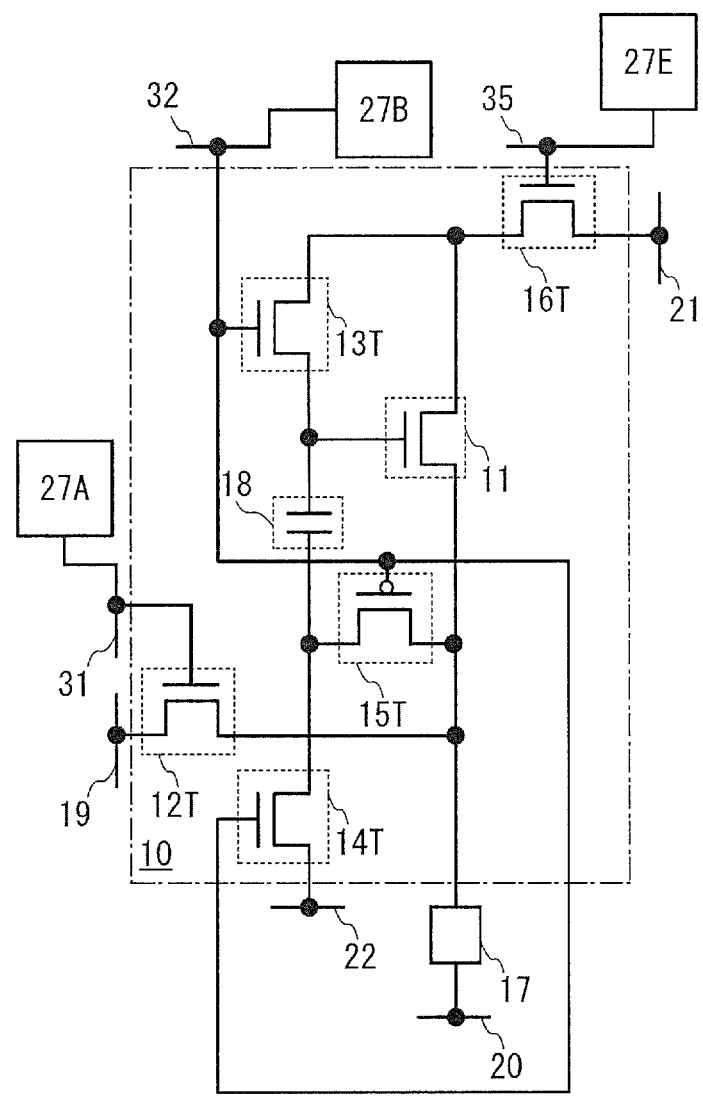
FIG. 69 is a circuit diagram illustrating an example of a circuit according to one embodiment of the present invention.

Note that the wiring 34 can be combined with the wiring 32 and the wiring 33 to form one wiring. At this time, the polarity of the transistor 15T is preferably opposite to that of the transistor 13T and the transistor 14T. FIG. 69 is a circuit diagram where the wiring 34 is combined with the wiring 32 and the wiring 33 to form one wiring.

Figure 70:
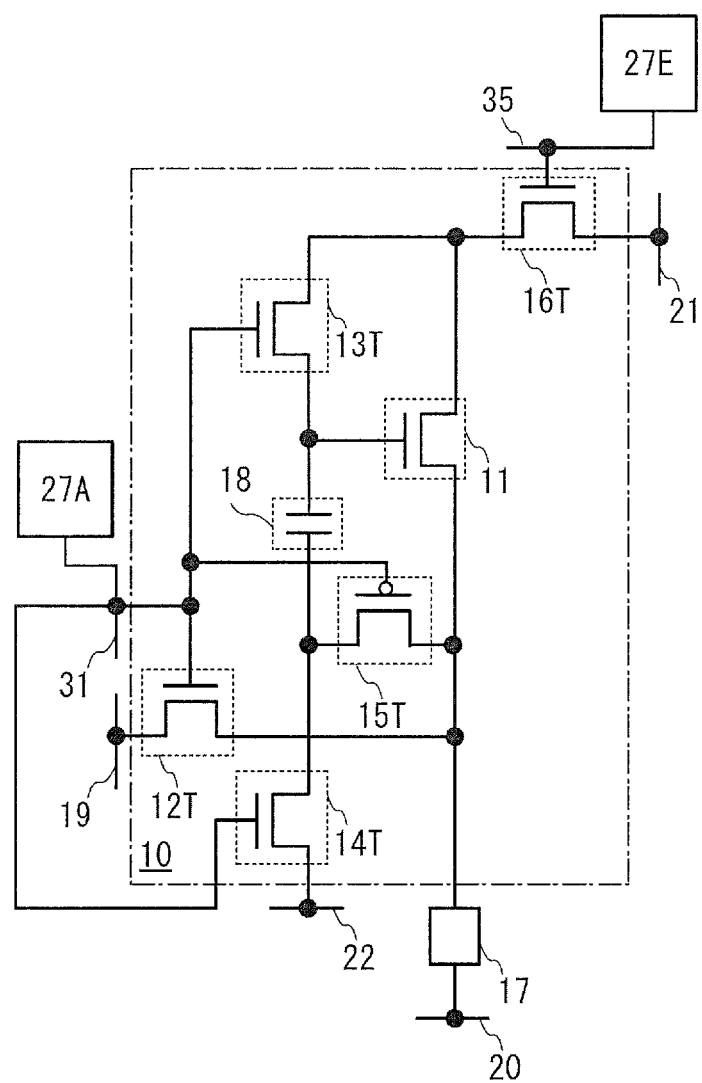
FIG. 70 is a circuit diagram illustrating an example of a circuit according to one embodiment of the present invention.

Note that the wiring 34 can be combined with the wiring 31, the wiring 32, and the wiring 33 to form one wiring. At this time, the polarity of the transistor 15T is preferably opposite to that of the transistor 12T, the transistor 13T, and the transistor 14T. FIG. 70 is a circuit diagram where the wiring 34 is combined with the wiring 31, the wiring 32, and the wiring 33 to form one wiring.

In many cases, the transistor 11 operates in a saturation region when current flows therethrough. Therefore, the transistor 11 preferably has a longer channel length or gate length than the transistor 12T, the transistor 13T, the transistor 14T, the transistor 15T, and the transistor 16T. When the channel length or the gate length is increased, characteristics in a saturation region have a flat slope; accordingly, a kink effect can be reduced. Note that one aspect of an embodiment of the present invention is not limited thereto.

In many cases, the transistor 11 operates in a saturation region when current flows therethrough. Therefore, the transistor 11 preferably has a longer channel width or gate width than the transistor 12T, the transistor 13T, the transistor 14T, the transistor 15T, and the transistor 16T. When the channel width or the gate width is increased, a large amount of current can flow even when the transistor 11 operates in a saturation region. Note that one aspect of an embodiment of the present invention is not limited thereto.

Figure 29:
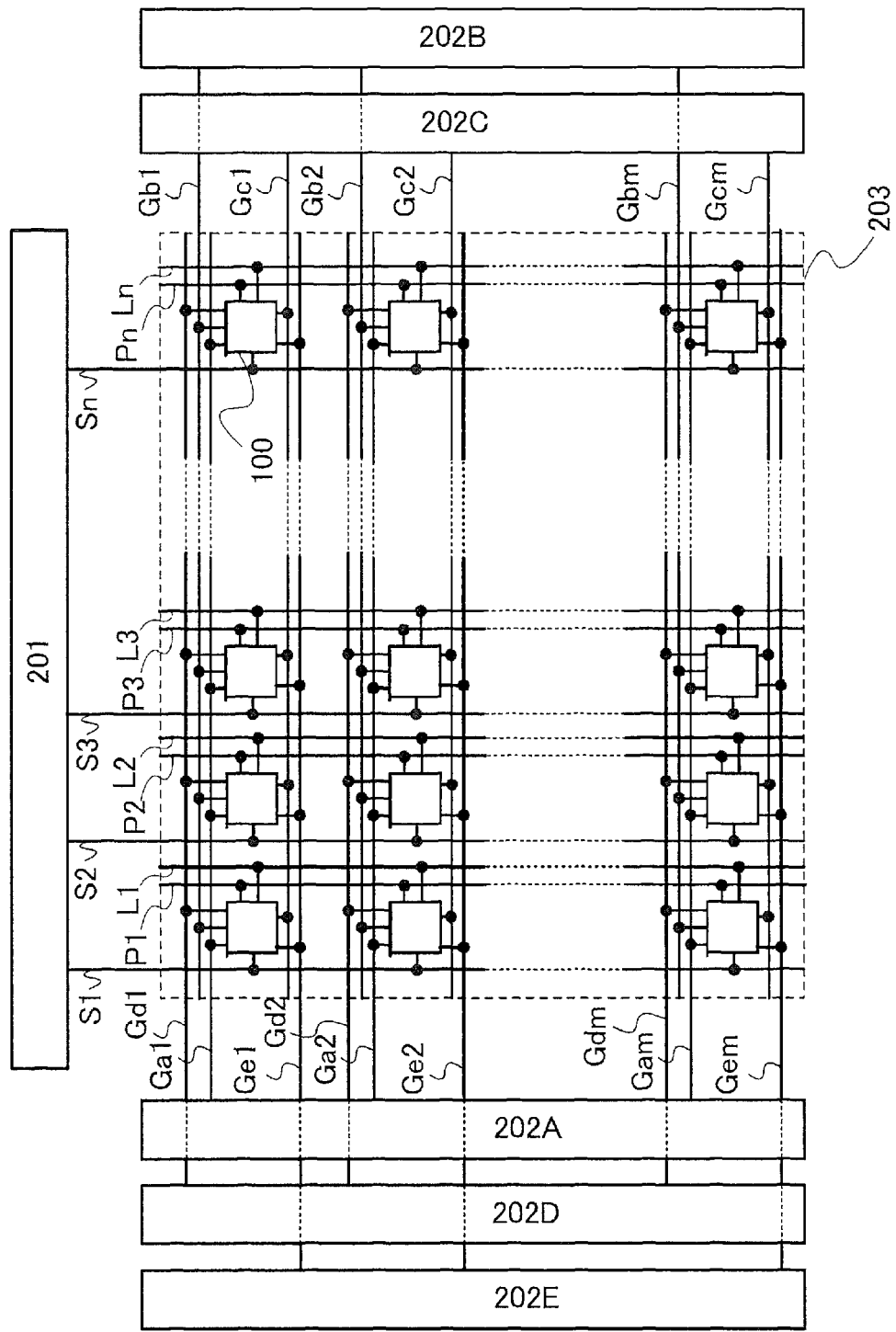
FIG. 29 is a block diagram illustrating an example of pixels according to one embodiment of the present invention.

As for the case where the circuit 10 is used as the pixel 100 as illustrated in FIG. 28, FIG. 29 is an example of a block diagram of a display device including the pixel 100.

The display device includes a signal line driver circuit 201, a scan line driver circuit 202A, a scan line driver circuit 202B, a scan line driver circuit 202C, a scan line driver circuit 202D, a scan line driver circuit 202E, and a pixel region 203, for example. The pixel region 203 is provided with a plurality of signal lines S1 to Sn extended in the column direction from the signal line driver circuit 201. The pixel region 203 is further provided with a plurality of scan lines Ga1 to Gam extended in the row direction from the scan line driver circuit 202A. The pixel region 203 is further provided with a plurality of scan lines Gb1 to Gbm extended in the row direction from the scan line driver circuit 202B. The pixel region 203 is further provided with a plurality of scan lines Gc1 to Gcm extended in the row direction from the scan line driver circuit 202C. The pixel region 203 is further provided with a plurality of scan lines Gd1 to Gdm extended in the row direction from the scan line driver circuit 202D. The pixel region 203 is further provided with a plurality of scan lines Gc1 to Gem extended in the row direction from the scan line driver circuit 202E. In the pixel region 203, a plurality of pixels 100 is arranged in a matrix. Further, the pixel region 203 includes power supply lines P1 to Pn and L1 to Ln which are parallel to the signal lines S1 to Sn. Each of the pixels 100 is connected to the signal line Sj (one of the signal lines S1 to Sn), the scan line Gai (one of the scan lines Ga1 to Gam), the scan line Gb1 (one of the scan lines Gb1 to Gbm), the scan line Gci (one of the scan lines Gc1 to Gcm), the scan line Gdi (one of the scan lines Gd1 to Gdm), the scan line Gei (one of the scan lines Ge1 to Gem), the power supply line Pj (one of the power supply lines P1 to Pn), and the power supply line Lj (one of the power supply lines L1 to Ln).

The scan line Gai corresponds to the wiring 31 in FIG. 2A. The scan line Gbj corresponds to the wiring 32 in FIG. 2A. The scan line Gcj corresponds to the wiring 33 in FIG. 2A. The scan line Gdj corresponds to the wiring 34 in FIG. 2A. The scan line Gej corresponds to the wiring 35 in FIG. 2A. The signal line Sj corresponds to the wiring 19 in FIG. 2A. The power supply line Pj corresponds to the wiring 21 in FIG. 2A. The power supply line Lj corresponds to the wiring 22 in FIG. 2A. Although not illustrated in FIG. 29, a cathode line which is common to all of the pixels is provided; the cathode line corresponds to the wiring 20 in FIG. 2A.

Note that the power supply line Pj can be shared by pixels horizontally adjacent to each other. For example, one power supply line is provided for two pixels; thus, the number of power supply lines can be reduced. Further, the power supply line Lj can be shared by pixels horizontally adjacent to each other. For example, one power supply line is provided for two pixels; thus, the number of power supply lines can be reduced.

Note that the power supply line Pj can be extended in the row direction to be parallel to the scan line Gai and the like. In that case, the power supply line Pj can be shared by pixels vertically adjacent to each other. For example, one supply line is provided for two pixels; thus, the number of power supply lines can be reduced. Further, the power supply line Lj can be extended in the row direction to be parallel to the scan line Gai and the like. In that case, the power supply line Lj can be shared by pixels vertically adjacent to each other. For example, one power supply line is provided for two pixels; thus, the number of power supply lines can be reduced.

Figure 25:
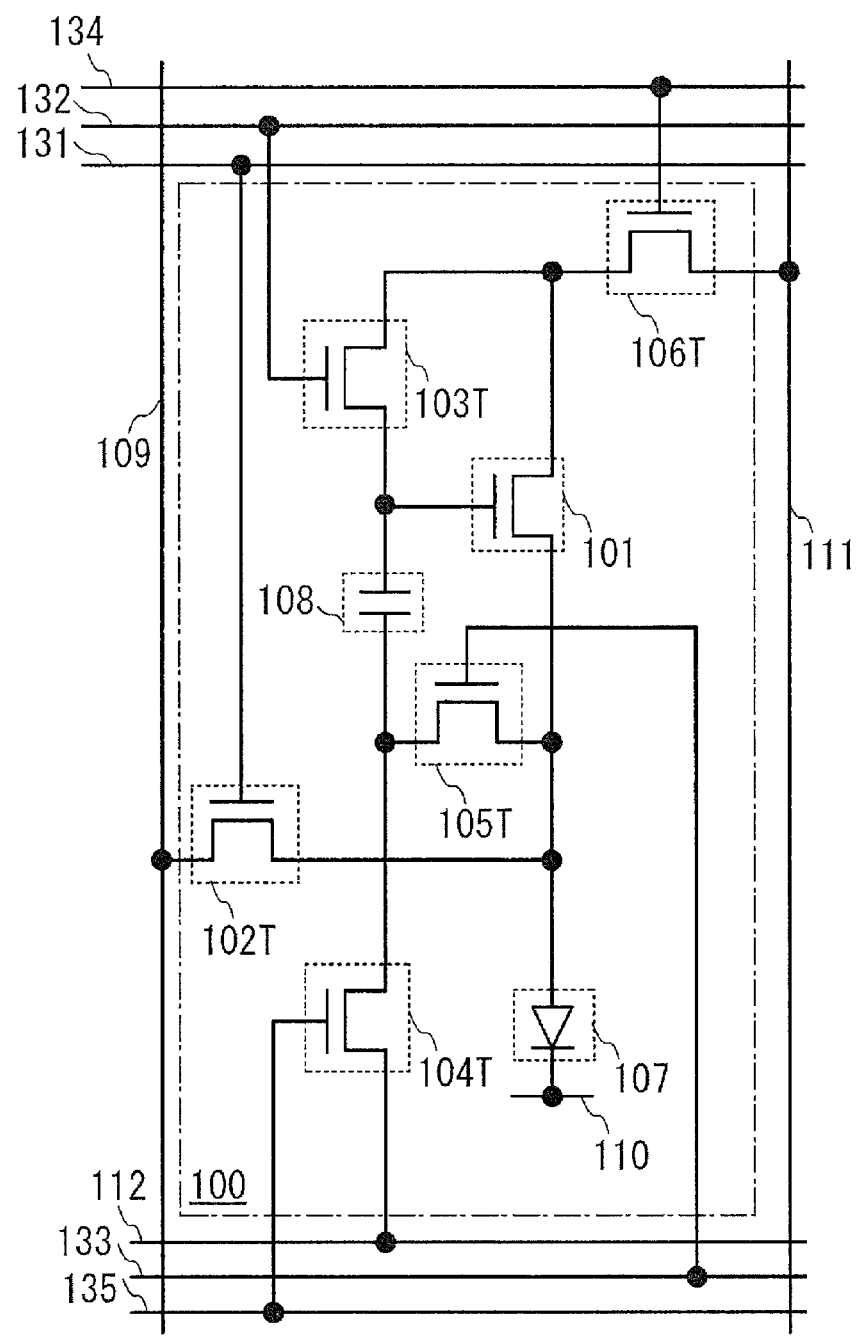
FIG. 25 is a circuit diagram illustrating an example of a pixel according to one embodiment of the present invention.

Note that, in FIG. 2A, the circuit 10 corresponds to a pixel in the case where the load 17 is a light-emitting element. FIG. 25 is a circuit diagram where the load 17 in FIG. 2A is a light-emitting element and the circuit 10 in FIG. 2A is a pixel. The pixel 100 in FIG. 25 includes a transistor 102T, a transistor 103T, a transistor 104T, a transistor 105T, a transistor 106T, the light-emitting element 107, the capacitor 108, and the transistor 101. The transistor 101 allows the circuit to function as a current source. The pixel 100 is connected to the wiring 109, the wiring 110, the wiring 111, and the wiring 112. Wirings 131 to 135 functioning as scan lines are connected to the respective gates of the transistors 102T to 106T. The conduction state or non-conduction state of each of the transistors 102T to 106T is controlled by an H-level potential or an L-level potential supplied through the corresponding wiring.

Note that the transistor 102T, the transistor 103T, the transistor 104T, the transistor 105T, and the transistor 106T illustrated in FIG. 25 correspond to the transistor 12T, the transistor 13T, the transistor 14T, the transistor 15T, and the transistor 16T illustrated in FIG. 2A, respectively. In addition, the capacitor 108, the transistor 101, the wiring 109, the wiring 110, the wiring 111, and the wiring 112 illustrated in FIG. 25 correspond to the capacitor 18, the transistor 11, the wiring 19, the wiring 20, the wiring 21, and the wiring 22 illustrated in FIG. 2A, respectively. The wiring 131 illustrated in FIG. 25 corresponds to the wiring 31 illustrated in FIG. 2A. The wiring 132 illustrated in FIG. 25 corresponds to the wiring 32 illustrated in FIG. 2A. The wiring 133 illustrated in FIG. 25 corresponds to the wiring 34 illustrated in FIG. 2A. The wiring 134 illustrated in FIG. 25 corresponds to the wiring 35 illustrated in FIG. 2A. The wiring 135 illustrated in FIG. 25 corresponds to the wiring 33 illustrated in FIG. 2A.

With the structure where a plurality of wirings is combined into one wiring, which is illustrated in FIG. 58, FIG. 59, FIG. 60, FIG. 61, FIG. 64, FIG. 65, FIG. 66, FIG. 67, FIG. 68, FIG. 69, and FIG. 70, the number of wirings functioning as scan lines connected to the pixel can be reduced.

Figure 62A:
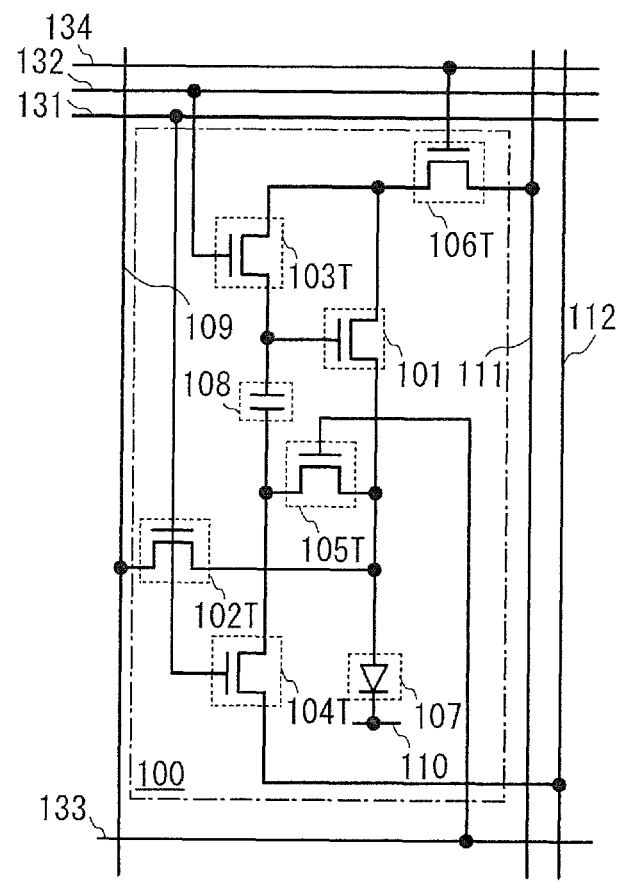
FIGS. 62A and 62B are circuit diagrams illustrating an example of a pixel according to one embodiment of the present invention.

As a specific example, when the structure in FIG. 60 where the wiring 31 and the wiring 33 are combined into one wiring is illustrated as in FIG. 25 where the load 17 is a light-emitting element, a circuit structure in FIG. 62A is obtained. FIG. 62A illustrates a structure where the wiring 131 and the wiring 135 in FIG. 25 are combined into one wiring 131.

Figure 62B:
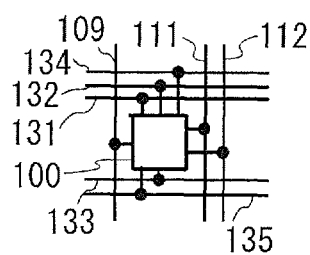

Note that FIG. 62B is a simplified diagram of the pixel structure illustrated in FIG. 25. FIG. 62B illustrates a connection relation between the wirings connected to the pixel 100 and the terminals of the pixel.

Figure 63A:
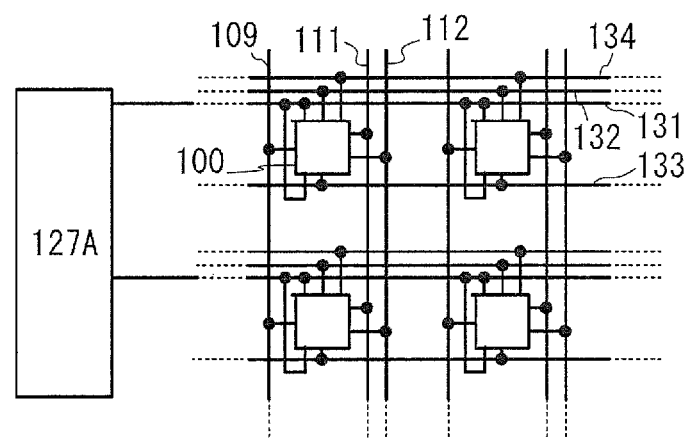
FIGS. 63A and 63B are each a circuit diagram illustrating an example of pixels according to one embodiment of the present invention.

Here, in the case where the pixels 100 each having the circuit structure in FIG. 62A are arranged in a matrix, a connection relation between wirings and each of the pixels can be similar to that illustrated in FIG. 62B, and a circuit structure in FIG. 63A can be obtained. With the circuit structure in FIG. 63A, the area occupied by wirings in a region where the pixels are provided can be reduced by omission of the wiring 135. Note that a circuit 127A illustrated in FIG. 63A has a function similar to that of the circuit 27A illustrated in FIG. 2A.

Figure 63B:
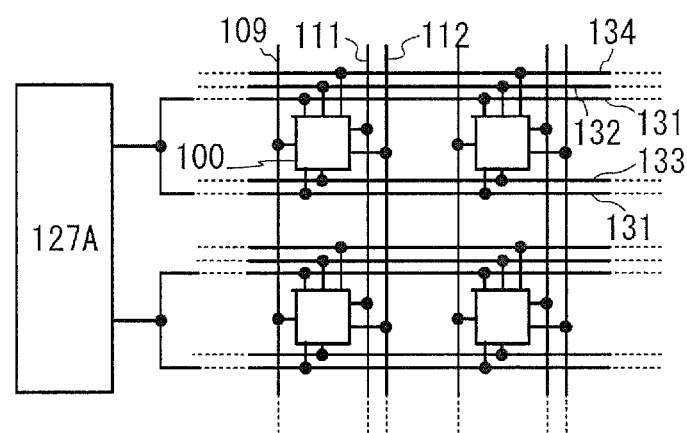

The wirings illustrated in FIG. 63A can be combined outside the region where the pixels are provided. Specifically, as illustrated in FIG. 63B, a wiring connected to the circuit 127A can be divided before it leads to the pixels and the divided wirings can be connected to the pixels. With this structure, the number of output terminals of the circuit 127A can be reduced.

Next, the operation of the circuit 10 illustrated in FIG. 1A is described. The operation of the circuit 10 illustrated in FIG. 1A can be mainly divided into first operation, second operation, and third operation. Note that one aspect of an embodiment of the present invention is not limited thereto, and another operation can be added or part of the operation can be omitted.

In the case where the operation of the circuit 10 is applied to that of the pixel 100 in the above display device in FIG. 29, the first operation is operation in which scan lines are selected in response to signals output from the scan line driver circuits 202A to 202E, and then the potential of each node of the pixels 100 connected to the selected scan lines is initialized (first operation). The second operation is operation in which a video signal is written into the initialized pixel 100 to obtain the threshold voltage of a transistor. After the threshold voltage of the transistor is obtained by writing of the video signal, the operation moves to light emission. The third operation is operation in which light is emitted in accordance with the video signal written into the pixel.

Figure 2B:
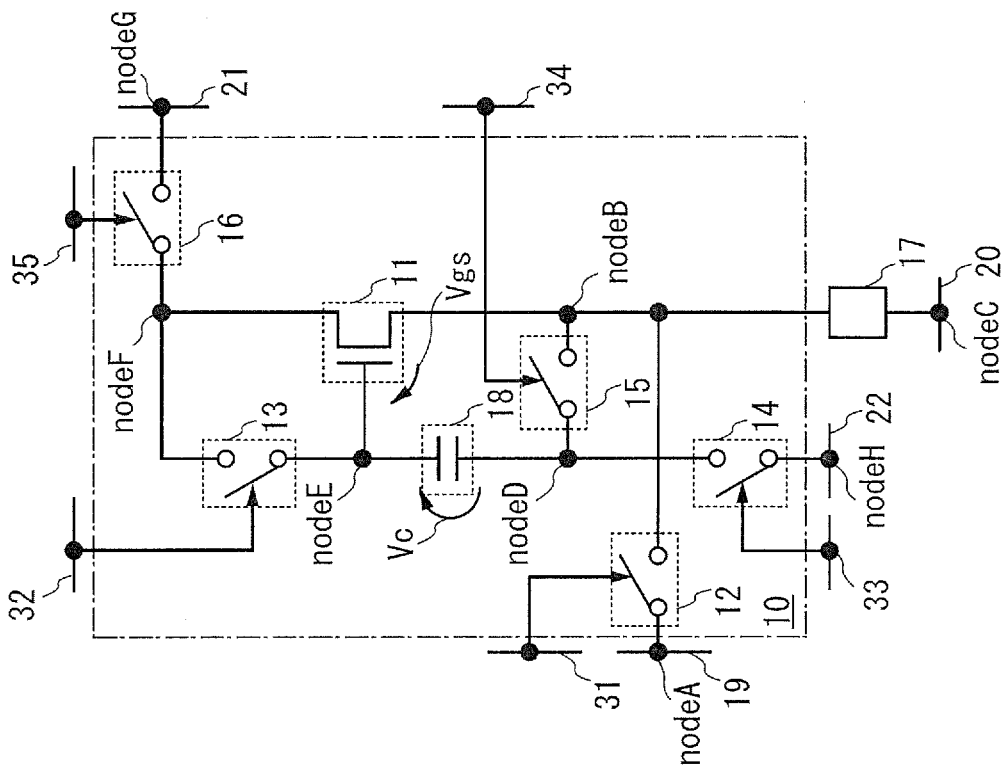
FIGS. 2A and 2B are each a circuit diagram illustrating an example of a circuit according to one embodiment of the present invention.
Figure 2A:
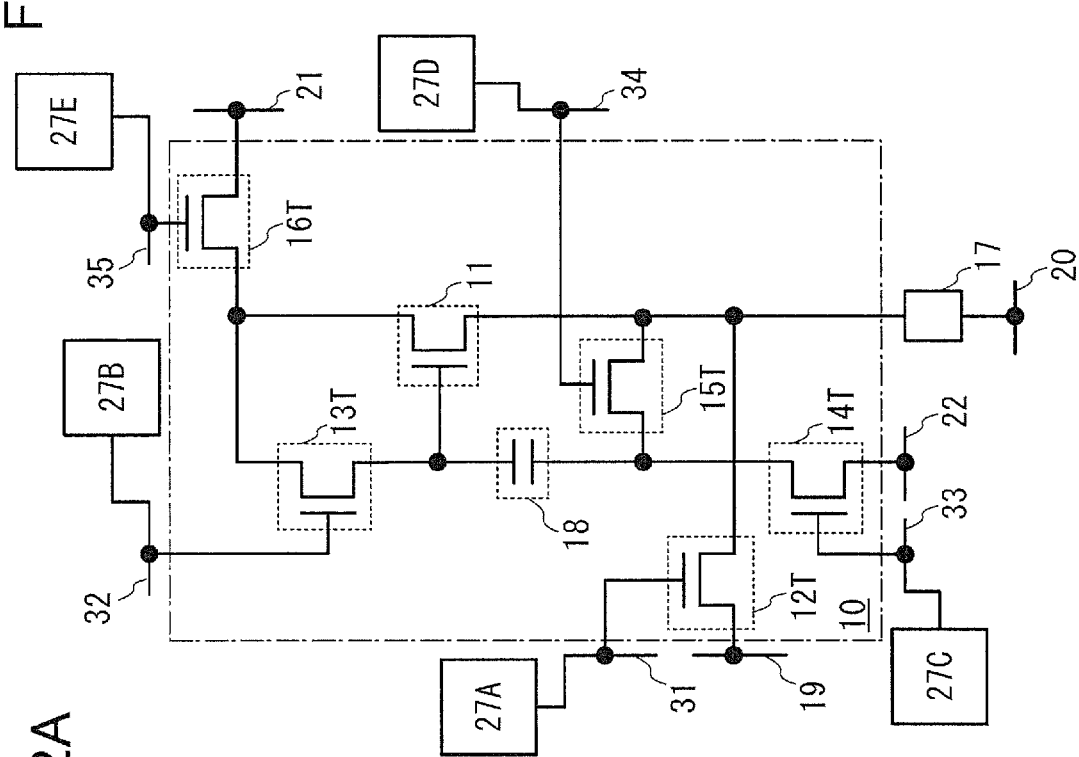

Note that, in order to explain the operation of the circuit with the structure illustrated in FIG. 1A, FIG. 2B shows symbols representing the potentials of nodes between elements and the potentials of wirings. In addition, in FIG. 2B, voltage between the one terminal (mainly serving as a source) and the gate of the transistor 11 is denoted by symbol Vgs, and voltage between the electrodes of the capacitor 18 is denoted by symbol Vc.

A node A, a node B, a node C, a node D, a node E, a node F, a node G and a node H correspond to the nodes and wirings illustrated in FIG. 2B. The potential of the node A corresponds to the potential of the wiring 19. The potential of the node B corresponds to the potential of a wiring connecting the first terminal of the transistor 11, the first terminal of the switch 12, the first terminal of the switch 15, and the one electrode of the load 17. The potential of the node C corresponds to the potential of the wiring 20. The potential of the node D corresponds to the potential of a wiring connecting the other electrode of the capacitor 18, the first terminal of the switch 14, and the second terminal of the switch 15. The potential of the node E corresponds to the potential of a wiring connecting the gate of the transistor 11, the one electrode of the capacitor 18, and the first terminal of the switch 13. The potential of the node F corresponds to the potential of a wiring connecting the second terminal of the transistor 11, the second terminal of the switch 13, and the first terminal of the switch 16. The potential of the node G corresponds to the potential of the wiring 21. The potential of the node H corresponds to the potential of the wiring 22.

First, the first operation is described with reference to FIG. 3A. Note that, in FIG. 3A, reference numerals of the elements are omitted, and a conduction state or a non-conduction state of each of the switches is denoted by ON or OFF. In addition, potentials applied as the voltage Vgs and the voltage Vc and potentials applied to the node A, the node B, the node C, the node D, the node E, the node F, the node G, and the node H, which are illustrated in FIG. 2B, are shown.

In the first operation, the potential of each node is initialized. Specifically, the node A is set at Vsig, the node C is set at Vcat, the node G is set at VDD, and the node H is set at V1. Then, the switch 12, the switch 13, the switch 14, and the switch 16 are turned on, and the switch 15 is turned off. Thus, the potential of the node B becomes Vsig, the potential of the node D becomes V1, the potential of the node E becomes VDD, and the potential of the node F becomes VDD. Further, Vgs becomes (VDD−Vsig), and Vc becomes (VDD−V1).

As described above, Vsig at the node A is a potential for controlling the amount of current flowing between the wiring 21 and the wiring 20 with the use of the transistor 11 in the third operation. In addition, for example, Vsig at the node A is lower than or equal to Vcat at the node C. With this structure, current can be prevented from flowing to the load 17 in the first operation. Accordingly, problems caused by current flowing to the load 17 can be reduced. Further, when Vsig is lower than Vcat, the load 17 can be reverse-biased. In that case, for example, deterioration of the load 17 can be reduced and the load 17 can be repaired.

In a manner similar to the above, in the first operation, the potential V1 at the node D is set higher than Vsig at the node A, for example. With this structure, the transistor 11 can operate in a saturation region in the third operation for supplying current to the load 17.

In the first operation, the potential VDD at the node E and the node F is higher than Vcat at the node C, for example. With this structure, Vgs can be higher than the threshold voltage of the transistor 11 in the first operation. Further, electric charge can be accumulated in the capacitor 18.

Next, the second operation is described with reference to FIG. 3B, as in the case of FIG. 3A.

The second operation is operation for obtaining the threshold voltage of the transistor 11 as Vgs by discharging the potential of the gate of the transistor 11 (or the electric charge accumulated in the capacitor 18). Specifically, the node A is set at Vsig, the node C is set at Vcat, the node G is set at VDD, and the node H is set at V1. Then, the switch 12, the switch 13, and the switch 14 are turned on, and the switch 15 and the switch 16 are turned off. Thus, the potential of the node B becomes Vsig, the potential of the node D becomes V1, the potential of the node E becomes (Vsig+Vth), and the potential of the node F becomes (Vsig+Vth). Further, Vgs becomes Vth, and Vc becomes (Vsig+Vth−V1).

As described above, Vsig at the node B in the second operation is a potential for controlling the amount of current flowing between the wiring 21 and the wiring 20 with the use of the transistor 11 in the third operation. By the second operation, the potential of the node E corresponding to the potential of the gate of the transistor 11 can be (Vsig+Vth), which includes the threshold voltage of the transistor 11.

Further, the potential VDD at the node E and the node F in the first operation is discharged by the second operation. By the discharge, Vgs is lowered to the threshold voltage Vth of the transistor 11 and is set in a steady state. Therefore, the discharge sets the node E and the node F in a steady state at (Vsig+Vth). In addition, at the termination of the second operation, (Vsig+Vth−V1) is held as Vc.

Note that, in some cases, it takes a very long time until Vgs becomes equal to the threshold voltage Vth of the transistor 11. Accordingly, in many cases, the circuit is driven with Vgs not completely lowered to the threshold voltage Vth. That is, in many cases, the second operation is terminated in the state where Vgs is slightly higher than the threshold voltage Vth. In other words, at the termination of the second operation, Vgs corresponds to a voltage in accordance with the threshold voltage.

Next, the third operation is described with reference to FIG. 3C, as in the case of FIGS. 3A and 3B.

The third operation is operation for outputting current to the load 17 with the use of the transistor 11 as part of a current source. Specifically, the node A is set at an arbitrary potential, for example, Vsig, the node C is set at Vcat, the node G is set at VDD, and the node H is set at an arbitrary potential, for example, V1. Then, the switch 15 and the switch 16 are turned on, and the switch 12, the switch 13, and the switch 14 are turned off. Thus, the potentials of the node B and the node D become Vel, the potential of the node E becomes (Vsig+Vth−V1+Vel), and the potential of the node F becomes VDD. Further, Vgs becomes (Vsig+Vth−V1), and Vc becomes (Vsig+Vth−V1).

Note that, in the third operation, the potentials of the node B, the node D, and the node F are increased while the node E is kept in an electrically floating state. Accordingly, the potential of the node E is increased by capacitive coupling while (Vsig+Vth−V1) is held as Vc, thereby becoming (Vsig+Vth−V1+Vel). That is, an increase in the potentials of the node B and the node D leads to an increase in the potential of the node E by bootstrap operation.

The circuit can operate even when the potentials of the node B and the node D are increased; therefore, adverse effects of, if any, deterioration in voltage-current characteristics of the load (e.g., a display element or a light-emitting element) can be reduced.

The potential Vel which is the potentials of the node B and the node D is set when the potential of the node F is increased to VDD and current flows to the load 17 through the transistor 11 which allows the circuit to function as a current source in the third operation. Specifically, Vel is set to a potential between VDD and Vcat.

In the third operation, Vgs of the transistor 11 becomes (Vsig+Vth−V1), which is set in consideration of the threshold voltage of the transistor 11. The amount of current of the transistor 11 depends on (Vgs−Vth). Accordingly, with the structure in this embodiment, adverse effects of variation in the threshold voltage of the transistor on the amount of current supplied to the load can be reduced. Further, even when the threshold voltage is changed by deterioration of the transistor, adverse effects of the change can be reduced. Therefore, in the case of a display element, display unevenness can be reduced and an image can be displayed with high quality.

Note that operation in which the load 17 or the capacitor 18 is charged or discharged can be performed before the first operation. In other words, precharge operation for initialization can be performed. Operation in that case is illustrated in FIG. 3D.

Specifically, the node A is set at an arbitrary potential, the node C is set at Vcat, the node G is set at VDD, and the node H is set at V1. Then, the switch 12 is turned off. The switch 14 and the switch 15 are turned on. As a result, the potential of the node B becomes V1; thus, the load 17 can be charged or discharged in advance. At this time, the switch 13 and the switch 16 may be in a non-conduction state. Note that, when the switch 13 and the switch 16 are in a conduction state, it is also possible to accumulate electric charge in the capacitor 18 or to discharge electric charge therein in advance.

In this operation, since the switch 12 is in a non-conduction state, the node A may be set at an arbitrary potential. Therefore, precharge operation can be performed in the pixel while a signal is supplied to another pixel through the wiring 19. Accordingly, a long period of time can be ensured for the operation of the circuit. Moreover, the precharge operation leads to rapid completion of the initialization in the first operation.

In order to prevent current from flowing to the load 17 in the precharge operation, the potential V1 is preferably set lower than or equal to Vcat. Note that one aspect of an embodiment of the present invention is not limited thereto.

Note that the precharge operation is not necessarily performed.

Note that FIG. 1A illustrates the circuit structure in this embodiment but one embodiment of the present invention is not limited thereto. A variety of circuits can be employed by changing the location or number of switches and/or by supplying appropriate voltage so that the circuit operates in a manner similar to the operation described with reference to FIGS. 3A to 3C, in which the threshold voltage of the transistor is corrected.

Specifically, for example, the switch 12, the switch 13, the switch 14, the switch 15, and the switch 16 can be provided anywhere and the number thereof is not limited as long as the switches can control a conduction state and a non-conduction state between nodes. In the case of the first operation described with reference to FIG. 3A, a connection relation illustrated in FIG. 4A may be employed. In the case of the second operation described with reference to FIG. 3B, a connection relation illustrated in FIG. 4B may be employed. In the case of the third operation described with reference to FIG. 3C, a connection relation illustrated in FIG. 4C may be employed. In the case of the operation described with reference to FIG. 3D, a connection relation illustrated in FIG. 4D may be employed. Each node can be set at any potential unless the node affects the operation.

Note that the operation for correcting the threshold voltage of the transistor is described with reference to FIGS. 3A to 3C and the like but one embodiment of the present invention is not limited thereto. For example, a period for correcting variation in the mobility of the transistor 11 may be provided between the second operation in FIG. 3B and the third operation in FIG. 3C. FIGS. 5A to 5D illustrate operation in the case where the period for correcting the mobility of the transistor 11 is provided in addition to the first operation, the second operation, and the third operation which are described with reference to FIGS. 3A to 3C.

Figure 3A:
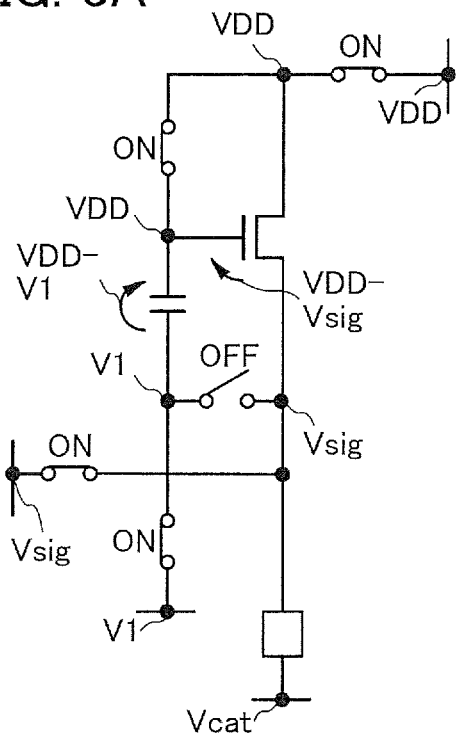
FIGS. 3A to 3D are circuit diagrams illustrating an example of a circuit according to one embodiment of the present invention.
Figure 5A:
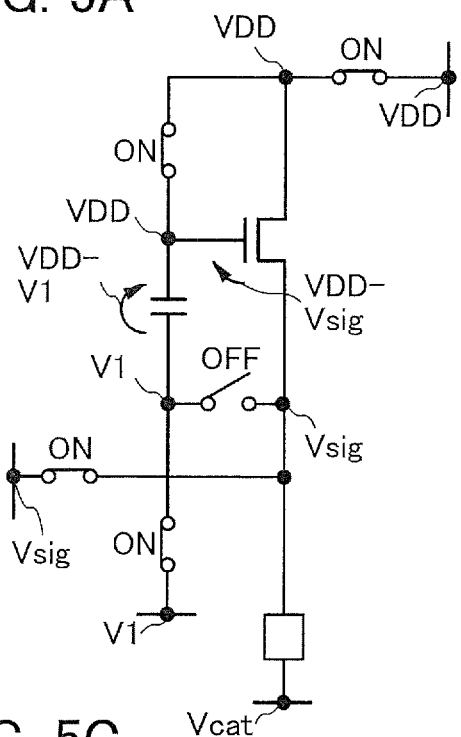
FIGS. 5A to 5D are circuit diagrams illustrating an example of a circuit according to one embodiment of the present invention.
Figure 5B:
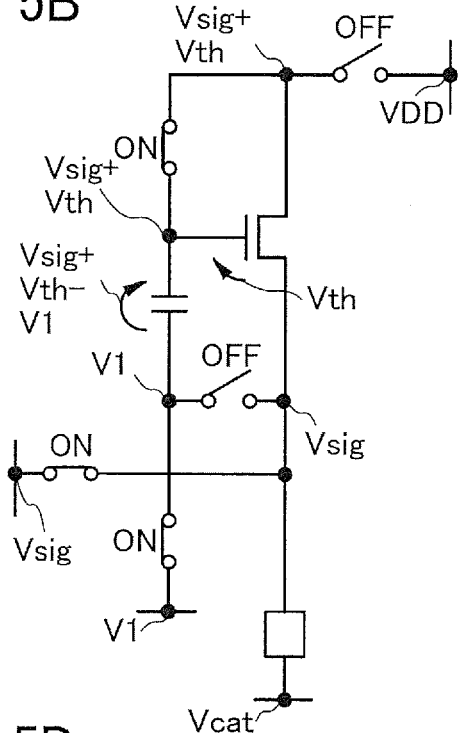

Note that first operation illustrated in FIG. 5A is the same as the first operation illustrated in FIG. 3A, and thus description thereof is omitted. In addition, second operation illustrated in FIG. 5B is the same as the second operation illustrated in FIG. 3B, and thus description thereof is omitted.

Next, third operation is described with reference to FIG. 5C, as in the case of FIGS. 3A and 3B.

In the third operation, the transistor 11 is turned on with the use of the potential held at the gate of the transistor 11 (electric charge stored in the capacitor 18), and the mobility of the transistor 11 is corrected with the use of the amount of current flowing therethrough. Specifically, the node A is set at an arbitrary potential, for example, Vsig, the node C is set at Vcat, the node G is set at an arbitrary potential, for example, VDD, and the node H is set at an arbitrary potential, for example, V1. Then, the switch 13 and the switch 15 are turned on, and the switch 12, the switch 14, and the switch 16 are turned off. Thus, the potentials of the node B and the node D become Vsig, and the potentials of the node E and the node F become (2×Vsig+Vth−V1+ΔVel). Further, Vgs becomes (Vsig+Vth−V1−ΔVel), and Vc becomes (Vsig+Vth−V1−ΔVel).

In the third operation, immediately after the switch 13 and the switch 15 are turned on and the switch 12, the switch 14, and the switch 16 are turned off, Vgs becomes (Vsig+Vth−V1), which is higher than the threshold voltage Vth. Thus, electric charge stored in the capacitor 18 flows through the transistor 11. When current flows through the transistor 11, each of the potentials of the node E and the node F is decreased to (2×Vsig+Vth−V1−ΔVel) and each of Vc and Vgs becomes (Vsig+Vth−V1−ΔVel). That is, when the electric charge stored in the capacitor 18 flows through the transistor 11, the voltages become lower by ΔVel.

The amount of change in voltage (ΔVel) of the transistor 11 changes depending on the mobility of the transistor 11. Accordingly, the potential of the node E corresponding to the potential of the gate of the transistor 11 can be set in advance in consideration of the amount of change in potential, which depends on the mobility of the transistor 11.

In the third operation, Vgs of the transistor 11 becomes (Vsig+Vth−V1−ΔVel), which is set in consideration of the mobility of the transistor 11. Accordingly, with the structure in this embodiment, adverse effects of variation in the mobility of the transistor on the amount of current supplied to the load can be reduced. Further, even when the mobility is changed by deterioration of the transistor, adverse effects of the change can be reduced.

Next, fourth operation is described with reference to FIG. 5D, as in the case of FIGS. 3A and 3B. Note that the fourth operation illustrated in FIG. 5D is similar to the third operation illustrated in FIG. 3C, and thus only different points are described below.

By the fourth operation, the potentials of the node B and the node D become Vel, the potential of the node E becomes (Vsig+Vth−V1+Vel−ΔVel), and the potential of the node F becomes VDD. Further, Vgs becomes (Vsig+Vth−V1−ΔVel), and Vc becomes (Vsig+Vth−V1−ΔVel).

In the fourth operation, Vgs of the transistor 11 becomes (Vsig+Vth−V1−ΔVel), which is set in consideration of the threshold voltage and mobility of the transistor 11. Accordingly, with the structure in this embodiment, adverse effects of variation in the threshold voltage and mobility of the transistor on the amount of current supplied to the load can be reduced.

Note that a variety of circuits can be employed by changing the location or number of switches and/or by supplying appropriate voltage so that the circuit operates in a manner similar to the operation described with reference to FIGS. 5A to 5D, in which the threshold voltage of the transistor is corrected.

Specifically, for example, the switch 12, the switch 13, the switch 14, the switch 15, and the switch 16 can be provided anywhere and the number thereof is not limited as long as the switches can control a conduction state and a non-conduction state between nodes. In the case of the first operation described with reference to FIG. 5A, a connection relation illustrated in FIG. 6A may be employed. In the case of the second operation described with reference to FIG. 5B, a connection relation illustrated in FIG. 6B may be employed. In the case of the third operation described with reference to FIG. 5C, a connection relation illustrated in FIG. 6C may be employed. In the case of the fourth operation described with reference to FIG. 5D, a connection relation illustrated in FIG. 6D may be employed. Each node can be set at any potential unless the node affects the operation.

Note that FIG. 1A illustrates the circuit structure in this embodiment but one embodiment of the present invention is not limited thereto. A variety of circuits can be employed by changing the transistor 11 in number or location.

Figure 3B:
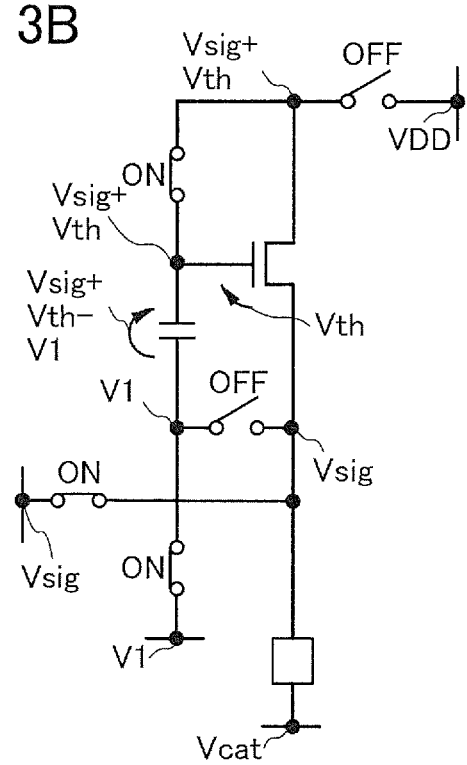
Figure 3C:
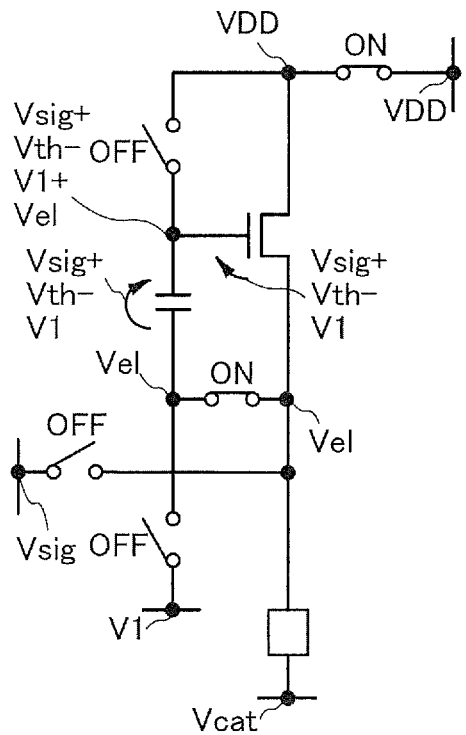
Figure 3D:
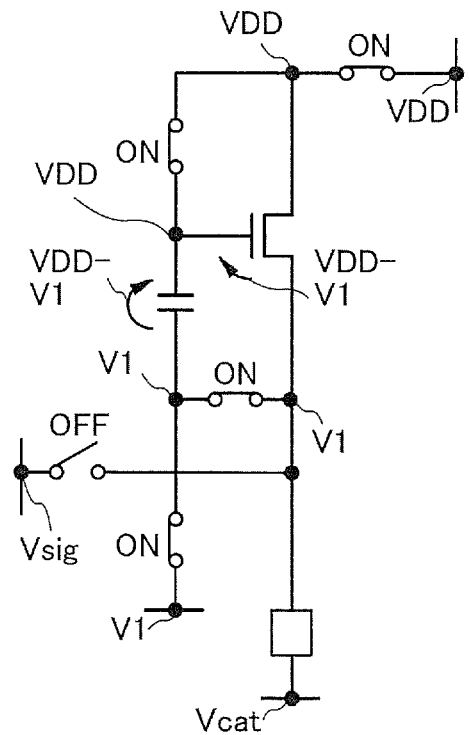
Figure 4A:
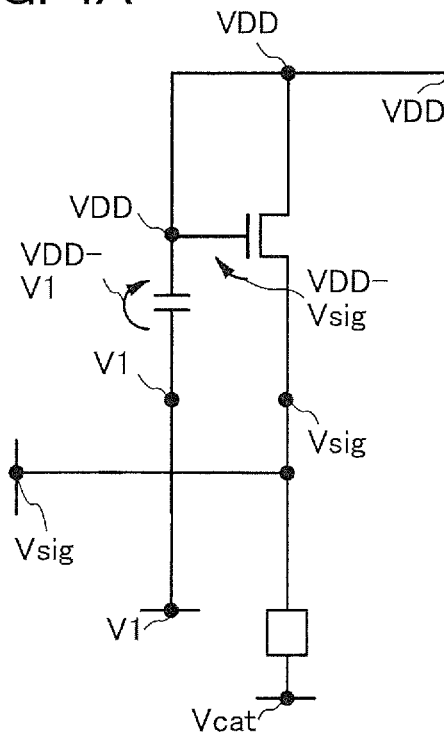
FIGS. 4A to 4D are circuit diagrams illustrating an example of a circuit according to one embodiment of the present invention.
Figure 4B:
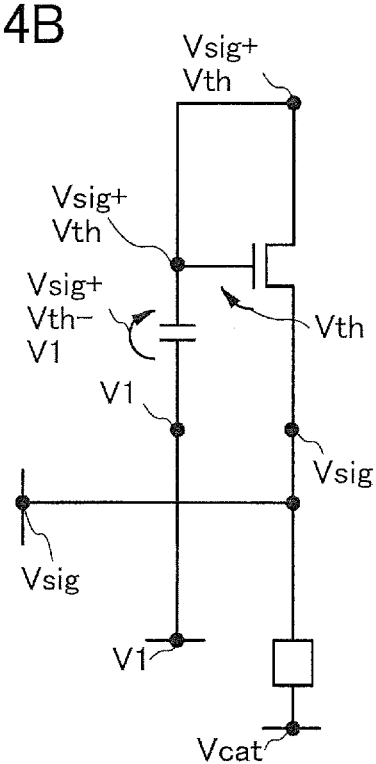
Figure 4C:
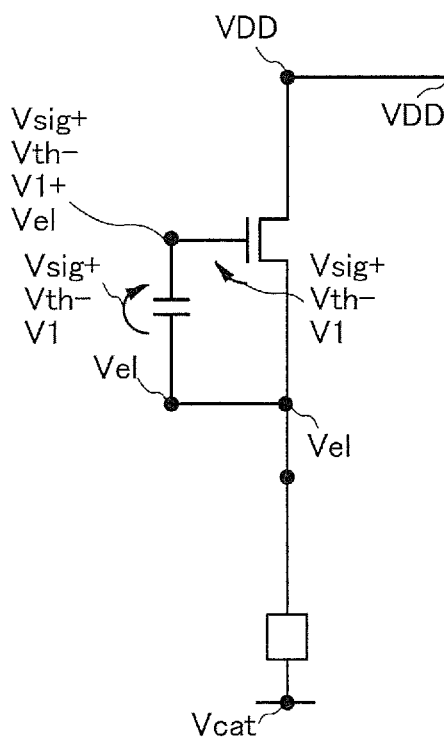
Figure 4D:
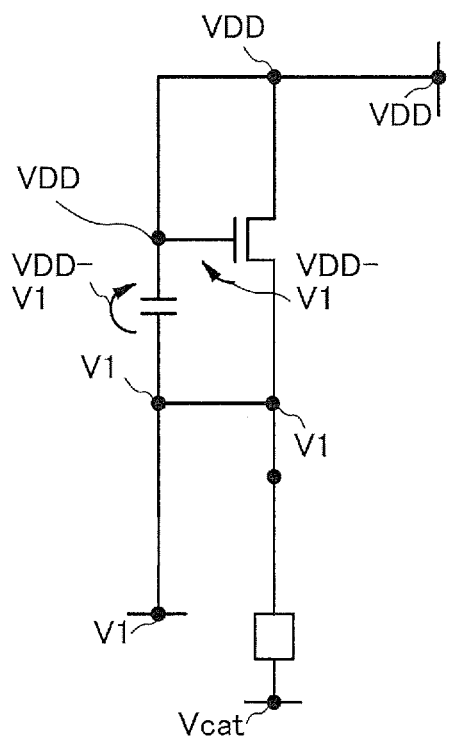

Note that, also in the case where the operation for correcting the mobility of the transistor 11 is performed as in FIGS. 5A to 5D or FIGS. 6A to 6D, it is possible to perform precharge operation as in FIG. 3D or FIG. 4D.

Figure 7:
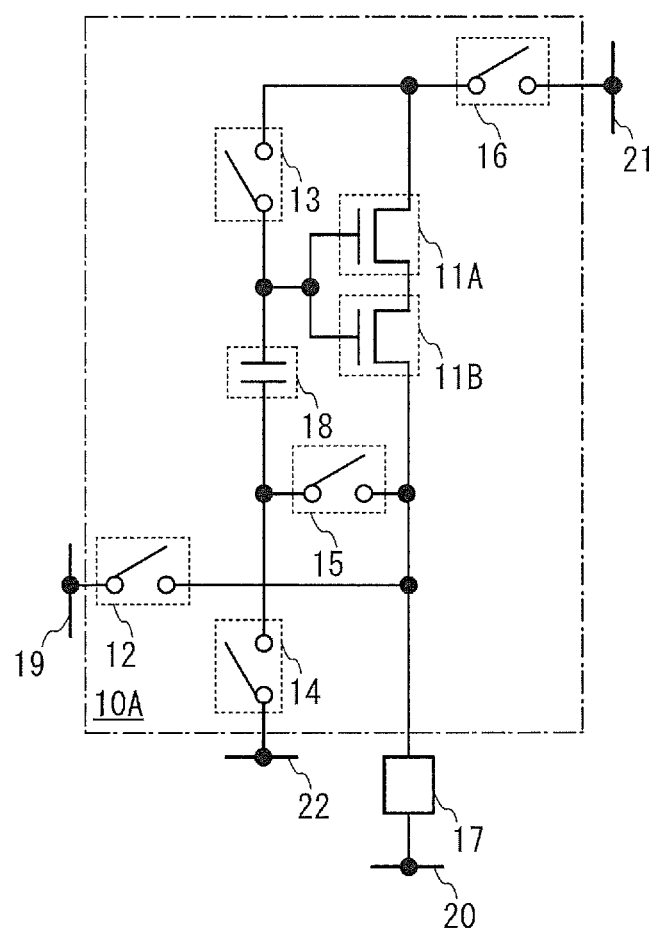
FIG. 7 is a circuit diagram illustrating an example of a circuit according to one embodiment of the present invention.

For example, as in a circuit 10A illustrated in FIG. 7, a transistor 11A and a transistor 11B which have gates connected to each other and are connected in series can be used as transistors which allow the circuit to function as a current source. Note that components in common with those in FIG. 1A are denoted by common reference numerals, and description thereof is omitted. Thus, characteristics in a saturation region have a flat slope; accordingly, a kink effect can be reduced.

Figure 8:
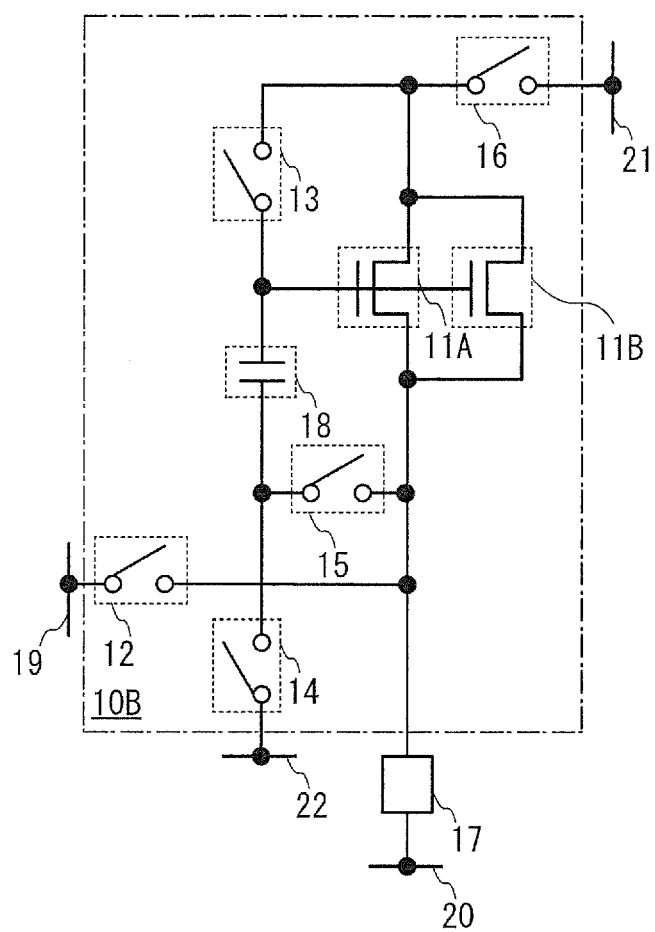
FIG. 8 is a circuit diagram illustrating an example of a circuit according to one embodiment of the present invention.

As another structural example, as in a circuit 10B illustrated in FIG. 8, the transistor 11A and the transistor 11B which have gates connected to each other and are connected in parallel can be used as transistors which allow the circuit to function as a current source. Note that components in common with those in FIG. 1A are denoted by common reference numerals, and description thereof is omitted. Thus, a large amount of current can flow even when the transistors operate in a saturation region. This structure also allows characteristics in a saturation region to have a flat slope; accordingly, a kink effect can be reduced.

Figure 9:
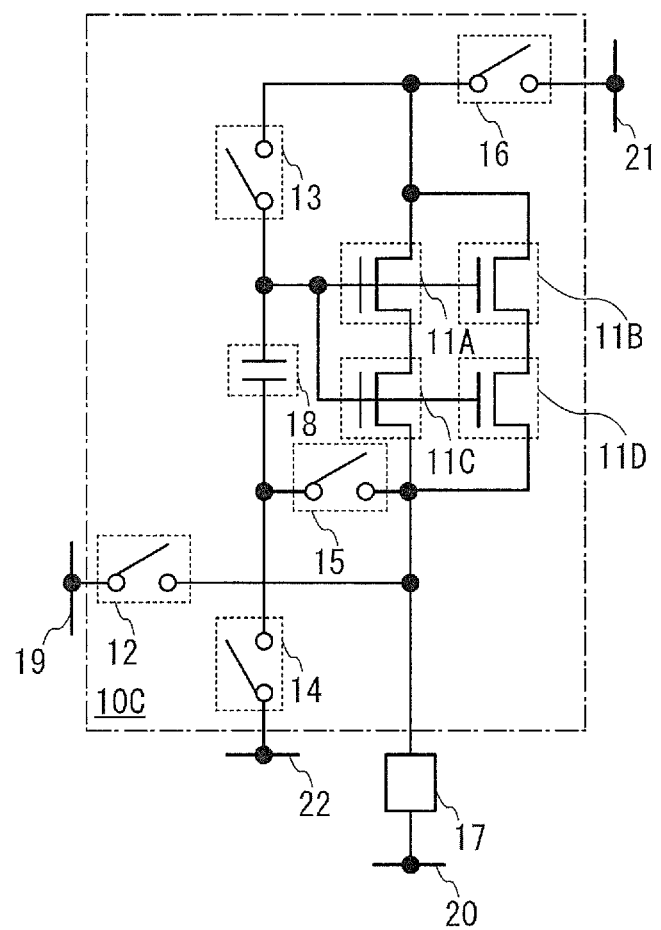
FIG. 9 is a circuit diagram illustrating an example of a circuit according to one embodiment of the present invention.

As another structural example, as in a circuit 10C illustrated in FIG. 9, the transistor 11A, the transistor 11B, a transistor 11C, and a transistor 11D which have gates connected to each other and are connected in series and parallel can be used as transistors which allow the circuit to function as a current source. Note that components in common with those in FIG. 1A are denoted by common reference numerals, and description thereof is omitted.

The channel width and/or channel length of the transistor 11 can be changed by application of any of the structures illustrated in FIG. 7, FIG. 8, and FIG. 9. The channel width and/or channel length are/is changed by combining a plurality of transistors as in the structures illustrated in FIG. 7, FIG. 8, and FIG. 9, whereby adverse effects of variation in transistor characteristics can be reduced as compared to the structure where a transistor having a large channel width and/or a large channel length is provided from the beginning.

Note that variation in the threshold voltage or the like of a transistor is corrected in this embodiment, but one aspect of an embodiment of the present invention is not limited thereto.

For example, the circuit can operate to supply current to the load 17 without the operation for correcting variation in threshold voltage.

Note that FIG. 1A and the like each illustrate an example of a circuit structure; therefore, a transistor can be provided additionally. On the other hand, for each node in FIG. 1A and the like, it is also possible not to provide an additional transistor, switch, passive element, or the like. For example, it is possible not to increase the number of transistors directly connected to the node A, the node B, the node C, the node D, the node E, the node F, the node G, and/or the node H.

In this embodiment, an example of a basic principle is described. Thus, part or the whole of this embodiment can be freely combined with, applied to, or replaced with part or the whole of another embodiment.

(Embodiment 2)

In this embodiment, an example of a circuit structure which is partly different from that described in Embodiment 1 is described. Accordingly, the description in Embodiment 1 can be applied to this embodiment.

Figure 10B:
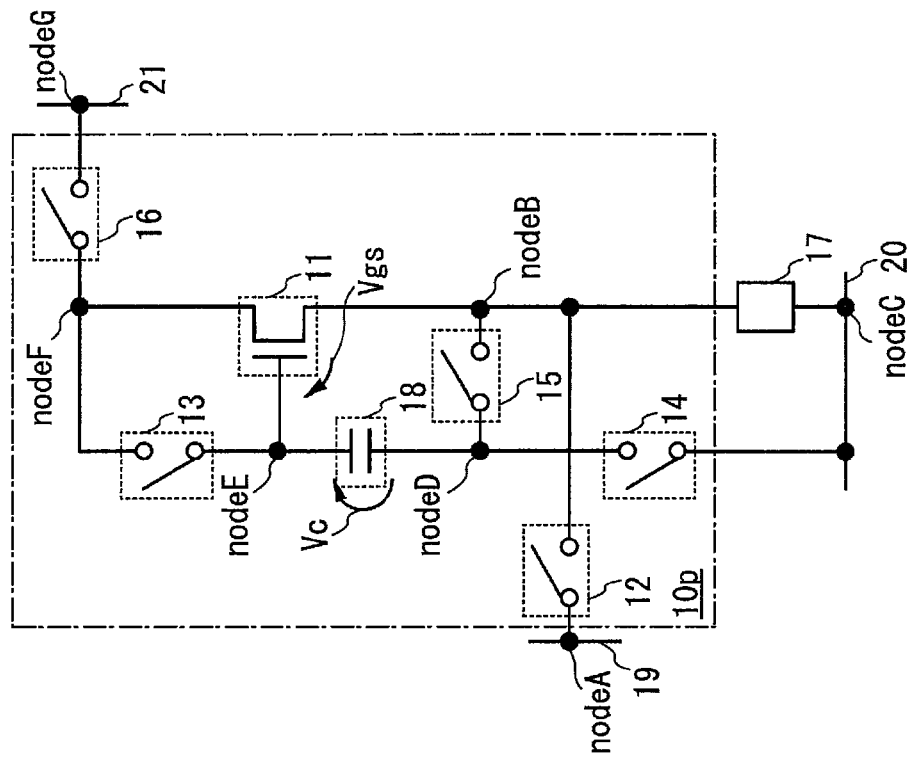
FIGS. 10A and 10B are circuit diagrams illustrating an example of a circuit according to one embodiment of the present invention.
Figure 10A:
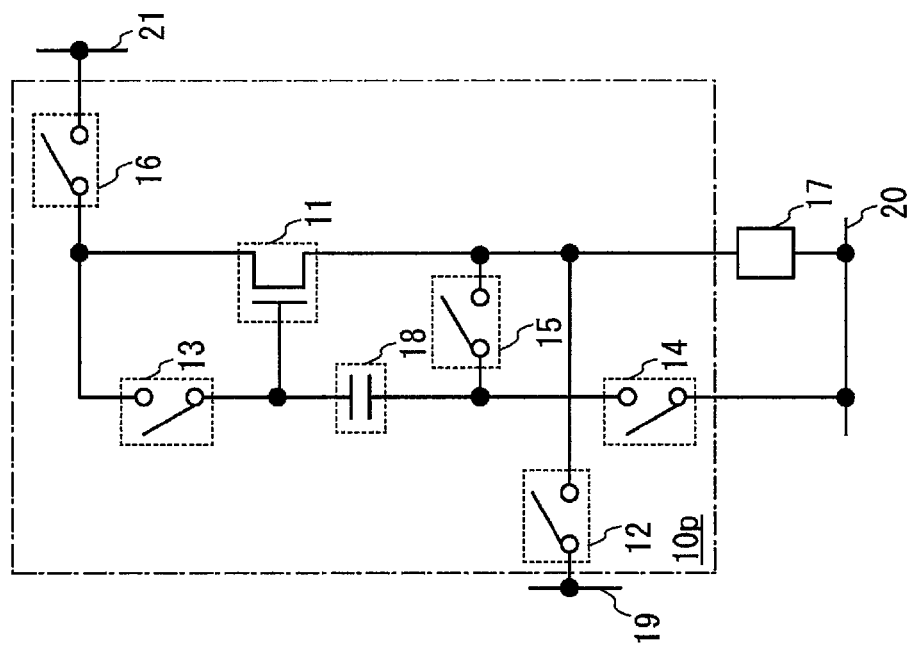

FIG. 10A illustrates a circuit 10p which has a circuit structure similar to that of the circuit 10 in FIG. 1A. The circuit 10p illustrated in FIG. 10A is different from the circuit 10 illustrated in FIG. 1A in that the wiring 22 for supplying the potential V1 is not included and the second terminal of the switch 14 is connected to the wiring 20. Note that components in common with those in FIG. 1A are denoted by common reference numerals, and description thereof is omitted.

Figure 30:
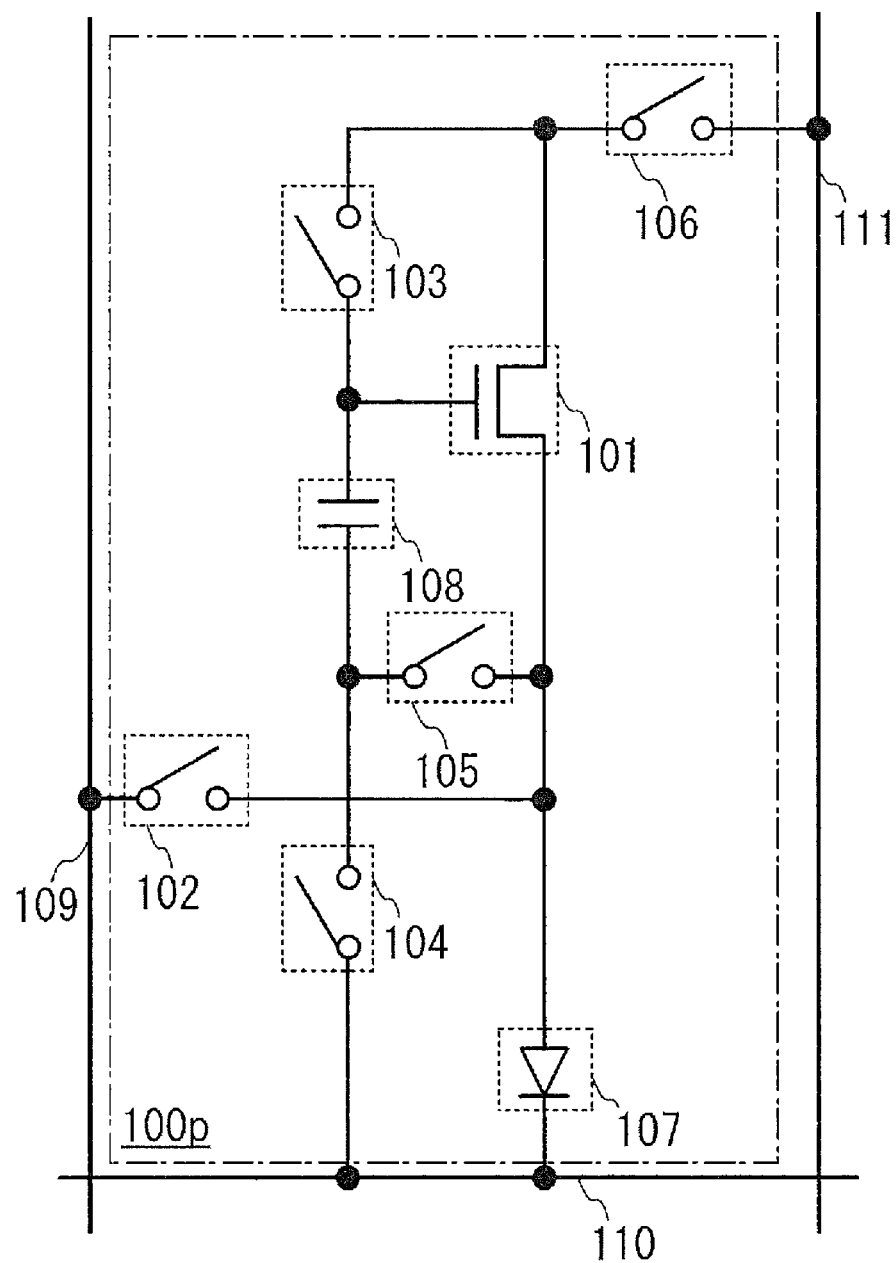
FIG. 30 is a circuit diagram illustrating an example of a pixel according to one embodiment of the present invention.

Note that, in FIG. 10A, the circuit 10p corresponds to a pixel in the case where the load 17 is a light-emitting element. FIG. 30 is a circuit diagram where the load 17 in FIG. 10A is a light-emitting element and the circuit 10p in FIG. 10A is a pixel. A pixel 100p in FIG. 30 includes the switch 102, the switch 103, the switch 104, the switch 105, the switch 106, the light-emitting element 107, the capacitor 108, and the transistor 101 which allows the circuit to function as a current source. The pixel 100p is connected to the wiring 109, the wiring 110, and the wiring 111.

Note that the switch 102, the switch 103, the switch 104, the switch 105, and the switch 106 illustrated in FIG. 30 correspond to the switch 12, the switch 13, the switch 14, the switch 15, and the switch 16 illustrated in FIG. 10A, respectively. In addition, the capacitor 108, the transistor 101, the wiring 109, the wiring 110, and the wiring 111 illustrated in FIG. 30 correspond to the capacitor 18, the transistor 11, the wiring 19, the wiring 20, and the wiring 21 illustrated in FIG. 10A, respectively.

Next, the operation of the circuit 10p illustrated in FIG. 10A is described. The operation of the circuit 10p illustrated in FIG. 10A can be mainly divided into first operation, second operation, and third operation.

Note that, in order to explain the operation of the circuit with the structure illustrated in FIG. 10A, FIG. 10B shows symbols representing the potentials of nodes between elements and the potentials of wirings. In addition, in FIG. 10B, voltage between the one terminal (mainly serving as a source) and the gate of the transistor 11 is denoted by symbol Vgs, and voltage between the electrodes of the capacitor 18 is denoted by symbol Vc.

A node A, a node B, a node C, a node D, a node E, a node F, and a node G correspond to the nodes and wirings illustrated in FIG. 10B. The potential of the node A corresponds to the potential of the wiring 19. The potential of the node B corresponds to the potential of a wiring connecting the first terminal of the transistor 11, the first terminal of the switch 12, the first terminal of the switch 15, and the one electrode of the load 17. The potential of the node C corresponds to the potential of the wiring 20. The potential of the node D corresponds to the potential of a wiring connecting the first terminal of the switch 14, the second terminal of the switch 15, and the other electrode of the capacitor 18. The potential of the node E corresponds to the potential of a wiring connecting the gate of the transistor 11, the one electrode of the capacitor 18, and the first terminal of the switch 13. The potential of the node F corresponds to the potential of a wiring connecting the second terminal of the transistor 11, the second terminal of the switch 13, and the first terminal of the switch 16. The potential of the node G corresponds to the potential of the wiring 21.

First, the first operation is described with reference to FIG. 11A. Note that reference numerals of the elements in FIG. 10B are omitted, and a conduction state or a non-conduction state of each of the switches is denoted by ON or OFF. In addition, potentials applied as the voltage Vgs and the voltage Vc and potentials applied to the node A, the node B, the node C, the node D, the node E, the node F, and the node which are illustrated in FIG. 10B, are shown.

In the first operation, the potential of each node is initialized. Specifically, the node A is set at Vsig, the node C is set at Vcat, and the node G is set at VDD. Then, the switch 12, the switch 13, the switch 14, and the switch 16 are turned on, and the switch 15 is turned off. Thus, the potential of the node B becomes Vsig, the potential of the node D becomes Vcat, the potential of the node E becomes VDD, and the potential of the node F becomes VDD. Further, Vgs becomes (VDD−Vsig), and Vc becomes (VDD−Vcat).

Figure 11A:
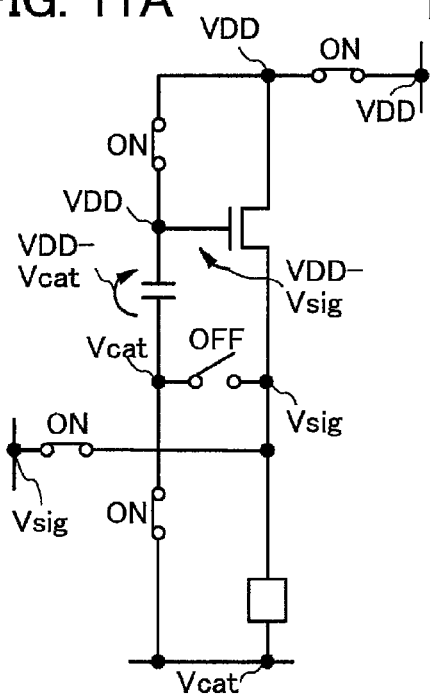
FIGS. 11A to 11D are circuit diagrams illustrating an example of a circuit according to one embodiment of the present invention.

The first operation illustrated in FIG. 11A is different from that illustrated in FIG. 3A in Embodiment 1 in that the potential V1 supplied to the node D is replaced with Vcat. The potential held at the node D in the first operation is higher than Vsig; therefore, Vcat, which is higher than Vsig, can be held at the node D in the first operation. With this structure, when current flows to the load 17 in the third operation, the transistor 11 can operate in a saturation region without an increase in the number of wirings.

Next, the second operation is described with reference to FIG. 11B, as in the case of FIG. 11A.

The second operation is operation for obtaining the threshold voltage of the transistor 11 as Vgs by discharging the potential of the gate of the transistor 11 (or the electric charge accumulated in the capacitor 18). Specifically, the node A is set at Vsig, the node C is set at Vcat, and the node G is set at VDD. Then, the switch 12, the switch 13, and the switch 14 are turned on, and the switch 15 and the switch 16 are turned off. Thus, the potential of the node B becomes Vsig, the potential of the node D becomes Vcat, the potential of the node E becomes (Vsig+Vth), and the potential of the node F becomes (Vsig+Vth). Further, Vgs becomes Vth, and Vc becomes (Vsig+Vth−Vcat).

Figure 11B:
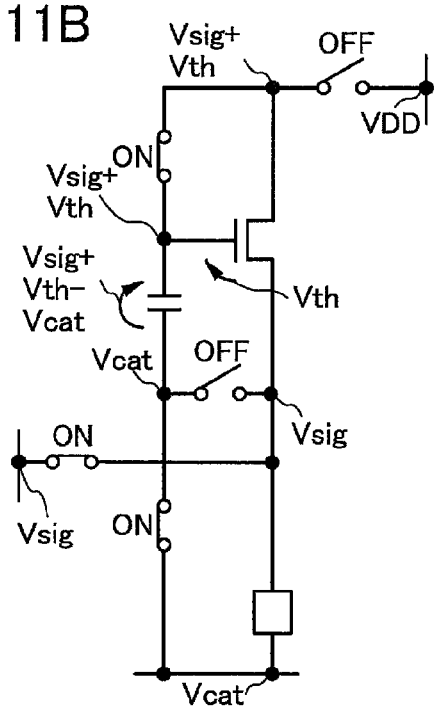

In the second operation illustrated in FIG. 11B, in a manner similar to that illustrated in FIG. 3B in Embodiment 1, the potential of the node E corresponding to the potential of the gate of the transistor 11 can be (Vsig+Vth), which includes the threshold voltage of the transistor 11. By the second operation, Vgs is lowered to the threshold voltage Vth of the transistor 11 and is set in a steady state. Therefore, the discharge sets the node E and the node F in a steady state at (Vsig+Vth). In addition, at the termination of the second operation, (Vsig+Vth−Vcat) is held as Vc.

Next, the third operation is described with reference to FIG. 11C, as in the case of FIGS. 11A and 11B.

The third operation is operation for outputting current to the load 17 with the use of the transistor 11 as part of a current source. Specifically, the node A is set at an arbitrary potential, for example, Vsig, the node C is set at Vcat, and the node G is set at VDD. Then, the switch 15 and the switch 16 are turned on, and the switch 12, the switch 13, and the switch 14 are turned off. Thus, the potentials of the node B and the node D become Vel, the potential of the node E becomes (Vsig+Vth−Vcat+Vel), and the potential of the node F becomes VDD. Further, Vgs becomes (Vsig+Vth−Vcat), and Vc becomes (Vsig+Vth−Vcat).

Figure 11C:
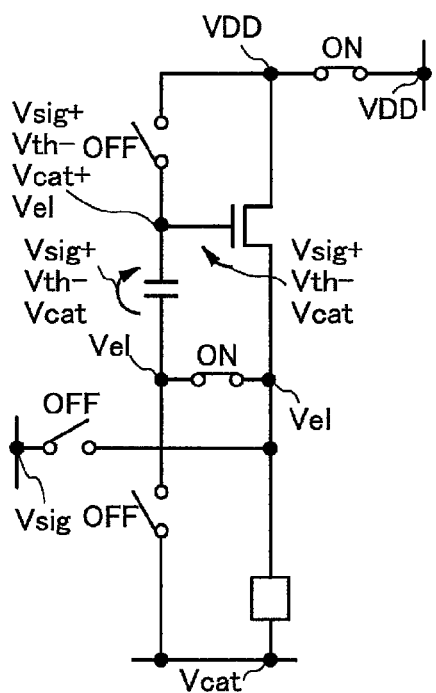

In the third operation illustrated in FIG. 11C, in a manner similar to that illustrated in FIG. 3C in Embodiment 1, the potentials of the node B, the node D, and the node F are increased while the node E is kept in an electrically floating state. Accordingly, the potential of the node E is increased by capacitive coupling while (Vsig+Vth−Vcat) is held as Vc, thereby becoming (Vsig+Vth−Vcat+Vel). That is, an increase in the potentials of the node B and the node D leads to an increase in the potential of the node E by bootstrap operation.

The circuit can operate even when the potentials of the node B and the node D are increased; therefore, adverse effects of, if any, deterioration in voltage-current characteristics of the load (e.g., a display element or a light-emitting element) can be reduced.

Figure 11D:
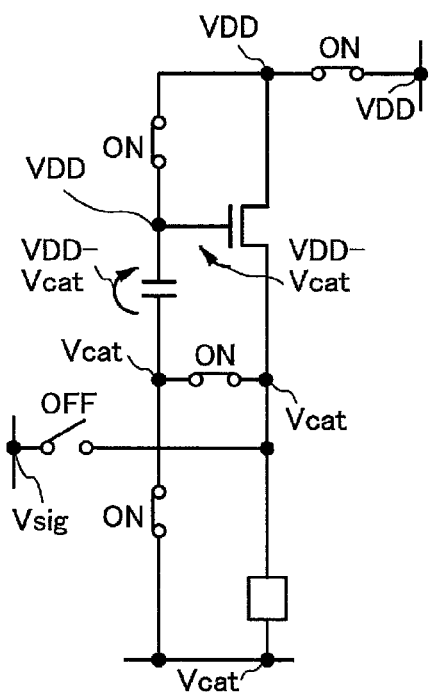

Note that precharge operation in which the load 17 or the capacitor 18 is charged or discharged can be performed before the first operation as in FIG. 3D. Operation in that case is illustrated in FIG. 11D.

Specifically, the node A is set at an arbitrary potential, the node C is set at Vcat, and the node G is set at VDD. Then, the switch 12 is turned off. The switch 14 and the switch 15 are turned on. As a result, the potential of the node B becomes Vcat; thus, the load 17 can be charged or discharged in advance. At this time, the switch 13 and the switch 16 may be in a non-conduction state. Note that, when the switch 13 and the switch 16 are in a conduction state, it is also possible to accumulate electric charge in the capacitor 18 or to discharge electric charge therein in advance.

Since the same level of voltage is applied to both the electrodes of the load 17 in the precharge operation, current can be prevented from flowing to the load 17.

Note that the precharge operation is not necessarily performed.

Note that FIG. 10A illustrates the circuit structure in this embodiment but one embodiment of the present invention is not limited thereto. A variety of circuits can be employed by changing the location or number of switches and/or by supplying appropriate voltage so that the circuit operates in a manner similar to the operation described with reference to FIGS. 11A to 11C, in which the threshold voltage of the transistor is corrected.

Figure 12A:
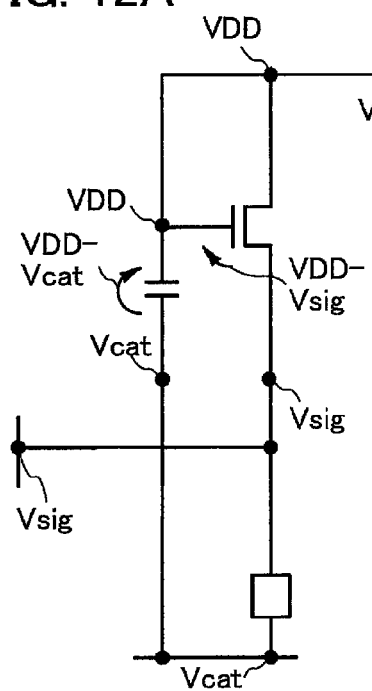
FIGS. 12A to 12D are circuit diagrams illustrating an example of a circuit according to one embodiment of the present invention.
Figure 12B:
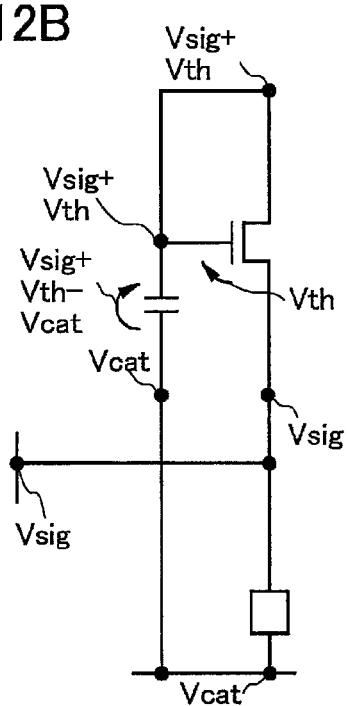
Figure 12C:
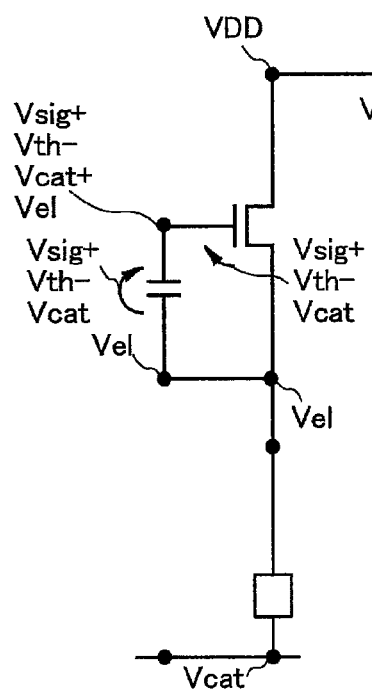
Figure 12D:
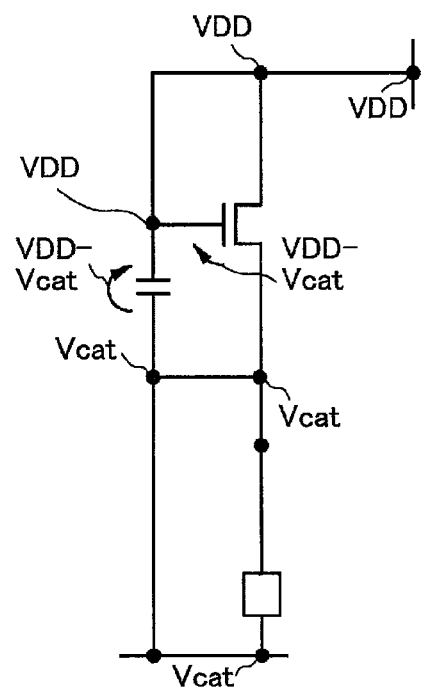

Specifically, for example, the switch 12, the switch 13, the switch 14, the switch 15, and the switch 16 can be provided anywhere and the number thereof is not limited as long as the switches can control a conduction state and a non-conduction state between nodes. In the case of the first operation described with reference to FIG. 11A, a connection relation illustrated in FIG. 12A may be employed. In the case of the second operation described with reference to FIG. 11B, a connection relation illustrated in FIG. 12B may be employed. In the case of the third operation described with reference to FIG. 11C, a connection relation illustrated in FIG. 12C may be employed. In the case of the operation described with reference to FIG. 11D, a connection relation illustrated in FIG. 12D may be employed. Each node can be set at any potential unless the node affects the operation.

As described above, with the circuit structure described in this embodiment, operation similar to that in Embodiment 1 can be performed even when the wiring 22 in the structure in Embodiment 1 is omitted. Accordingly, the number of wirings connected to the circuit can be reduced, leading to downsizing of the circuit.

Figure 5C:
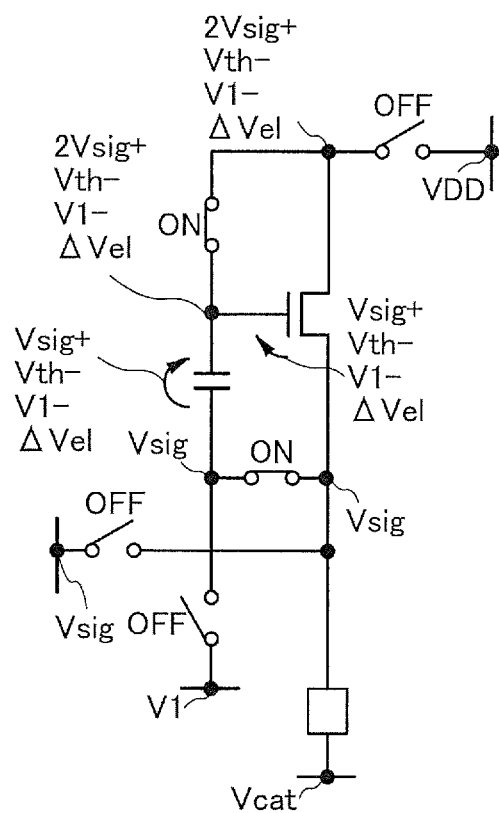
Figure 5D:
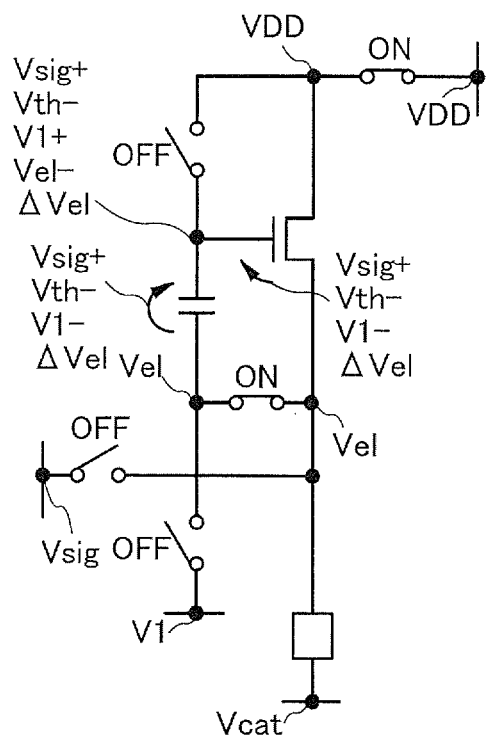
Figure 6A:
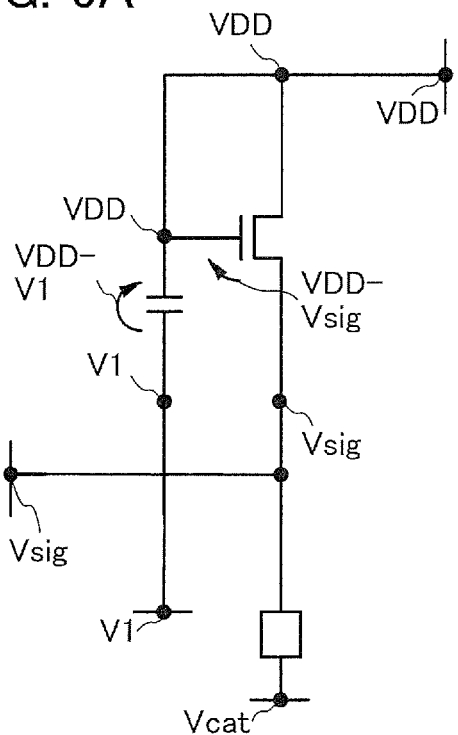
FIGS. 6A to 6D are circuit diagrams illustrating an example of a circuit according to one embodiment of the present invention.
Figure 6B:
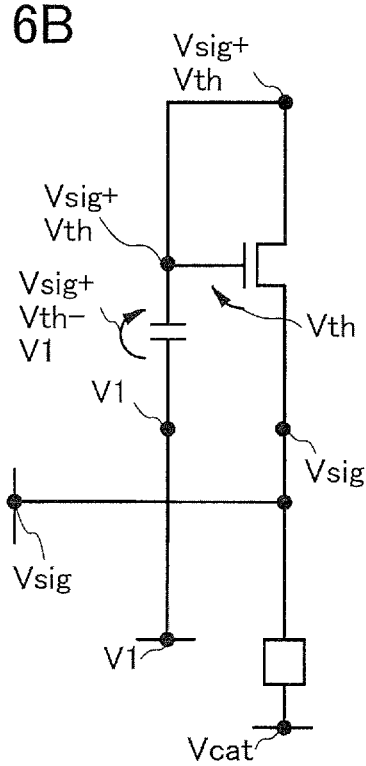
Figure 6C:
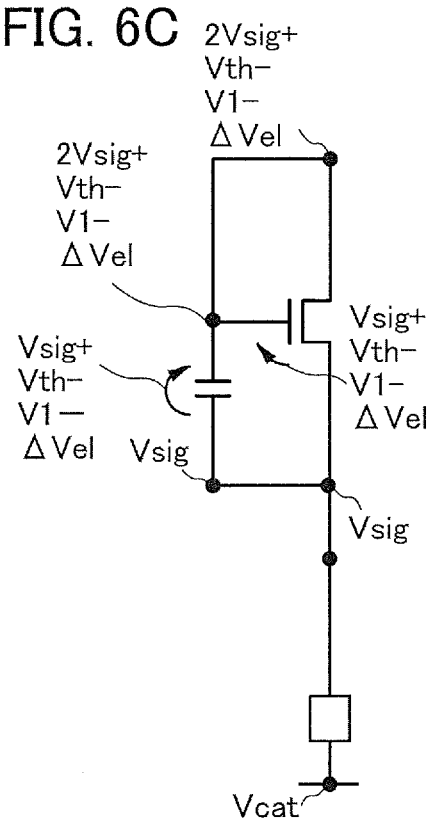
Figure 6D:
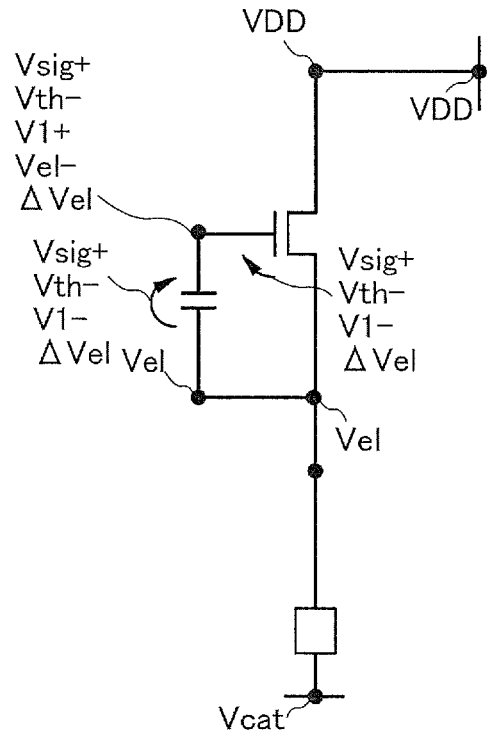

Note that it is possible to perform operation for correcting mobility with the use of the circuit in FIG. 10A in a manner similar to that in FIG. 5C or FIG. 6C in Embodiment 1.

Note that FIG. 10A and the like each illustrate an example of a circuit structure; therefore, a transistor can be provided additionally. On the other hand, for each node in FIG. 10A and the like, it is also possible not to provide an additional transistor, switch, passive element, or the like. For example, it is possible not to increase the number of transistors directly connected to the node A, the node B, the node C, the node D, the node E, the node F, and/or the node G.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 3)

In this embodiment, an example of a circuit structure which is partly different from the circuit structures described in Embodiments 1 and 2 is described. Accordingly, the description in Embodiments 1 and 2 can be applied to this embodiment.

Figure 13A:
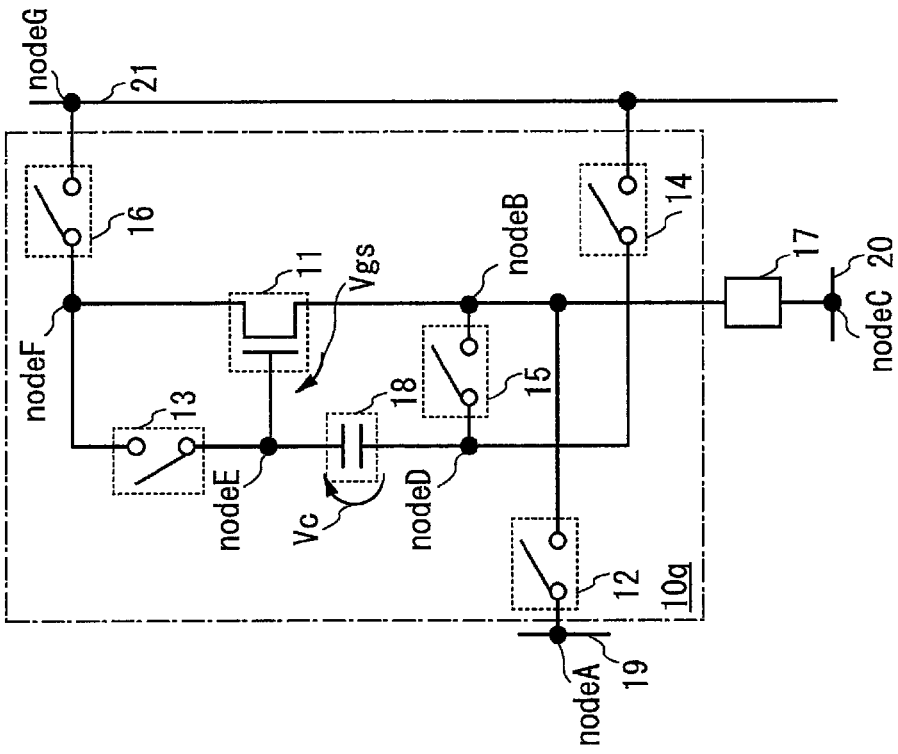
FIGS. 13A and 13B are circuit diagrams illustrating an example of a circuit according to one embodiment of the present invention.

FIG. 13A illustrates a circuit 10q which has a circuit structure similar to that of the circuit 10 in FIG. 1A. The circuit 10q illustrated in FIG. 13A is different from the circuit 10 illustrated in FIG. 1A in that the wiring 22 for supplying potential V1 is not included and the second terminal of the switch 14 is connected to the wiring 21. Note that components in common with those in FIG. 1A are denoted by common reference numerals, and description thereof is omitted.

Figure 31:
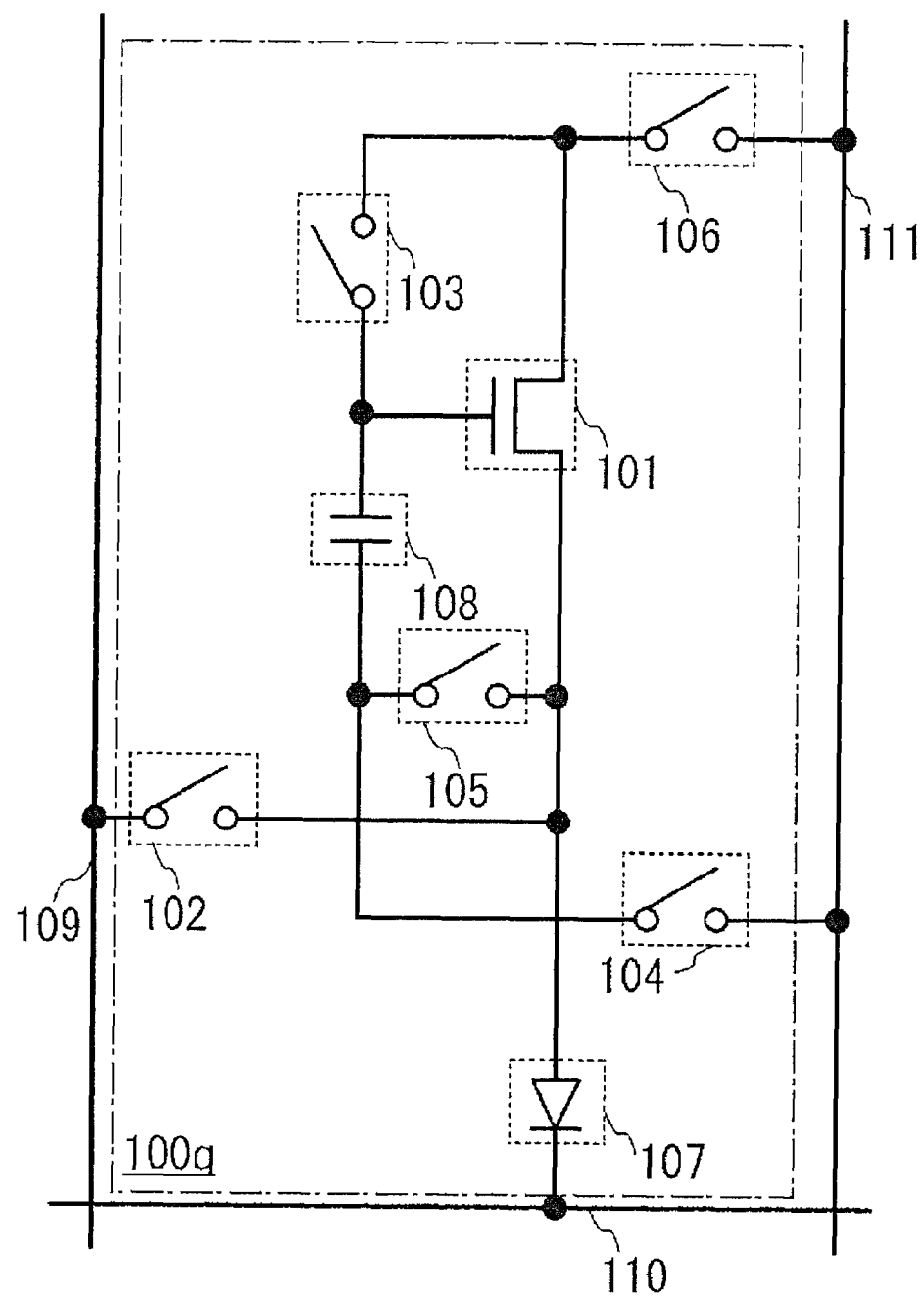
FIG. 31 is a circuit diagram illustrating an example of a pixel according to one embodiment of the present invention.

Note that, in FIG. 13A, the circuit 10q corresponds to a pixel in the case where the load 17 is a light-emitting element. FIG. 31 is a circuit diagram where the load 17 in FIG. 13A is a light-emitting element and the circuit 10q in FIG. 13A is a pixel. A pixel 100q in FIG. 31 includes the switch 102, the switch 103, the switch 104, the switch 105, the switch 106, the light-emitting element 107, the capacitor 108, and the transistor 101. The transistor 101 allows the circuit to function as a current source. The pixel 100q is connected to the wiring 109, the wiring 110, and the wiring 111.

Note that the switch 102, the switch 103, the switch 104, the switch 105, and the switch 106 illustrated in FIG. 31 correspond to the switch 12, the switch 13, the switch 14, the switch 15, and the switch 16 illustrated in FIG. 13A, respectively. In addition, the capacitor 108, the transistor 101, the wiring 109, the wiring 110, and the wiring 111 illustrated in FIG. 31 correspond to the capacitor 18, the transistor 11, the wiring 19, the wiring 20, and the wiring 21 illustrated in FIG. 13A, respectively.

Next, the operation of the circuit 10q illustrated in FIG. 13A is described. The operation of the circuit 10q illustrated in FIG. 13A can be mainly divided into first operation, second operation, and third operation.

Figure 13B:
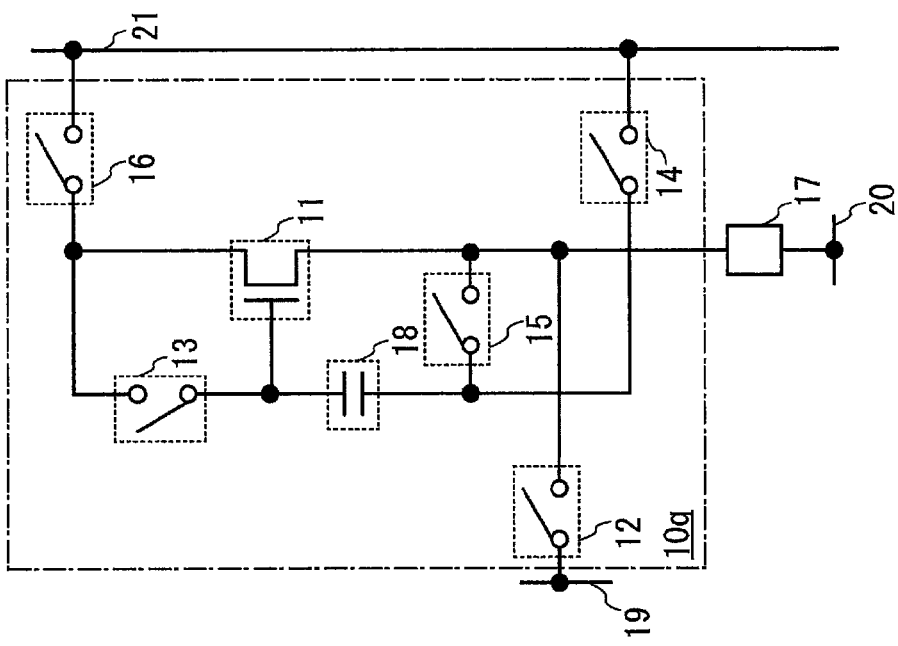

Note that, in order to explain the operation of the circuit with the structure illustrated in FIG. 13A, FIG. 13B shows symbols representing the potentials of nodes between elements and the potentials of wirings. In addition, in FIG. 13B, voltage between the one terminal (mainly serving as a source) and the gate of the transistor 11 is denoted by symbol Vgs, and voltage between the electrodes of the capacitor 18 is denoted by symbol Vc.

A node A, a node B, a node C, a node D, a node E, a node F, and a node G correspond to the nodes and wirings illustrated in FIG. 13B. The potential of the node A corresponds to the potential of the wiring 19. The potential of the node B corresponds to the potential of a wiring connecting the first terminal of the transistor 11, the first terminal of the switch 12, the first terminal of the switch 15, and the one electrode of the load 17. The potential of the node C corresponds to the potential of the wiring 20. The potential of the node D corresponds to the potential of a wiring connecting the first terminal of the switch 14, the second terminal of the switch 15, and the other electrode of the capacitor 18. The potential of the node E corresponds to the potential of a wiring connecting the gate of the transistor 11, the one electrode of the capacitor 18, and the first terminal of the switch 13. The potential of the node F corresponds to the potential of a wiring connecting the second terminal of the transistor 11, the second terminal of the switch 13, and the first terminal of the switch 16. The potential of the node G corresponds to the potential of the wiring 21.

First, the first operation is described with reference to FIG. 14A. Note that reference numerals of the elements in FIG. 13B are omitted, and a conduction state or a non-conduction state of each of the switches is denoted by ON or OFF. In addition, potentials applied as the voltage Vgs and the voltage Vc and potentials applied to the node A, the node B, the node C, the node D, the node E, the node F, and the node which are illustrated in FIG. 13B, are shown.

In the first operation, the potential of each node is initialized. Specifically, the node A is set at Vsig, the node C is set at Vcat, and the node G is set at VDD. Then, the switch 12, the switch 13, the switch 14, and the switch 16 are turned on, and the switch 15 is turned off. Thus, the potential of the node B becomes Vsig, the potential of the node D becomes VDD, the potential of the node E becomes VDD, and the potential of the node F becomes VDD. Further, Vgs becomes (VDD−Vsig), and the voltage between the electrodes of the capacitor 18 becomes 0.

Figure 14A:
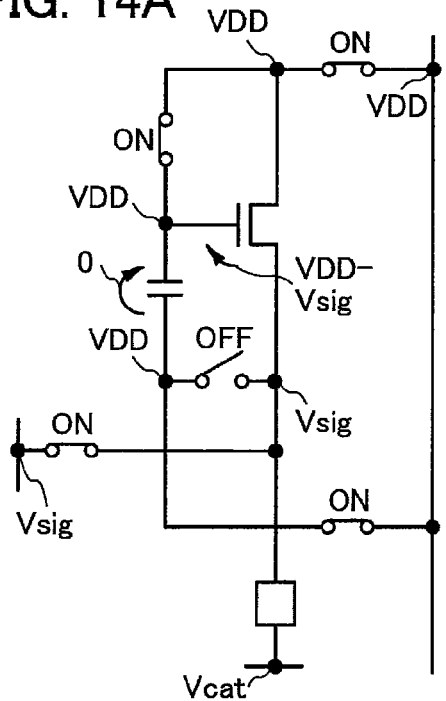
FIGS. 14A to 14C are circuit diagrams illustrating an example of a circuit according to one embodiment of the present invention.

The first operation illustrated in FIG. 14A is different from that illustrated in FIG. 3A in Embodiment 1 in that the potential V1 supplied to the node D is replaced with the potential VDD. The potential held at the node D in the first operation is higher than Vsig; therefore, VDD, which is higher than Vsig, can be held at the node D in the first operation. With this structure, when current flows to the load 17 in the third operation, the transistor 11 can operate in a saturation region without an increase in the number of wirings.

Next, the second operation is described with reference to FIG. 14B, as in the case of FIG. 14A.

The second operation is operation for obtaining the threshold voltage of the transistor 11 as Vgs by discharging the potential of the gate of the transistor 11 (or the electric charge accumulated in the capacitor 18). Specifically, the node A is set at Vsig, the node C is set at Vcat, and the node G is set at VDD. Then, the switch 12, the switch 13, and the switch 14 are turned on, and the switch 15 and the switch 16 are turned off. Thus, the potential of the node B becomes Vsig, the potential of the node D becomes VDD, the potential of the node E becomes (Vsig+Vth), and the potential of the node F becomes (Vsig+Vth). Further, Vgs becomes Vth, and Vc becomes (Vsig+Vth−VDD).

Figure 14B:
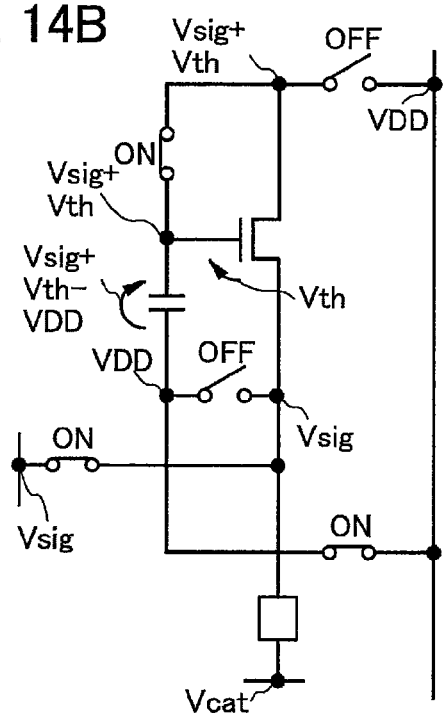

In the second operation illustrated in FIG. 14B, in a manner similar to that illustrated in FIG. 3B in Embodiment 1, the potential of the node E corresponding to the potential of the gate of the transistor 11 can be (Vsig+Vth), which includes the threshold voltage of the transistor 11. By the second operation, Vgs is lowered to the threshold voltage Vth of the transistor 11 and is set in a steady state. Therefore, the discharge sets the node E and the node F in a steady state at (Vsig+Vth). In addition, at the termination of the second operation, (Vsig+Vth−VDD) is held as Vc.

Next, the third operation is described with reference to FIG. 14C, as in the case of FIGS. 14A and 14B.

The third operation is operation for outputting current to the load 17 with the use of the transistor 11 as part of a current source. Specifically, the node A is set at an arbitrary potential, for example, Vsig, the node C is set at Vcat, and the node G is set at VDD. Then, the switch 15 and the switch 16 are turned on, and the switch 12, the switch 13, and the switch 14 are turned off. Thus, the potentials of the node B and the node D become Vel, the potential of the node E becomes (Vsig+Vth−VDD+Vel), and the potential of the node F becomes VDD. Further, Vgs becomes (Vsig+Vth−VDD), and Vc becomes (Vsig+Vth−VDD).

Figure 14C:
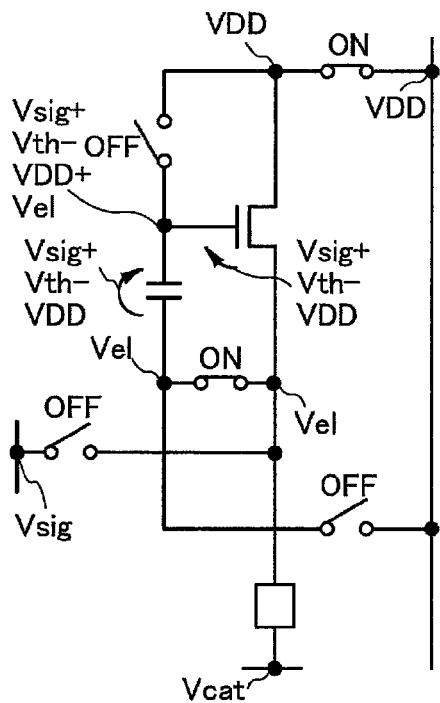

In the third operation illustrated in FIG. 14C, in a manner similar to that illustrated in FIG. 3C in Embodiment 1, the potentials of the node B, the node D, and the node F are increased while the node E is kept in an electrically floating state. Accordingly, the potential of the node E is increased by capacitive coupling while (Vsig+Vth−VDD) is held as Vc, thereby becoming (Vsig+Vth−VDD+Vel). That is, an increase in the potentials of the node B and the node D leads to an increase in the potential of the node E by bootstrap operation.

The circuit can operate even when the potentials of the node B and the node D are increased; therefore, adverse effects of, if any, deterioration in voltage-current characteristics of the load (e.g., a display element or a light-emitting element) can be reduced.

Note that FIG. 13A illustrates the circuit structure in this embodiment but one embodiment of the present invention is not limited thereto. A variety of circuits can be employed by changing the location or number of switches and/or by supplying appropriate voltage so that the circuit operates in a manner similar to the operation described with reference to FIGS. 14A to 14C, in which the threshold voltage of the transistor is corrected.

Figure 15A:
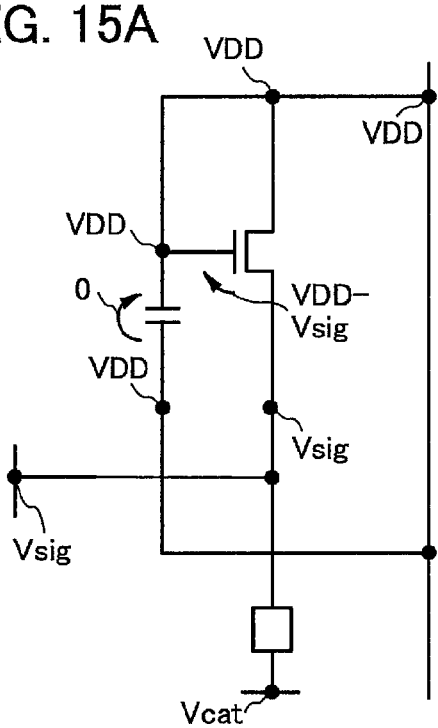
FIGS. 15A to 15C are circuit diagrams illustrating an example of a circuit according to one embodiment of the present invention.
Figure 15B:
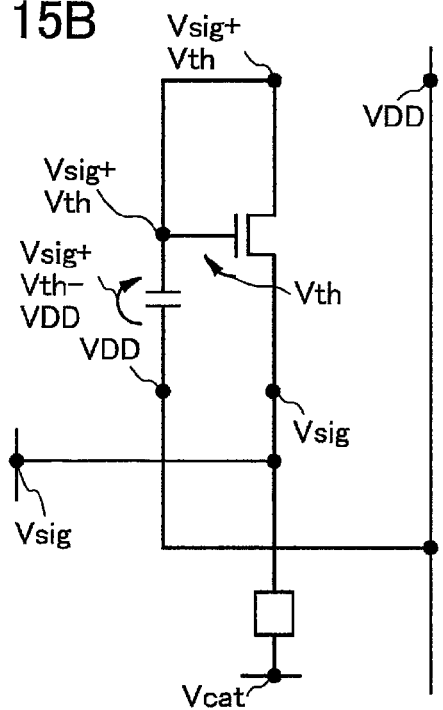
Figure 15C:
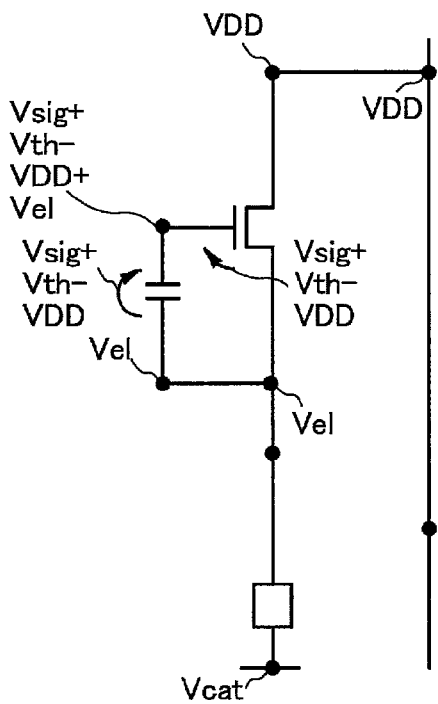

Specifically, for example, the switch 12, the switch 13, the switch 14, the switch 15, and the switch 16 can be provided anywhere and the number thereof is not limited as long as the switches can control a conduction state and a non-conduction state between nodes. In the case of the first operation described with reference to FIG. 14A, a connection relation illustrated in FIG. 15A may be employed. In the case of the second operation described with reference to FIG. 14B, a connection relation illustrated in FIG. 15B may be employed. In the case of the third operation described with reference to FIG. 14C, a connection relation illustrated in FIG. 15C may be employed. Each node can be set at any potential unless the node affects the operation.

As described above, with the circuit structure described in this embodiment, operation similar to that in Embodiment 1 can be performed even when the wiring 22 in the structure in Embodiment 1 is omitted. Accordingly, the number of wirings connected to the circuit can be reduced, leading to downsizing of the circuit.

Note that it is possible to perform operation for correcting mobility with the use of the circuit in FIG. 13A in a manner similar to that in FIG. 5C or FIG. 6C in Embodiment 1.

Note that FIG. 13A and the like each illustrate an example of a circuit structure; therefore, a transistor can be provided additionally. On the other hand, for each node in FIG. 13A and the like, it is also possible not to provide an additional transistor, switch, passive element, or the like. For example, it is possible not to increase the number of transistors directly connected to the node A, the node B, the node C, the node D, the node E, the node F, and/or the node G.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.
(Embodiment 4)

In this embodiment, an example of a circuit structure which is partly different from the circuit structures described in Embodiments 1 to 3 is described. Accordingly, the description in Embodiments 1 to 3 can be applied to this embodiment.

Figure 16:
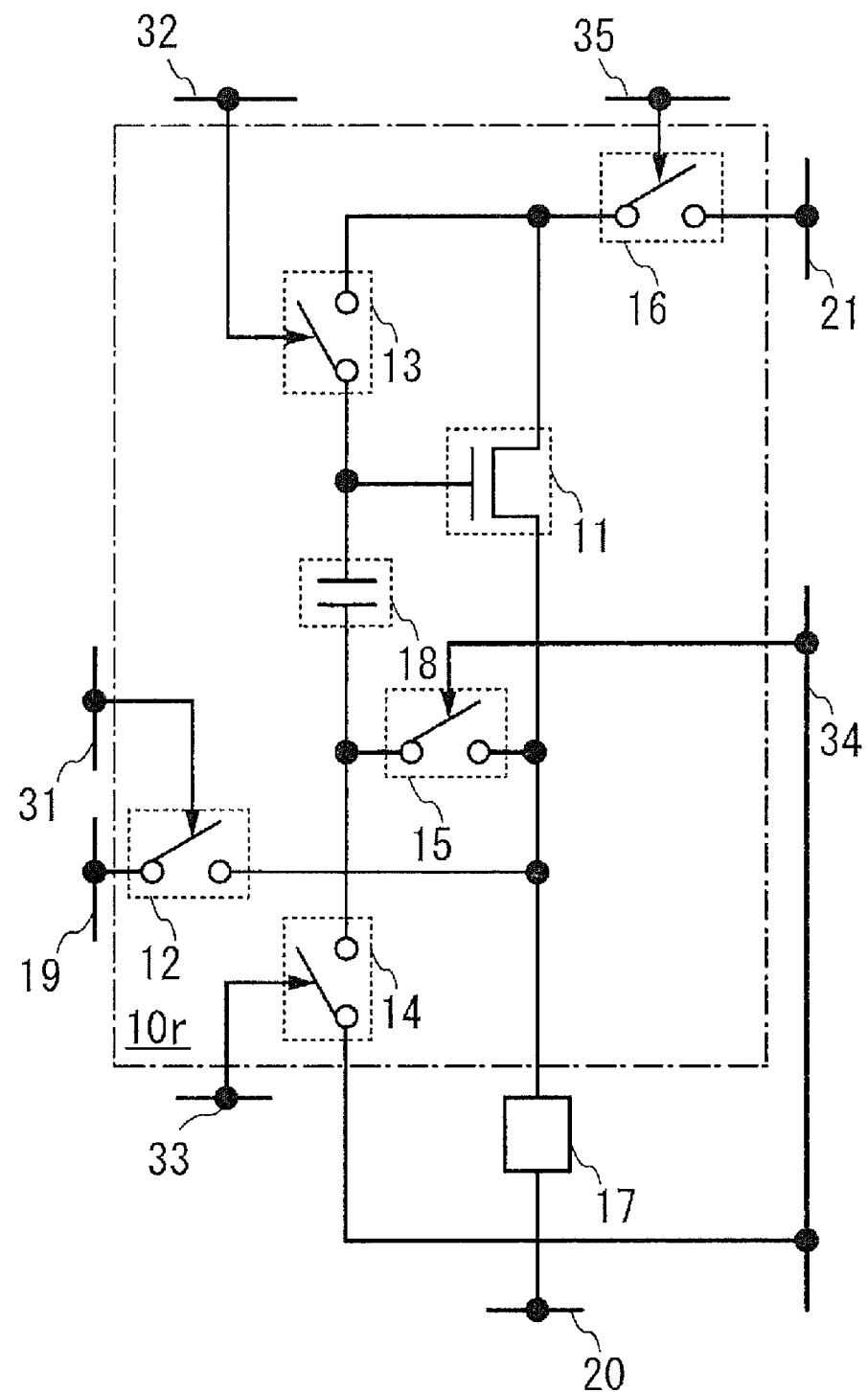
FIG. 16 is a circuit diagram illustrating an example of a circuit according to one embodiment of the present invention.

FIG. 16 illustrates a circuit 10r which has a circuit structure similar to that of the circuit 10 in FIG. 2A. The circuit 10r illustrated in FIG. 16 is different from the circuit 10 illustrated in FIG. 2A in that the wiring 22 for supplying the potential V1 is not included and the second terminal of the switch 14 is connected to the wiring 34, and that the switches 12 to 16 are provided instead of the transistors 12T to 16T. Note that components in common with those in FIG. 2A are denoted by common reference numerals, and description thereof is omitted.

Figure 32:
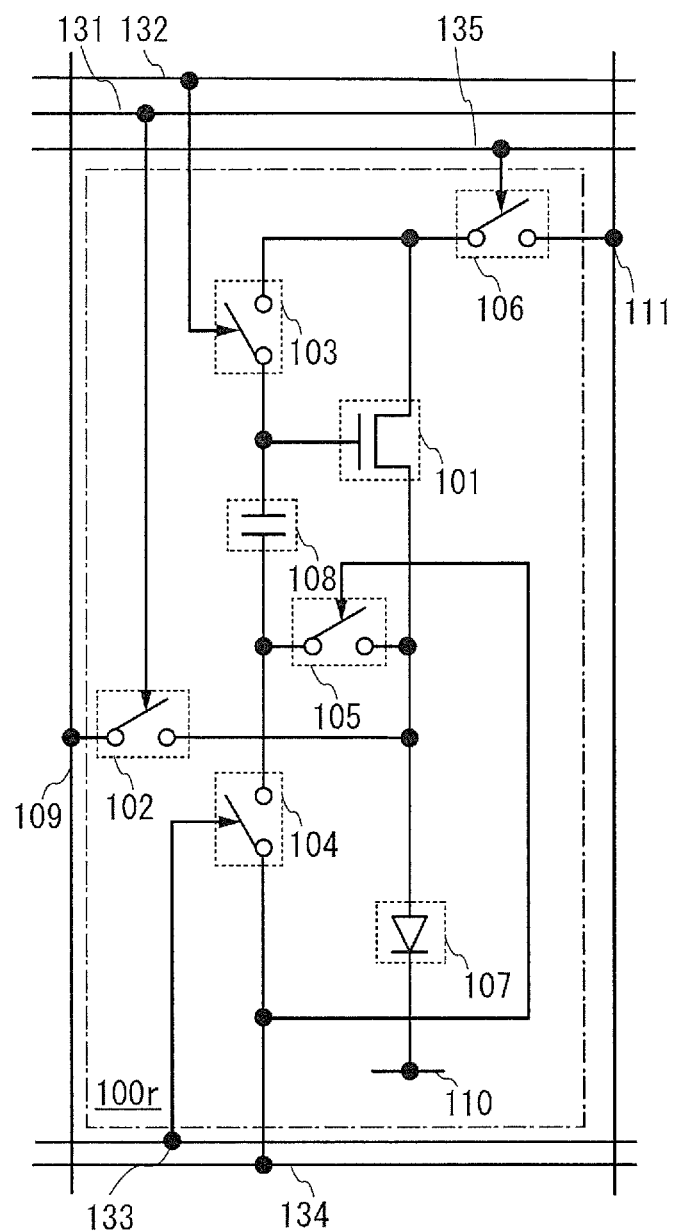
FIG. 32 is a circuit diagram illustrating an example of a pixel according to one embodiment of the present invention.

Note that, in FIG. 16, the circuit 10r corresponds to a pixel in the case where the load 17 is a light-emitting element. FIG. 32 is a circuit diagram where the load 17 in FIG. 16 is a light-emitting element and the circuit 10r in FIG. 16 is a pixel. A pixel 100r in FIG. 32 includes the switch 102, the switch 103, the switch 104, the switch 105, the switch 106, the light-emitting element 107, the capacitor 108, and the transistor 101. The transistor 101 allows the circuit to function as a current source. The pixel 100r is connected to the wiring 109, the wiring 110, and the wiring 111. Further, the switches 102 to 106 are connected to the wirings 131 to 135, respectively, and the conduction state or non-conduction state of each of the switches 102 to 106 is controlled by an H-level potential or an L-level potential supplied through the corresponding wiring.

Note that the switch 102, the switch 103, the switch 104, the switch 105, and the switch 106 illustrated in FIG. 32 correspond to the switch 12, the switch 13, the switch 14, the switch 15, and the switch 16 illustrated in FIG. 16, respectively. In addition, the capacitor 108, the transistor 101, the wiring 109, the wiring 110, and the wiring 111 illustrated in FIG. 32 correspond to the capacitor 18, the transistor 11, the wiring 19, the wiring 20, and the wiring 21 illustrated in FIG. 16, respectively. The wirings 131 to 135 illustrated in FIG. 32 correspond to the wirings 31 to 35, respectively.

As in the case of the operations described in Embodiments 1 to 3, the operation of the circuit 10r illustrated in FIG. 16 can be mainly divided into first operation, second operation, and third operation.

Note that the operation of the circuit 10r illustrated in FIG. 16 is different from that illustrated in FIGS. 3A to 3D in Embodiment 1 in that the potential V1 supplied to the node D is replaced with an L-level potential of a wiring for controlling the conduction state or non-conduction state of the switch 15. In this case, in the first operation of the circuit 10r illustrated in FIG. 16, the potential held at the node D is higher than Vsig; therefore, the L-level potential of the wiring for controlling the conduction state or non-conduction state of the switch 15 is set higher than Vsig. With this structure, when current flows to the load 17 in the third operation, the transistor 11 can operate in a saturation region without an increase in the number of wirings.

As described above, with the circuit structure described in this embodiment, operation similar to that in Embodiment 1 can be performed even when the wiring 22 in the structure in Embodiment 1 is omitted. Accordingly, the number of wirings connected to the circuit can be reduced, leading to downsizing of the circuit.

Note that it is possible to perform operation for correcting mobility with the use of the circuit in FIG. 16 in a manner similar to that in FIG. 5C or FIG. 6C in Embodiment 1.

Note that it is possible to perform precharge operation with the use of the circuit in FIG. 16 in a manner similar to that in FIG. 3D or FIG. 4D in Embodiment 1.

Note that FIG. 16 and the like each illustrate an example of a circuit structure; therefore, a transistor can be provided additionally. On the other hand, for each node in FIG. 16 and the like, it is also possible not to provide an additional transistor, switch, passive element, or the like. For example, it is possible not to increase the number of transistors directly connected to the node A, the node B, the node C, the node D, the node E, the node F, and/or the node G.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.
(Embodiment 5)

In this embodiment, examples of a circuit structure which is obtained by adding a component to the circuit structure described in any of Embodiments 1 to 4 are described. Accordingly, the description in Embodiments 1 to 4 can be applied to this embodiment.

Figure 17B:
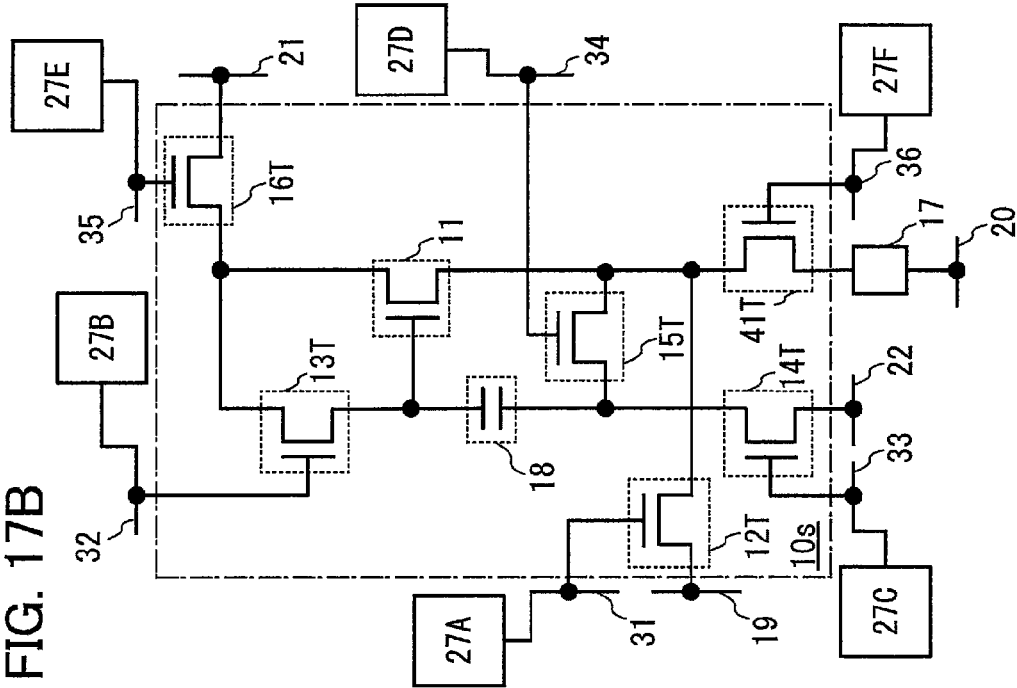
FIGS. 17A and 17B are each a circuit diagram illustrating an example of a circuit according to one embodiment of the present invention.
Figure 17A:
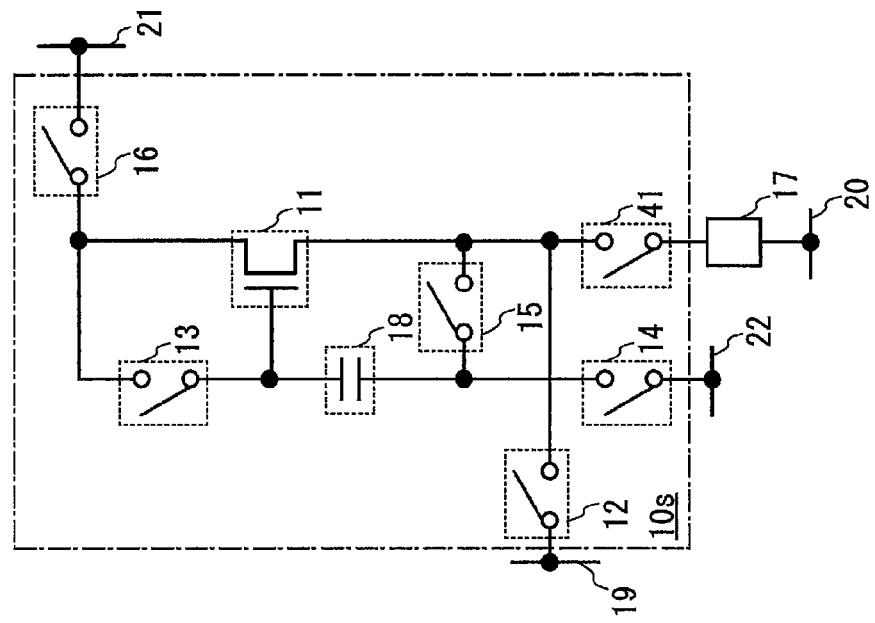

FIG. 17A illustrates a circuit 10s which has a circuit structure obtained by adding a switch to the circuit 10 in FIG. 1A. The circuit 10s illustrated in FIG. 17A is different from the circuit 10 illustrated in FIG. 1A in that a switch 41 is additionally provided between the one electrode of the load 17 and the first terminal of the transistor 11, the first terminal of the switch 12, and the first terminal of the switch 15. Note that components in common with those in FIG. 1A are denoted by common reference numerals, and description thereof is omitted.

Figure 33:
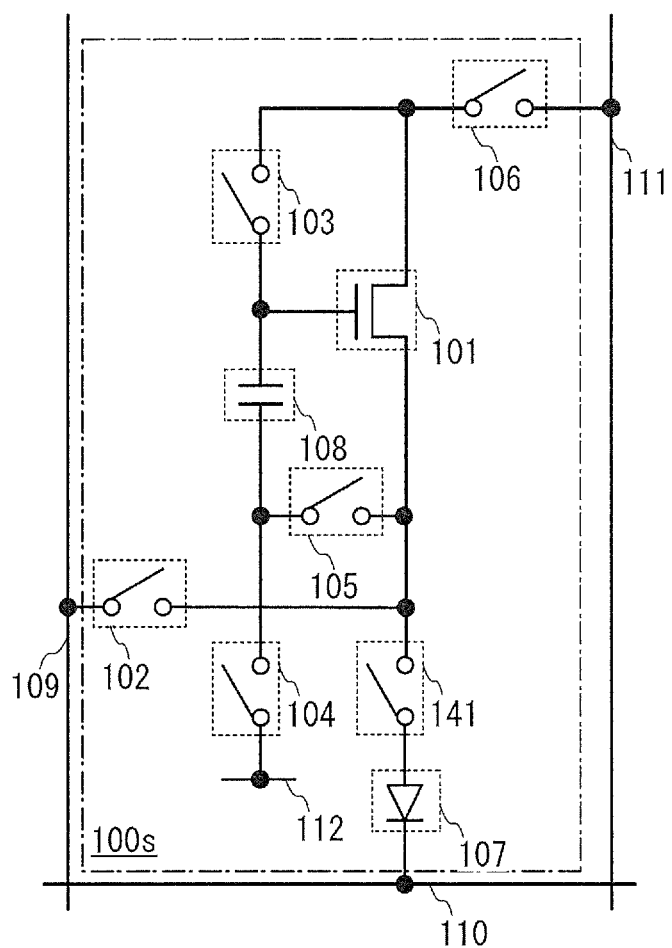
FIG. 33 is a circuit diagram illustrating an example of a pixel according to one embodiment of the present invention.

Note that, in FIG. 17A, the circuit 10s corresponds to a pixel in the case where the load 17 is a light-emitting element. FIG. 33 is a circuit diagram where the load 17 in FIG. 17A is a light-emitting element and the circuit 10s in FIG. 17A is a pixel. A pixel 100s in FIG. 33 includes the switch 102, the switch 103, the switch 104, the switch 105, the switch 106, a switch 141, the light-emitting element 107, the capacitor 108, and the transistor 101. The transistor 101 allows the circuit to function as a current source. The pixel 100s is connected to the wiring 109, the wiring 110, the wiring 111, and the wiring 112.

Note that the switch 102, the switch 103, the switch 104, the switch 105, the switch 106, and the switch 141 illustrated in FIG. 33 correspond to the switch 12, the switch 13, the switch 14, the switch 15, the switch 16, and the switch 41 illustrated in FIG. 17A, respectively. In addition, the capacitor 108, the transistor 101, the wiring 109, the wiring 110, the wiring 111, and the wiring 112 illustrated in FIG. 33 correspond to the capacitor 18, the transistor 11, the wiring 19, the wiring 20, the wiring 21, and the wiring 22 illustrated in FIG. 17A, respectively.

Note that FIG. 17B illustrates an example in which, as in FIG. 2A, a transistor 41T is used as the switch 41 in FIG. 17A and a circuit 27F is connected to a gate of the transistor 41T through a wiring 36.

Figure 71:
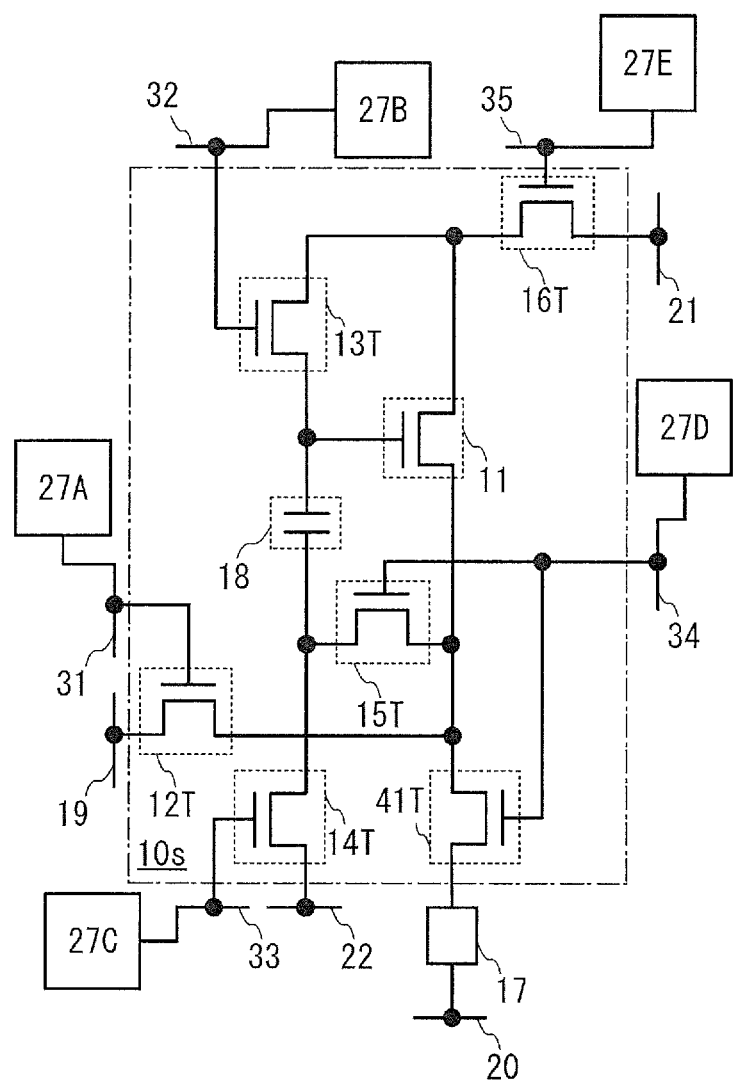
FIG. 71 is a circuit diagram illustrating an example of a circuit according to one embodiment of the present invention.

Note that the wiring 36 and the wiring 34 can be combined into one wiring. At this time, the transistor 41T and the transistor 15T preferably have the same polarity. FIG. 71 is a circuit diagram in that case.

Figure 72:
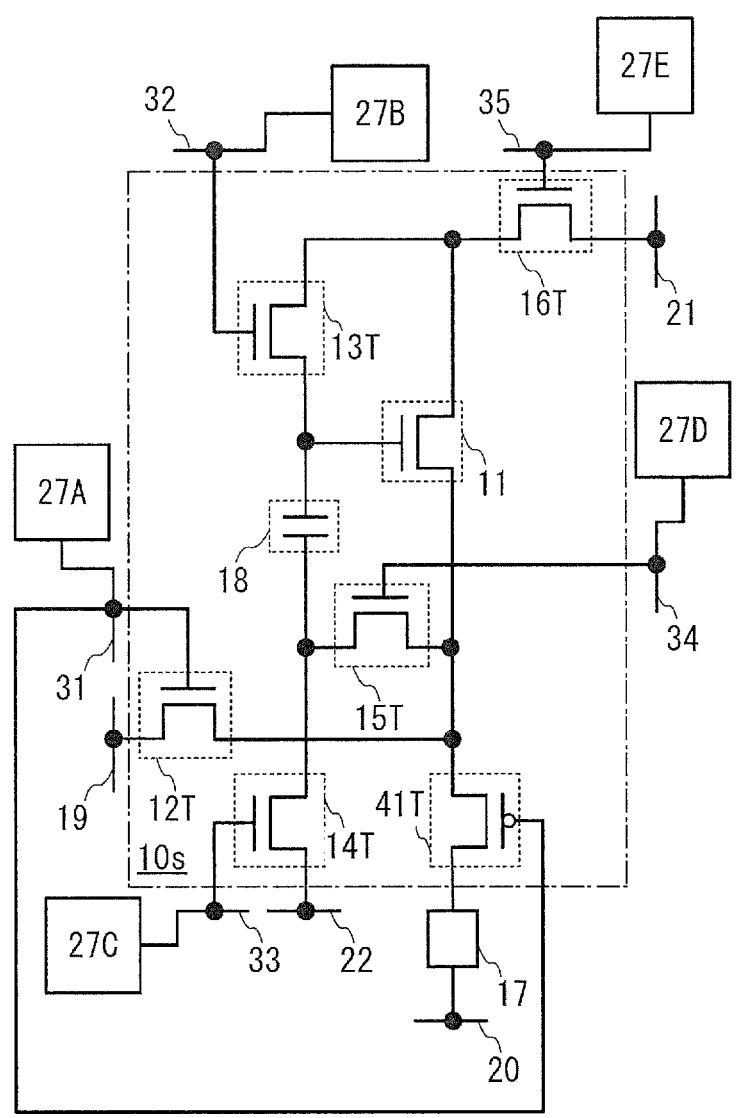
FIG. 72 is a circuit diagram illustrating an example of a circuit according to one embodiment of the present invention.

Note that the wiring 36 and the wiring 31 can be combined into one wiring. At this time, the polarity of the transistor 41T is preferably opposite to that of the transistor 12T. FIG. 72 is a circuit diagram in that case.

Figure 73:
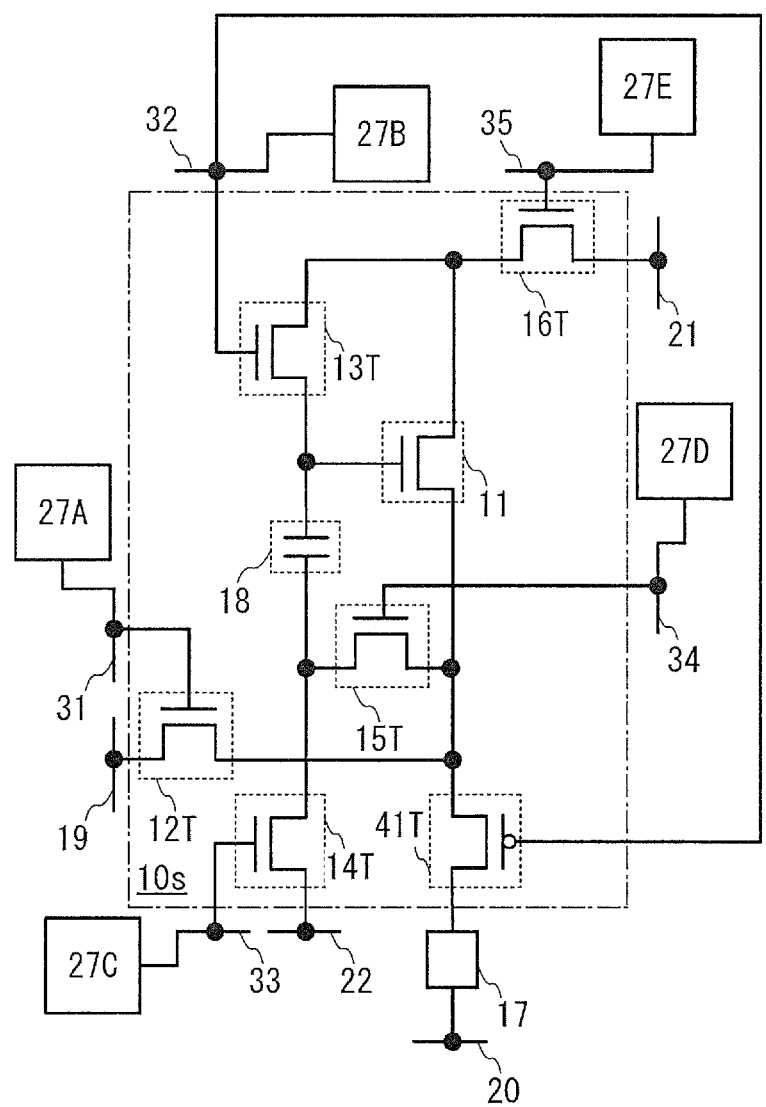
FIG. 73 is a circuit diagram illustrating an example of a circuit according to one embodiment of the present invention.

Note that the wiring 36 and the wiring 32 can be combined into one wiring. At this time, the polarity of the transistor 41T is preferably opposite to that of the transistor 13T. FIG. 73 is a circuit diagram in that case.

Figure 74:
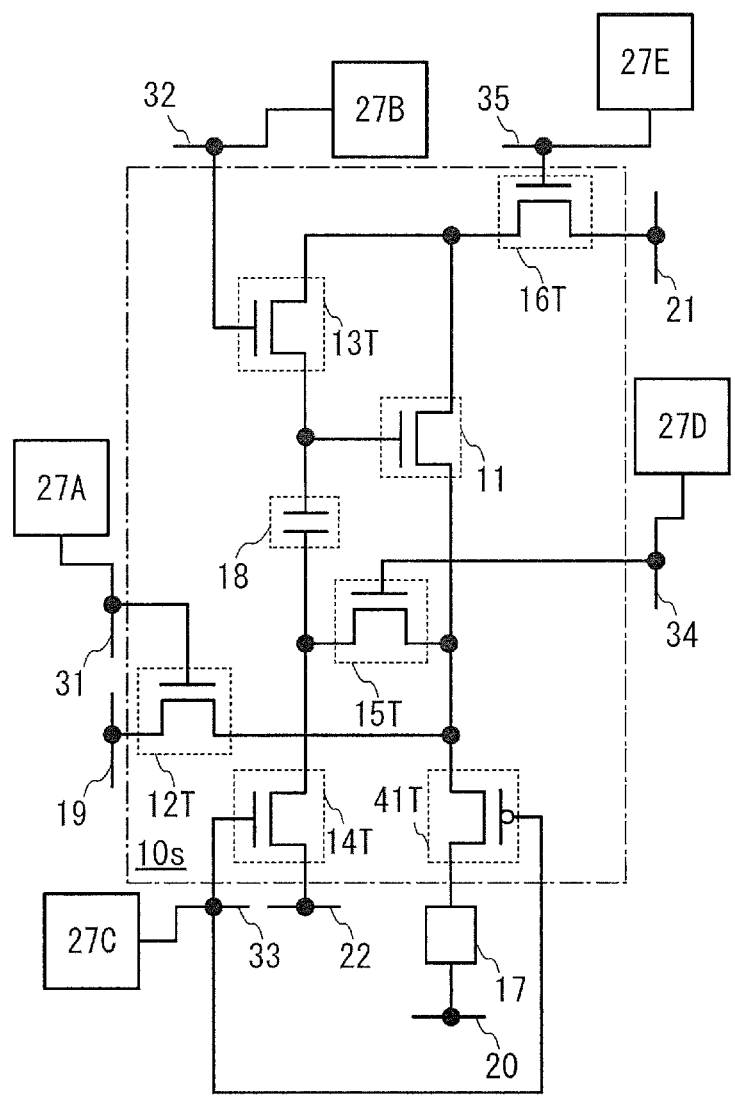
FIG. 74 is a circuit diagram illustrating an example of a circuit according to one embodiment of the present invention.

Note that the wiring 36 and the wiring 33 can be combined into one wiring. At this time, the polarity of the transistor 41T is preferably opposite to that of the transistor 14T. FIG. 74 is a circuit diagram in that case.

Figure 75:
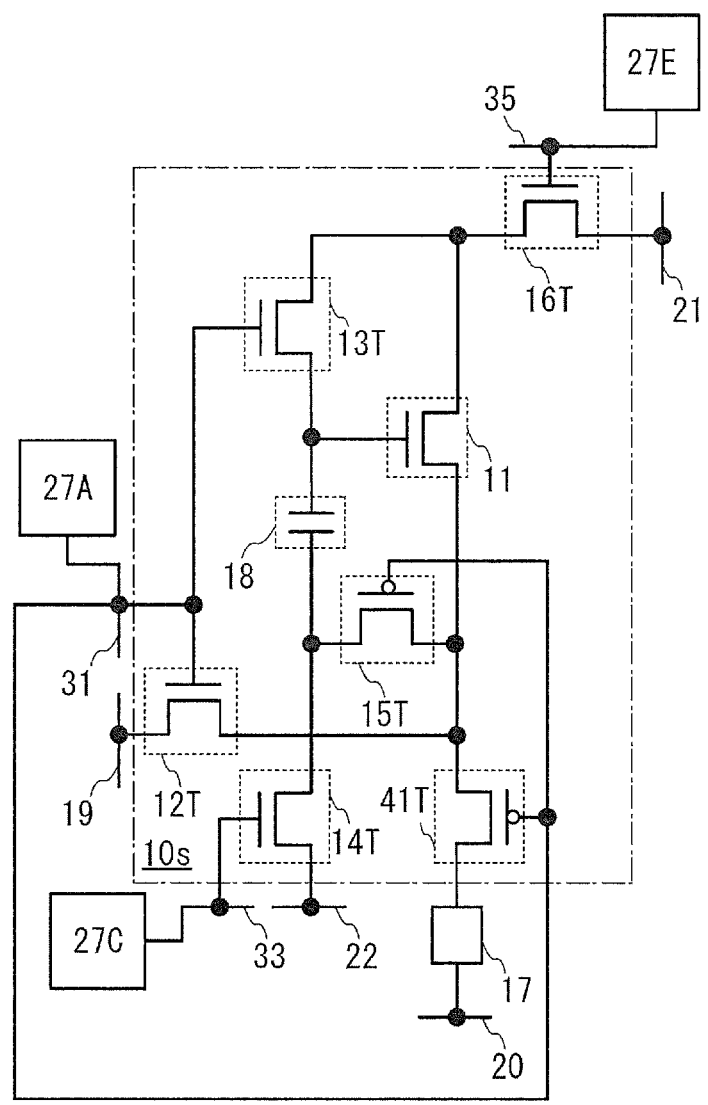
FIG. 75 is a circuit diagram illustrating an example of a circuit according to one embodiment of the present invention.

Note that the wiring 36 and the wiring 34 can be combined with the wiring 31 and the wiring 32 to farm one wiring. At this time, the polarity of the transistor 41T and the transistor 15T is preferably opposite to that of the transistor 12T and the transistor 13T. FIG. 75 is a circuit diagram where the wiring 36 and the wiring 34 are combined with the wiring 31 and the wiring 32 to form one wiring.

Figure 76:
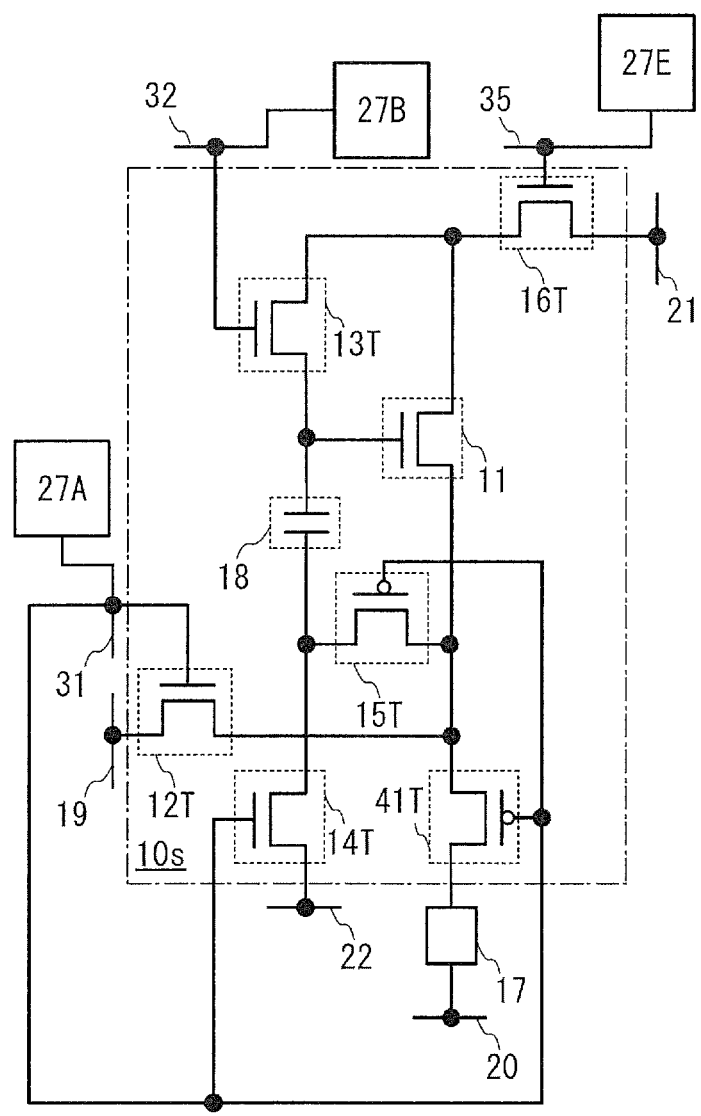
FIG. 76 is a circuit diagram illustrating an example of a circuit according to one embodiment of the present invention.

Note that the wiring 36 and the wiring 34 can be combined with the wiring 31 and the wiring 33 to form one wiring. At this time, the polarity of the transistor 41T and the transistor 15T is preferably opposite to that of the transistor 12T and the transistor 14T. FIG. 76 is a circuit diagram where the wiring 36 and the wiring 34 are combined with the wiring 31 and the wiring 33 to form one wiring.

Figure 77:
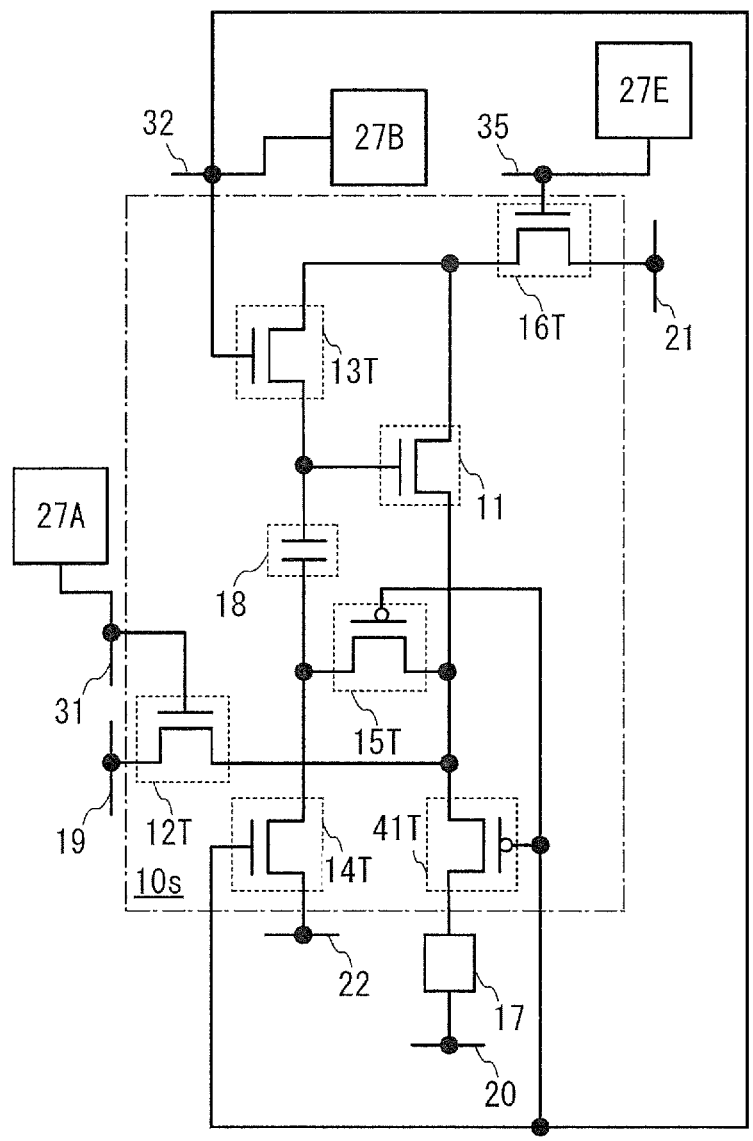
FIG. 77 is a circuit diagram illustrating an example of a circuit according to one embodiment of the present invention.

Note that the wiring 36 and the wiring 34 can be combined with the wiring 32 and the wiring 33 to form one wiring. At this time, the polarity of the transistor 41T and the transistor 15T is preferably opposite to that of the transistor 13T and the transistor 14T. FIG. 77 is a circuit diagram where the wiring 36 and the wiring 34 are combined with the wiring 32 and the wiring 33 to form one wiring.

Figure 78:
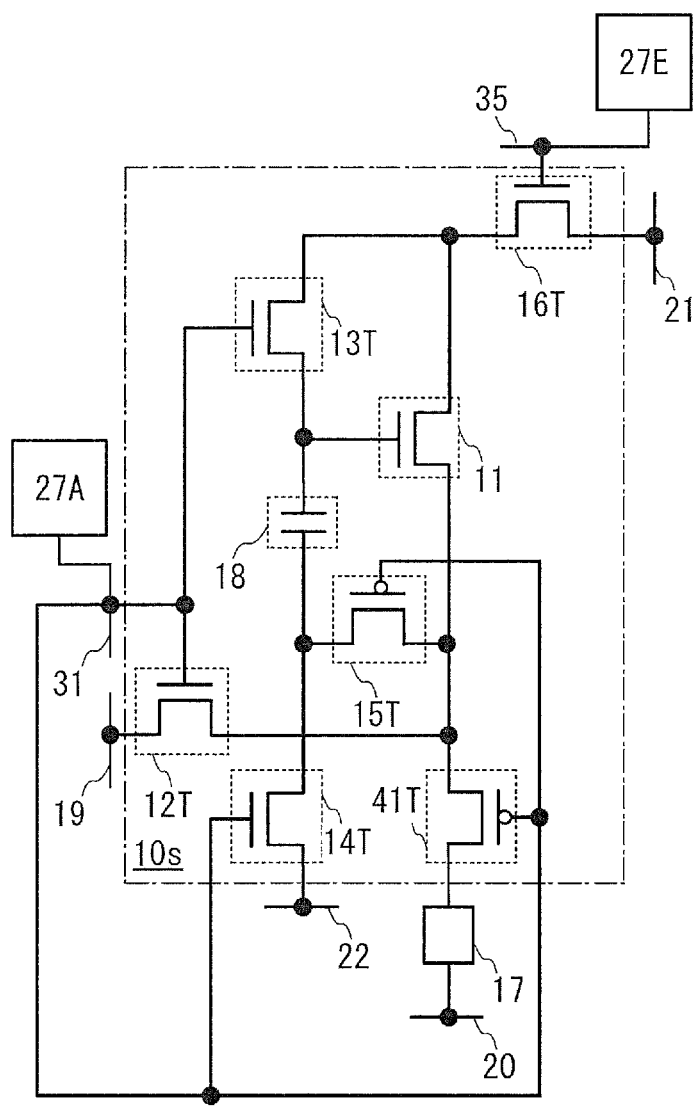
FIG. 78 is a circuit diagram illustrating an example of a circuit according to one embodiment of the present invention.

Note that the wiring 36 and the wiring 34 can be combined with one, two, or all of the wiring 31, the wiring 32, and the wiring 33 to form one wiring. At this time, the polarity of the transistor 41T and the transistor 15T is preferably opposite to that of the transistor 12T, the transistor 13T, and the transistor 14T. FIG. 78 is a circuit diagram where the wiring 36 and the wiring 34 are combined with the wiring 31, the wiring 32, and the wiring 33 to form one wiring.

Figure 79:
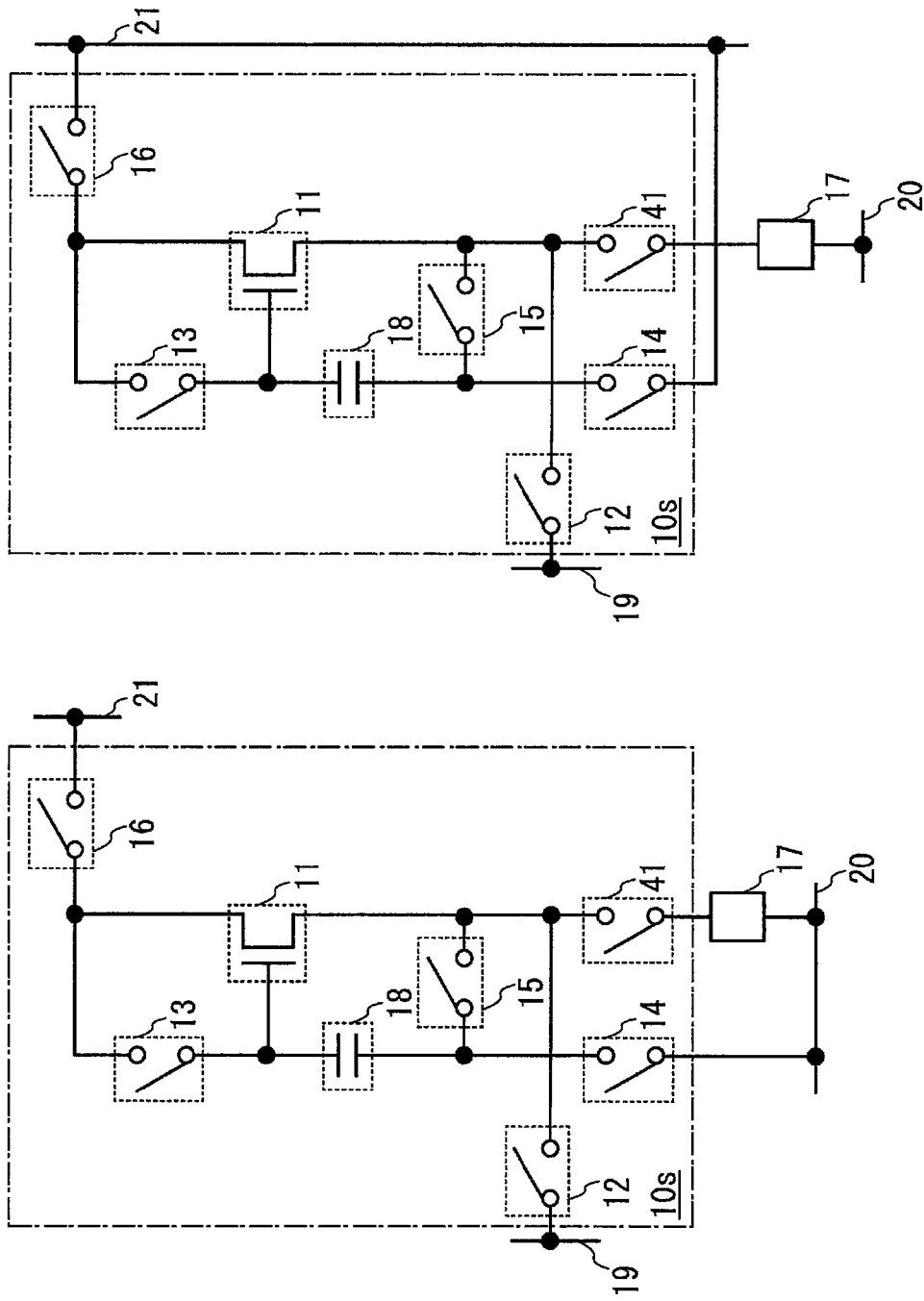
FIGS. 79A and 79B are each a circuit diagram illustrating an example of a circuit according to one embodiment of the present invention.

Note that FIG. 79A illustrates an example in which the wiring 22 in FIG. 17A is combined with the wiring 20 as in FIG. 10A. FIG. 79B illustrates an example in which the wiring 22 in FIG. 17A is combined with the wiring 21 as in FIG. 13A.

Although the wirings are combined in the pixel in FIG. 71, FIG. 72, FIG. 73, FIG. 74, FIG. 75, FIG. 76, FIG. 77, and FIG. 78, the wirings can be connected outside the pixel region and provided as separate wirings in the pixel region as illustrated in FIG. 63B.

As in the case of the operations described in Embodiments 1 to 4, the operation of the circuit 10s illustrated in FIG. 17A can be mainly divided into first operation, second operation, and third operation.

Note that the operation of the circuit 10s illustrated in FIG. 17A is different from that illustrated in FIGS. 3A to 3D in Embodiment 1 in that the switch 41 is turned off in the first operation and the second operation and is turned on in the third operation. In this case, current flowing to the load 17 can be reduced more surely in the first operation and the second operation, and current can flow to the load 17 in the third operation. With this structure, operation can be performed so that current is more surely prevented from flowing to the load 17. Accordingly, current can be prevented from flowing to the load 17 without setting Vsig lower than Vcat. Further, since the electrical connection between the load 17 and the transistor 11 can be cut by the switch 41, the load 17 does not need to be charged or discharged in the first operation or the second operation. Consequently, a steady state can be obtained in a short time and signal input can be completed rapidly.

Note that the switch 41 is preferably in a non-conduction state in precharge operation like the precharge operations in FIG. 3D and FIG. 4D because the load 17 does not need to be charged or discharged. In the case where the load 17 needs to be charged or discharged, the switch 41 is preferably in a conduction state.

Note that it is possible to perform operation for correcting mobility with the use of the circuit in FIG. 17A in a manner similar to that in FIG. 5C or FIG. 6C in Embodiment 1. In that case, the switch 41 may be in either a conduction state or a non-conduction state.

Figure 18B:
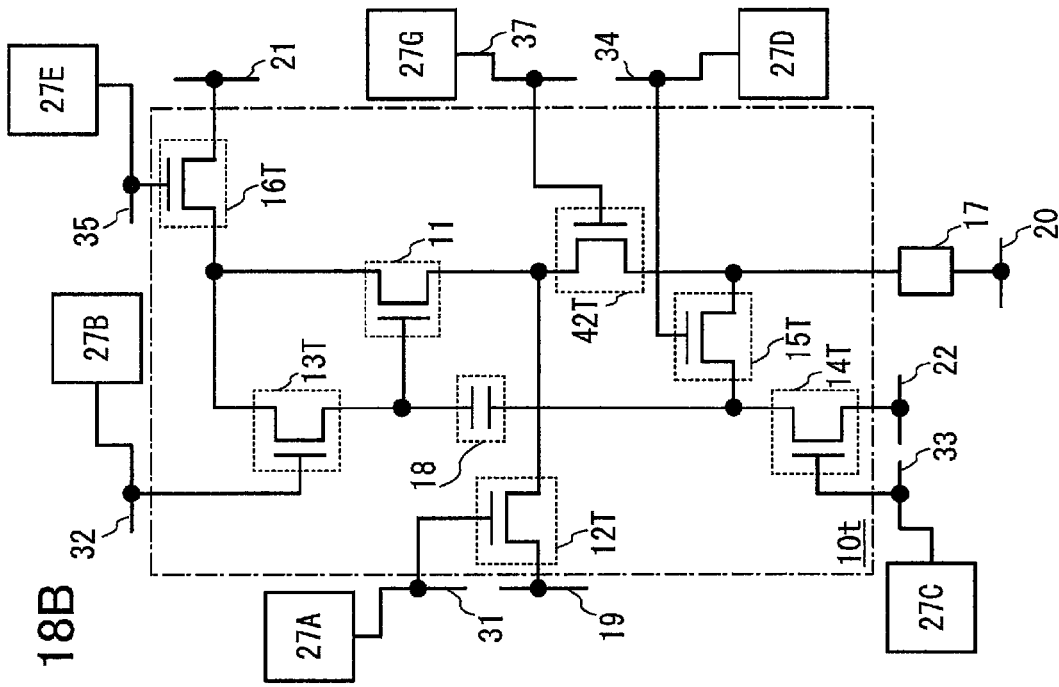
FIGS. 18A and 18B are each a circuit diagram illustrating an example of a circuit according to one embodiment of the present invention.
Figure 18A:
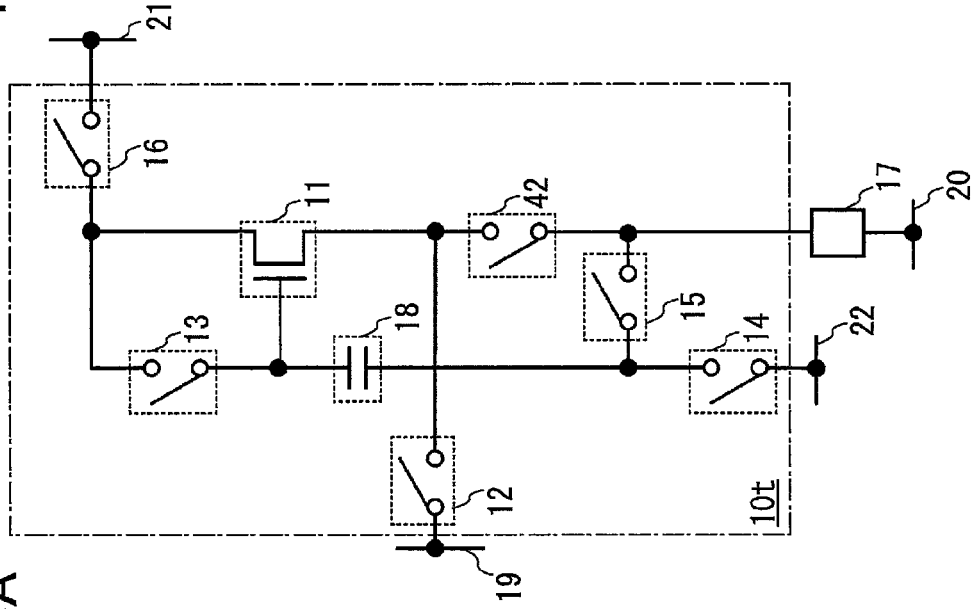

Note that FIG. 18A illustrates a structure different from the structure illustrated in FIG. 17A, in which the switch 41 is provided.

FIG. 18A illustrates a circuit 10t which has a circuit structure obtained by adding a switch to the circuit 10 in FIG. 1A. The circuit 10t illustrated in FIG. 18A is different from the circuit 10s illustrated in FIG. 17A in that a switch 42 is provided between the one electrode of the load 17 and the first terminal of the switch 15, and the first terminal of the transistor 11 and the first terminal of the switch 12. Note that components in common with those in FIG. 1A are denoted by common reference numerals, and description thereof is omitted.

Figure 34:
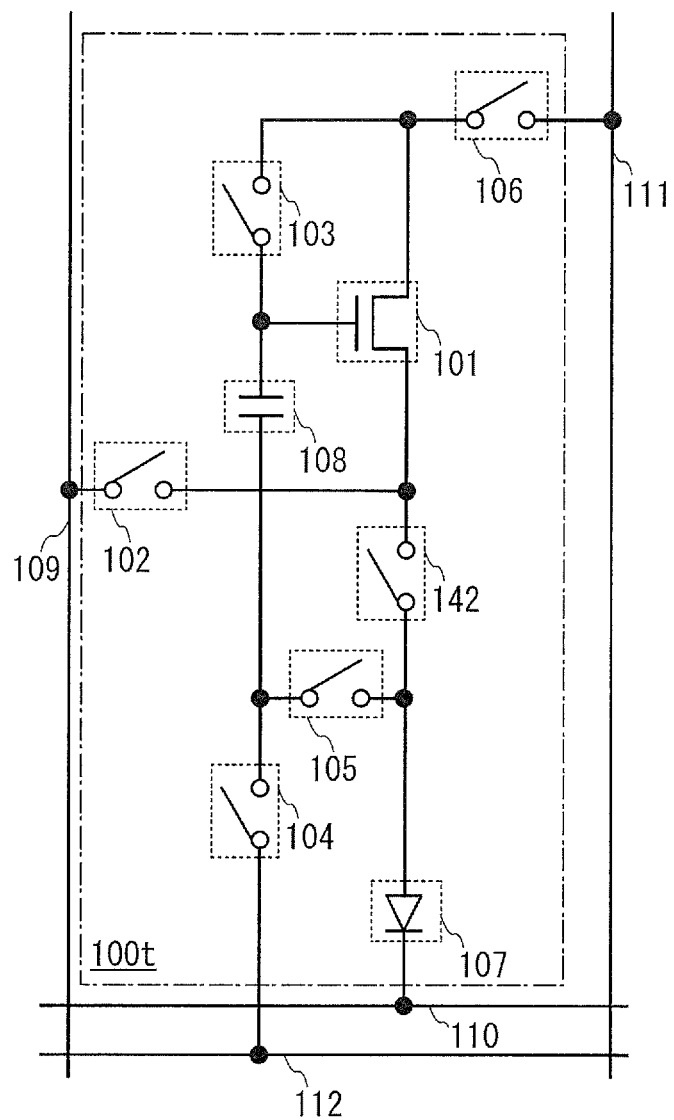
FIG. 34 is a circuit diagram illustrating an example of a pixel according to one embodiment of the present invention.

Note that, in FIG. 18A, the circuit 10t corresponds to a pixel in the case where the load 17 is a light-emitting element. FIG. 34 is a circuit diagram where the load 17 in FIG. 18A is a light-emitting element and the circuit 10t in FIG. 18A is a pixel. A pixel 100t in FIG. 34 includes the switch 102, the switch 103, the switch 104, the switch 105, the switch 106, a switch 142, the light-emitting element 107, the capacitor 108, and the transistor 101. The transistor 101 allows the circuit to function as a current source. The pixel 100t is connected to the wiring 109, the wiring 110, the wiring 111, and the wiring 112.

Note that the switch 102, the switch 103, the switch 104, the switch 105, the switch 106, and the switch 142 illustrated in FIG. 34 correspond to the switch 12, the switch 13, the switch 14, the switch 15, the switch 16, and the switch 42 illustrated in FIG. 18A, respectively. In addition, the capacitor 108, the transistor 101, the wiring 109, the wiring 110, the wiring 111, and the wiring 112 illustrated in FIG. 34 correspond to the capacitor 18, the transistor 11, the wiring 19, the wiring 20, the wiring 21, and the wiring 22 illustrated in FIG. 18A, respectively.

Note that FIG. 18B illustrates an example in which, as in FIG. 2A, a transistor 42T is used as the switch 42 in FIG. 18A and a circuit 27G is connected to a gate of the transistor 42T through a wiring 37.

Figure 80:
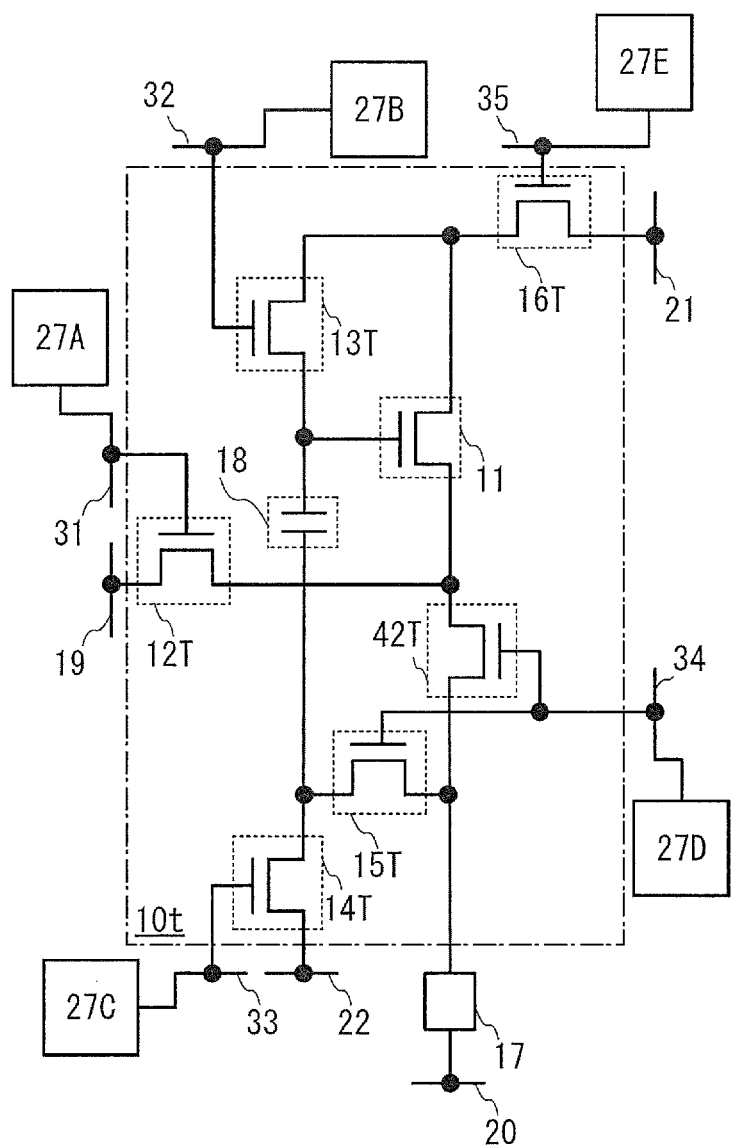
FIG. 80 is a circuit diagram illustrating an example of a circuit according to one embodiment of the present invention.

Note that the wiring 37 and the wiring 34 can be combined into one wiring. At this time, the transistor 42T and the transistor 15T preferably have the same polarity. FIG. 80 is a circuit diagram in that case.

Figure 81:
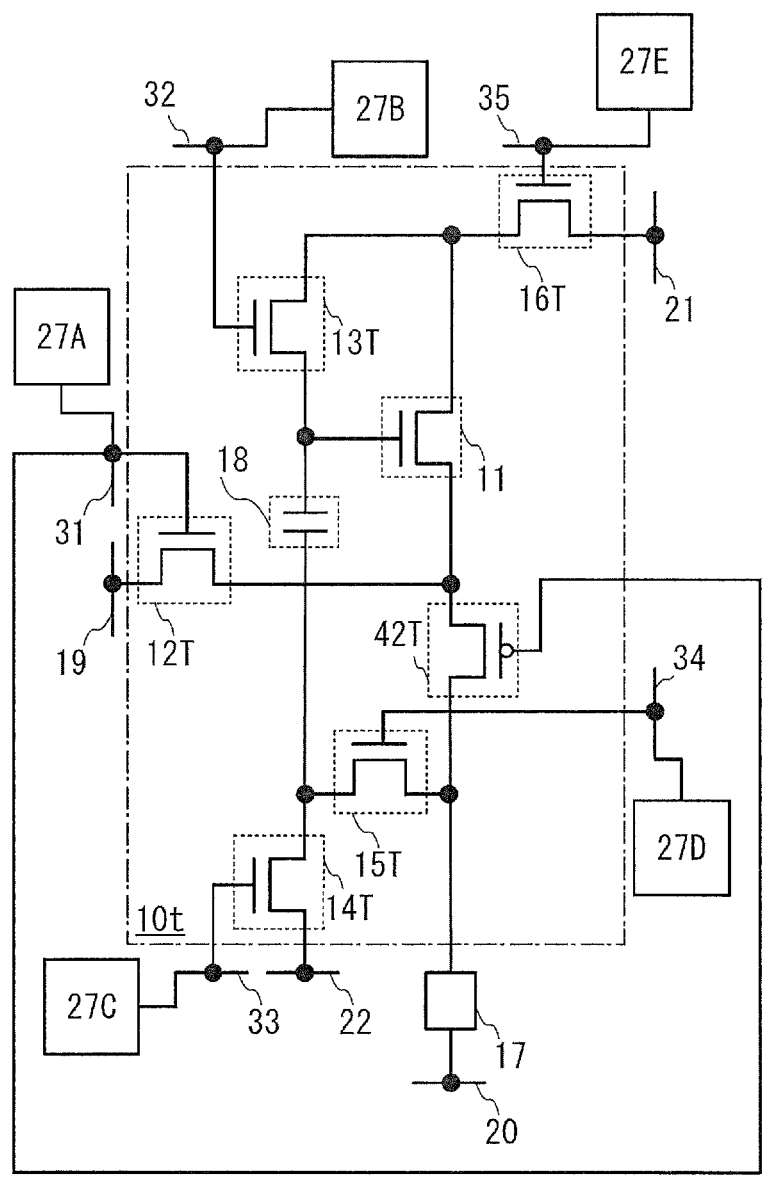
FIG. 81 is a circuit diagram illustrating an example of a circuit according to one embodiment of the present invention.

Note that the wiring 37 and the wiring 31 can be combined into one wiring. At this time, the polarity of the transistor 42T is preferably opposite to that of the transistor 12T. FIG. 81 is a circuit diagram in that case.

Figure 82:
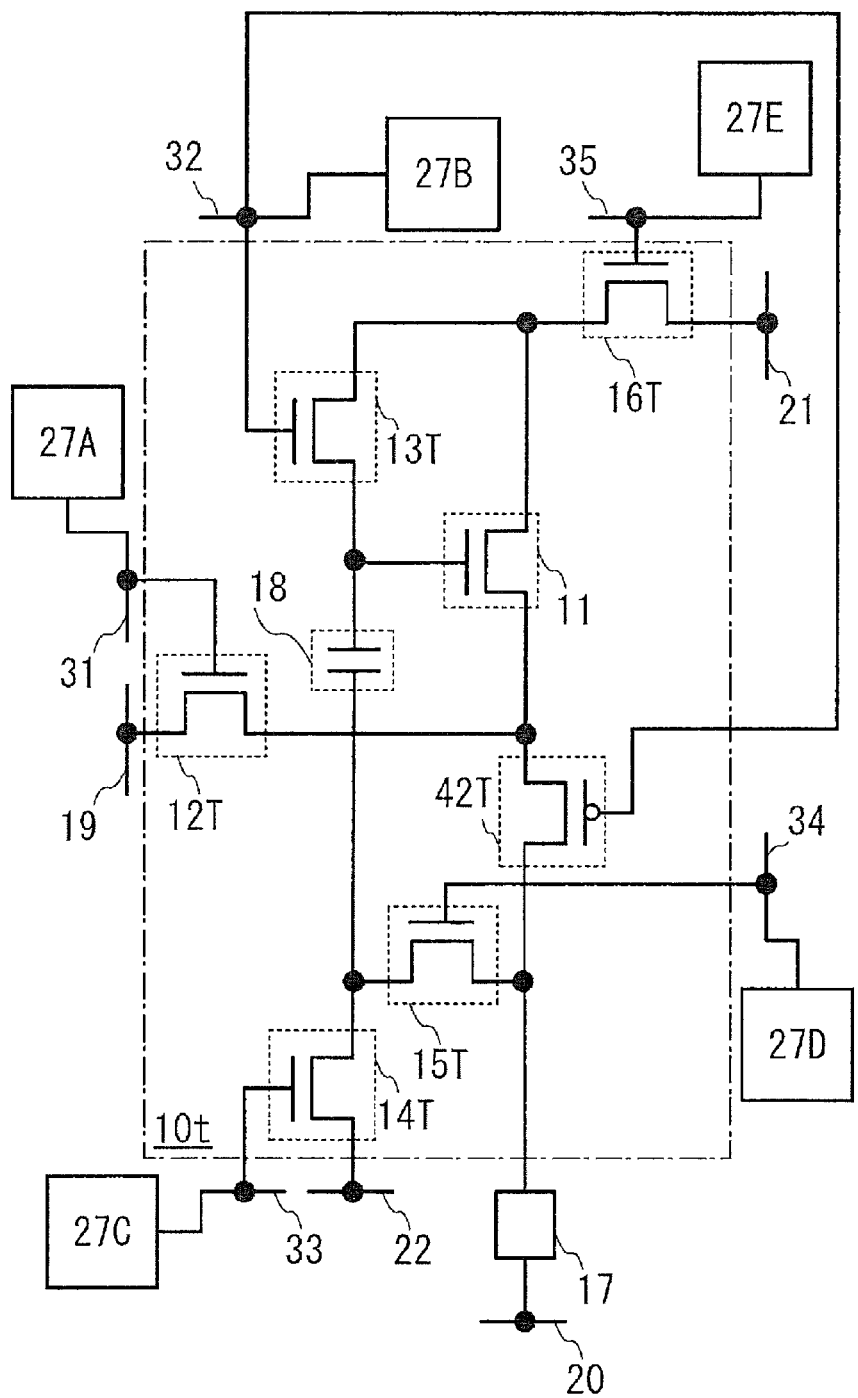
FIG. 82 is a circuit diagram illustrating an example of a circuit according to one embodiment of the present invention.

Note that the wiring 37 and the wiring 32 can be combined into one wiring. At this time, the polarity of the transistor 42T is preferably opposite to that of the transistor 13T. FIG. 82 is a circuit diagram in that case.

Figure 83:
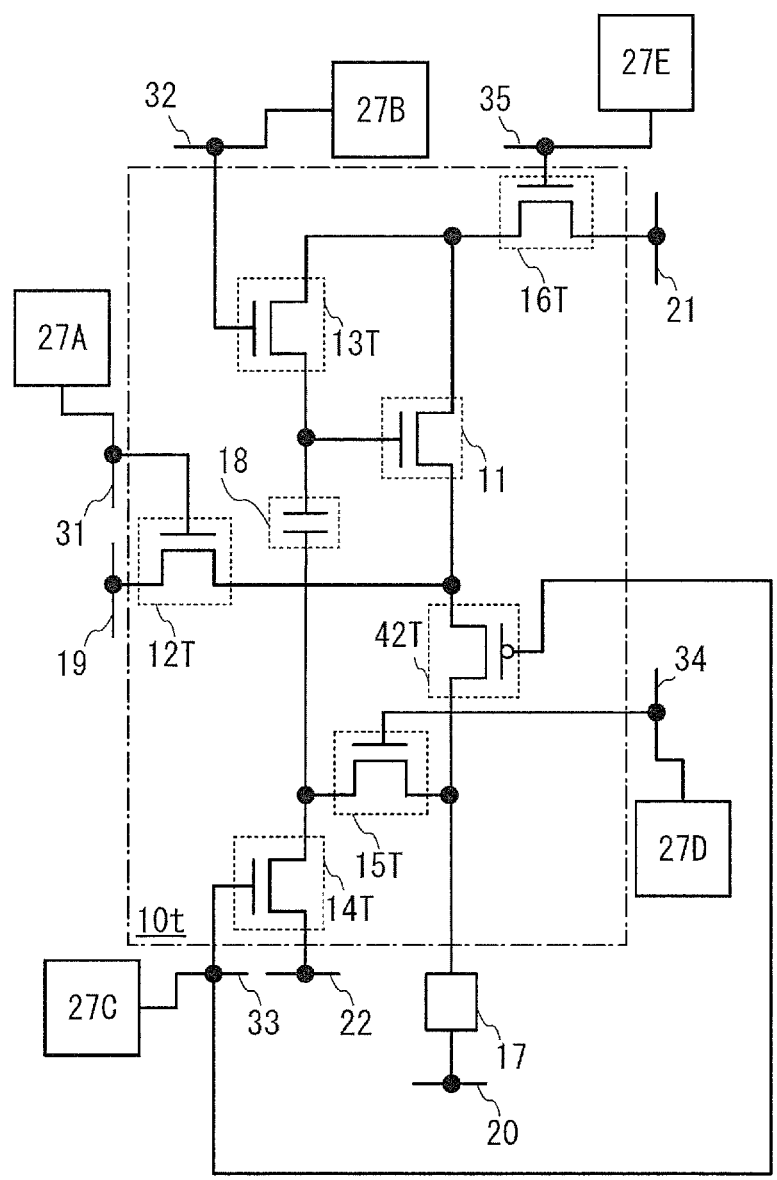
FIG. 83 is a circuit diagram illustrating an example of a circuit according to one embodiment of the present invention.

Note that the wiring 37 and the wiring 33 can be combined into one wiring. At this time, the polarity of the transistor 42T is preferably opposite to that of the transistor 14T. FIG. 83 is a circuit diagram in that case.

Figure 84:
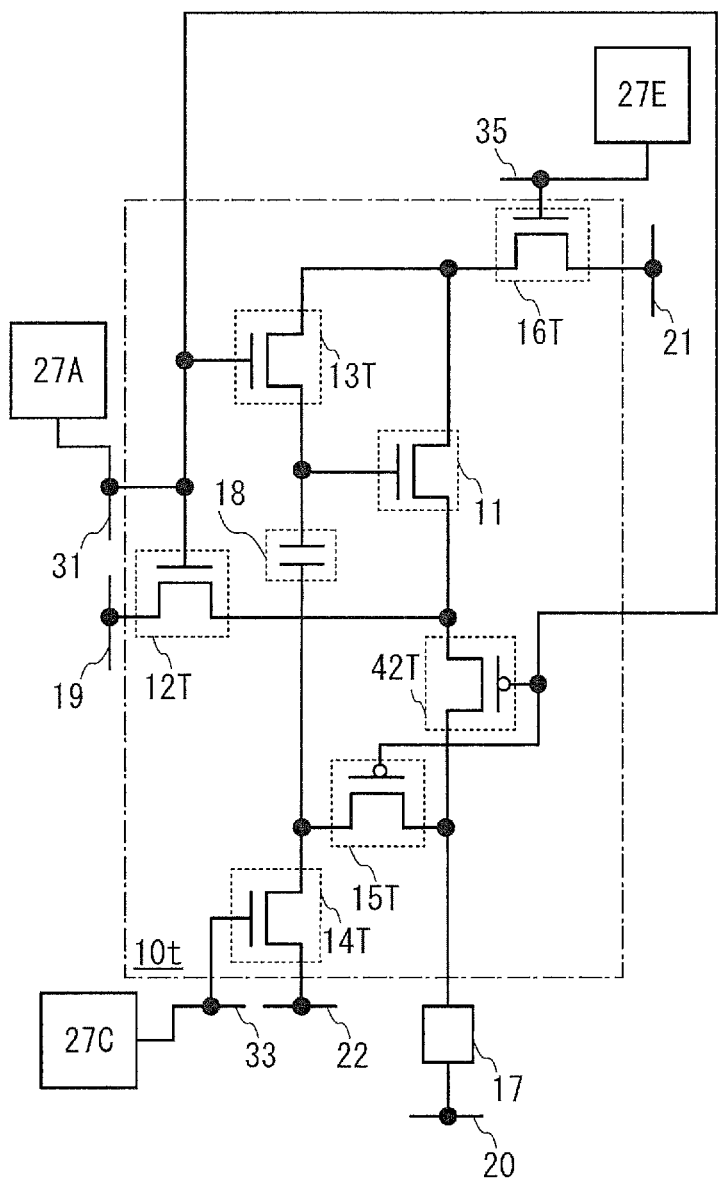
FIG. 84 is a circuit diagram illustrating an example of a circuit according to one embodiment of the present invention.

Note that the wiring 37 and the wiring 34 can be combined with the wiring 31 and the wiring 32 to form one wiring. At this time, the polarity of the transistor 42T and the transistor 15T is preferably opposite to that of the transistor 12T and the transistor 13T. FIG. 84 is a circuit diagram where the wiring 37 and the wiring 34 are combined with the wiring 31 and the wiring 32 to form one wiring.

Figure 85:
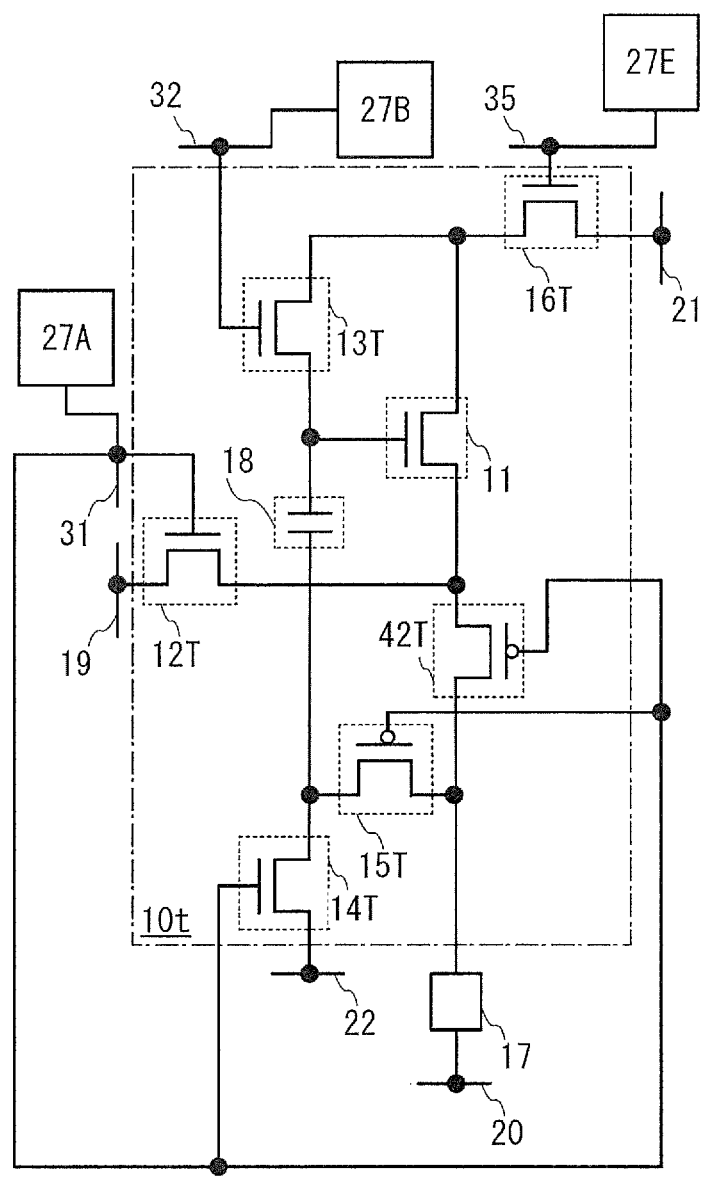
FIG. 85 is a circuit diagram illustrating an example of a circuit according to one embodiment of the present invention.

Note that the wiring 37 and the wiring 34 can be combined with the wiring 31 and the wiring 33 to form one wiring. At this time, the polarity of the transistor 42T and the transistor 15T is preferably opposite to that of the transistor 12T and the transistor 14T. FIG. 85 is a circuit diagram where the wiring 37 and the wiring 34 are combined with the wiring 31 and the wiring 33 to form one wiring.

Figure 86:
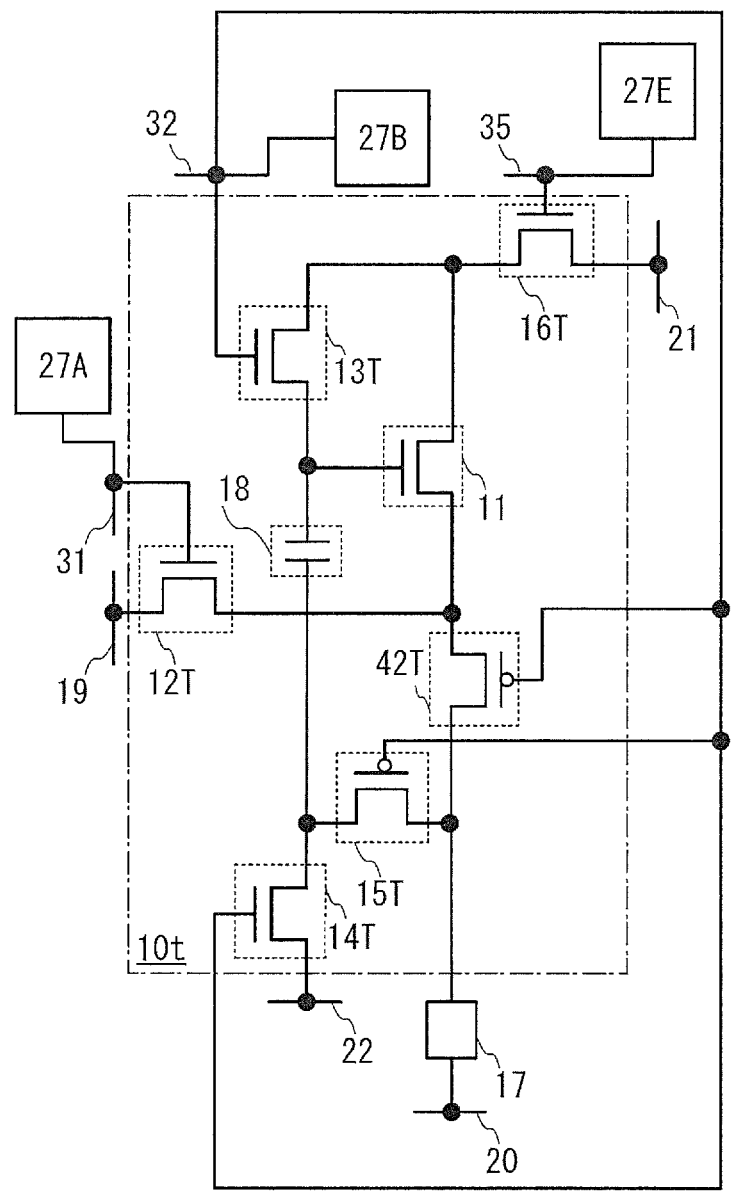
FIG. 86 is a circuit diagram illustrating an example of a circuit according to one embodiment of the present invention.

Note that the wiring 37 and the wiring 34 can be combined with the wiring 32 and the wiring 33 to form one wiring. At this time, the polarity of the transistor 42T and the transistor 15T is preferably opposite to that of the transistor 13T and the transistor 14T. FIG. 86 is a circuit diagram where the wiring 37 and the wiring 34 are combined with the wiring 32 and the wiring 33 to form one wiring.

Figure 87:
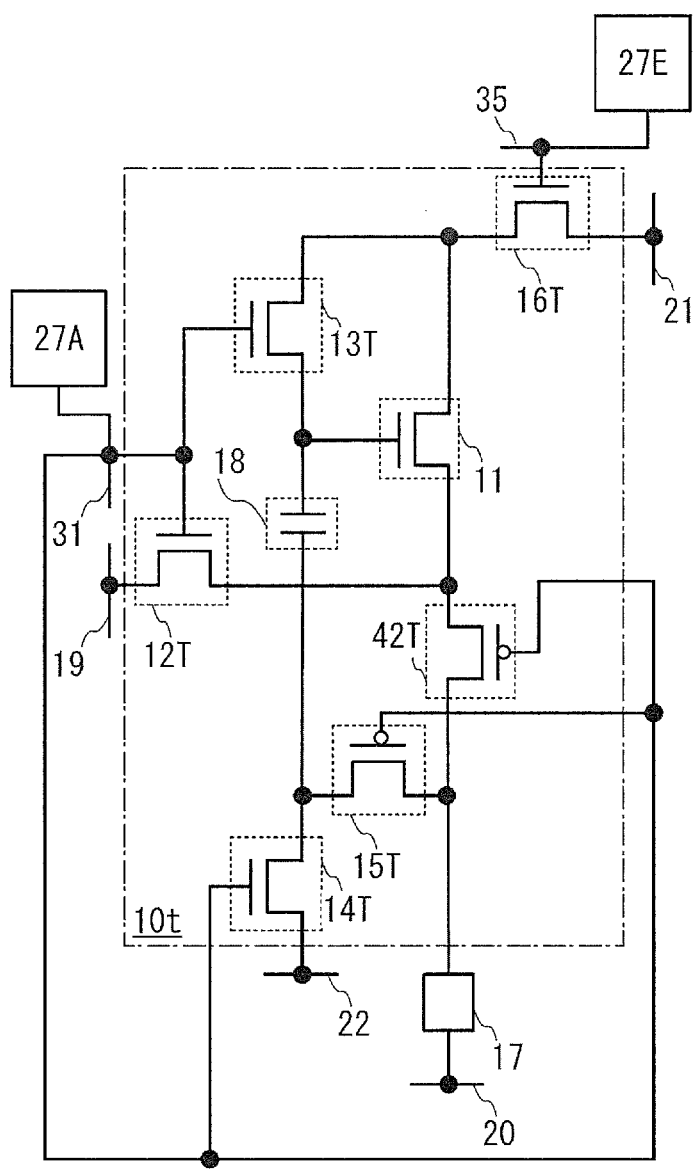
FIG. 87 is a circuit diagram illustrating an example of a circuit according to one embodiment of the present invention.

Note that the wiring 37 and the wiring 34 can be combined with one, two, or all of the wiring 31, the wiring 32, and the wiring 33 to form one wiring. At this time, the polarity of the transistor 42T and the transistor 15T is preferably opposite to that of the transistor 12T, the transistor 13T, and the transistor 14T. FIG. 87 is a circuit diagram where the wiring 37 and the wiring 34 are combined with the wiring 31, the wiring 32, and the wiring 33 to form one wiring.

Figure 88B:
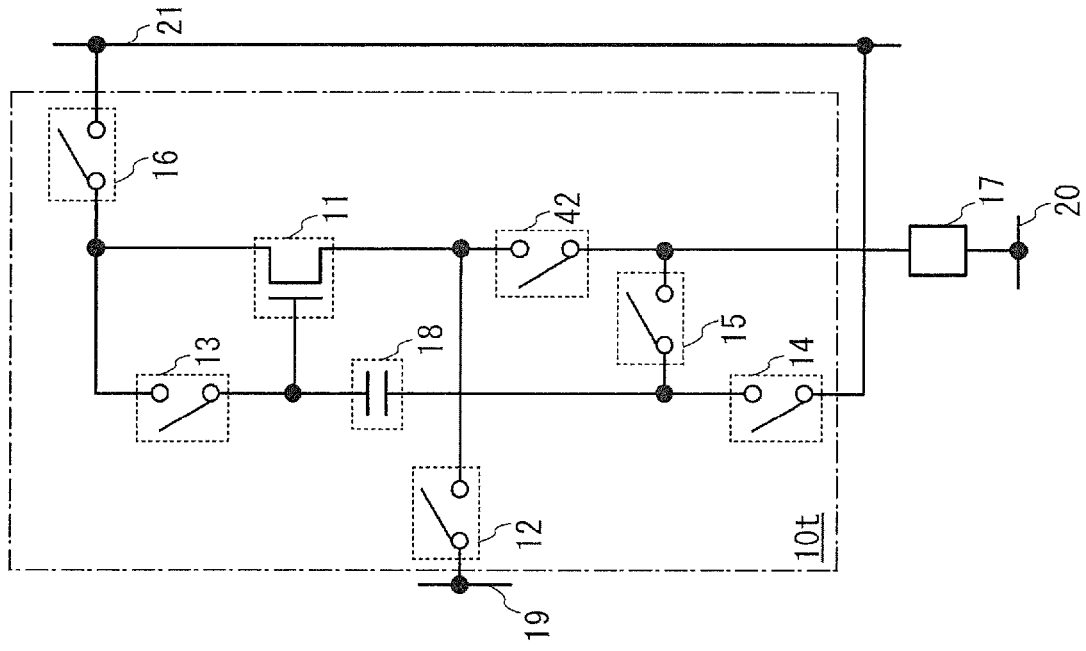
FIGS. 88A and 88B are each a circuit diagram illustrating an example of a circuit according to one embodiment of the present invention.
Figure 88A:
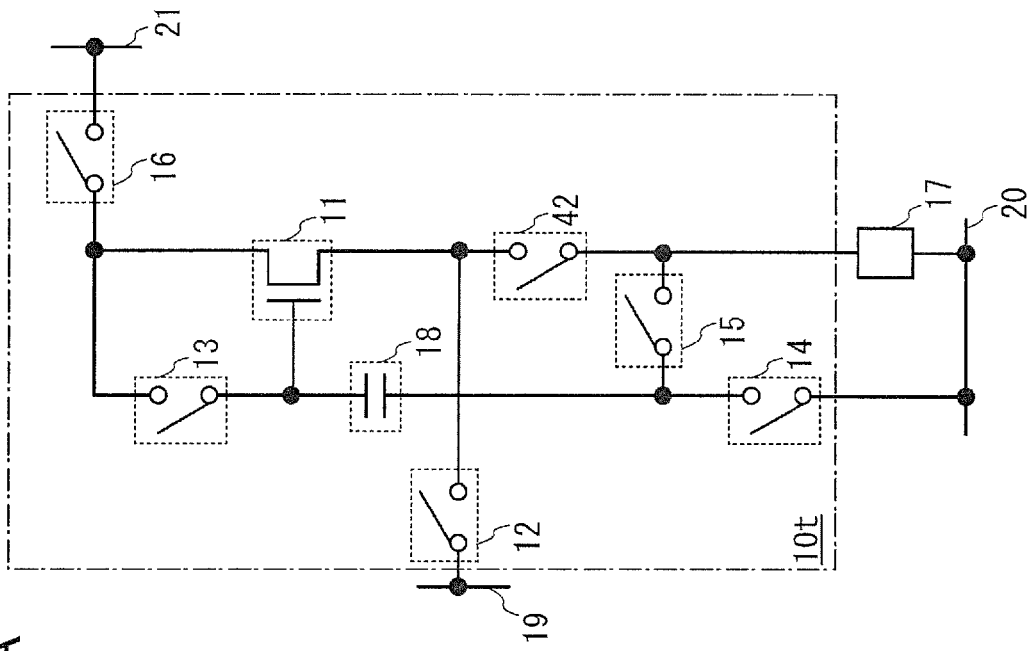

Note that FIG. 88A illustrates an example in which the wiring 22 in FIG. 18A is combined with the wiring 20 as in FIG. 10A. FIG. 88B illustrates an example in which the wiring 22 in FIG. 18A is combined with the wiring 21 as in FIG. 13A.

Although the wirings are combined in the pixel in FIG. 80, FIG. 81, FIG. 82, FIG. 83, FIG. 84, FIG. 85, FIG. 86, and FIG. 87, the wirings can be connected outside the pixel region and provided as separate wirings in the pixel region as illustrated in FIG. 63B.

Note that the operation of the circuit 10t illustrated in FIG. 18A is different from that illustrated in FIGS. 3A to 3D in Embodiment 1 in that the switch 42 is turned off in the first operation and the second operation and is turned on in the third operation. In this case, current flowing to the load 17 can be reduced more surely in the first operation and the second operation, and current can flow to the load 17 in the third operation. With this structure, operation can be performed so that current is more surely prevented from flowing to the load 17. Accordingly, current can be prevented from flowing to the load 17 without setting the potential Vsig lower than the potential Vcat. Further, since the electrical connection between the load 17 and the transistor 11 can be cut by the switch 42, the load 17 does not need to be charged or discharged in the first operation or the second operation. Consequently, a steady state can be obtained in a short time and signal input can be completed rapidly.

Note that the switch 42 and the switch 15 are preferably in a non-conduction state in precharge operation like the precharge operations in FIG. 3D and FIG. 4D because the load 17 does not need to be charged or discharged. In the case where the load 17 needs to be charged or discharged, the switch 42 and the switch 15 are preferably in a conduction state.

Note that it is possible to perform operation for correcting mobility with the use of the circuit in FIG. 18A in a manner similar to that in FIG. 5C or FIG. 6C in Embodiment 1. In that case, the switch 42 is preferably in a conduction state so that current can flow therethrough.

Note that FIGS. 17A and 17B, FIGS. 18A and 18B, and the like each illustrate an example of a circuit structure; therefore, a transistor can be provided additionally. On the other hand, for each node in FIGS. 17A and 17B, FIGS. 18A and 18B, and the like, it is also possible not to provide an additional transistor, switch, passive element, or the like. For example, it is possible not to increase the number of transistors directly connected to the node A, the node B, the node C, the node D, the node E, the node F, the node G and/or the node H.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 6)

In this embodiment, examples of a circuit structure which is obtained by adding a component to the circuit structure described in any of Embodiments 1 to 5 are described. Accordingly, the description in Embodiments 1 to 5 can be applied to this embodiment.

Figure 19A:
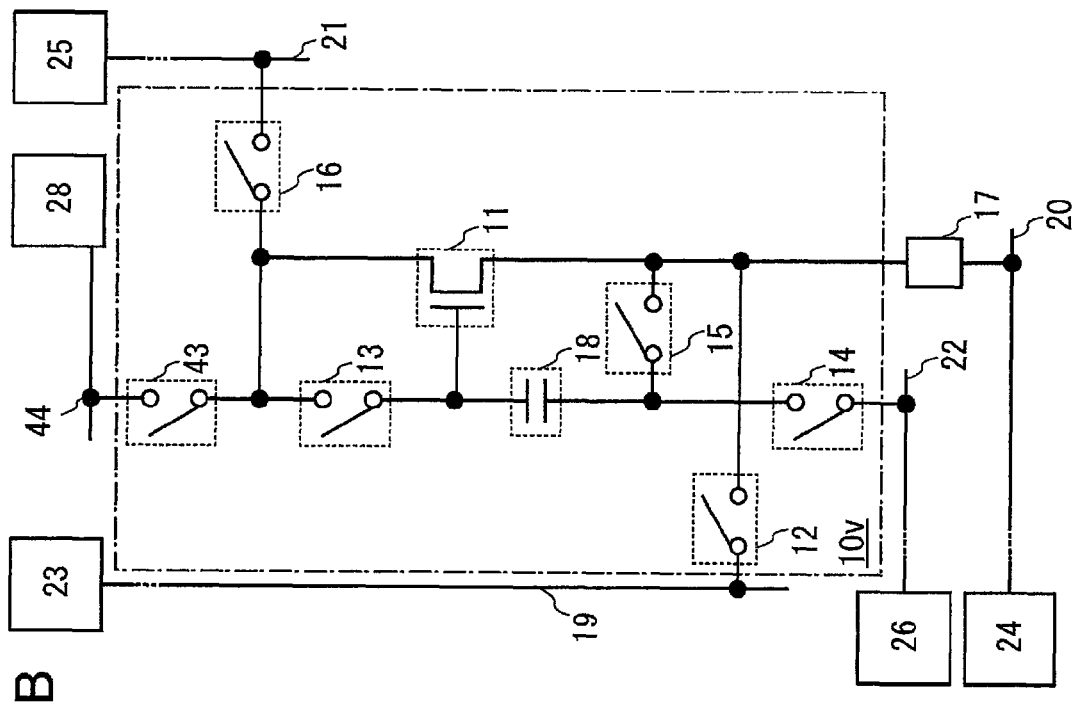
FIGS. 19A and 19B are each a circuit diagram illustrating an example of a circuit according to one embodiment of the present invention.

FIG. 19A illustrates a circuit 10v which has a circuit structure similar to that of the circuit 10 in FIG. 1A. The circuit 10v illustrated in FIG. 19A is different from the circuit 10 illustrated in FIG. 1A in that a wiring 44 and a switch 43 are provided. A first terminal of the switch 43 is connected to the second terminal of the transistor 11, and a second terminal of the switch 43 is connected to the wiring 44. Note that components in common with those in FIG. 1A are denoted by common reference numerals, and description thereof is omitted.

Figure 35:
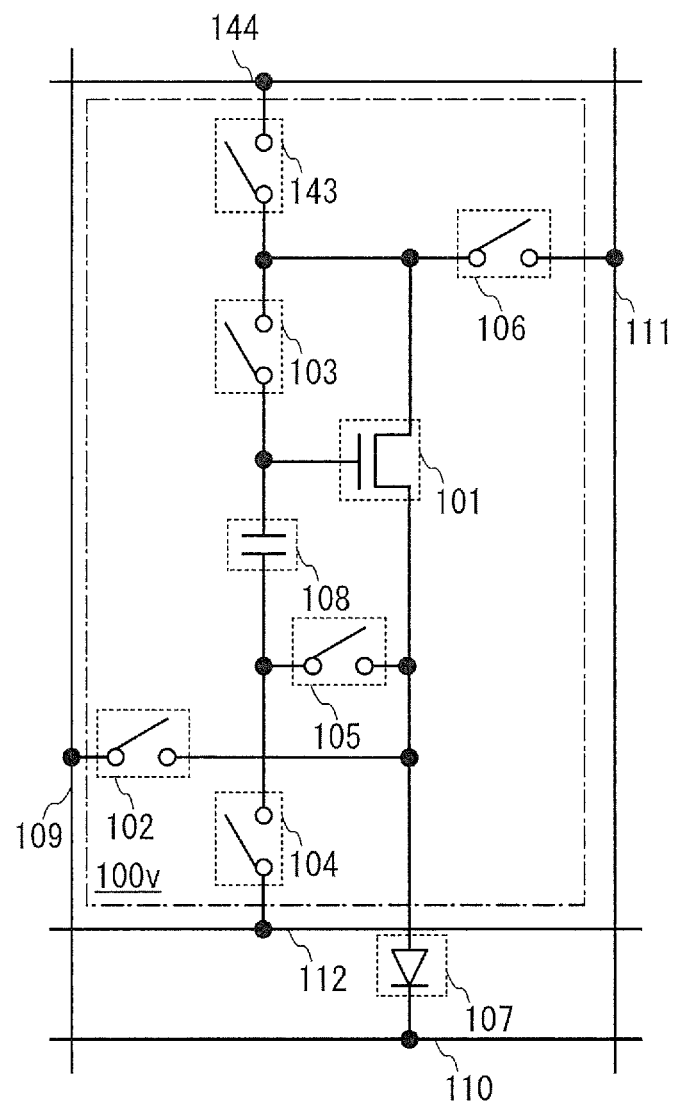
FIG. 35 is a circuit diagram illustrating an example of a pixel according to one embodiment of the present invention.

Note that, in FIG. 19A, the circuit 10v corresponds to a pixel in the case where the load 17 is a light-emitting element. FIG. 35 is a circuit diagram where the load 17 in FIG. 19A is a light-emitting element and the circuit 10v in FIG. 19A is a pixel. A pixel 100v in FIG. 35 includes the switch 102, the switch 103, the switch 104, the switch 105, the switch 106, a switch 143, the light-emitting element 107, the capacitor 108, and the transistor 101. The transistor 101 allows the circuit to function as a current source. The pixel 100v is connected to the wiring 109, the wiring 110, the wiring 111, the wiring 112, and a wiring 144.

Note that the switch 102, the switch 103, the switch 104, the switch 105, the switch 106, and the switch 143 illustrated in FIG. 35 correspond to the switch 12, the switch 13, the switch 14, the switch 15, the switch 16, and the switch 43 illustrated in FIG. 19A, respectively. In addition, the capacitor 108, the transistor 101, the wiring 109, the wiring 110, the wiring 111, the wiring 112, and the wiring 144 illustrated in FIG. 35 correspond to the capacitor 18, the transistor 11, the wiring 19, the wiring 20, the wiring 21, the wiring 22, and the wiring 44 illustrated in FIG. 19A, respectively.

Figure 19B:
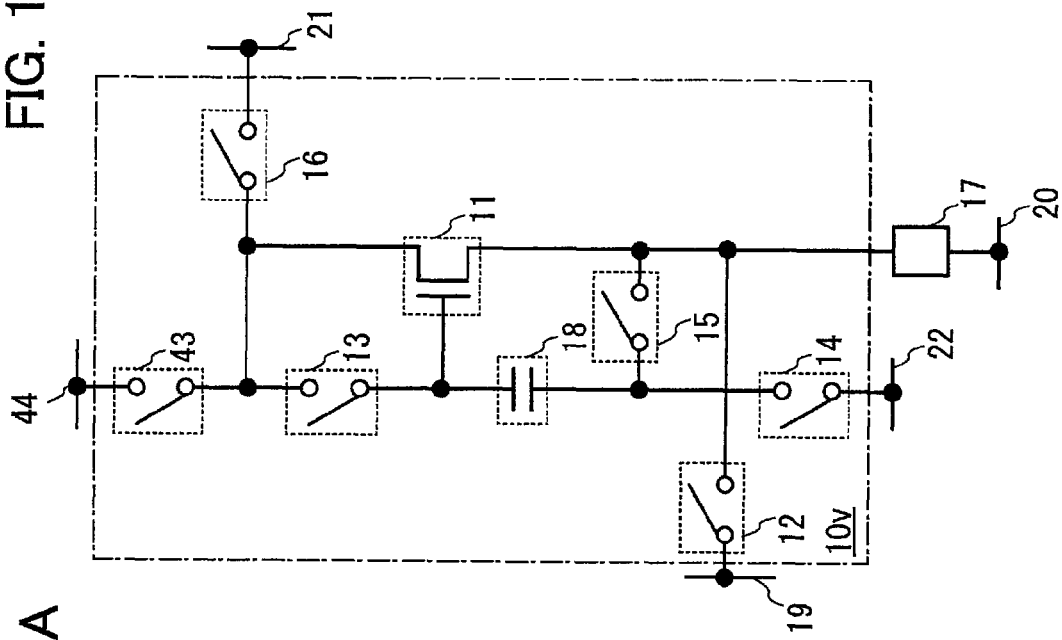

Note that, as illustrated in FIG. 19B, the wiring 44 is connected to at least a circuit 28 having a function of supplying a potential Vinit, for example. An example of the circuit 28 is a power supply circuit. Accordingly, the wiring 44 has a function of transmitting or supplying the potential Vinit.

The potential Vinit is set in order to accumulate electric charge in the capacitor 18 in initialization of the potential of each node. A potential supplied to the wiring 44 is not limited to the potential Vinit and may be VDD, for example.

Note that the wiring 44 can be shared by pixels horizontally or vertically adjacent to each other. For example, one wiring is provided for two pixels; thus, the number of wirings can be reduced.

Figure 89:
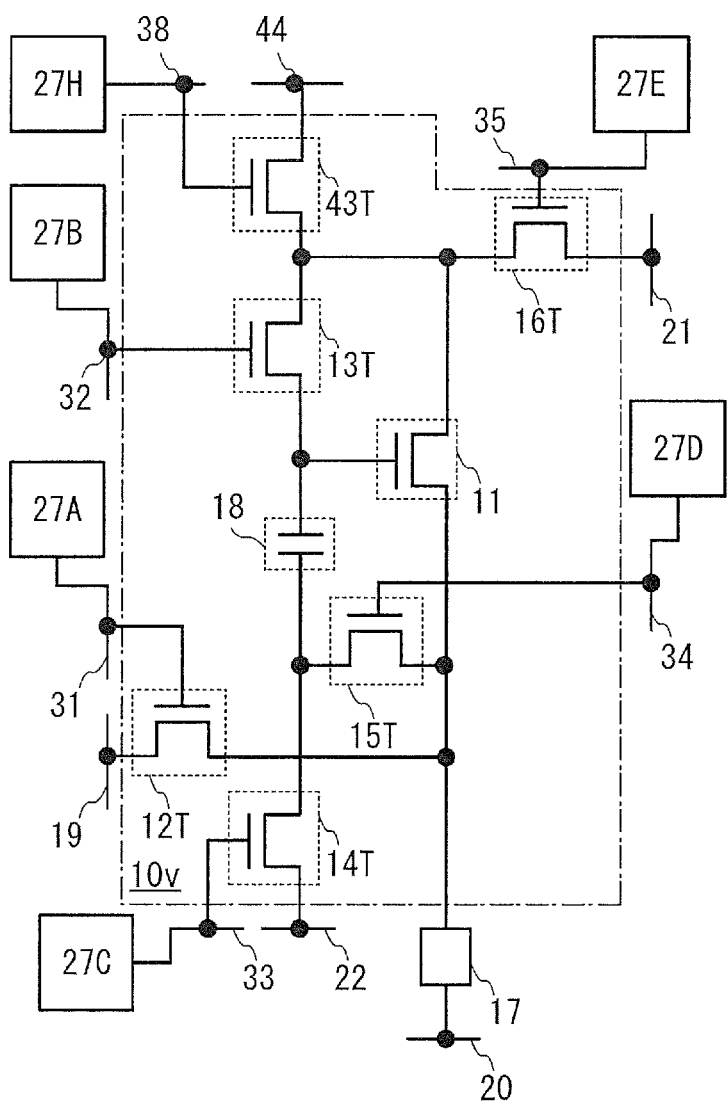
FIG. 89 is a circuit diagram illustrating an example of a circuit according to one embodiment of the present invention.

Note that FIG. 89 illustrates an example in which, as in FIG. 2A, a transistor 43T is used as the switch 43 in FIG. 19A and a circuit 27H is connected to a gate of the transistor 43T through a wiring 38.

Note that the wiring 38 can be combined with the wiring 31, the wiring 32, and/or the wiring 33 in another circuit 10*v* to form one wiring. At this time, the transistor 43T preferably has the same polarity as the transistor 12T, the transistor 13T, and/or the transistor 14T in the other circuit 10*v*. As an example, FIG. 90 is a circuit diagram where the wiring 38 is combined with the wiring 31 in the other circuit 10*v* to form one wiring.

Note that the wiring 38 can be combined with the wiring 34 and/or the wiring 35 in another circuit 10*v* to form one wiring. At this time, the polarity of the transistor 43T is preferably opposite to that of the transistor 15T and/or the transistor 16T in the other circuit 10*v*. As an example, FIG. 91 is a circuit diagram where the wiring 38 is combined with the wiring 34 in the other circuit 10*v* to form one wiring.

Note that the wiring 38 can be combined with the wiring 31, the wiring 32, and/or the wiring 33 in another circuit 10*v* and the wiring 34 and/or the wiring 35 in the other circuit 10*v* to form one wiring. At this time, the transistor 43T preferably has the same polarity as the transistor 12T, the transistor 13T, and/or the transistor 14T in the other circuit 10*v*, and the polarity of the transistor 43T is preferably opposite to that of the transistor 15T and/or the transistor 16T in the other circuit 10*v*. As an example, FIG. 92 is a circuit diagram where the wiring 38 is combined with the wiring 31 and the wiring 34 in the other circuit 10*v* to form one wiring.

Figure 90:
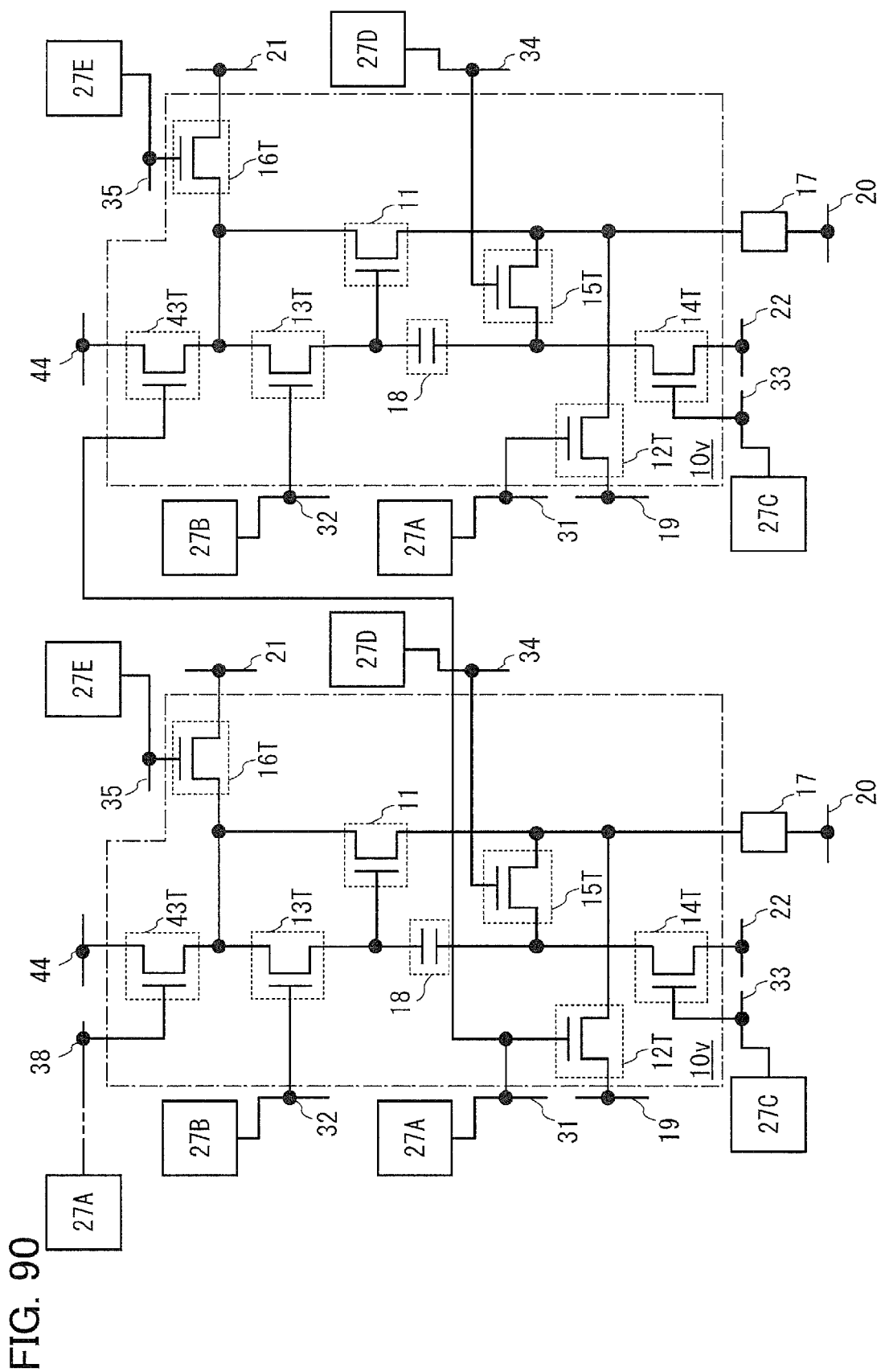
FIG. 90 is a circuit diagram illustrating an example of a circuit according to one embodiment of the present invention.
Figure 91:
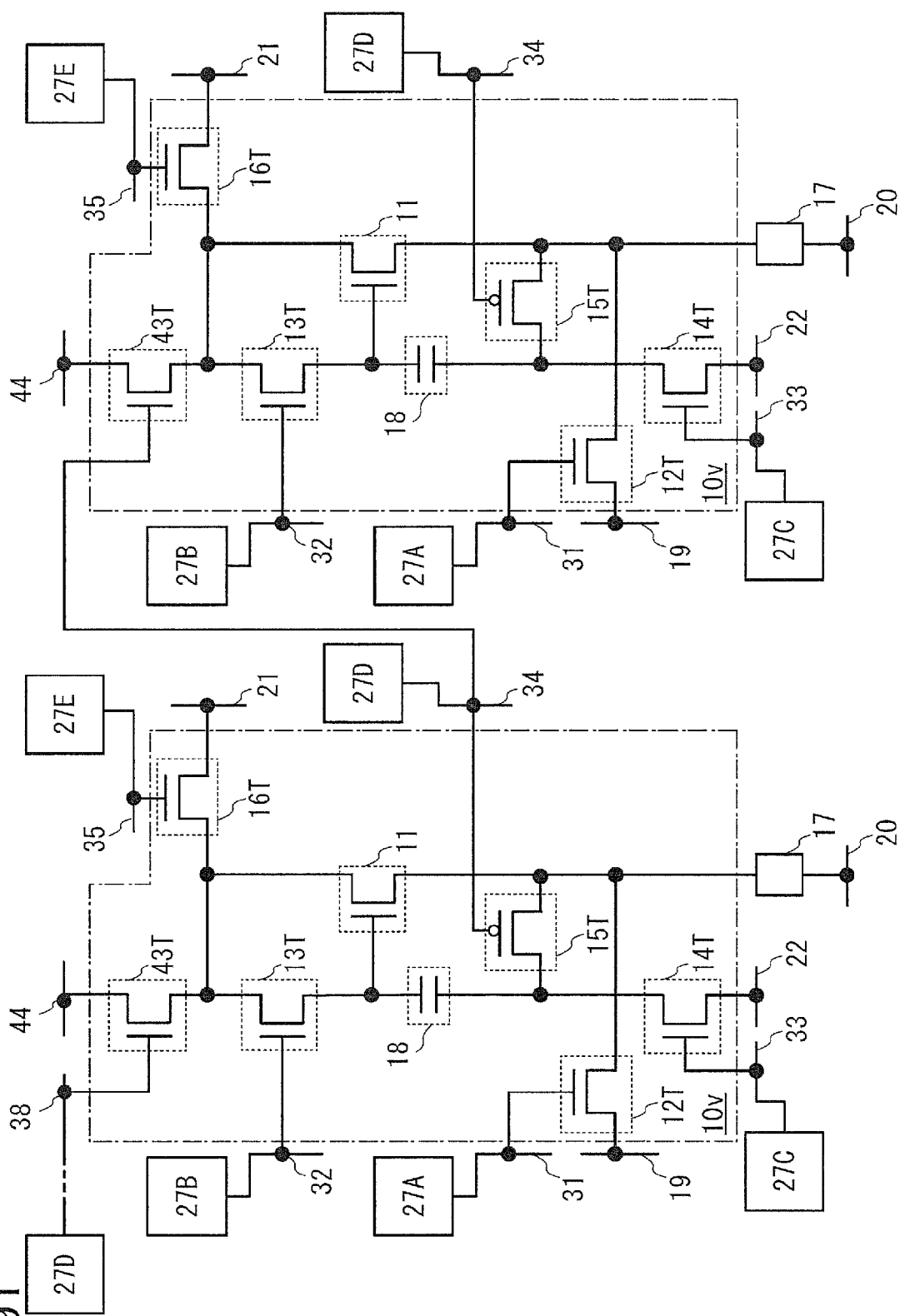
FIG. 91 is a circuit diagram illustrating an example of a circuit according to one embodiment of the present invention.
Figure 92:
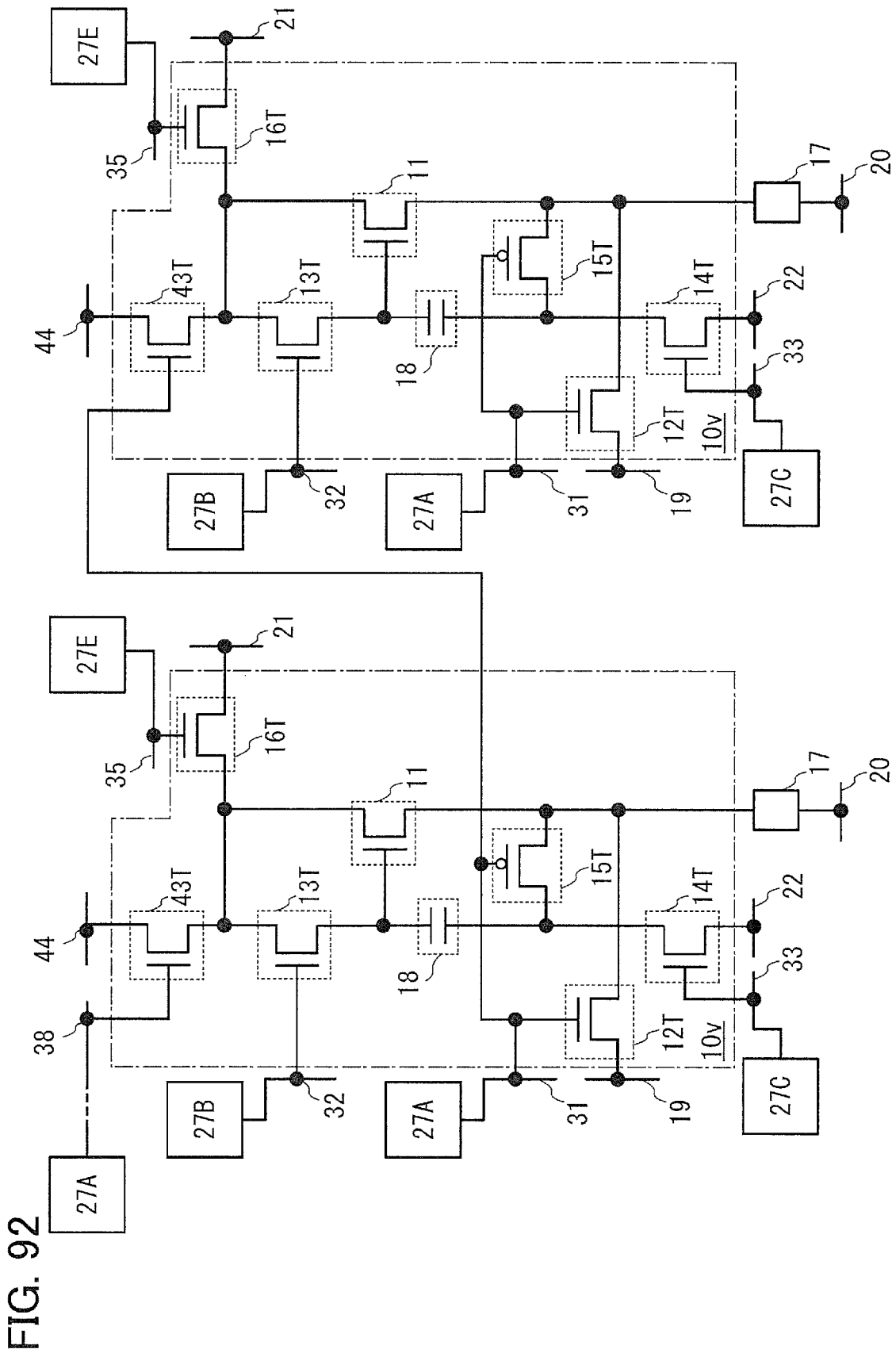
FIG. 92 is a circuit diagram illustrating an example of a circuit according to one embodiment of the present invention.

Although the wirings are combined in the pixel in FIG. 90, FIG. 91, and FIG. 92, the wirings can be connected outside the pixel region and provided as separate wirings in the pixel region as illustrated in FIG. 63B.

As in the case of the operations described in Embodiments 1 to 5, the operation of the circuit 10*v* illustrated in FIG. 19A can be mainly divided into first operation, second operation, and third operation.

Note that the operation of the circuit 10*v* illustrated in FIG. 19A is different from that of the circuit illustrated in FIG. 1A in Embodiment 1 in that the switch 43 and the switch 14 are turned on and electric charge is accumulated in the capacitor 18 in a period other than the first operation, the second operation, and the third operation, for example, before the first operation. In this case, time taken for the first operation can be shortened. With this structure, a long period of time can be ensured for supplying current to the load 17. At this time, the load 17 can be charged or discharged by turning on the switch 15, which is preferable. However, in the case where the load 17 does not need to be charged or discharged, the switch 15 is preferably in a non-conduction state.

Figure 20B:
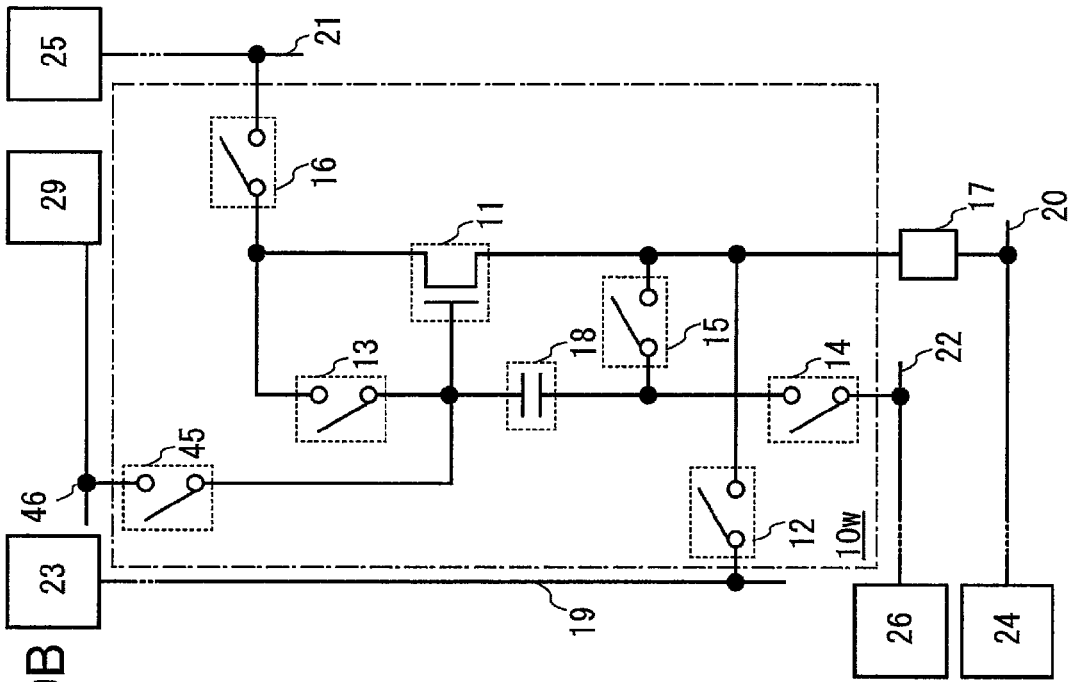
FIGS. 20A and 20B are each a circuit diagram illustrating an example of a circuit according to one embodiment of the present invention.
Figure 20A:
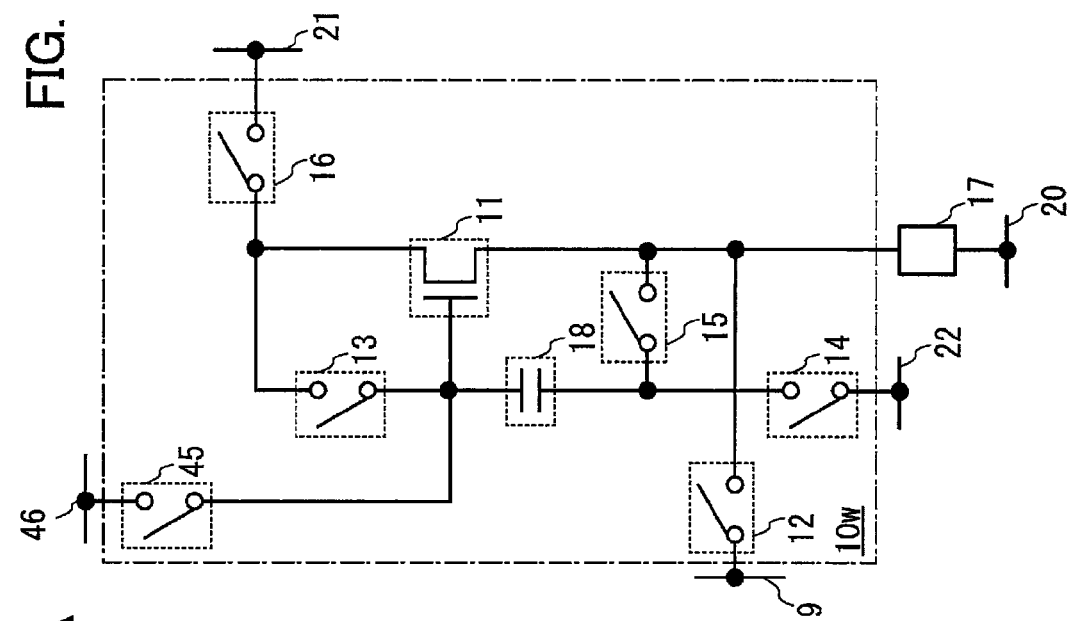

Note that FIG. 20A illustrates a structure where connection is partly different from that in the structure illustrated in FIG. 19A.

FIG. 20A illustrates a circuit 10*w* which has a circuit structure similar to that of the circuit 10 in FIG. 1A. The circuit 10*w* illustrated in FIG. 20A is different from the circuit 10 illustrated in FIG. 1A in that a wiring 46 and a switch 45 are provided. A first terminal of the switch 45 is connected to the gate of the transistor 11, and a second terminal of the switch 45 is connected to the wiring 46. Note that components in common with those in FIG. 1A are denoted by common reference numerals, and description thereof is omitted.

Figure 36:
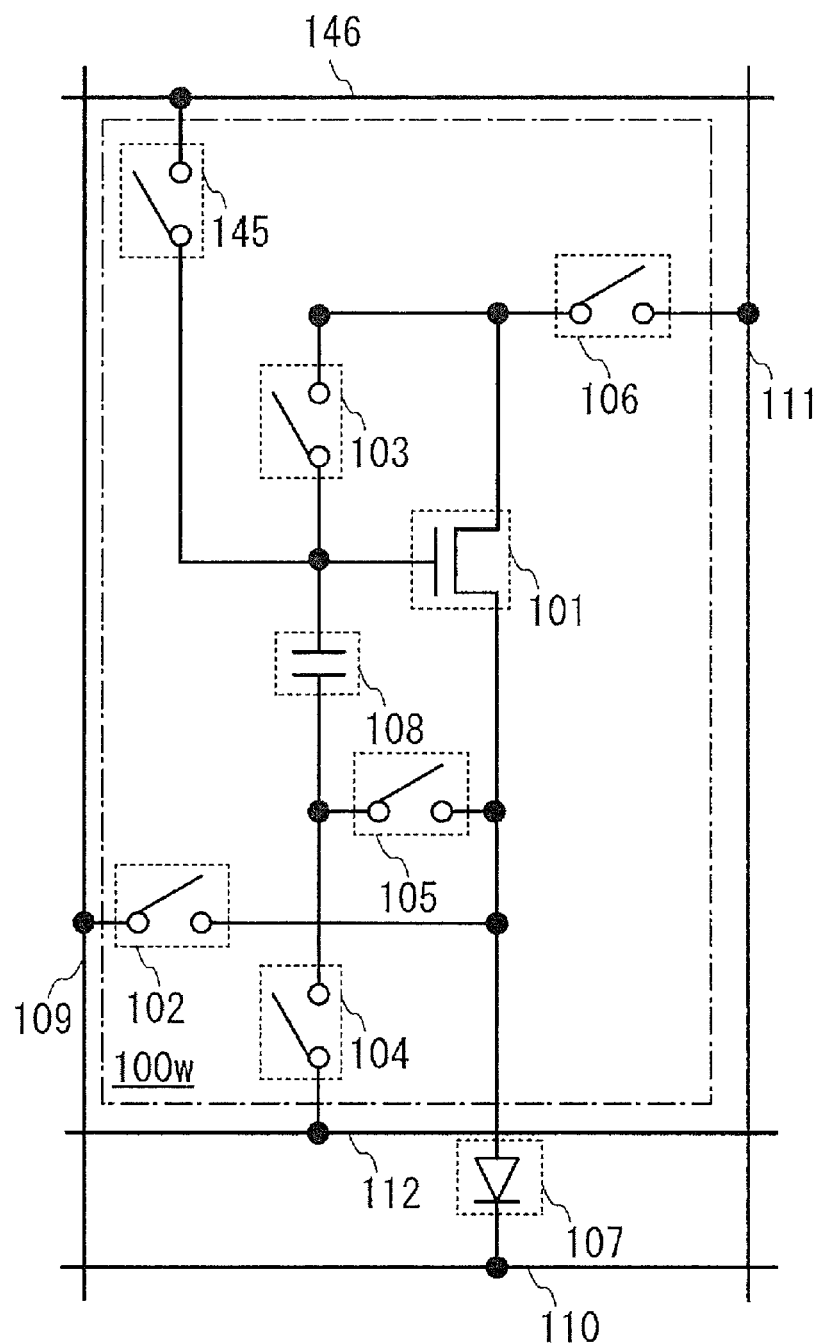
FIG. 36 is a circuit diagram illustrating an example of a pixel according to one embodiment of the present invention.

Note that, in FIG. 20A, the circuit 10*w* corresponds to a pixel in the case where the load 17 is a light-emitting element. FIG. 36 is a circuit diagram where the load 17 in FIG. 20A is a light-emitting element and the circuit 10*w* in FIG. 20A is a pixel. A pixel 100*w* in FIG. 36 includes the switch 102, the switch 103, the switch 104, the switch 105, the switch 106, a switch 145, the light-emitting element 107, the capacitor 108, and the transistor 101. The transistor 101 allows the circuit to function as a current source. The pixel 100*w* is connected to the wiring 109, the wiring 110, the wiring 111, the wiring 112, and a wiring 146.

Note that the switch 102, the switch 103, the switch 104, the switch 105, the switch 106, and the switch 145 illustrated in FIG. 36 correspond to the switch 12, the switch 13, the switch 14, the switch 15, the switch 16, and the switch 45 illustrated in FIG. 20A, respectively. In addition, the capacitor 108, the transistor 101, the wiring 109, the wiring 110, the wiring 111, the wiring 112, and the wiring 146 illustrated in FIG. 36 correspond to the capacitor 18, the transistor 11, the wiring 19, the wiring 20, the wiring 21, the wiring 22, and the wiring 46 illustrated in FIG. 20A, respectively.

Note that the operation of the circuit 10*w* illustrated in FIG. 20A is different from that of the circuit illustrated in FIG. 1A in Embodiment 1 in that the switch 45 is turned on and electric charge is accumulated in the capacitor 18 in a period other than the first operation, the second operation, and the third operation, for example, before the first operation. In this case, time taken for the first operation can be shortened. With this structure, a long period of time can be ensured for supplying current to the load 17.

Note that the wiring 46 can be shared by pixels horizontally or vertically adjacent to each other. For example, one wiring is provided for two pixels; thus, the number of wirings can be reduced.

Figure 93:
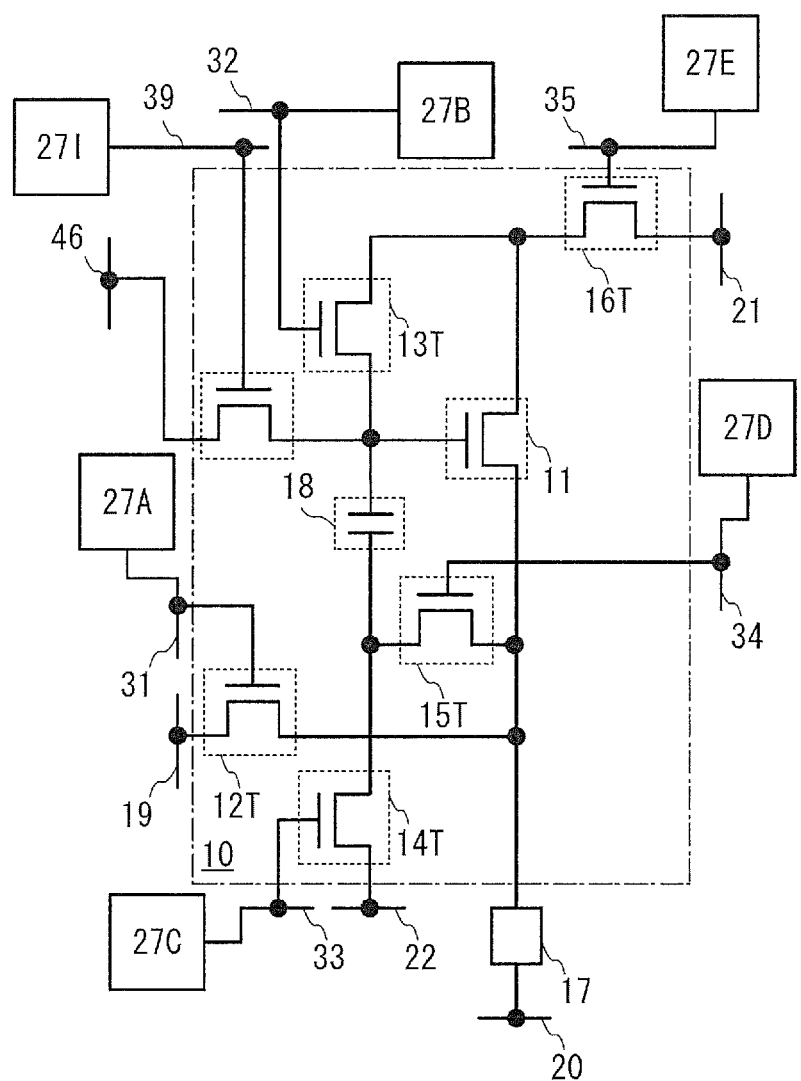
FIG. 93 is a circuit diagram illustrating an example of a circuit according to one embodiment of the present invention.

Note that FIG. 93 illustrates an example in which, as in FIG. 2A, a transistor 45T is used as the switch 45 in FIG. 20A and a circuit 27I is connected to a gate of the transistor 45T through a wiring 39.

Note that the wiring 39 can be combined with the wiring 31, the wiring 32, and/or the wiring 33 in another circuit 10*w* to form one wiring. At this time, the transistor 45T preferably has the same polarity as the transistor 12T, the transistor 13T, and/or the transistor 14T in the other circuit 10*w*. As an example, FIG. 94 is a circuit diagram where the wiring 39 is combined with the wiring 31 in the other circuit 10*w* to form one wiring.

Note that the wiring 39 can be combined with the wiring 34 and/or the wiring 35 in another circuit 10*w* to form one wiring. At this time, the polarity of the transistor 45T is preferably opposite to that of the transistor 15T and/or the transistor 16T in the other circuit 10*w*. As an example, FIG. 95 is a circuit diagram where the wiring 39 is combined with the wiring 34 in the other circuit 10*w* to form one wiring.

Note that the wiring 39 can be combined with the wiring 31, the wiring 32, and/or the wiring 33 in another circuit 10*w* and the wiring 34 and/or the wiring 35 in the other circuit 10*w* to form one wiring. At this time, the transistor 45T preferably has the same polarity as the transistor 12T, the transistor 13T, and/or the transistor 14T in the other circuit 10*w*, and the polarity of the transistor 45T is preferably opposite to that of the transistor 15T and/or the transistor 16T in the other circuit 10*w*. As an example, FIG. 96 is a circuit diagram where the wiring 39 is combined with the wiring 31 and the wiring 34 in the other circuit 10*w* to form one wiring.

Figure 94:
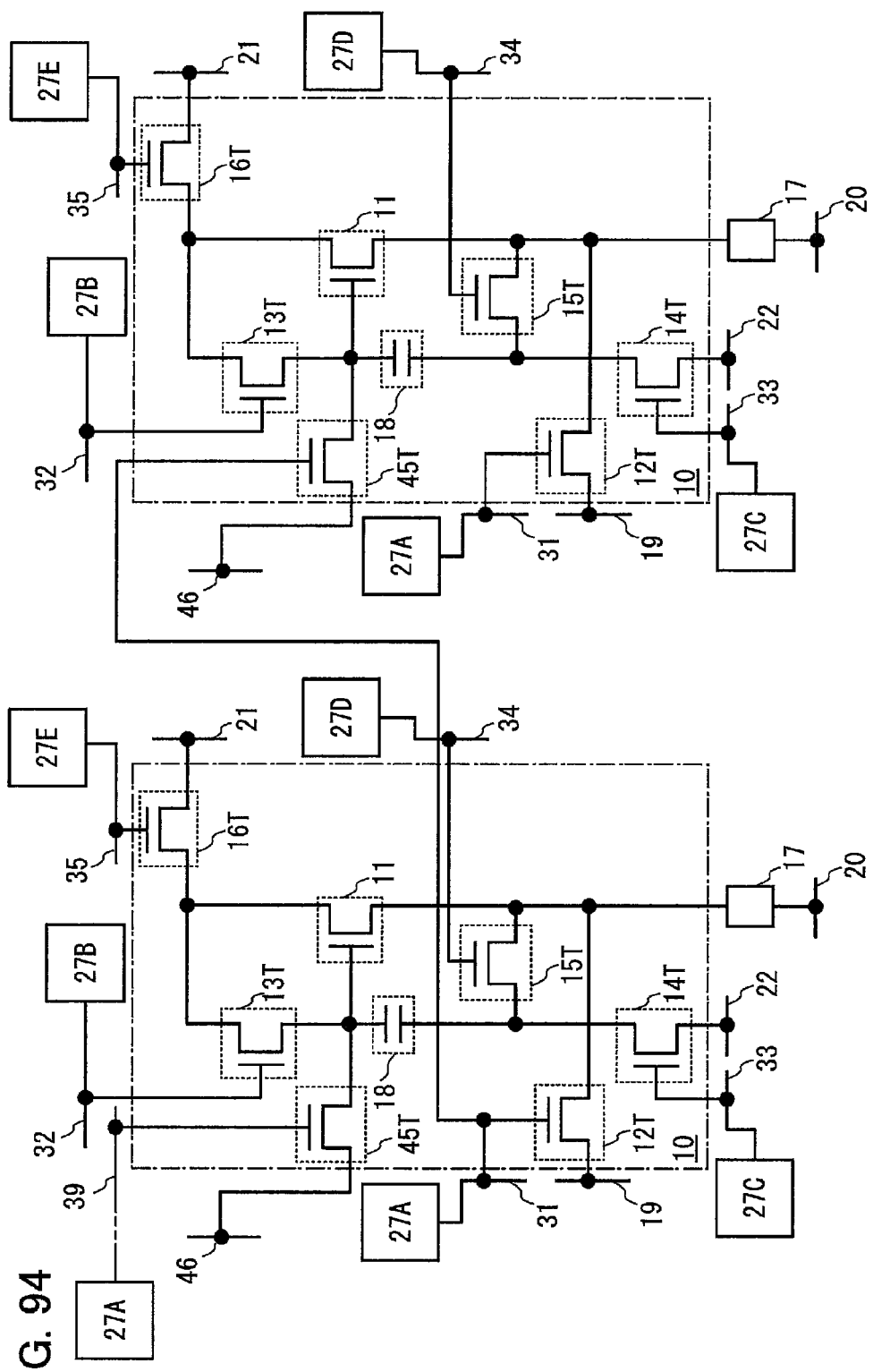
FIG. 94 is a circuit diagram illustrating an example of a circuit according to one embodiment of the present invention.
Figure 95:
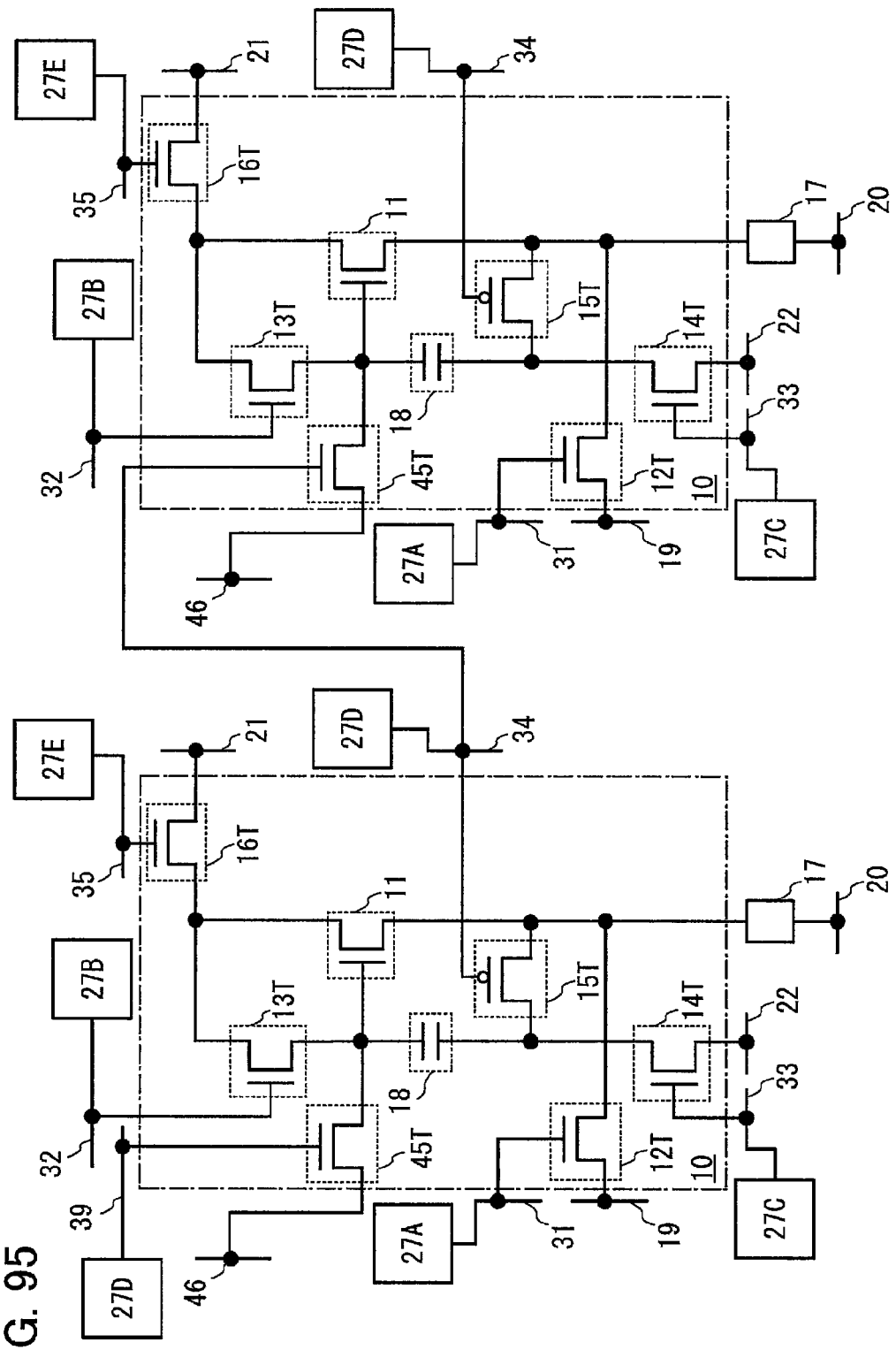
FIG. 95 is a circuit diagram illustrating an example of a circuit according to one embodiment of the present invention.
Figure 96:
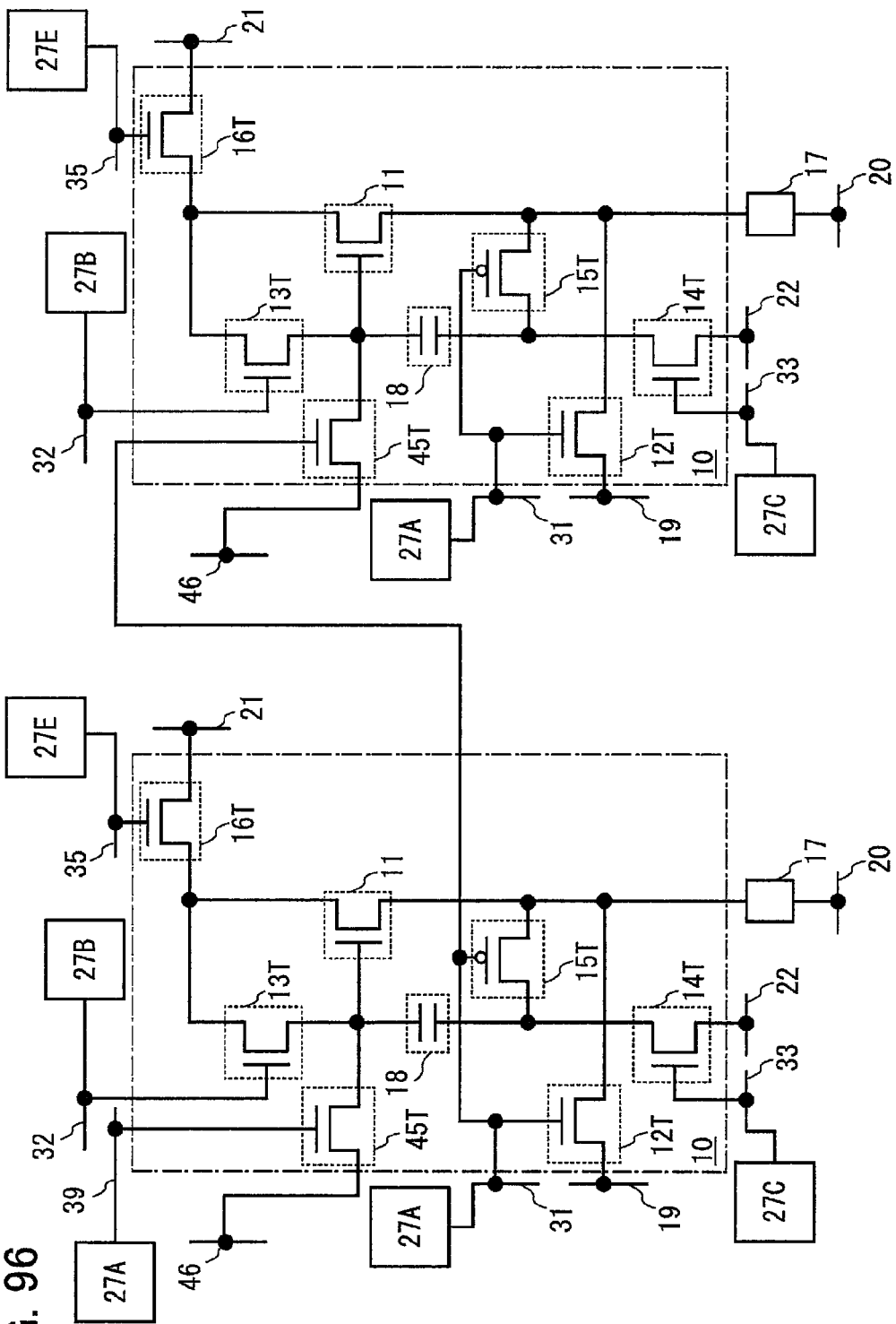
FIG. 96 is a circuit diagram illustrating an example of a circuit according to one embodiment of the present invention.

Although the wirings are combined in the pixel in FIG. 94, FIG. 95, and FIG. 96, the wirings can be connected outside the pixel region and provided as separate wirings in the pixel region as illustrated in FIG. 63B.

Note that it is possible to perform operation for correcting mobility with the use of the circuits in FIG. 19A and FIG. 20A in a manner similar to that in FIG. 5C or FIG. 6C in Embodiment 1. In that case, the switch 43 and the switch 45 are preferably in a non-conduction state.

Note that the switch 41 can be additionally provided in the circuit illustrated in FIG. 19A, FIG. 19B, FIG. 20A, or FIG. 20B, as in FIG. 17A. It is also possible to additionally provide the switch 42 in the circuit illustrated in FIG. 19A, FIG. 19B, FIG. 20A, or FIG. 20B, as in FIG. 18A.

Note that FIG. 19A, FIG. 20A, and the like each illustrate an example of a circuit structure; therefore, a transistor can be provided additionally. On the other hand, for each node in FIG. 19A, FIG. 20A, and the like, it is also possible not to provide an additional transistor, switch, passive element, or the like. For example, it is possible not to increase the number of transistors directly connected to the node A, the node B, the node C, the node D, the node E, the node F, the node G, and/or the node H.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 7)

In this embodiment, examples of a structure used for part of a signal line driver circuit of a display device including the circuit described in any of the above embodiments are described.

Figure 21:
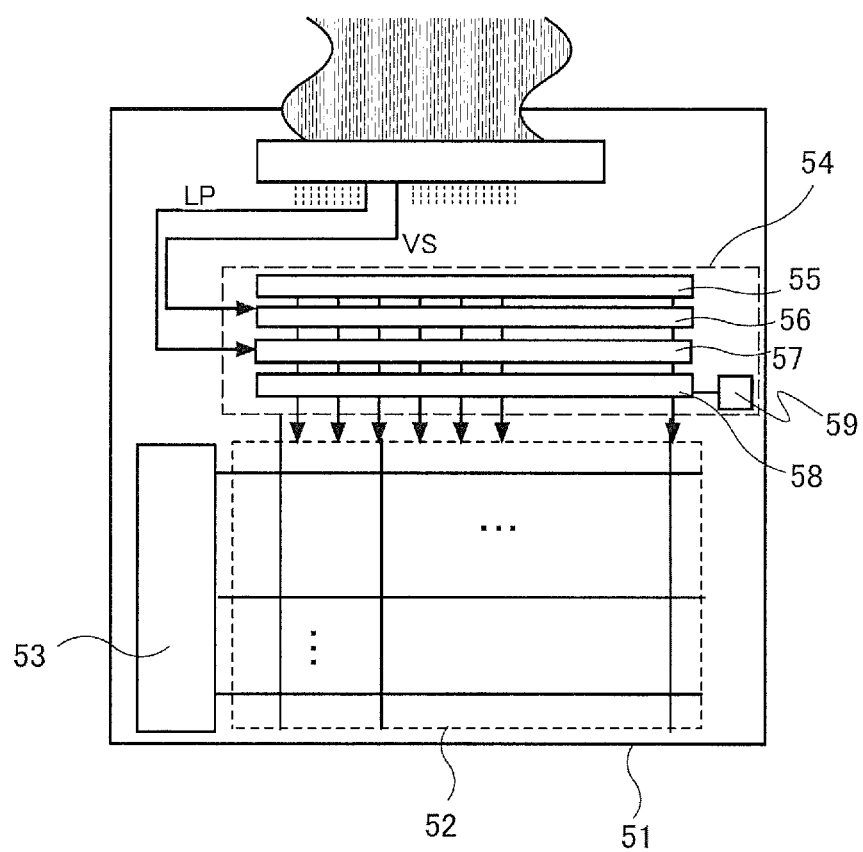
FIG. 21 is a block diagram illustrating an example of a circuit according to one embodiment of the present invention.

As illustrated in FIG. 21, a display device 51 to which the circuit described in any of the above embodiments is applied includes a pixel region 52, a gate line driver circuit 53, and a signal line driver circuit 54. The gate line driver circuit 53 sequentially outputs a selection signal to the pixel region 52. The signal line driver circuit 54 sequentially outputs a video signal to the pixel region 52. In the pixel region 52, an image is displayed by controlling the state of light in accordance with the video signal. The video signal input from the signal line driver circuit 54 to the pixel region 52 is current. That is, the states of a display element and an element for controlling the display element disposed in each pixel are changed by the video signal (current) input from the signal line driver circuit 54. Examples of the display element disposed in a pixel include an EL element, an element used in a field emission display (FED), a liquid crystal element, electronic ink, an electrophoretic element, and a grating light valve (GLV). Examples of a display device using a liquid crystal element include a liquid crystal display (e.g., a transmissive liquid crystal display, a transflective liquid crystal display, a reflective liquid crystal display, a direct-view liquid crystal display, or a projection liquid crystal display). Examples of a display device using electronic ink or an electrophoretic element include electronic paper.

Note that a plurality of gate line driver circuits 53 and a plurality of signal line driver circuits 54 may be provided.

The structure of the signal line driver circuit 54 can be divided into plural portions. For example, the signal line driver circuit 54 can be roughly divided into a shift register 55, a first latch circuit (LAT1) 56, a second latch circuit (LAT2) 57, and a digital-analog converter circuit 58. The digital-analog converter circuit 58 has a function of converting voltage into current, and it may also have a function of performing gamma correction. In other words, the digital-analog converter circuit 58 has a circuit which outputs current (video signal) to a pixel, that is, a current source circuit, to which the circuit described in any of the above embodiments can be applied.

In addition, a pixel has a display element such as an EL element. The pixel has a circuit which outputs current (video signal) to the display element, that is, a current source circuit, to which the circuit described in any of the above embodiments can be applied.

Here, the operation of the signal line driver circuit 54 is briefly described. The shift register 55 is formed using a plurality of columns of flip-flop circuits (FFs) and the like, and a clock signal (S-CLK), a start pulse (SP), and an inverted clock signal (S-CLKb) are input to the shift register 55. Sampling pulses are sequentially output in accordance with the timing of these signals.

The sampling pulses output from the shift register 55 are input to the first latch circuit (LAT1) 56. A video signal VS is input to the first latch circuit (LAT1) 56 from a video signal line. The first latch circuit 56 holds the video signal in each column in accordance with the timing at which the sampling pulse is input. Note that the video signal has a digital value in the case where the digital-analog converter circuit 58 is provided. Further, the video signal at this stage is voltage in many cases.

However, in the case where the first latch circuit 56 and the second latch circuit 57 are circuits which can store analog values, the digital-analog converter circuit 58 can be omitted in many cases. In that case, the video signal is current in many cases. Further, in the case where data output to the pixel region 52 has a binary value, that is, a digital value, the digital-analog converter circuit 58 can be omitted in many cases.

After holding of video signals is completed up to the last column in the first latch circuit (LAT1) 56, a latch pulse (LP) is input from a latch control line in a horizontal retrace period, and the video signals which have been held in the first latch circuit (LAT1) 56 are transferred to the second latch circuit (LAT2) 57 all at once. After that, the video signals held in the second latch circuit (LAT2) 57 for one row are input to the digital-analog converter circuit 58 at a time. Then, signals output from the digital-analog converter circuit 58 are input to the pixel region 52.

While the video signals held in the second latch circuit (LAT2) 57 are input to the digital-analog converter circuit 58 and then input to the pixel region 52, sampling pulses are output from the shift register 55 again. In other words, two operations are performed concurrently. Accordingly, line sequential driving can be performed. Hereafter, the above operation is repeated.

In the case where the current source circuit in the digital-analog converter circuit 58 is a circuit which performs setting operation and output operation, a circuit for supplying current to the current source circuit is needed. In that case, a reference current source circuit 59 is provided.

Note that the signal line driver circuit or part thereof may be formed using, for example, an external IC chip instead of being provided over the same substrate as the pixel region 52. In that case, the IC chip and the substrate are connected by chip on glass (COG) or tape automated bonding (TAB) or using a printed board or the like.

Note that the structure of the signal line driver circuit or the like is not limited to that in FIG. 21.

Figure 22:
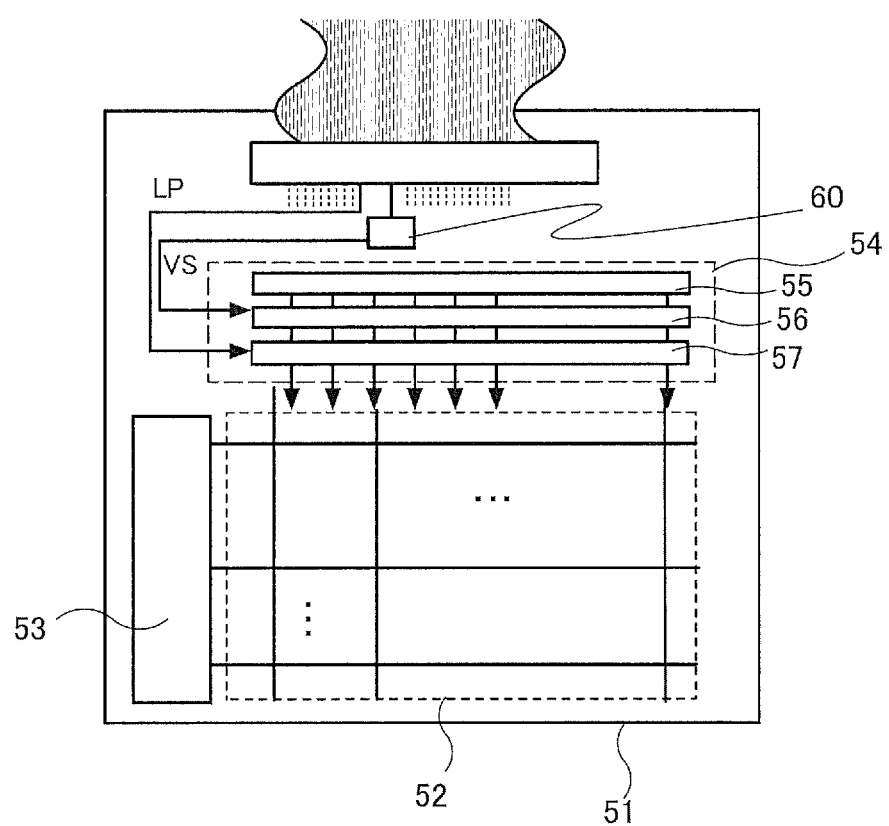
FIG. 22 is a block diagram illustrating an example of a circuit according to one embodiment of the present invention.

For example, in the case where the first latch circuit 56 and the second latch circuit 57 can store analog values, the video signal VS (analog current) is input to the first latch circuit (LAT1) 56 from a reference current source circuit 60 as illustrated in FIG. 22 in some cases. Further, the second latch circuit 57 is not provided in FIG. 22 in some cases.

Next, a specific structure where the circuit described in any of the above embodiments is applied to the signal line driver circuit 54 is described.

Figure 23:
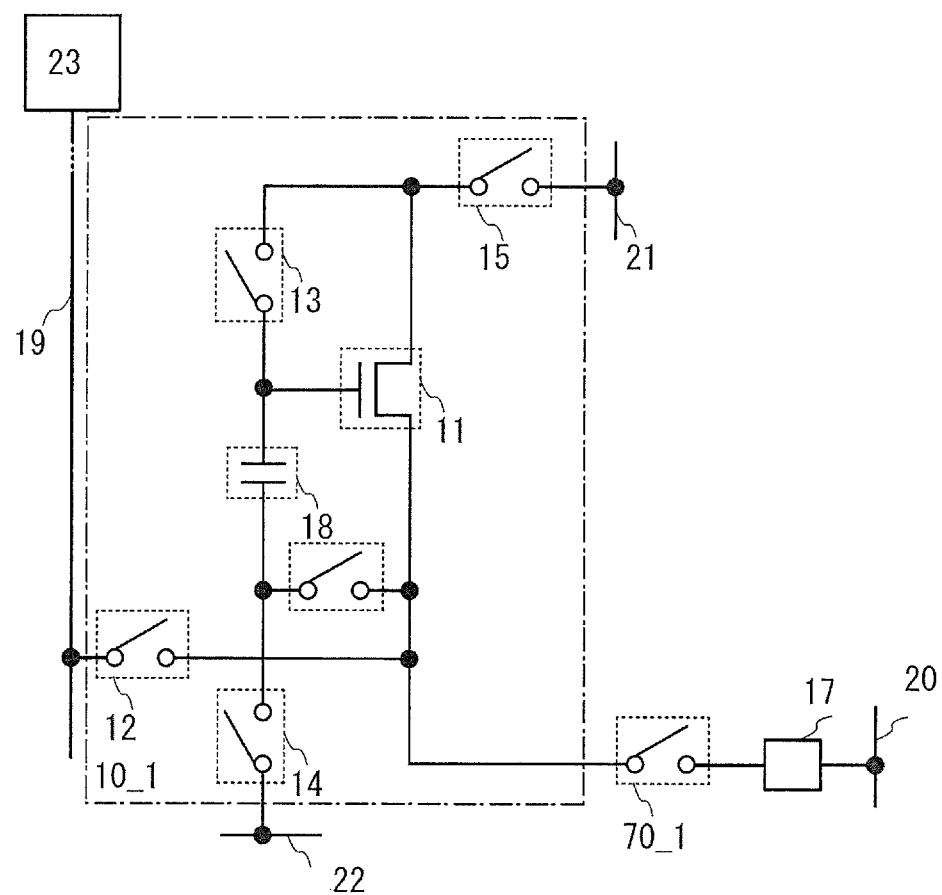
FIG. 23 is a circuit diagram illustrating an example of a circuit according to one embodiment of the present invention.

First, FIG. 23 illustrates an example of a circuit structure of the circuit described in any of the above embodiments, which is applied to the signal line driver circuit. A circuit 10_1 illustrated in FIG. 23 has the same structure as the circuit 10 described with reference to FIG. 1A in Embodiment 1. Note that components in common with those in FIG. 1A are denoted by common reference numerals, and description thereof is omitted. In accordance with Vsig from the circuit 23, the circuit 10_1 illustrated in FIG. 23 can output current which is less affected by variation in the threshold voltage of the transistor 11.

Supply of current which is less affected by variation in the threshold voltage set in the circuit 10_1 is controlled by the switching of a switch 70_1 provided between the circuit 10_1 and the load 17. In that case, for example, it is possible to provide a plurality of circuits 10_1 and to control the amount of current flowing to the load with switches 70_1.

Figure 24:
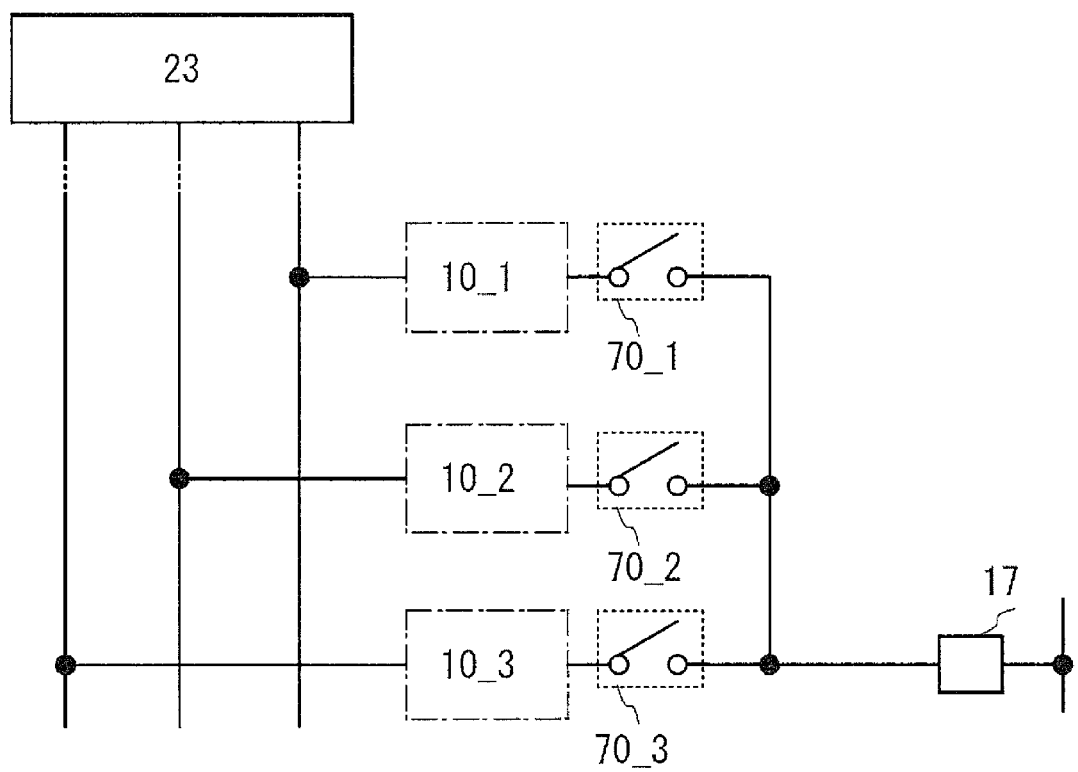
FIG. 24 is a circuit diagram illustrating an example of a circuit according to one embodiment of the present invention.

For example, a structure illustrated in FIG. 24 can be employed. In the structure, circuits 10_1 to 103 are provided as the plurality of circuits and the amount of current flowing to the load 17 is controlled by switches 70_1 to 70_3. The amount of current flowing in the circuits 10_1 to 10_3 may be set by the circuit 23 so as to vary or be equal between the circuits, and the amount of current flowing to the load 17 may be controlled by the switches.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.
(Embodiment 8)

In this embodiment, examples of structures of a top view and a cross-sectional view corresponding to the circuit structure of the pixel illustrated in FIG. 25 in Embodiment 1 are described.

Figure 37:
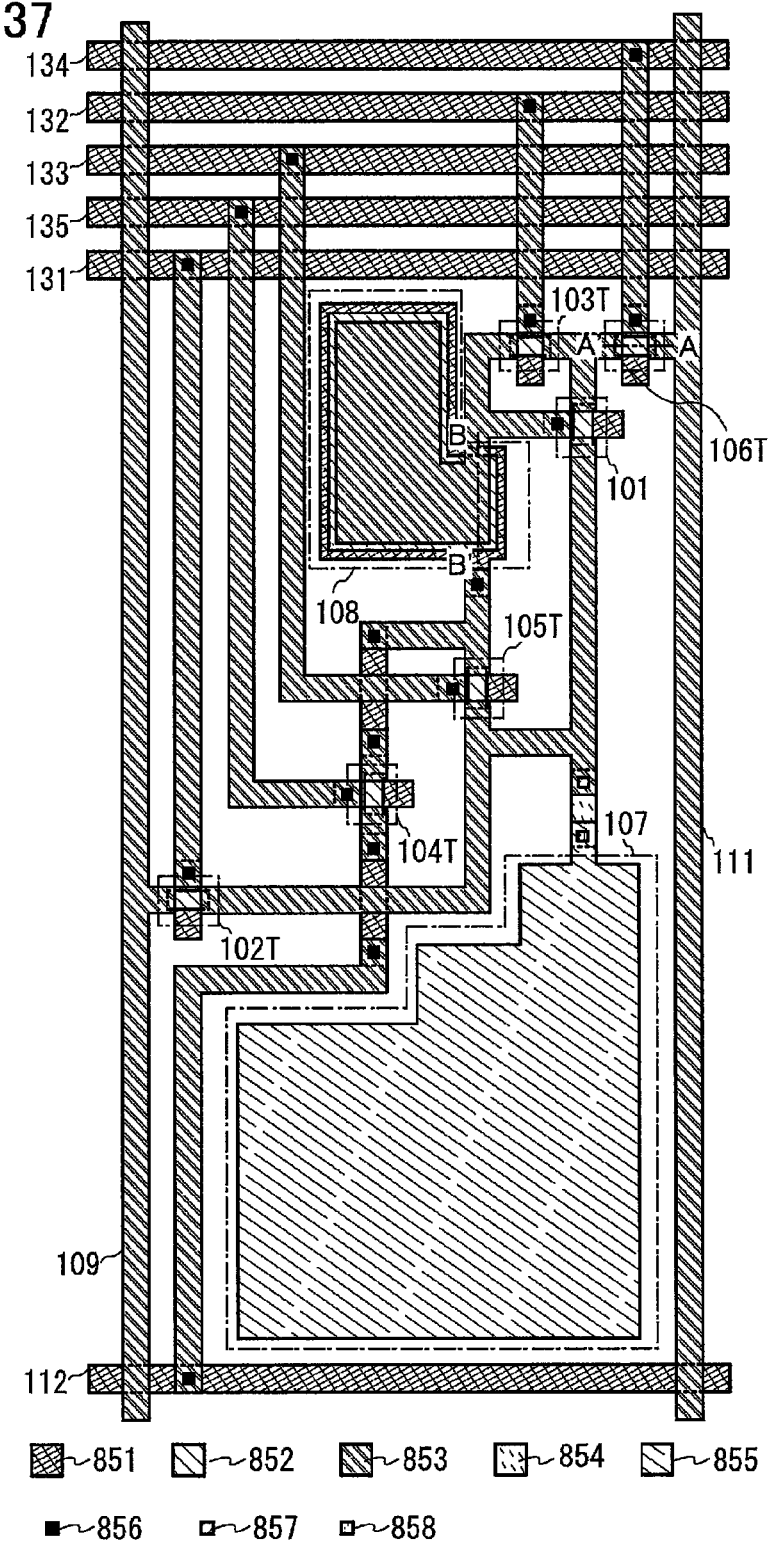
FIG. 37 is a top view illustrating an example of a pixel according to one embodiment of the present invention.

A top view of FIG. 37 illustrates the structure described with reference to FIG. 25 in Embodiment 1. In the top view of FIG. 37, each transistor is an inverted staggered transistor.

FIG. 37, which is a top view of a pixel applicable to a display device, illustrates the transistor 101, the transistor 102T, the transistor 103T, the transistor 104T, the transistor 105T, the transistor 106T, the light-emitting element 107 (only one electrode thereof is illustrated), the capacitor 108, the wiring 109, the wiring 111, the wiring 112, the wiring 131, the wiring 132, the wiring 133, the wiring 134, and the wiring 135 as components corresponding to those in FIG. 25.

The components illustrated in FIG. 37 include a conductive layer 851, a semiconductor layer 852, a conductive layer 853, a conductive layer 854, a conductive layer 855, a contact hole 856, a contact hole 857, and a contact hole 858. Note that an insulating layer in each layer is not illustrated here.

The conductive layer 851 has regions functioning as a gate electrode and a scan line. Note that the conductive layer 851 is provided over a substrate over which an element such as a transistor is formed. A base insulating layer may be provided between the substrate and the conductive layer 851.

Although there is no particular limitation on a substrate that can be used as the substrate, a glass substrate is preferably used. Note that the base insulating layer has a function of preventing diffusion of an impurity element from the substrate, and can be formed to have a single-layer structure or a stacked structure using one or more layers selected from a silicon nitride layer, a silicon oxide layer, a silicon nitride oxide layer, and a silicon oxynitride layer.

Examples of the substrate include a semiconductor substrate (e.g., a single crystal substrate or a silicon substrate), an SOI substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, and a base material film. As examples of the glass substrate, a barium borosilicate glass substrate, an aluminoborosilicate glass substrate, and a soda-lime glass substrate can be given. For the flexible substrate, a flexible synthetic resin such as plastics typified by polyethylene terephthalate (PET), polyethylene naphthalate (PEN), and polyether sulfone (PES), or acrylic can be used, for example. For the attachment film, polypropylene, polyester, polyvinyl fluoride, or polyvinyl chloride can be used, for example. For the base material film, polyester, polyamide, polyimide, an inorganic material vapor deposited film, or paper can be used, for example. In particular, by forming transistors with the use of a semiconductor substrate, a single crystal substrate, an SOI substrate, or the like, small-size transistors with less variation in characteristic, size, shape, or the like and with high current supply capability can be formed. By forming a circuit with the use of such transistors, the power consumption of the circuit can be reduced or the circuit can be highly integrated.

Note that a transistor may be formed using one substrate, and then, the transistor may be transferred to another substrate. Example of a substrate to which a transistor is transferred are, in addition to the above-described substrate over which the transistor can be formed, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, and a rubber substrate. By using such a substrate, transistors with excellent properties or transistors with low power consumption can be formed, a device with high durability or high heat resistance can be formed, or reduction in weight or thickness can be achieved.

The conductive layer 851 can be formed to have a single-layer structure or a stacked structure using one or more of metal materials such as molybdenum (Mo), titanium (Ti), chromium (Cr), tantalum (Ta), tungsten (W), aluminum (Al), copper (Cu), neodymium (Nd), and scandium (Sc) and an alloy material containing any of these metal materials as a main component.

The semiconductor layer 852 has a region functioning as semiconductor layers of the transistors.

The semiconductor layer 852 may include amorphous silicon. The semiconductor layer 852 may include polycrystalline silicon. Alternatively, the semiconductor layer 852 may include an organic semiconductor, an oxide semiconductor, or the like.

The conductive layer 853 has regions functioning as a wiring and sources and drains of the transistors.

The conductive layer 853 can be fowled using, for example, an element selected from Al, Cr, Cu, Ta, Ti, Mo, and W, an alloy containing any of these elements as a component, or an alloy film containing any of these elements in combination. Further, a structure may be employed in which a high-melting-point metal layer of Ti, Mo, W, or the like is stacked on one or both of a top side and a bottom side of a metal layer of Al, Cu, or the like. When an Al material to which an element (e.g., Si, Nd, or Sc) which prevents generation of hillocks and whiskers in an Al film is added is used, heat resistance can be improved.

Alternatively, the conductive layer 853 may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$; abbreviated to ITO), indium zinc oxide ($In_2O_3$—ZnO), or any of these metal oxide materials containing silicon oxide can be used.

The conductive layer 854 has a region functioning as a wiring. Note that the conductive layer 854 is provided to improve the planarity of an insulating layer formed later in contact with a transparent conductive layer and is not necessarily provided.

The conductive layer 855 has a region functioning as one electrode of the light-emitting element. The conductive layer 855 has a function of reflecting light in the case where light emitted from the light-emitting element is extracted from the counter substrate side. The conductive layer 855 has a function of transmitting light in the case where light emitted from the light-emitting element is extracted from the element substrate side.

The contact hole 856 has a function of connecting the conductive layer 851 and the conductive layer 853. An insulating layer functioning as a gate insulating layer is provided between the conductive layer 851 and the conductive layer 853. The insulating layer functioning as a gate insulating layer can be formed by a plasma CVD method, a sputtering method, or the like to have a single-layer structure or a stacked structure using one or more of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer.

The contact hole 857 has a function of connecting the conductive layer 853 and the conductive layer 854. An insulating layer functioning as a passivation layer is provided between the conductive layer 853 and the conductive layer 854. For the passivation layer, an inorganic insulating film such as a silicon nitride film, an aluminum nitride film, a silicon nitride oxide film, or an aluminum nitride oxide film can be used.

The contact hole 858 has a function of connecting the conductive layer 854 and the conductive layer 855. An insulating layer for surface planarization is provided between the conductive layer 854 and the conductive layer 855. For the insulating layer for surface planarization, an organic material such as polyimide, acrylic, or a benzocyclobutene-based resin can be used. Other than such organic materials, it is also possible to use a low-dielectric constant material (low-k material) or the like.

Next, a structure of a cross section (along dashed-two dotted line A-A' in FIG. 37) of the transistor 106T and a structure of a cross section (along dashed-two dotted line B-B' in FIG. 37) of the capacitor 108 which are illustrated in the top view of FIG. 37 are described with reference to FIGS. 26A and 26B.

Figure 26A:
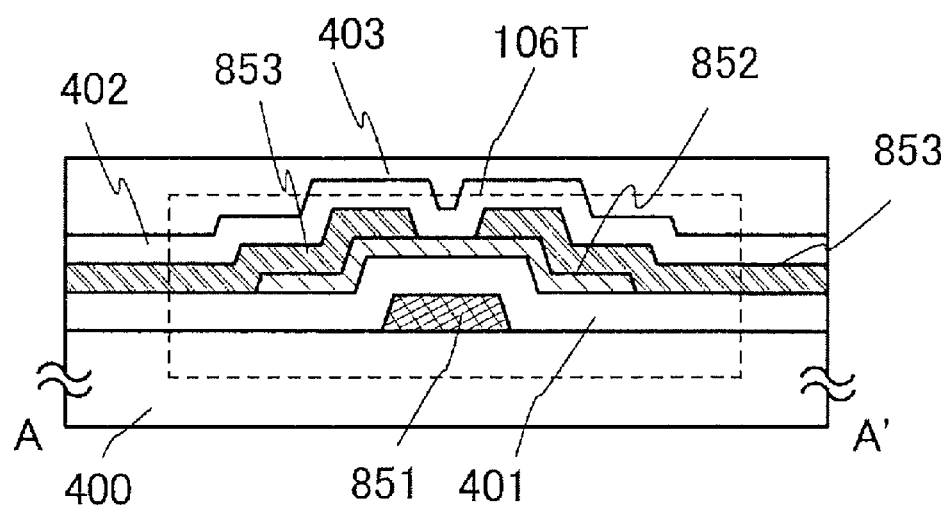
FIGS. 26A and 26B are cross-sectional views illustrating an example of a pixel according to one embodiment of the present invention.

The transistor 106T illustrated in FIG. 26A is an example of a bottom-gate transistor and is also referred to as an inverted staggered transistor. Note that there is no particular limitation on the structure of the transistor; for example, a staggered type transistor or a planar type transistor having a top-gate structure or a bottom-gate structure can be employed. Further, the transistor may have a single-gate structure including one channel formation region, a double-gate structure including two channel formation regions, or a triple-gate structure including three channel formation regions. Alternatively, the transistor may have a dual-gate structure including two gate electrode layers provided over and below a channel region with a gate insulating layer positioned therebetween.

The transistor 106T illustrated in the cross-sectional view of FIG. 26A includes, over a substrate 400, the conductive layer 851 serving as a gate, an insulating layer 401 functioning as a gate insulating layer, the semiconductor layer 852, and the conductive layer 853 serving as a source and a drain. An insulating layer 402 is provided as a passivation layer so as to cover the transistor 106T. An insulating layer 403 for surface planarization is provided over the insulating layer 402.

Figure 26B:
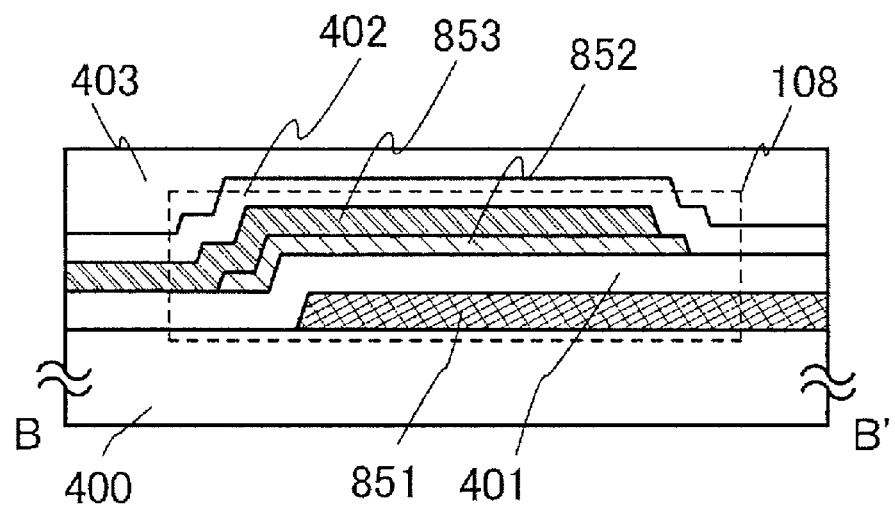

The capacitor 108 illustrated in the cross-sectional view of FIG. 26B includes, over the substrate 400, the conductive layer 851 serving as one electrode, the insulating layer 401, the semiconductor layer 852, and the conductive layer 853 serving as the other electrode. The insulating layer 402 is provided as a passivation layer so as to cover the capacitor 108. The insulating layer 403 for surface planarization is provided over the insulating layer 402.

Note that a top view of the pixel which can be applied to a display device is not limited to the top view of FIG. 37, and another structure can be employed.

Figure 38:
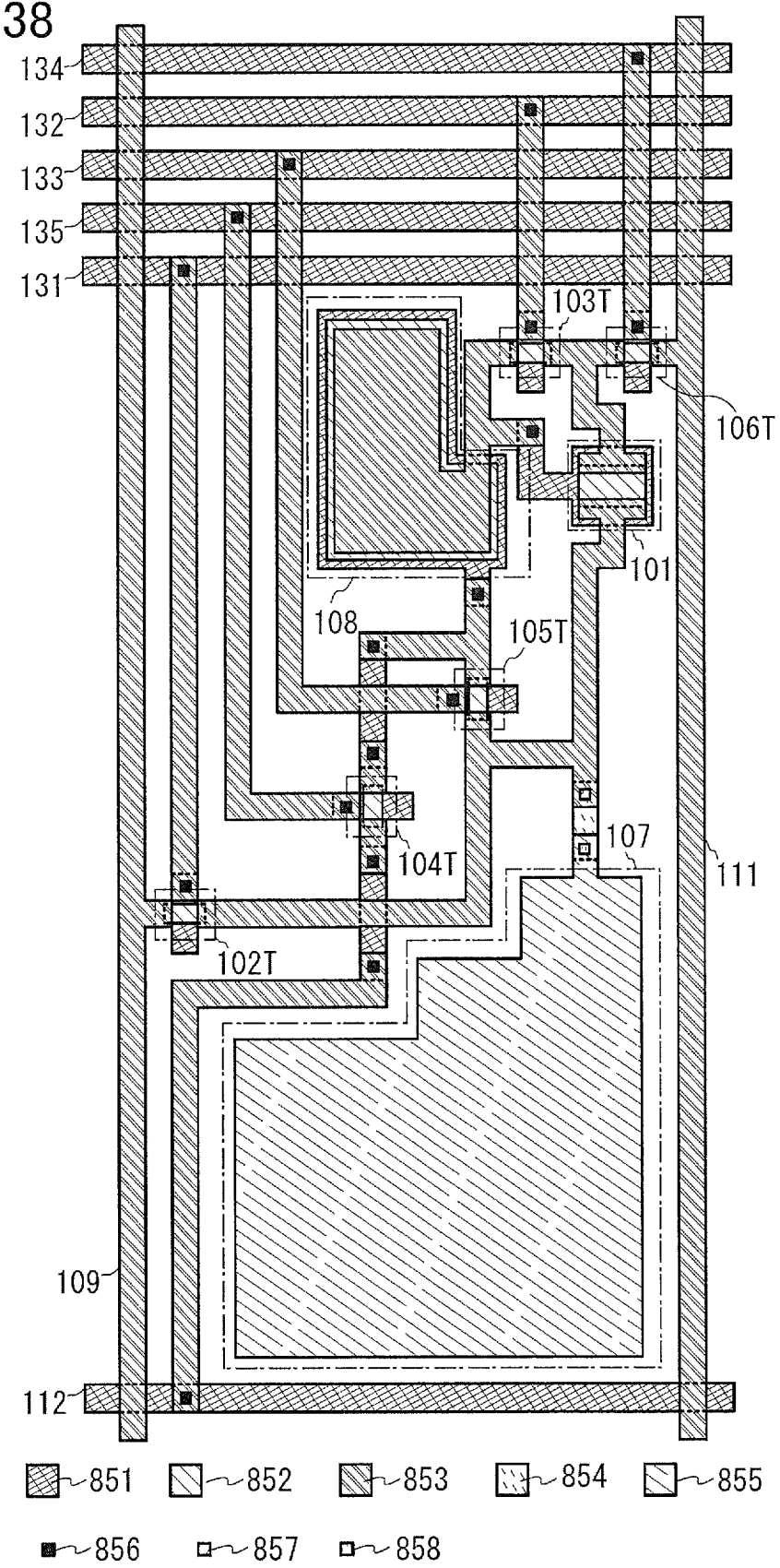
FIG. 38 is a top view illustrating an example of a pixel according to one embodiment of the present invention.

As another top-view structure, a top view of FIG. 38 can be employed. FIG. 38 is different from FIG. 37 in that the size of the transistor 101 which allows the circuit to function as a current source is larger than the size of the transistor functioning as a switch. With this structure, the amount of current flowing through the transistor 101 which allows the circuit to function as a current source can be increased.

Figure 39:
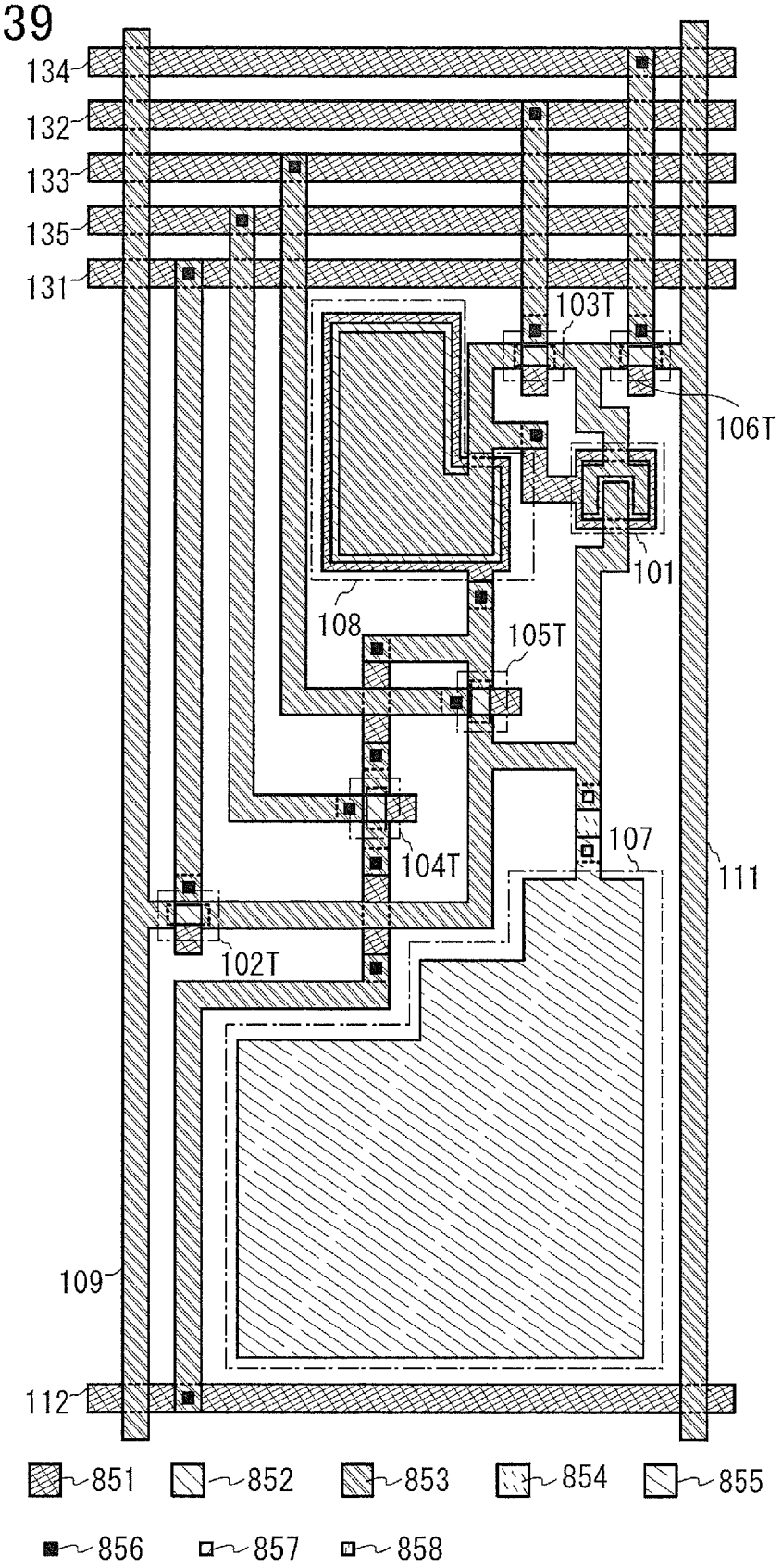
FIG. 39 is a top view illustrating an example of a pixel according to one embodiment of the present invention.

As another top-view structure, a top view of FIG. 39 can be employed. FIG. 39 is different from FIG. 37 in that an electrode serving as the other terminal of the transistor 101 which allows the circuit to function as a current source has a U-shape to surround an electrode serving as the one terminal of the transistor 101. With this structure, the amount of current flowing through the transistor 101 which allows the circuit to function as a current source can be increased.

Figure 40:
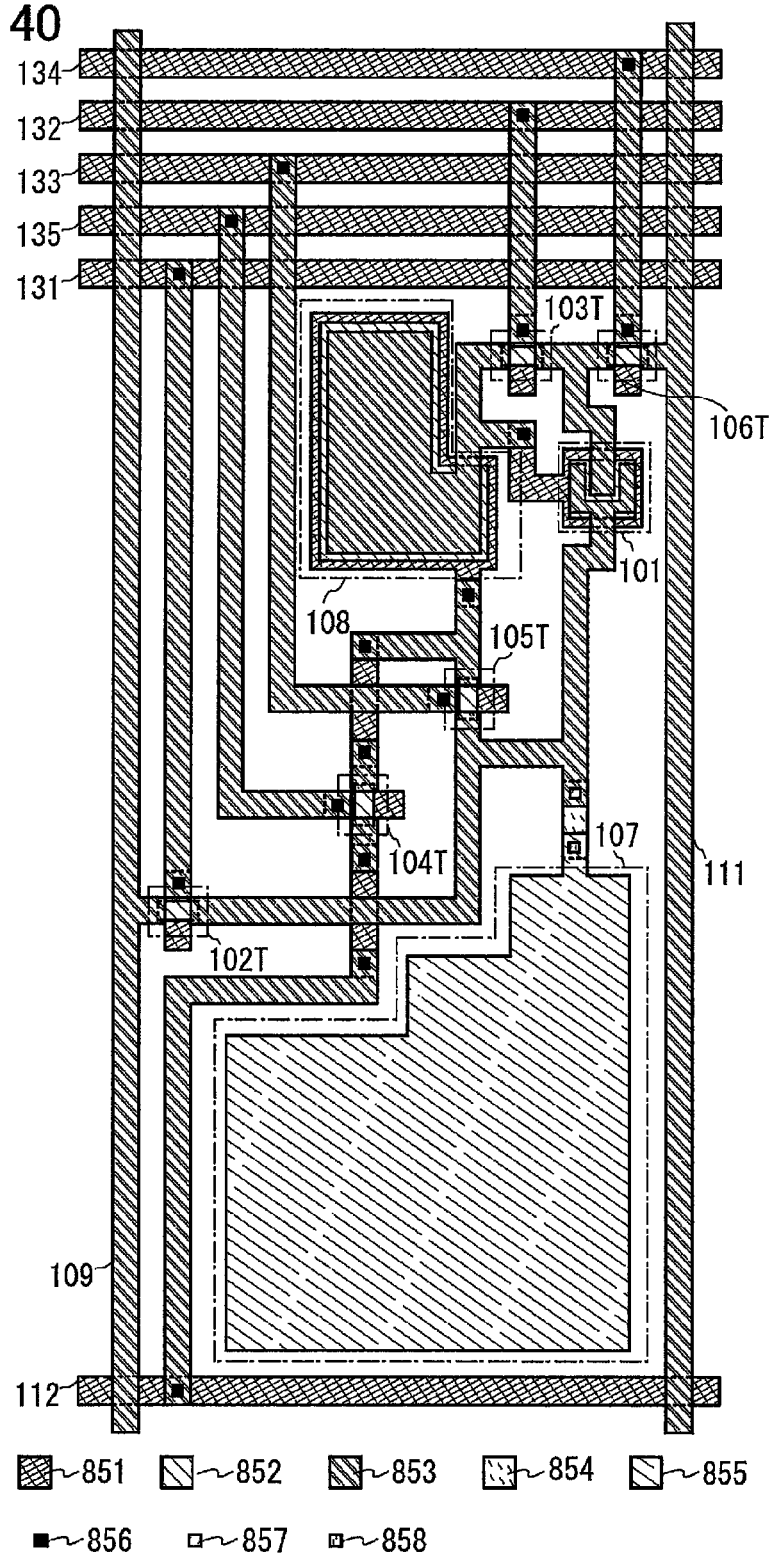
FIG. 40 is a top view illustrating an example of a pixel according to one embodiment of the present invention.

As another top-view structure, a top view of FIG. 40 can be employed. FIG. 40 is different from FIG. 37 in that an electrode serving as the one terminal of the transistor 101 which allows the circuit to function as a current source has a U-shape to surround an electrode serving as the other terminal of the transistor 101. With this structure, the amount of current flowing through the transistor 101 which allows the circuit to function as a current source can be increased. Further, parasitic capacitance generated when the potential of the gate of the transistor 101 is increased by capacitive coupling can be increased.

Figure 41:
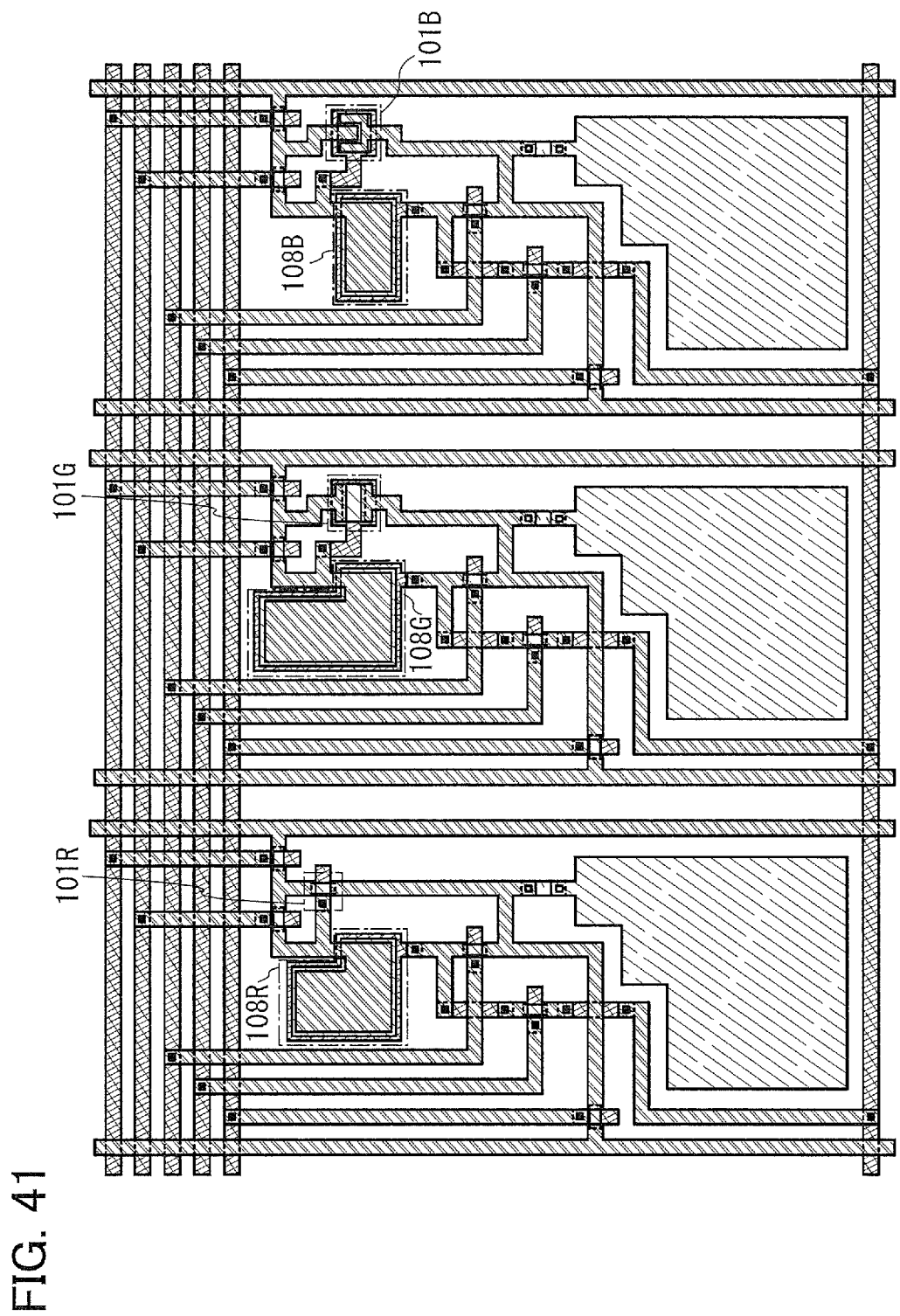
FIG. 41 is a top view illustrating an example of pixels according to one embodiment of the present invention.

Note that, in the case where pixels including light-emitting elements of different colors each have the structure in FIG. 25 and are arranged in parallel, the pixels may have top-view structures in which the sizes of the capacitors 108 or the transistors 101 which allow the circuits to function as current sources differ between the colors. FIG. 41 illustrates a top-view structure where the sizes of the transistors 101 which allow the circuits to function as current sources differ between colors. A transistor 101R in FIG. 41 is a transistor which allows the circuit to function as a current source in a pixel including a light-emitting element which emits red light. A transistor 101G in FIG. 41 is a transistor which allows the circuit to function as a current source in a pixel including a light-emitting element which emits green light. A transistor 101B in FIG. 41 is a transistor which allows the circuit to function as a current source in a pixel including a light-emitting element which emits blue light. A capacitor 108R in FIG. 41 is a capacitor in the pixel including the light-emitting element which emits red light. A capacitor 108G in FIG. 41 is a capacitor in the pixel including the light-emitting element which emits green light. A capacitor 108B in FIG. 41 is a capacitor in the pixel including the light-emitting element which emits blue light. With this structure, a proper amount of current can be supplied to each light-emitting element of the corresponding color.

Figure 42:
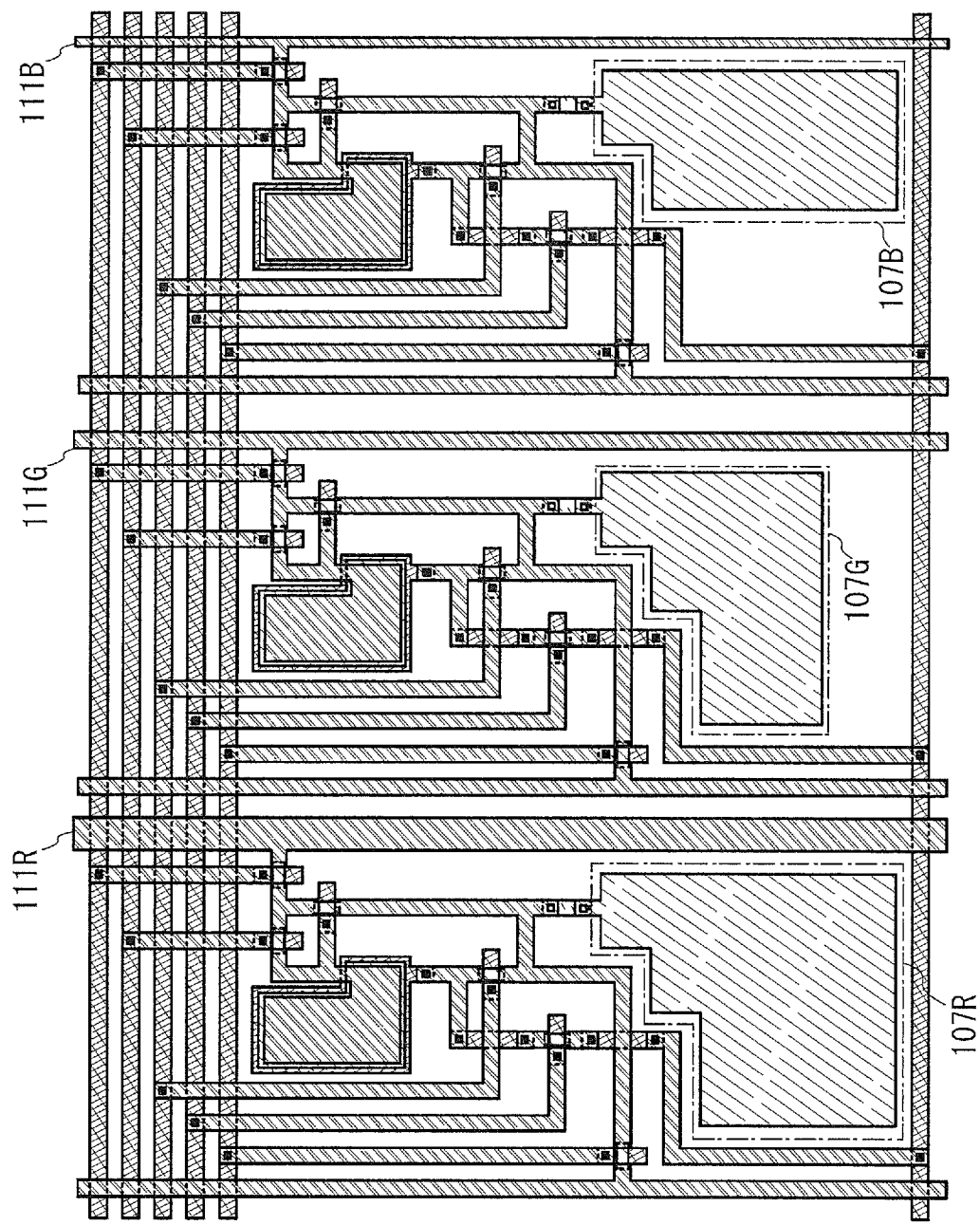
FIG. 42 is a top view illustrating an example of pixels according to one embodiment of the present invention.

Note that, in the case where pixels including light-emitting elements of different colors each have the structure in FIG. 25 and are arranged in parallel, the pixels may have top-view structures in which the widths of the wirings 111 functioning as power supply lines differ between the colors. FIG. 42 illustrates a top-view structure where the widths of the wirings 111 functioning as power supply lines differ between colors. A wiring 111R in FIG. 42 is a wiring for supplying current to a light-emitting element which emits red light. A wiring 111G in FIG. 42 is a wiring for supplying current to a light-emitting element which emits green light. A wiring 111B in FIG. 42 is a wiring for supplying current to a light-emitting element which emits blue light. With this structure, a proper amount of current can be supplied to each light-emitting element of the corresponding color.

Further, in the case where pixels including light-emitting elements of different colors each have the structure in FIG. 25 and are arranged in parallel, the pixels may have top-view structures in which the sizes of the electrodes of the light-emitting elements 107 differ between the colors. A top-view structure where the sizes of the electrodes of the light-emitting elements 107 differ between colors is also illustrated in FIG. 42. A light-emitting element 107R in FIG. 42 corresponds to an electrode of a light-emitting element which emits red light. A light-emitting element 107G in FIG. 42 corresponds to an electrode of a light-emitting element which emits green light. A light-emitting element 107B in FIG. 42 corresponds to an electrode of a light-emitting element which emits blue light. With this structure, the balance of the luminance between the colors can be adjusted.

Figure 43:
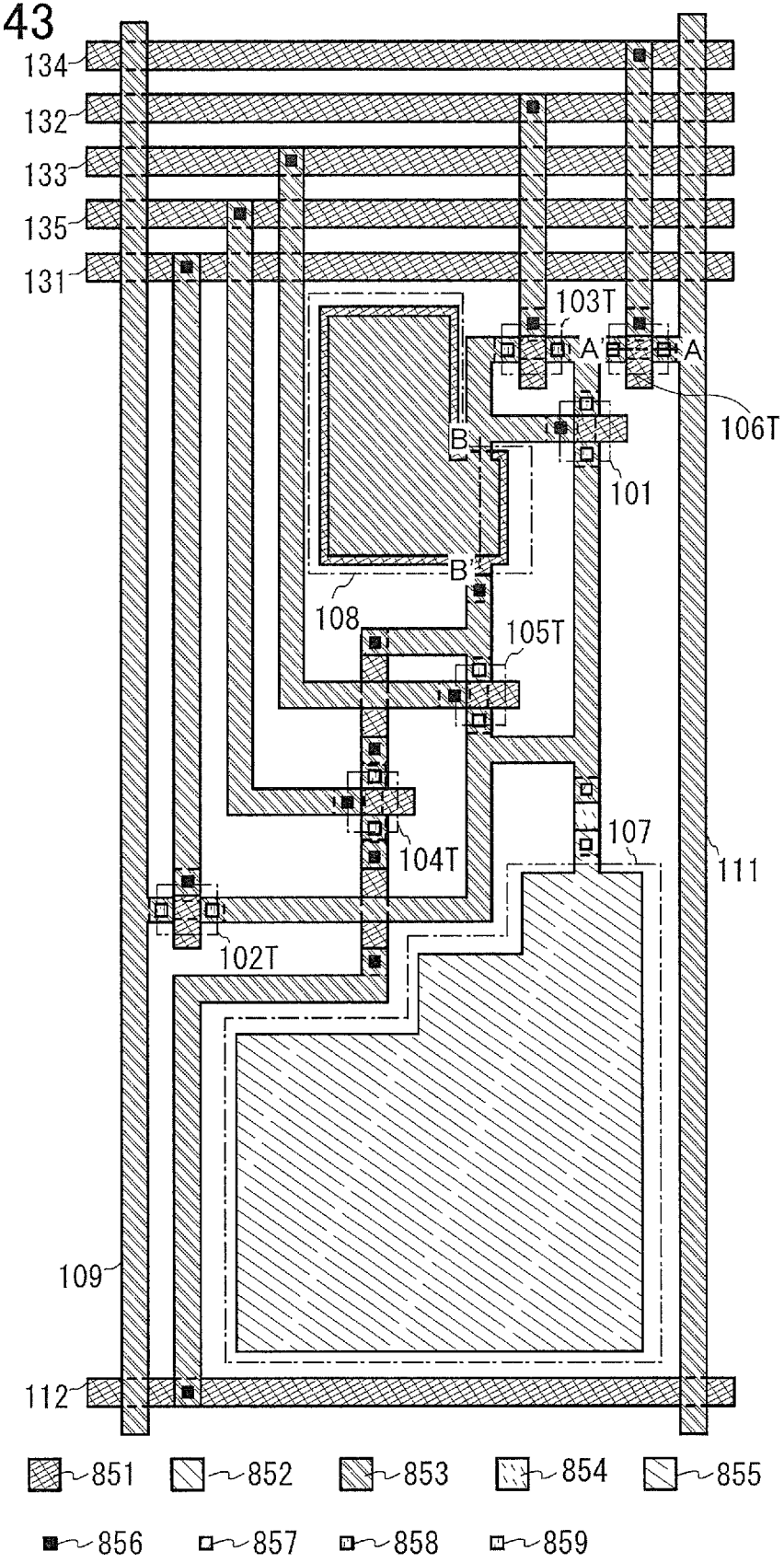
FIG. 43 is a top view illustrating an example of a pixel according to one embodiment of the present invention.

The above top views illustrate an inverted staggered transistor as each transistor, but the transistors may be top-gate transistors. FIG. 43 is a top view where each transistor included in a pixel is a top-gate transistor. In the case of using a top-gate transistor, a contact hole 859 is added to the top-view structure illustrated in FIG. 37.

The contact hole 859 has a function of connecting the semiconductor layer 852 and the conductive layer 853.

In the case where the transistor included in the pixel is a top-gate transistor as illustrated in FIG. 43, a semiconductor layer of the transistor is preferably formed using amorphous silicon or polycrystalline silicon. With this structure, the semiconductor layer can be used as a wiring between transistors in such a manner that an impurity element such as phosphorus or boron is introduced into the semiconductor layer to increase conductivity thereof.

Here, a structure of a cross section (along dashed-two dotted line A-A' in FIG. 43) of the transistor 106T and a structure of a cross section (along dashed-two dotted line B-B' in FIG. 43) of the capacitor 108 which are illustrated in the top view of FIG. 43 are described with reference to FIGS. 27A and 27B.

Figure 27A:
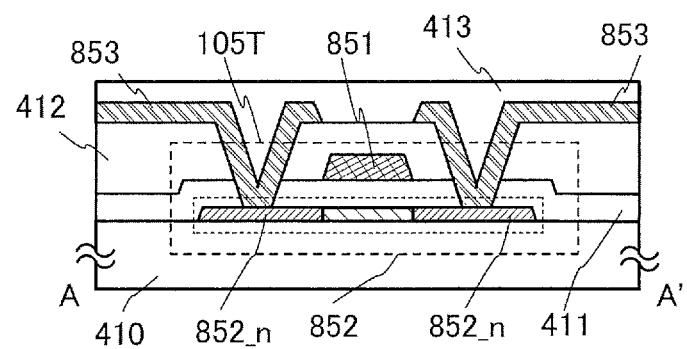
FIGS. 27A and 27B are cross-sectional views illustrating an example of a pixel according to one embodiment of the present invention.

The transistor 106T illustrated in FIG. 27A is an example of a top-gate transistor. Further, the transistor may have a single-gate structure including one channel formation region, a double-gate structure including two channel formation regions, or a triple-gate structure including three channel formation regions. Alternatively, the transistor may have a dual-gate structure including two gate electrode layers provided over and below a channel region with a gate insulating layer positioned therebetween.

The transistor 106T illustrated in the cross-sectional view of FIG. 27A includes, over a substrate 410, the semiconductor layer 852 including impurity regions 852n into which an impurity is introduced to improve conductivity, an insulating layer 411 functioning as a gate insulating layer, the conductive layer 851 serving as a gate, an insulating layer 412 functioning as an interlayer insulating layer, and the conductive layer 853 functioning as a source and a drain. An insulating layer 413 for surface planarization is provided to cover the insulating layer 412 and the conductive layer 853.

Figure 27B:
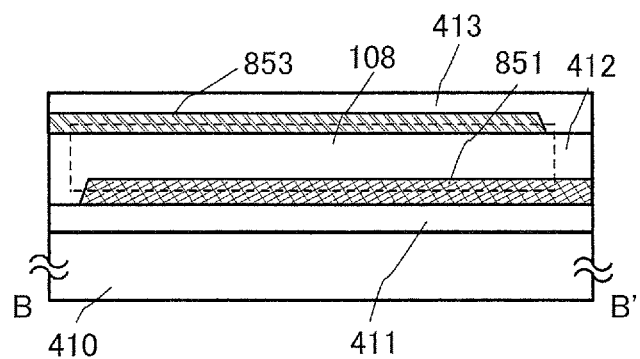

The capacitor 108 illustrated in the cross-sectional view of FIG. 27B includes, over the substrate 410, the insulating layer 411, the conductive layer 851 serving as one electrode, the insulating layer 412, and the conductive layer 853 serving as the other electrode. The insulating layer 413 for surface planarization is provided to cover the insulating layer 412 and the conductive layer 853.

Figure 44:
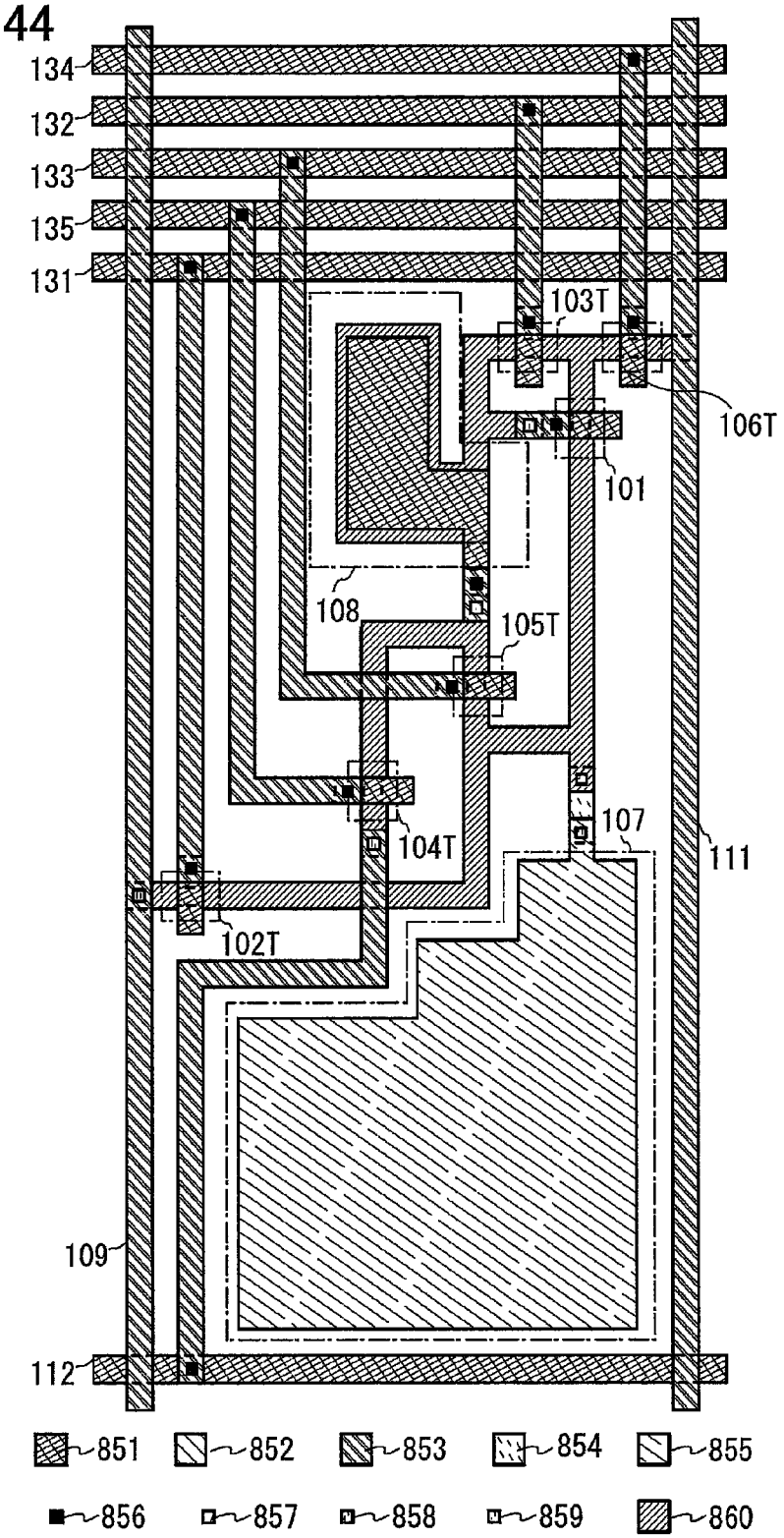
FIG. 44 is a top view illustrating an example of a pixel according to one embodiment of the present invention.

FIG. 44 illustrates a top-view structure where a semiconductor layer is formed using amorphous silicon or polycrystalline silicon and the semiconductor layer is used as a wiring between transistors in such a manner that an impurity element such as phosphorus or boron is introduced into the semiconductor layer to increase conductivity thereof. A semiconductor layer 860 in FIG. 44 is a semiconductor layer whose conductivity is increased by introduction of an impurity element.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 9)

In FIG. 25 in Embodiment 1, each transistor included in the pixel of the display device is an n-channel transistor. In this embodiment, a circuit structure where a p-channel transistor is used for the pixel of the display device is described.

Figure 45:
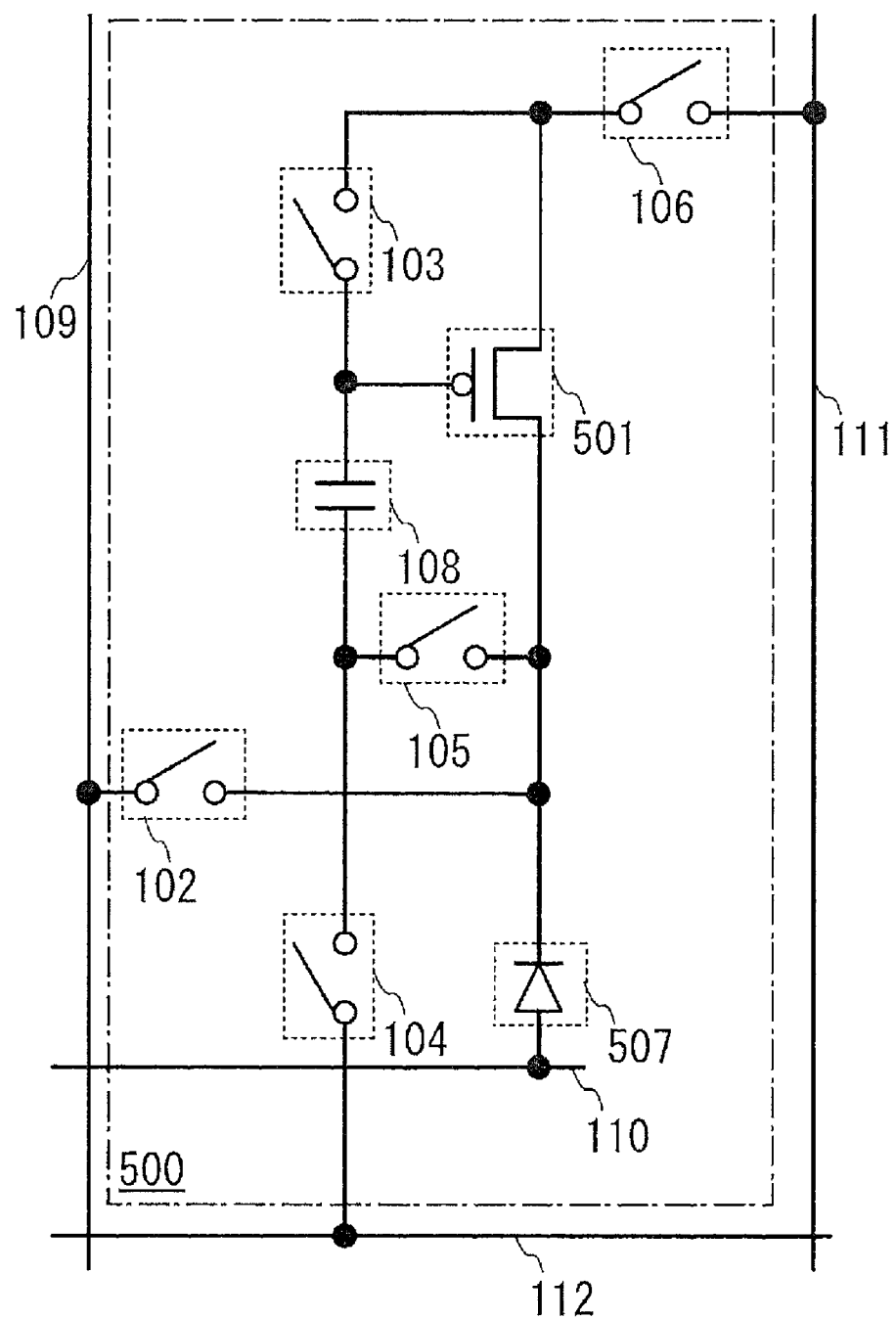
FIG. 45 is a circuit diagram illustrating an example of a pixel according to one embodiment of the present invention.

The transistor 101 of the pixel 100 in FIG. 25 is an n-channel transistor, but a p-channel transistor 501 of a pixel 500 illustrated in FIG. 45 can be used instead.

As shown by comparison with FIG. 25, the connection of a light-emitting element is changed in FIG. 45 so that the direction of current flowing therethrough is opposite to that in the case of the light-emitting element 107. Specifically, a circuit structure where a light-emitting element 507 is connected as in FIG. 45 may be employed.

In FIG. 45, Vcat supplied to the wiring 110 in FIG. 25 and the potential VDD supplied to the wiring 111 in FIG. 25 are exchanged. Specifically, in FIG. 45, the wiring 110 and the wiring 111 are supplied with the potential VDD and Vcat, respectively. Further, the potential V1 is lower than Vsig.

In this manner, a p-channel transistor can be used as the transistor which allows the circuit to function as a current source.

Figure 46:
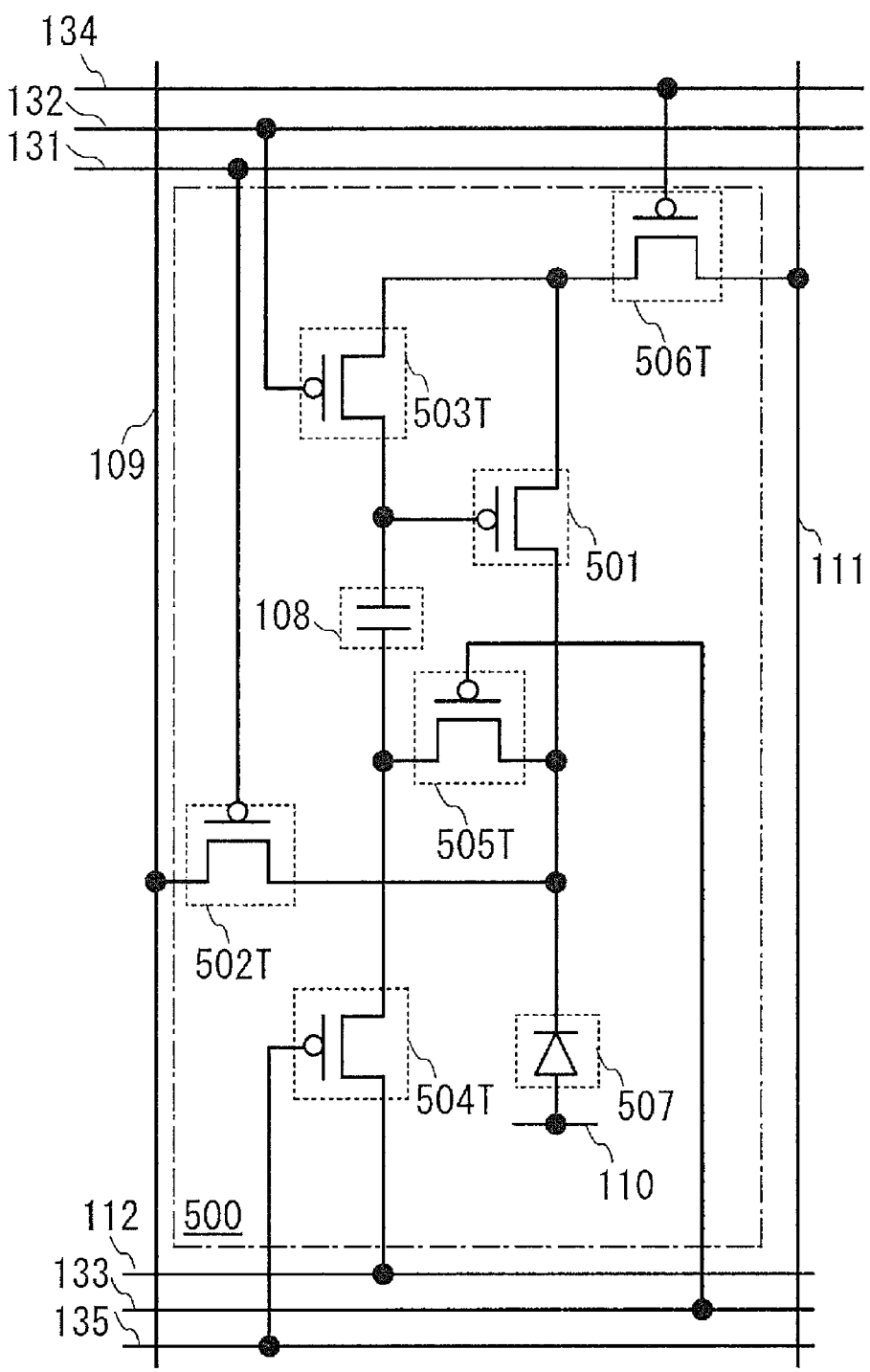
FIG. 46 is a circuit diagram illustrating an example of a pixel according to one embodiment of the present invention.

Note that each switch included in the pixel 100 in FIG. 25 can be a p-channel transistor. Specifically, as illustrated in FIG. 46, a transistor 502T, a transistor 503T, a transistor 504T, a transistor 505T, and a transistor 506T which are p-channel transistors may be used as the switches and the pixel may be controlled by the turning on or off the transistors. Signals for turning on or off the transistors are supplied to the wirings 131 to 135 as appropriate so that the operation of the pixel is the same as the operation in FIGS. 3A to 3D.

Figure 47:
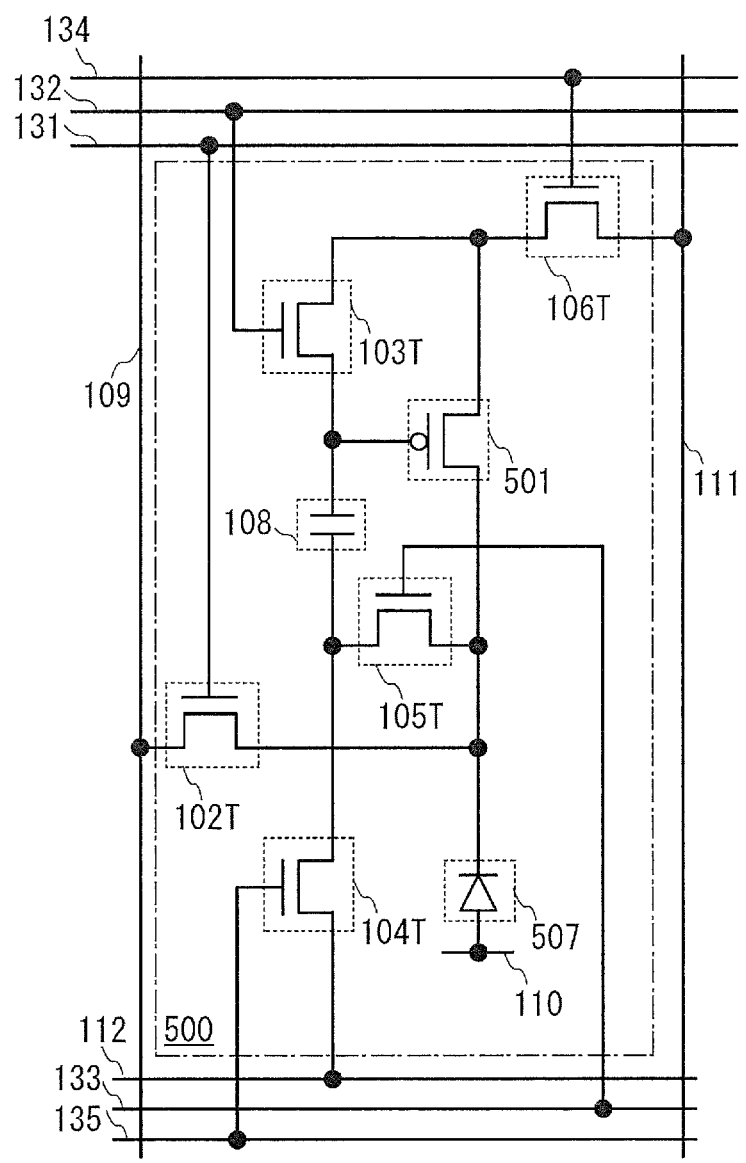
FIG. 47 is a circuit diagram illustrating an example of a pixel according to one embodiment of the present invention.

Note that it is also possible to employ a structure where an n-channel transistor is used as each switch included in a pixel as in the pixel 100 in FIG. 25 and a p-channel transistor is used only as the transistor which allows the circuit to function as a current source. Specifically, as illustrated in FIG. 47, an n-channel transistor may be used as each switch.

Figure 48:
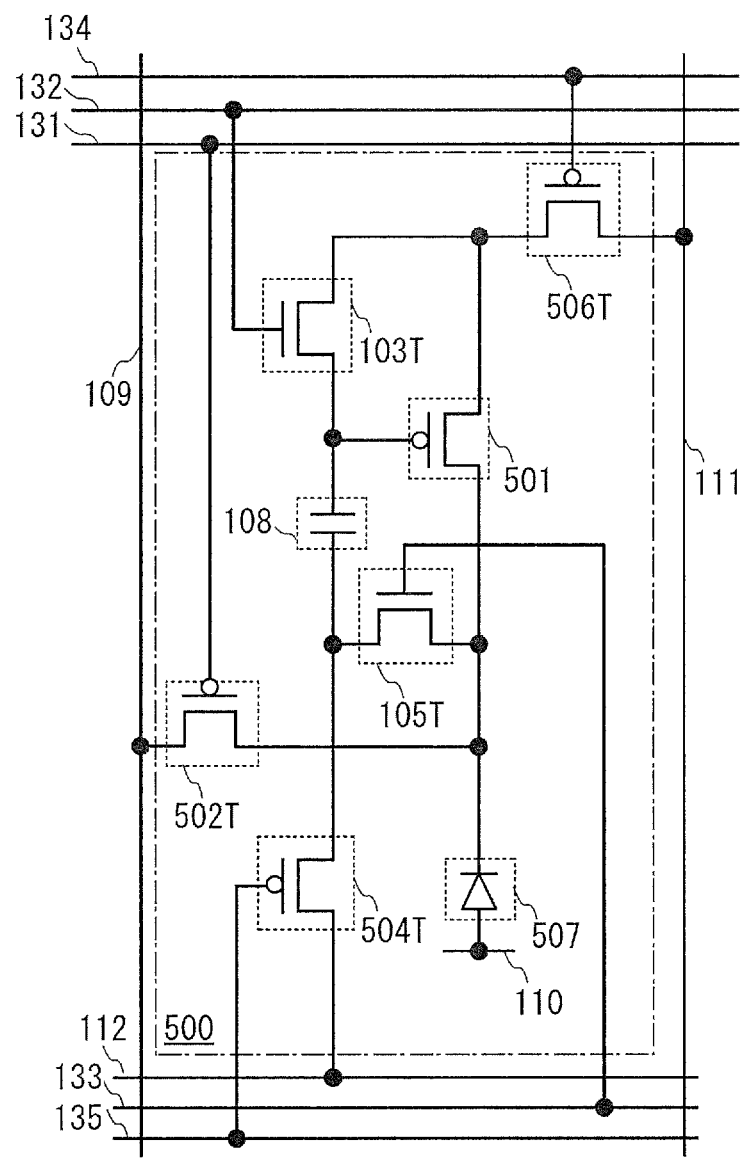
FIG. 48 is a circuit diagram illustrating an example of a pixel according to one embodiment of the present invention.

Note that switches included in a pixel can have different conductivity types. Specifically, as illustrated in FIG. 48, the switches included in the pixel 500 can be the p-channel transistor 502T, the n-channel transistor 103T, the p-channel transistor 504T, the n-channel transistor 105T, and the p-channel transistor 506T.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 10)

In FIG. 25 in Embodiment 1, each transistor included in the pixel of the display device is an n-channel transistor. In this embodiment, a circuit structure where a transistor whose channel formation region is formed in an oxide semiconductor layer is used for the pixel of the display device is described.

Figure 49:
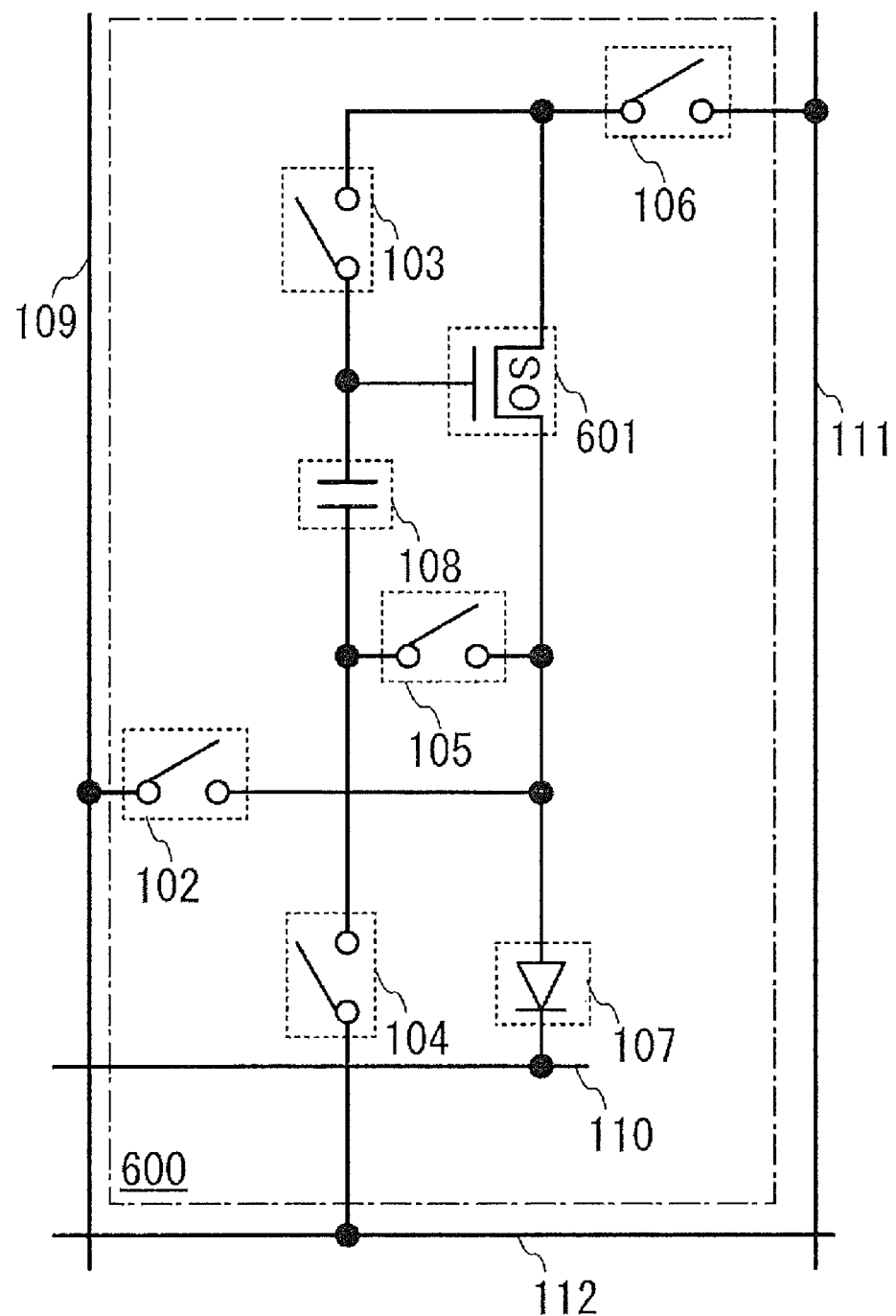
FIG. 49 is a circuit diagram illustrating an example of a pixel according to one embodiment of the present invention.

In FIG. 25, the transistor 101 of the pixel 100 is simply an n-channel transistor, but a transistor whose channel formation region is formed in an oxide semiconductor layer, like a transistor 601 of a pixel 600 illustrated in FIG. 49, can be used instead. Note that, as illustrated in FIG. 49, "OS" is written in the transistor 601 in order to indicate that a channel formation region of the transistor is formed in an oxide semiconductor layer, which also applies to other drawings.

In the structure in FIG. 49, the transistor 601 is a transistor whose channel formation region is formed in an oxide semiconductor layer and therefore the off-state current of the transistor can be reduced. Accordingly, the pixel can have a circuit structure which does not easily allow malfunction.

Figure 50:
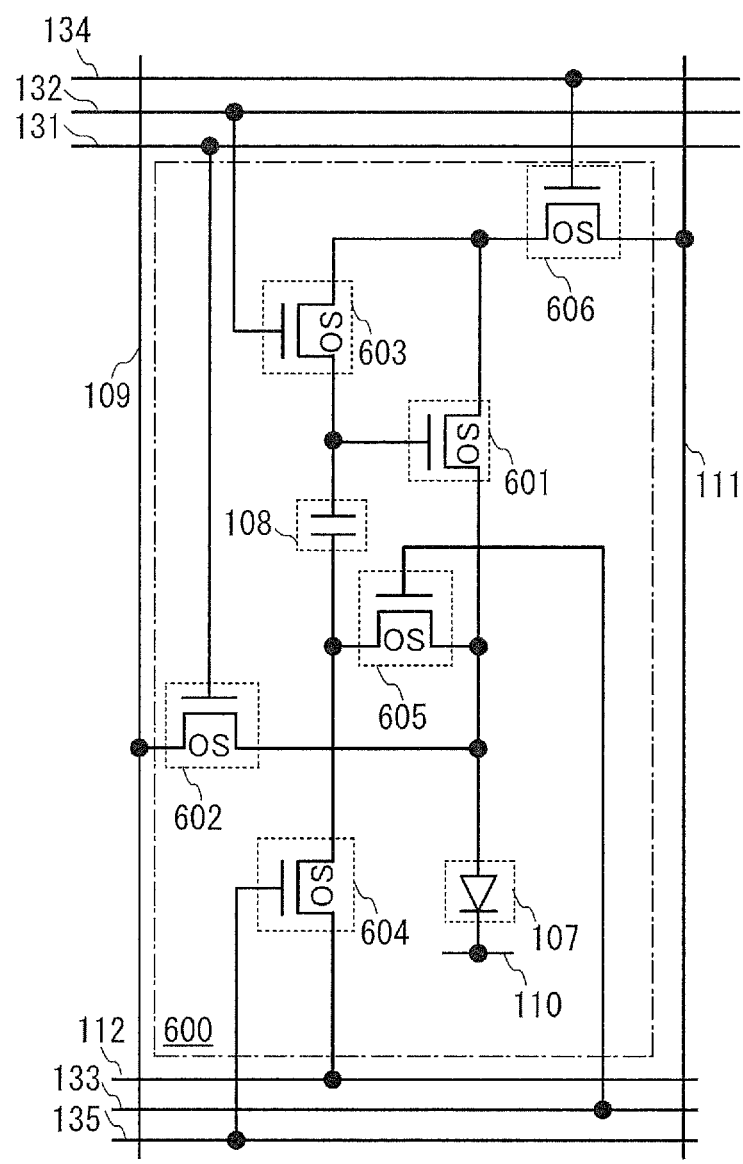
FIG. 50 is a circuit diagram illustrating an example of a pixel according to one embodiment of the present invention.

Each switch included in the pixel 600 can be a transistor whose channel formation region is formed in an oxide semiconductor layer. Specifically, as illustrated in FIG. 50, the switches may be transistors 602 to 606 each of whose channel formation region is formed in an oxide semiconductor layer.

Note that, in this specification, the off-state current is current that flows between a source and a drain when a transistor is in a non-conduction state. In the case of an n-channel transistor (whose threshold voltage is, for example, approximately 0 V to 2 V), the off-state current refers to current flowing between a source and a drain when negative voltage is applied between a gate and the source.

Next, a material for an oxide semiconductor layer in which a channel formation region is formed is described below. As described above, a structure in this embodiment may include a layer formed using an oxide semiconductor (oxide semiconductor layer), for example.

As the oxide semiconductor, for example, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, or a Hf—In—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; or a single-component metal oxide such as an In—O-based oxide semiconductor, a Sn—O-based oxide semiconductor, or a Zn—O-based oxide semiconductor can be used. In addition, any of the above oxide semiconductors may contain an element other than In, Ga, Sn, and Zn, for example, $SiO_2$.

For example, an In—Sn—Zn—O-based oxide semiconductor refers to an oxide semiconductor containing indium (In), tin (Sn), and zinc (Zn), and there is no particular limitation on the composition ratio thereof. Further, for example, an In—Ga—Zn—O-based oxide semiconductor refers to an oxide semiconductor containing indium (In), gallium (Ga), and zinc (Zn), and there is no limitation on the composition ratio thereof. An In—Ga—Zn—O-based oxide semiconductor can be referred to as IGZO.

The oxide semiconductor layer can be formed using an oxide semiconductor film. In the case where an In—Sn—Zn—O-based oxide semiconductor film is formed by sputtering, a target which contains In, Sn, and Zn as metal elements at an atomic ratio of 1:2:2, 2:1:3, 1:1:1, 20:45:35, or the like is used.

In the case where an In—Zn—O-based oxide semiconductor film is formed by a sputtering method, the atomic ratio of metal elements in a target is In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), further preferably In:Zn=1.5:1 to 15:1 ($In_2O_3$:ZnO=3:4 to 15:2 in a molar ratio). For example, in a target which has an atomic ratio of In:Zn:O=X:Y:Z, the relation of $Z>1.5X+Y$ is satisfied.

In the case where an In—Ga—Zn—O-based oxide semiconductor film is formed by a sputtering method, the atomic ratio of metal elements in a target can be In:Ga:Zn 1:1:0.5, 1:1:1, or 1:1:2.

When the purity of the target is set to 99.99% or higher, alkali metal, a hydrogen atom, a hydrogen molecule, water, a hydroxyl group, a hydride, or the like mixed into the oxide semiconductor film can be reduced. In addition, when the target is used, the concentration of alkali metal such as lithium, sodium, or potassium can be reduced in the oxide semiconductor film.

Note that it has been pointed out that an oxide semiconductor is insensitive to impurities, there is no problem even when a considerable amount of metal impurities is contained in the film, and therefore, soda-lime glass which contains a large amount of alkali metal such as sodium (Na) and is inexpensive can be used (Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633). However, such consideration is not appropriate. Alkali metal is not a constituent element of an oxide semiconductor, and therefore, is an impurity. Likewise, alkaline earth metal is an impurity in the case where alkaline earth metal is not a constituent element of an oxide semiconductor. Alkali metal, in particular, Na becomes $Na^+$ when an insulating film in contact with the oxide semiconductor layer is an oxide and Na diffuses into the insulating film. Further, in the oxide semiconductor layer, Na cuts or enters a bond between metal and oxygen which constitute the oxide semiconductor. As a result, for example, deterioration in characteristics of a transistor, such as a negative shift of threshold voltage, which leads to a normally-on state of the transistor, or a decrease in mobility, occurs. In addition, variation in characteristics occurs. Such deterioration in characteristics of the transistor and variation in the characteristics due to the impurity remarkably appear when the concentration of hydrogen in the oxide semiconductor layer is sufficiently low. Therefore, when the hydrogen concentration in the oxide semiconductor layer is lower than or equal to $1 \times 10^{18}/cm^3$, preferably lower than or equal to $1 \times 10^{17}/cm^3$, the concentration of the above impurity is preferably reduced. Specifically, the Na concentration measured by secondary ion mass spectrometry is preferably lower than or equal to $5 \times 10^{16}/cm^3$, further preferably lower than or equal to $1 \times 10^{16}/cm^3$, still further preferably lower than or equal to $1 \times 10^{15}/cm^3$. Similarly, the measurement value of a Li concentration is preferably less than or equal to $5 \times 10^{15}/cm^3$, further preferably less than or equal to $1 \times 10^{15}/cm^3$. Similarly, the measurement value of a K concentration is preferably less than or equal to $5 \times 10^{15}/cm^3$, further preferably less than or equal to $1 \times 10^{15}/cm^3$.

Note that the oxide semiconductor film is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that, in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a decrease in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, a triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that, when the CAAC-OS film is formed, the direction of the c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, a change in electric characteristics of the transistor due to irradiation with visible light or ultraviolet light can be reduced. Thus, the transistor has high reliability.

Examples of a crystal structure of the CAAC-OS film are described in detail with reference to FIGS. 51A to 51E, FIGS. 52A to 52C, FIGS. 53A to 53C, and FIGS. 54A and 54B. In FIGS. 51A to 51E, FIGS. 52A to 52C, FIGS. 53A to 53C, and FIGS. 54A and 54B, the vertical direction corresponds to the c-axis direction and a plane perpendicular to the c-axis direction corresponds to the a-b plane, unless otherwise specified. When the terms "upper half" and "lower half" are simply used, they refer to an upper half above the a-b plane and a lower half below the a-b plane (an upper half and a lower half with respect to the a-b plane). Furthermore, in FIGS. 51A to 51E, O surrounded by a circle represents a tetracoordinate O atom and O surrounded by a double circle represents a tricoordinate O atom.

Figure 51A:
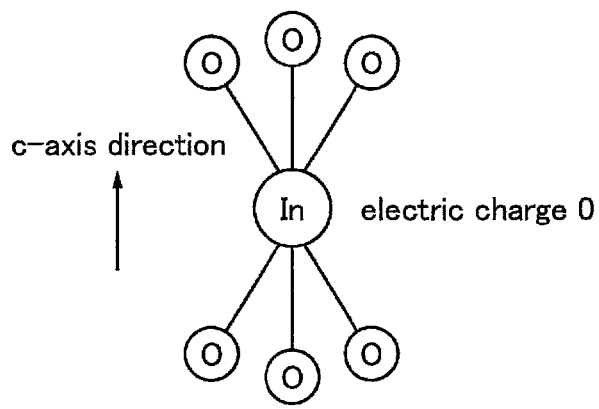
FIGS. 51A to 51E are each a diagram illustrating a structure of an oxide material according to one embodiment of the present invention.

FIG. 51A illustrates a structure including one hexacoordinate In atom and six tetracoordinate oxygen atoms (hereinafter referred to as tetracoordinate O atoms) proximate to the In atom. Here, a structure including one metal atom and oxygen atoms proximate thereto is referred to as a small group. The structure in FIG. 51A is actually an octahedral structure, but is illustrated as a planar structure for simplicity. Note that three tetracoordinate O atoms exist in each of an upper half and a lower half in FIG. 51A. In the small group illustrated in FIG. 51A, electric charge is 0.

Figure 51D:
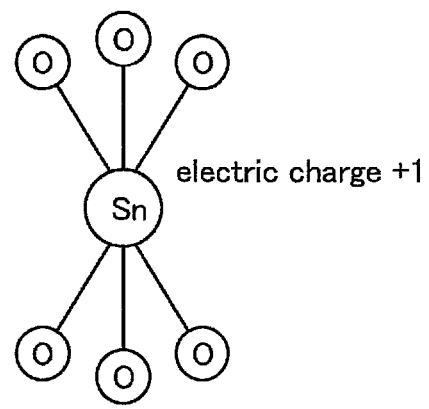
Figure 51B:
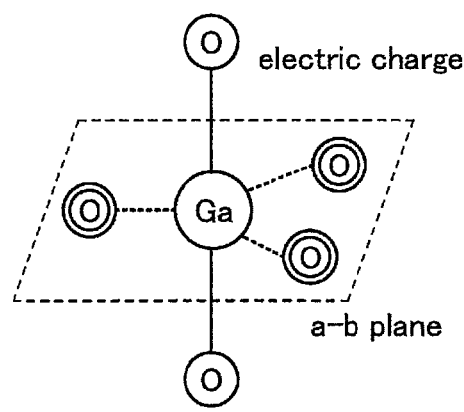

FIG. 51B illustrates a structure including one pentacoordinate Ga atom, three tricoordinate oxygen atoms (hereinafter referred to as tricoordinate O atoms) proximate to the Ga atom, and two tetracoordinate O atoms proximate to the Ga atom. All the tricoordinate O atoms exist on the a-b plane. One tetracoordinate O atom exists in each of an upper half and a lower half in FIG. 51B. An In atom can also have the structure illustrated in FIG. 51B because an In atom can have five ligands. In the small group illustrated in FIG. 51B, electric charge is 0.

Figure 51E:
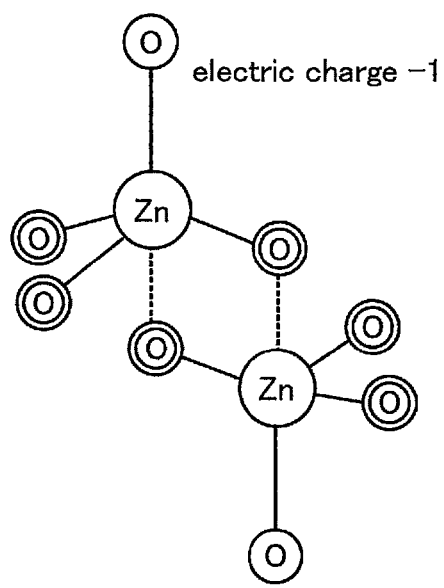
Figure 51C:
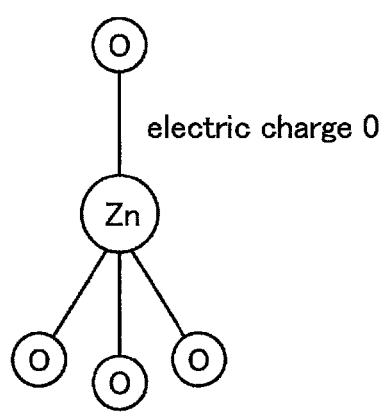

FIG. 51C illustrates a structure including one tetracoordinate Zn atom and four tetracoordinate O atoms proximate to the Zn atom. In FIG. 51C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 51C. In the small group illustrated in FIG. 51C, electric charge is 0.

FIG. 51D illustrates a structure including one hexacoordinate Sn atom and six tetracoordinate O atoms proximate to the Sn atom. In FIG. 51D, three tetracoordinate O atoms exist in each of an upper half and a lower half. In the small group illustrated in FIG. 51D, electric charge is +1.

FIG. 51E illustrates a small group including two Zn atoms. In FIG. 51E, one tetracoordinate O atom exists in each of an upper half and a lower half. In the small group illustrated in FIG. 51E, electric charge is −1.

Here, a plurality of small groups fauns a medium group, and a plurality of medium groups forms a large group (also referred to as a unit cell).

Now, a rule of bonding between the small groups is described. The three O atoms in the upper half with respect to the hexacoordinate In atom in FIG. 51A each have three proximate In atoms in the downward direction, and the three O atoms in the lower half each have three proximate In atoms in the upward direction. The one O atom in the upper half with respect to the pentacoordinate Ga atom in FIG. 51B has one proximate Ga atom in the downward direction, and the one O atom in the lower half has one proximate Ga atom in the upward direction. The one O atom in the upper half with respect to the tetracoordinate Zn atom in FIG. 51C has one proximate Zn atom in the downward direction, and the three O atoms in the lower half each have three proximate Zn atoms in the upward direction. In this manner, the number of tetracoordinate O atoms above a metal atom is equal to the number of metal atoms proximate to and below each of the tetracoordinate O atoms. Similarly, the number of tetracoordinate O atoms below a metal atom is equal to the number of metal atoms proximate to and above each of the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. The reason is described below. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 52A:
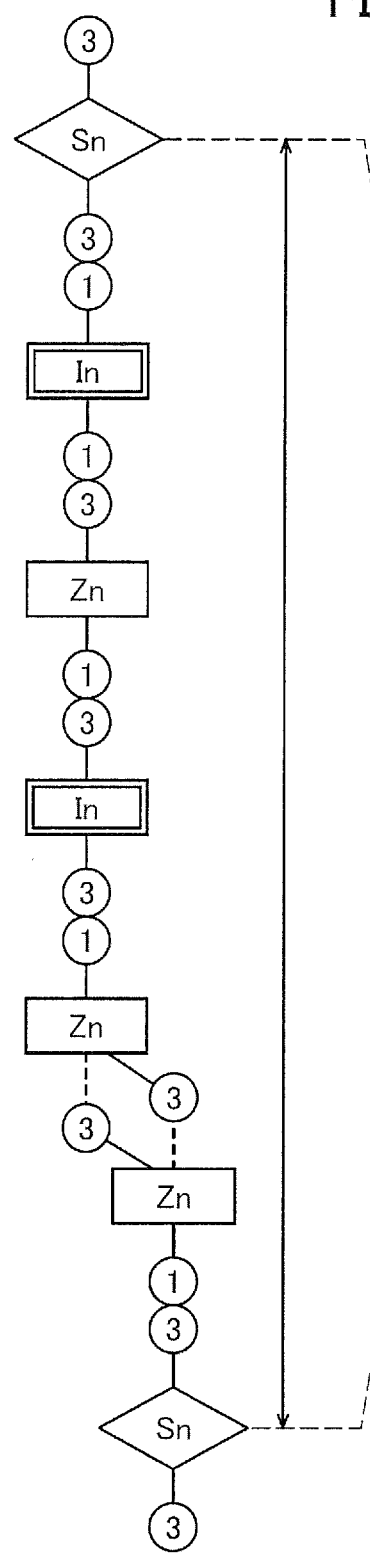
FIGS. 52A to 52C are diagrams illustrating a structure of an oxide material according to one embodiment of the present invention.
Figure 52B:
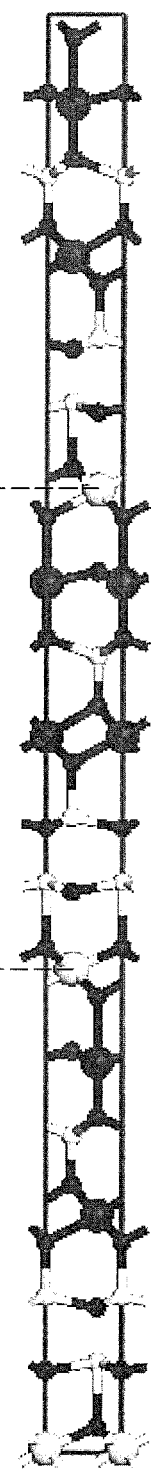
Figure 52C:
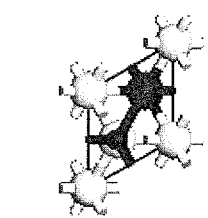

FIG. 52A illustrates a model of a medium group included in a layered structure of an In—Sn—Zn-based oxide. FIG. 52B illustrates a large group including three medium groups. Note that FIG. 52C illustrates an atomic arrangement in the case where the layered structure in FIG. 52B is observed from the c-axis direction.

In FIG. 52A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom is denoted by circled 3. In a similar manner, in FIG. 52A, one tetracoordinate O atom existing in each of an upper half and a lower half with respect to an In atom is denoted by circled 1. FIG. 52A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn-based oxide in FIG. 52A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge of a small group including a Sn atom is +1. Therefore, electric charge of −1, which cancels +1, is needed to form a layered structure including a Sn atom. As a structure having electric charge of −1, the small group including two Zn atoms as illustrated in FIG. 51E can be given. For example, with one small group including two Zn atoms, electric charge of one small group including a Sn atom can be cancelled, so that the total electric charge of the layered structure can be 0.

Specifically, when the large group illustrated in FIG. 52B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$, (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; and the like.

Figure 53A:
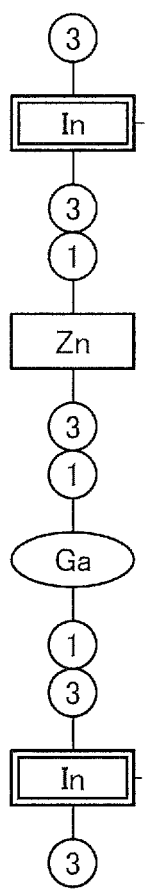
FIGS. 53A to 53C are diagrams illustrating a structure of an oxide material according to one embodiment of the present invention.

As an example, FIG. 53A illustrates a model of a medium group included in a layered structure of an In—Ga—Zn—O-based material.

In the medium group included in the layered structure of the In—Ga—Zn—O-based material in FIG. 53A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through the one tetracoordinate O atom in the lower half with respect to the Ga atom. A plurality of such medium groups is bonded, so that a large group is formed.

Figure 53B:
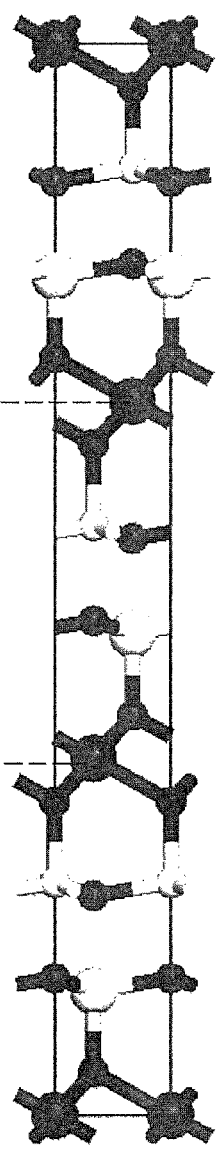
Figure 53C:
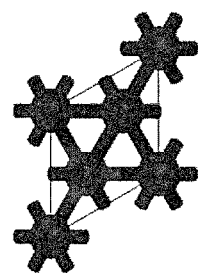

FIG. 53B illustrates a large group including three medium groups. Note that FIG. 53C illustrates an atomic arrangement in the case where the layered structure in FIG. 53B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 53A but also a medium group in which the arrangement of the In atom, the Ga atom, and the Zn atom is different from that in FIG. 53A.

Specifically, when the large group illustrated in FIG. 53B is repeated, an In—Ga—Zn—O-based crystal can be obtained. Note that a layered structure of the obtained In—Ga—Zn—O-based crystal can be expressed as a composition formula, $InGaO_3(ZnO)_n$, (n is a natural number).

Figure 54A:
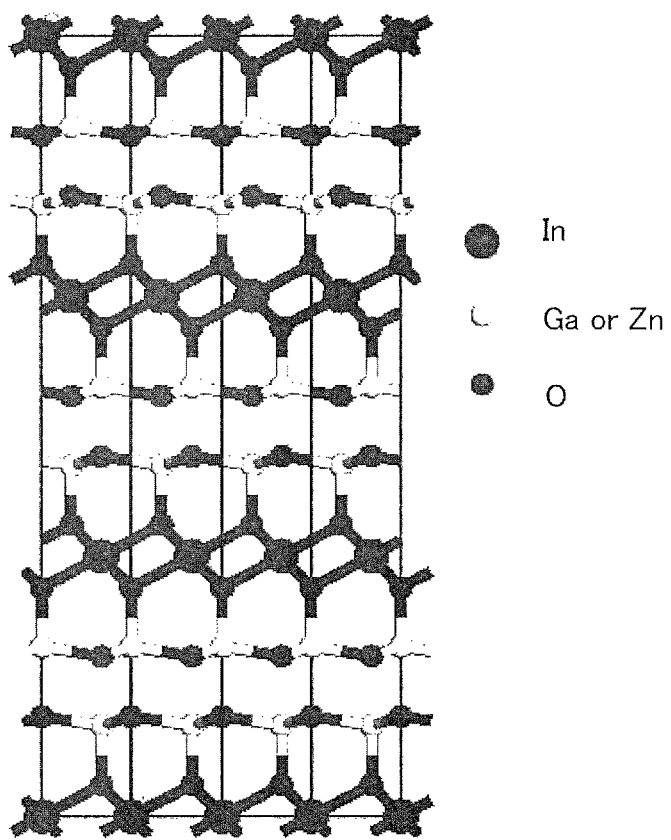
FIGS. 54A and 54B are each a diagram illustrating a structure of an oxide material according to one embodiment of the present invention.

In the case of n=1 ($InGaZnO_4$), a crystal structure illustrated in FIG. 54A can be obtained, for example. Note that, in the crystal structure in FIG. 54A, since a Ga atom and an In atom each have five ligands as described with reference to FIG. 51B, a structure where Ga is replaced with In can be obtained.

Figure 54B:
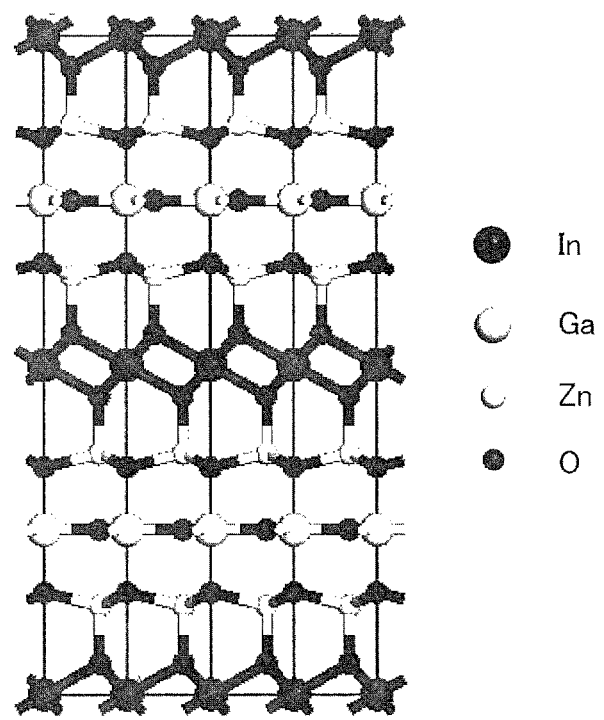

In the case of n=2 ($InGaZn_2O_5$), a crystal structure illustrated in FIG. 54B can be obtained, for example. Note that, in the crystal structure in FIG. 54B, since a Ga atom and an In atom each have five ligands as described with reference to FIG. 51B, a structure where Ga is replaced with In can be obtained.

A CAAC-OS film can be formed by a sputtering method. The above material can be used as a target material. In the case where the CAAC-OS film is formed by a sputtering method, the proportion of an oxygen gas in an atmosphere is preferably high. For sputtering in a mixed gas atmosphere of argon and oxygen, for example, the proportion of an oxygen gas is preferably set to 30% or higher, further preferably 40% or higher. This is because supply of oxygen from the atmosphere promotes crystallization of the CAAC-OS film.

In the case where a CAAC-OS film is formed by a sputtering method, a substrate over which the CAAC-OS film is formed is heated preferably to 150° C. or higher, further preferably to 170° C. or higher. This is because the higher the substrate temperature becomes, the more crystallization of the CAAC-OS film is promoted.

After being subjected to heat treatment in a nitrogen atmosphere or in vacuum, the CAAC-OS film is preferably subjected to heat treatment in an oxygen atmosphere or a mixed atmosphere of oxygen and another gas. This is because an oxygen vacancy due to the former heat treatment can be repaired by supply of oxygen from the atmosphere in the latter heat treatment.

A film surface where the CAAC-OS film is formed (deposition surface) is preferably flat. This is because the c-axes of crystal parts in the CAAC-OS film are substantially perpendicular to the deposition surface, and thus roughness of the deposition surface causes grain boundaries in the CAAC-OS film. For that reason, the deposition surface is preferably subjected to planarization treatment such as chemical mechanical polishing (CMP) before the CAAC-OS film is formed. The average roughness of the deposition surface is preferably 0.5 nm or less, further preferably 0.3 nm or less.

Note that the oxide semiconductor film formed by sputtering or the like contains moisture or hydrogen (including a hydroxyl group) as an impurity in some cases. In one embodiment of the present invention, in order to reduce impurities such as moisture or hydrogen in the oxide semiconductor film (or an oxide semiconductor layer formed using the oxide semiconductor film) (in order to perform dehydration or dehydrogenation), the oxide semiconductor film (oxide semiconductor layer) is subjected to heat treatment in a reduced-pressure atmosphere, an inert gas atmosphere of nitrogen, a rare gas, or the like, an oxygen gas atmosphere, or ultra dry air (the moisture amount is less than or equal to 20 ppm (−55° C. by conversion into a dew point), preferably less than or equal to 1 ppm, further preferably less than or equal to 10 ppb, in the case where the measurement is performed with a dew point meter of a cavity ring down laser spectroscopy (CRDS) system).

By performing heat treatment on the oxide semiconductor film (oxide semiconductor layer), moisture or hydrogen in the oxide semiconductor film (oxide semiconductor layer) can be eliminated. Specifically, the heat treatment may be performed at a temperature higher than or equal to 250° C. and lower than or equal to 750° C., preferably higher than or equal to 400° C. and lower than the strain point of the substrate. For example, the heat treatment may be performed at 500° C. for longer than or equal to 3 minutes and shorter than or equal to 6 minutes. When an RTA method is used for the heat treatment, dehydration or dehydrogenation can be performed in a short time; thus, treatment can be performed even at a temperature higher than the strain point of a glass substrate.

After moisture or hydrogen in the oxide semiconductor film (oxide semiconductor layer) is eliminated in this manner, oxygen is added. Thus, oxygen defects, for example, in the oxide semiconductor film (oxide semiconductor layer) can be reduced, so that the oxide semiconductor film (oxide semiconductor layer) can be i-type (intrinsic) or substantially i-type.

Oxygen can be added in such a manner that, for example, an insulating film including a region where the proportion of oxygen is higher than that in the stoichiometric composition ratio is formed in contact with the oxide semiconductor film (oxide semiconductor layer), and then heat treatment is performed. In such a manner, excess oxygen in the insulating film can be supplied to the oxide semiconductor film (oxide semiconductor layer). Thus, the oxide semiconductor film (oxide semiconductor layer) can contain oxygen excessively. Oxygen contained excessively exists, for example, between lattices of a crystal included in the oxide semiconductor film (oxide semiconductor layer).

Note that the insulating film including a region where the proportion of oxygen is higher than that in the stoichiometric composition ratio may be used for either an insulating film positioned on the upper side of the oxide semiconductor film (oxide semiconductor layer) or an insulating film positioned on the lower side of the oxide semiconductor film (oxide semiconductor layer) of insulating films in contact with the oxide semiconductor film (oxide semiconductor layer); it is preferable to use such an insulating film to both of the insulating films in contact with the oxide semiconductor film (oxide semiconductor layer). The above-described effect can be enhanced with a structure in which the insulating films each including a region where the proportion of oxygen is higher than that in the stoichiometric composition ratio are used as the insulating films in contact with the oxide semiconductor film (oxide semiconductor layer) and positioned on the upper side and lower side of the oxide semiconductor film (oxide semiconductor layer) so that the oxide semiconductor film (oxide semiconductor layer) is sandwiched between the insulating films.

Here, the insulating film including a region where the proportion of oxygen is higher than that in the stoichiometric composition ratio may be a single-layer insulating film or a plurality of insulating films stacked. Note that it is preferable that the insulating film contain impurities such as moisture and hydrogen as little as possible. When hydrogen is contained in the insulating film, entry of the hydrogen into the oxide semiconductor film (oxide semiconductor layer) or extraction of oxygen from the oxide semiconductor film (oxide semiconductor layer) by the hydrogen occurs, whereby the oxide semiconductor film (oxide semiconductor layer) has lower resistance (n-type conductivity); thus, a parasitic channel might be formed. Therefore, it is important that a film formation method in which hydrogen is not used be employed in order to form the insulating film containing as little hydrogen as possible. In addition, a material having a high barrier property is preferably used for the insulating film. For example, as the insulating film having a high barrier property, a silicon nitride film, a silicon nitride oxide film, an aluminum nitride film, an aluminum oxide film, or an aluminum nitride oxide film can be used. In the case of using a plurality of insulating films stacked, an insulating film having a low proportion of nitrogen such as a silicon oxide film or a silicon oxynitride film is formed to be closer to the oxide semiconductor film (oxide semiconductor layer) than the insulating film having a high barrier property. Then, the insulating film having a high barrier property is formed to overlap with the oxide semiconductor film (oxide semiconductor layer) with the insulating film having a low proportion of nitrogen positioned therebetween. With the use of the insulating film having a high barrier property, impurities such as moisture and hydrogen can be prevented from entering the oxide semiconductor film (oxide semiconductor layer), an interface between the oxide semiconductor film (oxide semiconductor layer) and another insulating film, and the vicinity thereof. In addition, the insulating film having a low proportion of nitrogen such as a silicon oxide film or a silicon oxynitride film is formed in contact with the oxide semiconductor film (oxide semiconductor layer), so that the insulating film formed using a material having a high barrier property can be prevented from being in contact with the oxide semiconductor film (oxide semiconductor layer) directly.

Alternatively, the addition of oxygen after moisture or hydrogen in the oxide semiconductor film (oxide semiconductor layer) is eliminated may be performed by performing heat treatment on the oxide semiconductor film (oxide semiconductor layer) in an oxygen atmosphere. The heat treatment is performed at a temperature, for example, higher than or equal to 100° C. and lower than 350° C., preferably higher than or equal to 150° C. and lower than 250° C. It is preferable that an oxygen gas used for the heat treatment in an oxygen atmosphere do not contain water, hydrogen, and the like. The purity of the oxygen gas which is introduced into a heat treatment apparatus is preferably higher than or equal to 6N (99.9999%), further preferably higher than or equal to 7N (99.99999%) (that is, the impurity concentration in the oxygen gas is preferably lower than or equal to 1 ppm, further preferably lower than or equal to 0.1 ppm).

Alternatively, the addition of oxygen after moisture or hydrogen in the oxide semiconductor film (oxide semiconductor layer) is eliminated may be performed by an ion implantation method, an ion doping method, or the like. For example, oxygen made to be plasma with a microwave of 2.45 GHz may be added to the oxide semiconductor film (oxide semiconductor layer).

The thus formed oxide semiconductor layer can be used as the semiconductor layer of the transistor 601. In this manner, the transistor 601 with extremely small off-state current can be obtained.

Alternatively, the semiconductor layer of the transistor 601 may include micro crystalline silicon. Note that microcrystalline silicon is a semiconductor having an intermediate structure between an amorphous structure and a crystalline structure (including single crystal and polycrystal). In microcrystalline silicon, columnar or needle-like crystals having a grain size greater than or equal to 2 nm and less than or equal to 200 nm, preferably greater than or equal to 10 nm and less than or equal to 80 nm, further preferably greater than or equal to 20 nm and less than or equal to 50 nm, still further preferably greater than or equal to 25 nm and less than or equal to 33 nm, have grown in a direction normal to a substrate surface. Therefore, a grain boundary is formed at an interface between the columnar or needle-like crystals in some cases.

Alternatively, the semiconductor layer of the transistor 601 may include amorphous silicon. Alternatively, the semiconductor layer of the transistor 601 may include polycrystalline silicon. Alternatively, the semiconductor layer of the transistor 601 may include an organic semiconductor, a carbon nanotube, or the like.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 11)

In this embodiment, a structure of a display panel cell having the pixel structure shown in any of the above embodiments is described with reference to FIGS. 55A and 55B.

Note that FIG. 55A is a top view illustrating a display panel cell, and FIG. 55B is a cross-sectional view taken along line A-A' in FIG. 55A. The display panel cell includes a signal line driver circuit 6701, a pixel portion 6702, a first scan line driver circuit 6703, and a second scan line driver circuit 6706, which are shown by dotted lines. Further, a sealing substrate 6704 and a sealant 6705 are provided. A portion surrounded by the sealant 6705 is a space 6707.

It is to be noted that a wiring 6708 is a wiring for transmitting signals input to the first scan line driver circuit 6703, the second scan line driver circuit 6706, and the signal line driver circuit 6701 and receives a video signal, a clock signal, a start signal, and the like from a flexible printed circuit (FPC) 6709 serving as an external input terminal. An IC chip (a semiconductor chip including a memory circuit, a buffer circuit, and the like) 6719 is mounted over a connecting portion of the FPC 6709 and the display panel cell by chip on glass (COG) or the like. Although only the FPC 6709 is illustrated here, a printed wiring board (PWB) may be attached to the FPC 6709. The display device in this specification includes not only a main body of the display panel cell but also the one with an FPC or a PWB attached thereto. In addition, it also includes a display panel cell on which an IC chip or the like is mounted.

Next, a cross-sectional structure is described with reference to FIG. 55B. The pixel portion 6702 and the peripheral driver circuits (the first scan line driver circuit 6703, the second scan line driver circuit 6706, and the signal line driver circuit 6701) are formed over a substrate 6710. Here, the signal line driver circuit 6701 and the pixel portion 6702 are illustrated.

Note that the signal line driver circuit 6701 is formed using transistors of a single conductivity type, such as an n-channel transistor 6720 and an n-channel transistor 6721. As for a pixel structure, a pixel can be formed using transistors of a single conductivity type by applying the pixel structure in FIG. 25. Accordingly, the peripheral driver circuits are formed using n-channel transistors, whereby a display panel cell formed using transistors of a single conductivity type can be manufactured. Needless to say, a CMOS circuit may be formed using a p-channel transistor as well as an n-channel transistor. Further, in this embodiment, a display panel cell in which peripheral driver circuits are formed over one substrate is described; however, one embodiment of the present invention is not limited thereto. All or some of the peripheral driver circuits may be formed into an IC chip or the like and mounted by COG or the like. In that case, the driver circuit does not need to be formed using transistors of a single conductivity type, and an n-channel transistor and a p-channel transistor can be used in combination.

Further, the pixel portion 6702 includes a transistor 6711 and a transistor 6712. Note that a source electrode of the transistor 6712 is connected to a first electrode (pixel electrode) 6713. An insulator 6714 is formed to cover an end portion of the first electrode 6713. Here, the insulator 6714 is formed using a positive photosensitive acrylic resin film.

In order to obtain favorable coverage, the insulator 6714 is formed to have a curved surface having a curvature at a top end portion or a bottom end portion of the insulator 6714. For example, in the case of using positive photosensitive acrylic as a material for the insulator 6714, it is preferable that only the top end portion of the insulator 6714 have a curved surface having a curvature radius (0.2 μm to 3 μm). Moreover, either a negative photosensitive resin or a positive photosensitive resin can be used for the insulator 6714.

A layer 6716 containing an organic compound and a second electrode (counter electrode) 6717 are formed over the first electrode 6713. Here, it is preferable to use a material having a high work function as a material for the first electrode 6713 functioning as an anode. For example, a single-layer film such as an indium tin oxide film, an indium zinc oxide film, a titanium nitride film, a chromium film, a tungsten film, a Zn film, or a Pt film, a stack of a titanium nitride film and a film containing aluminum as a main component, or a three-layer structure of a titanium nitride film, a film containing aluminum as a main component, and a titanium nitride film can be used. The stacked structure achieves low wiring resistance, a favorable ohmic contact, and a function as an anode.

The layer 6716 containing an organic compound is formed by an evaporation method using an evaporation mask, or an inkjet method. A complex of a metal belonging to Group 4 of the periodic table of the elements is used for part of the layer 6716 containing an organic compound, and may be combined with a low molecular material or a high molecular material. Further, as a material for the layer 6716 containing an organic compound, a single layer or a stacked layer of an organic compound is often used; however, in this embodiment, an inorganic compound may be used in part of a film formed of an organic compound. Moreover, a known triplet material can be used.

Further, as a material for the second electrode 6717 which functions as a cathode and is formed over the layer 6716 containing an organic compound, a material having a low work function (Al, Ag, Li, Ca, or an alloy thereof such as MgAg, MgIn, AlLi, $CaF_2$, or $Ca_3N_2$) may be used. In the case where light generated from the layer 6716 containing an organic compound passes through the second electrode (cathode) 6717, a stack of a metal thin film with a small thickness and a transparent conductive film (of indium tin oxide, indium oxide-zinc oxide ($In_2O_3$—ZnO), zinc oxide (ZnO), or the like) is preferably used as the second electrode 6717.

Further, by attaching the sealing substrate 6704 to the substrate 6710 with the sealant 6705, a light-emitting element 6718 is provided in the space 6707 surrounded by the substrate 6710, the sealing substrate 6704, and the sealant 6705. It is to be noted that the space 6707 may be filled with the sealant 6705, as well as with an inert gas (nitrogen, argon, or the like).

Note that an epoxy-based resin is preferably used for the sealant 6705. It is preferable that such a material do not transmit moisture and oxygen as much as possible. As a material for the sealing substrate 6704, a glass substrate, a quartz substrate, or a plastic substrate formed of fiberglass-reinforced plastics (FRP), polyvinylfluoride (PVF), polyester, acrylic, or the like can be used.

In the above manner, a display panel cell with any of the pixel structures in Embodiments 1 to 10 can be obtained.

Figure 97:
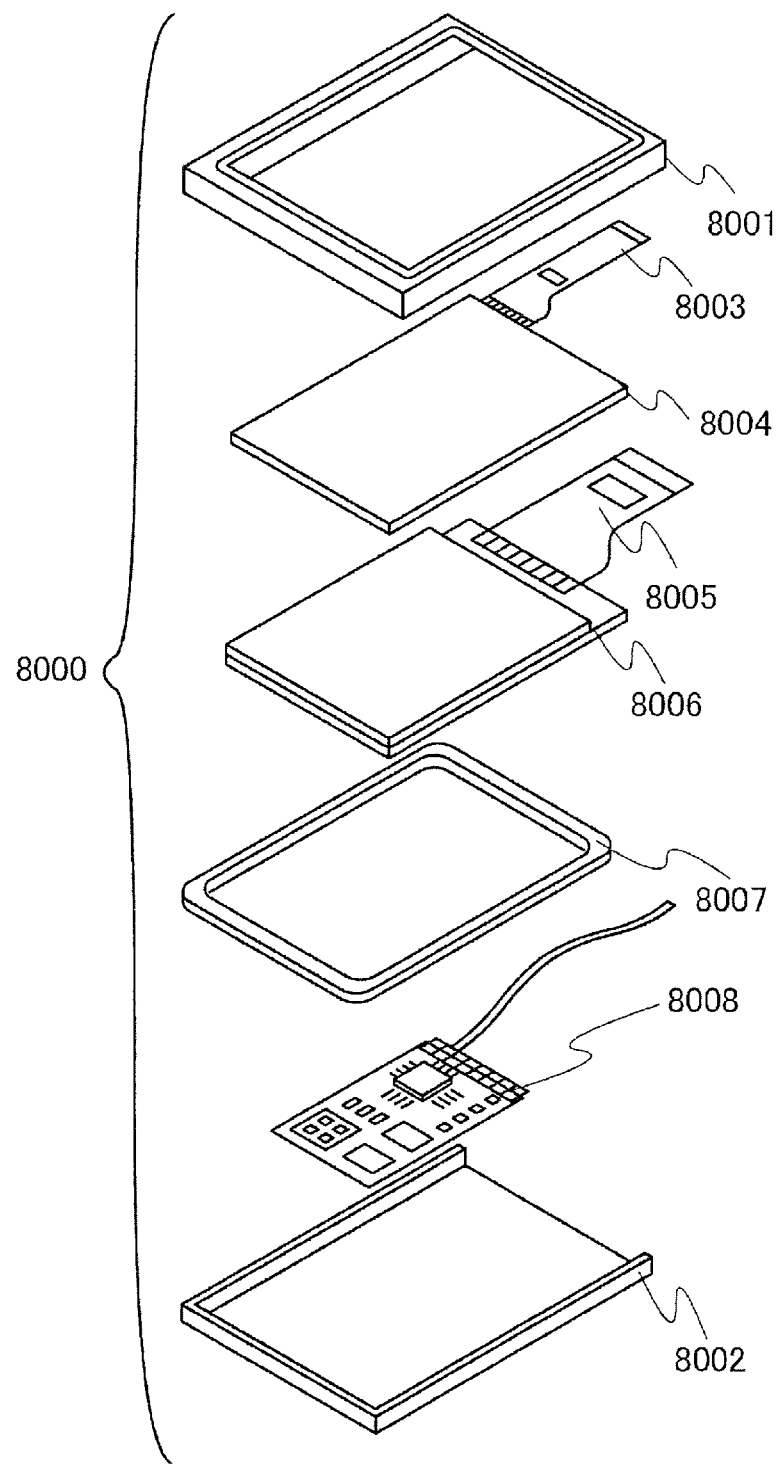
FIG. 97 is a diagram illustrating an example of a display module according to one embodiment of the present invention.

Next, a structural example of a display module which includes the display panel cell described with reference to FIGS. 55A and 55B is described with reference to FIG. 97.

In a display module 8000, a touch panel cell 8004 connected to an FPC 8003, a display panel cell 8006 connected to an FPC 8005, a frame 8007, and a printed board 8008 are provided between an upper cover 8001 and a lower cover 8002.

The shapes and sizes of the upper cover 8001 and the lower cover 8002 can be changed as appropriate in accordance with the sizes of the touch panel cell 8004 and the display panel cell 8006.

The touch panel cell 8004 can be a resistive touch panel cell or a capacitive touch panel cell and can be formed to overlap with the display panel cell 8006. It is also possible to provide a touch panel function for a counter substrate (sealing substrate) of the display panel cell 8006. A photo sensor may be provided in each pixel of the display panel cell 8006 so that an optical touch panel is obtained.

The display panel cell in FIGS. 55A and 55B can be used as the display panel cell 8006. In other words, a pixel can be formed using transistors of a single conductivity type by applying any of the pixel structures described in the Embodiments 1 to 10. Moreover, a peripheral driver circuit is formed using n-channel transistors, whereby a display panel cell formed using transistors of a single conductivity type can be manufactured.

The frame 8007 has a function of protecting the display panel cell 8006 and a function as an electromagnetic shield for blocking electromagnetic waves generated by the operation of the printed board 8008. The frame 8007 may function as a radiator plate.

The printed board 8008 includes a power supply circuit and a signal processing circuit for outputting a video signal and a clock signal. As a power source for supplying power to the power supply circuit, an external commercial power source or a power source using a separately provided battery may be used.

The display module 8000 may be additionally provided with a member such as a polarizing plate, a retardation plate, or a prism sheet.

This embodiment is obtained by performing change, addition, modification, removal, application, superordinate conceptualization, or subordinate conceptualization on part or the whole of another embodiment. Thus, part or the whole of this embodiment can be freely combined with, applied to, or replaced with part or the whole of another embodiment.

(Embodiment 12)

In this embodiment, examples of electronic devices are described.

FIGS. 56A to 56H and FIGS. 57A to 57D illustrate electronic devices. These electronic devices can include a housing 5000, a display portion 5001, a speaker 5003, an LED lamp 5004, an operation key 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 56A:
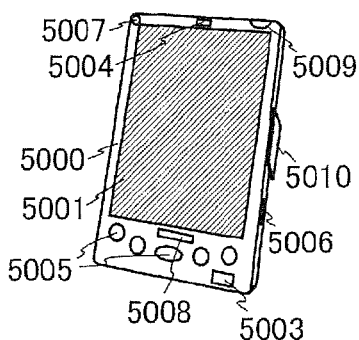
FIGS. 56A to 56H are each a diagram illustrating an electronic device to which a display device according to one embodiment of the present invention can be applied.
Figure 56B:
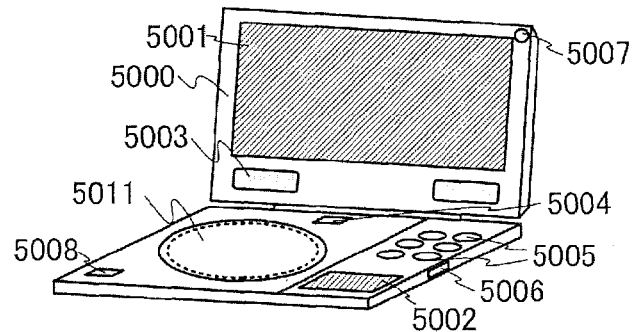
Figure 56C:
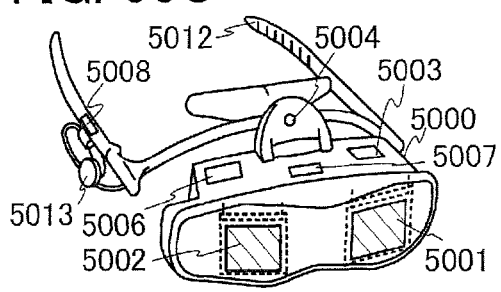
Figure 56D:
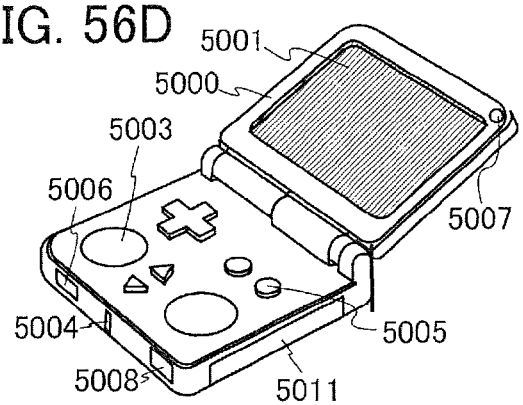
Figure 56E:
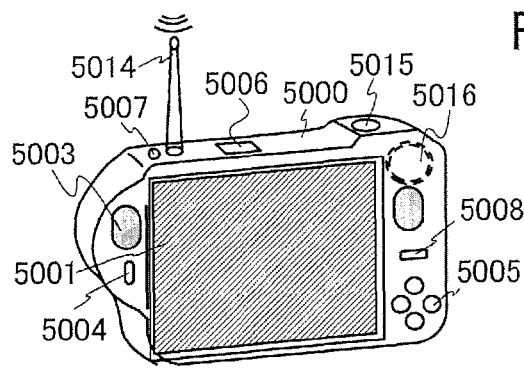
Figure 56F:
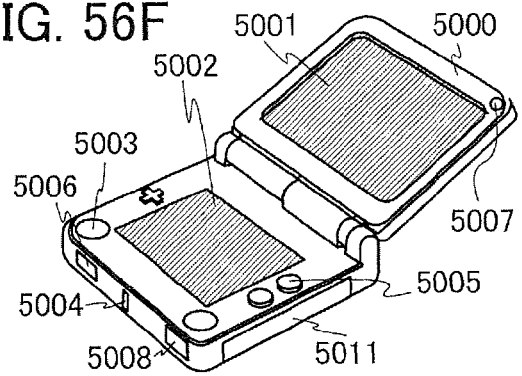
Figure 56G:
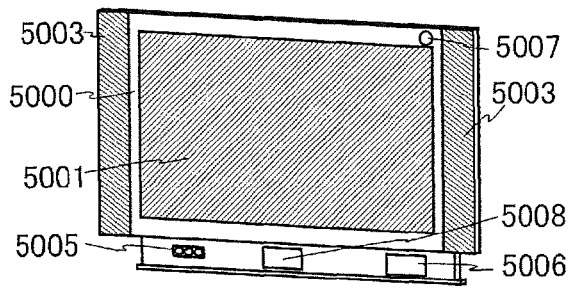
Figure 56H:
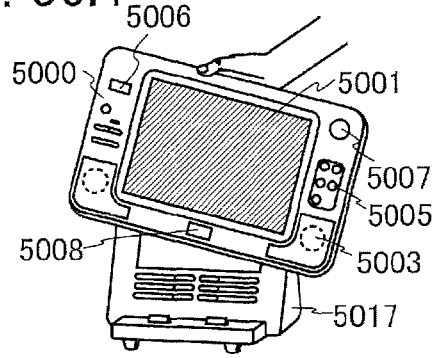
Figure 57A:
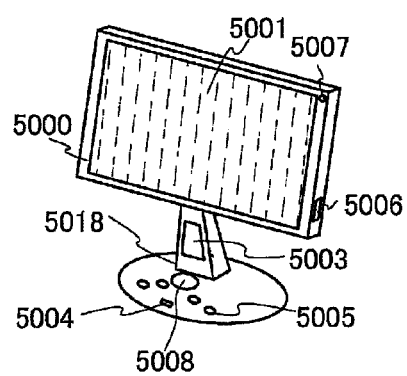
FIGS. 57A to 57H are each a diagram illustrating an electronic device to which a display device according to one embodiment of the present invention can be applied.
Figure 57B:
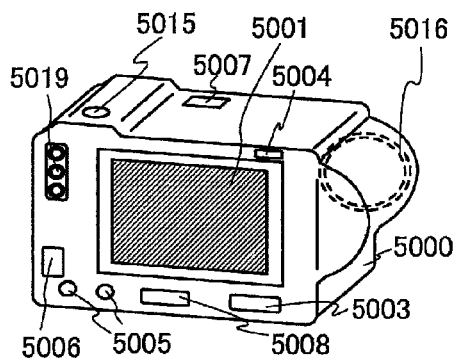
Figure 57C:
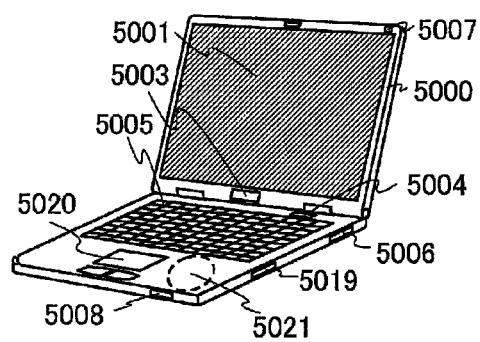
Figure 57D:
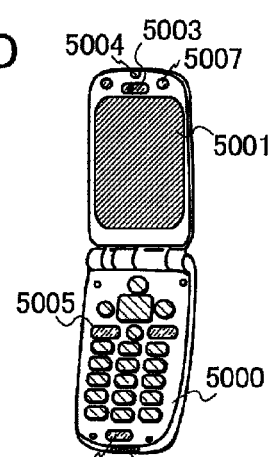

FIG. 56A illustrates a mobile computer which can include a switch 5009, an infrared port 5010, and the like in addition to the above objects. FIG. 56B illustrates a portable image reproducing device (e.g., a DVD reproducing device) provided with a memory medium, which can include a second display portion 5002, a memory medium reading portion 5011, and the like in addition to the above objects. FIG. 56C illustrates a goggle-type display which can include the second display portion 5002, a support 5012, an earphone 5013, and the like in addition to the above objects. FIG. 56D illustrates a portable game machine which can include the memory medium reading portion 5011 and the like in addition to the above objects. FIG. 56E illustrates a digital camera with a television reception function, which can include an antenna 5014, a shutter button 5015, an image receiving portion 5016, and the like in addition to the above objects. FIG. 56F illustrates a portable game machine which can include the second display portion 5002, the memory medium reading portion 5011, and the like in addition to the above objects. FIG. 56G illustrates a television receiver which can include a tuner, an image processing portion, and the like in addition to the above objects. FIG. 56H illustrates a portable television receiver which can include a charger 5017 capable of transmitting and receiving signals and the like in addition to the above objects. FIG. 57A illustrates a display which can include a support base 5018 and the like in addition to the above objects. FIG. 57B illustrates a camera which can include an external connection port 5019, the shutter button 5015, the image receiving portion 5016, and the like in addition to the above objects. FIG. 57C illustrates a computer which can include a pointing device 5020, the external connection port 5019, a reader/writer 5021, and the like in addition to the above objects. FIG. 57D illustrates a mobile phone which can include a transmitter, a receiver, a tuner of one-segment partial reception service for mobile phones and mobile terminals, and the like in addition to the above objects.

The electronic devices illustrated in FIGS. 56A to 56H and FIGS. 57A to 57D can have a variety of functions. For example, a function of displaying a variety of information (a still image, a moving image, a text image, and the like) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a memory medium and displaying the program or data on a display portion can be given. Further, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of shooting a still image, a function of shooting a moving image, a function of automatically or manually correcting a shot image, a function of storing a shot image in a memory medium (an external memory medium or a memory medium incorporated in the camera), a function of displaying a shot image on a display portion, or the like. Note that functions which can be provided for the electronic devices illustrated in FIGS. 56A to 56H and FIGS. 57A to 57D are not limited to those described above, and the electronic devices can have a variety of functions.

The electronic devices described in this embodiment each include a display portion for displaying some sort of information.

Next, application examples of a semiconductor device are described.

Figure 57E:
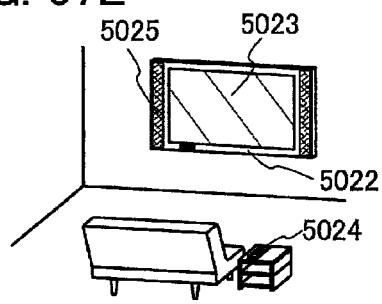

FIG. 57E illustrates an example in which a semiconductor device is incorporated in a building structure. FIG. 57E illustrates a housing 5022, a display portion 5023, a remote controller 5024 which is an operation portion, a speaker 5025, and the like. The semiconductor device is incorporated in the building structure as a wall-hanging type and can be provided without requiring a large space.

Figure 57F:
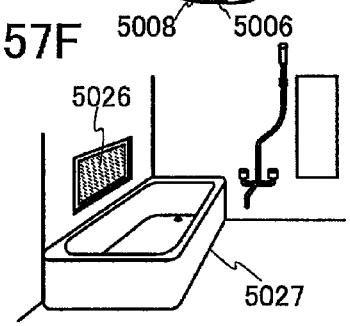

FIG. 57F illustrates another example in which a semiconductor device is incorporated in a building structure. A display module 5026 is incorporated in a prefabricated bath 5027, so that a person who takes a bath can view the display module 5026.

Note that, although the wall and the prefabricated bath are described as examples of the building structure in this embodiment, this embodiment is not limited thereto. The semiconductor device can be provided in a variety of building structures.

Next, examples of a semiconductor device incorporated in a moving object are described.

Figure 57G:
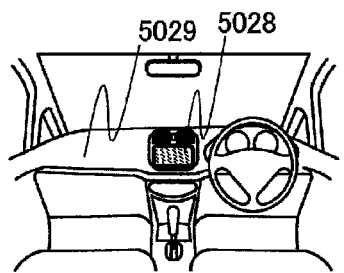

FIG. 57G illustrates an example in which a semiconductor device is provided in a car. A display module 5028 is attached to a body 5029 of the car and can display information on the operation of the car or information input from the inside or outside of the car on demand. Note that a navigation function may be provided.

Figure 57H:
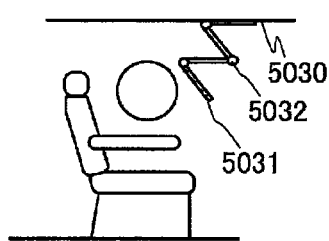

FIG. 57H illustrates an example in which a semiconductor device is incorporated in a passenger airplane. FIG. 57H illustrates a usage pattern in the case where a display module 5031 is provided for a ceiling 5030 above a seat of the passenger airplane. The display module 5031 is attached to the ceiling 5030 with a hinge portion 5032, and a passenger can view the display module 5031 by stretching of the hinge portion 5032. The display module 5031 has a function of displaying information when operated by the passenger.

Note that, although the body of the car and the body of the airplane are described as examples of the moving object in this embodiment, this embodiment is not limited thereto. The semiconductor device can be provided for a variety of moving objects such as a two-wheel motor vehicle, a four-wheel vehicle (including a car, a bus, and the like), a train (including a monorail, a railway, and the like), and a ship.

Note that, in this specification and the like, part of a diagram or a text described in one embodiment can be taken out to constitute one embodiment of the invention. Thus, in the case where a diagram or a text related to a certain part is described, a content taken out from a diagram or a text of the certain part is also disclosed as one embodiment of the invention and can constitute one embodiment of the invention. Therefore, for example, part of a diagram or a text including one or more of active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M <N) are provided, whereby one embodiment of the invention can be constituted. As another example, M elements (M is an integer) are picked up from a flow chart in which N elements (N is an integer, where M<N) are provided, whereby one embodiment of the invention can be constituted.

Note that, in the case where at least one specific example is described in a diagram or a text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention and can constitute one embodiment of the invention.

Note that, in this specification and the like, a content described in at least a diagram (which may be part of the diagram) is disclosed as one embodiment of the invention and can constitute one embodiment of the invention. Therefore, when a certain content is described in a diagram, the content is disclosed as one embodiment of the invention even without text description and can constitute one embodiment of the invention. Similarly, a diagram obtained by taking out part of a diagram is disclosed as one embodiment of the invention and can constitute one embodiment of the invention.

This application is based on Japanese Patent Application serial no. 2011-171476 filed with the Japan Patent Office on Aug. 5, 2011, the entire contents of which are hereby incorporated by reference.

What is claimed is:

1. A semiconductor device comprising:
   a transistor;
   a first switch one terminal of which is electrically connected to a gate of the transistor;
   a second switch one terminal of which is electrically connected to one of a source and a drain of the transistor;
   a third switch one terminal of which is electrically connected to the one of the source and the drain of the transistor;
   a fourth switch one terminal of which is electrically connected to the other of the source and the drain of the transistor and the other tee urinal of the first switch;
   a fifth switch one terminal of which is electrically connected to the other terminal of the third switch;
   a capacitor one electrode of which is electrically connected to the gate of the transistor, and the other electrode of which is electrically connected to the other terminal of the third switch; and
   a load one electrode of which is electrically connected to the one of the source and the drain of the transistor.

2. The semiconductor device according to claim 1, further comprising:
   a first wiring electrically connected to the other terminal of the second switch;
   a second wiring electrically connected to the other terminal of the fourth switch;
   a third wiring electrically connected to the other electrode of the load; and
   a fourth wiring electrically connected to the other terminal of the fifth switch,
   wherein the first wiring is electrically connected to a circuit capable of supplying a first potential,
   wherein the second wiring is electrically connected to a circuit capable of supplying a second potential,
   wherein the third wiring is electrically connected to a circuit capable of supplying a third potential,
   wherein the fourth wiring is electrically connected to a circuit capable of supplying a fourth potential,
   wherein the first potential is lower than the third potential,
   wherein the second potential is higher than the third potential, and
   wherein the fourth potential is higher than the first potential.

3. The semiconductor device according to claim 1, further comprising:
   a first wiring electrically connected to the other terminal of the second switch;
   a second wiring electrically connected to the other terminal of the fourth switch; and
   a third wiring electrically connected to the other electrode of the load and the other terminal of the fifth switch,
   wherein the first wiring is electrically connected to a circuit capable of supplying a first potential,
   wherein the second wiring is electrically connected to a circuit capable of supplying a second potential,
   wherein the third wiring is electrically connected to a circuit capable of supplying a third potential,
   wherein the first potential is lower than the third potential, and
   wherein the second potential is higher than the third potential.

4. The semiconductor device according to claim 1, wherein the first to fifth switches are transistors.

5. The semiconductor device according to claim 1, wherein the first to fifth switches are transistors having the same conductivity type.

6. The semiconductor device according to claim 1, further comprising a sixth switch one terminal of which is electrically connected to the one of the source and the drain of the transistor, and the other terminal of which is electrically connected to the one electrode of the load.

7. The semiconductor device according to claim 2, further comprising a seventh switch one terminal of which is electrically connected to the other of the source and the drain of the transistor, and the other terminal of which is electrically connected to a fifth wiring,
   wherein the fifth wiring is electrically connected to a circuit capable of supplying a fifth potential, and
   wherein the fifth potential is higher than the third potential.

8. The semiconductor device according to claim 1, wherein the load is a display element having a rectifying property.

9. A display module comprising the semiconductor device according to claim 1, wherein the display module comprises a flexible printed circuit.

10. A semiconductor device comprising:
    a transistor;
    a first switch one terminal of which is electrically connected to a gate of the transistor;
    a second switch one terminal of which is electrically connected to one of a source and a drain of the transistor;
    a third switch one terminal of which is electrically connected to the one of the source and the drain of the transistor;
    a fourth switch one terminal of which is electrically connected to the other of the source and the drain of the transistor and the other terminal of the first switch;
    a fifth switch one terminal of which is electrically connected to the other terminal of the third switch;

a capacitor one electrode of which is electrically connected to the gate of the transistor, and the other electrode of which is electrically connected to the other terminal of the third switch;

a load one electrode of which is electrically connected to the one of the source and the drain of the transistor;

a first wiring electrically connected to the other terminal of the second switch;

a second wiring electrically connected to the other terminal of the fourth switch and the other terminal of the fifth switch; and a third wiring electrically connected to the other electrode of the load, wherein the first wiring is electrically connected to a circuit capable of supplying a first potential, wherein the second wiring is electrically connected to a circuit capable of supplying a second potential, wherein the third wiring is electrically connected to a circuit capable of supplying a third potential, wherein the first potential is lower than the third potential, and wherein the second potential is higher than the third potential.

11. The semiconductor device according to claim 10, wherein the first to fifth switches are transistors.

12. The semiconductor device according to claim 10, wherein the first to fifth switches are transistors having the same conductivity type.

13. The semiconductor device according to claim 10, further comprising a sixth switch one terminal of which is electrically connected to the one of the source and the drain of the transistor, and the other terminal of which is electrically connected to the one electrode of the load.

14. The semiconductor device according to claim 10, further comprising a seventh switch one terminal of which is electrically connected to the other of the source and the drain of the transistor, and the other terminal of which is electrically connected to a fifth wiring, wherein the fifth wiring is electrically connected to a circuit capable of supplying a fifth potential, and wherein the fifth potential is higher than the third potential.

15. The semiconductor device according to claim 10, wherein the load is a display element having a rectifying property.

16. A display module comprising the semiconductor device according to claim 10, wherein the display module comprises a flexible printed circuit.

17. A semiconductor device comprising:
a transistor;
a first switch one terminal of which is electrically connected to a gate of the transistor;
a second switch one terminal of which is electrically connected to one of a source and a drain of the transistor;
a third switch one terminal of which is electrically connected to the one of the source and the drain of the transistor;

a fourth switch one terminal of which is electrically connected to the other of the source and the drain of the transistor and the other terminal of the first switch;

a fifth switch one terminal of which is electrically connected to the other terminal of the third switch;

a capacitor one electrode of which is electrically connected to the gate of the transistor, and the other electrode of which is electrically connected to the other terminal of the third switch; and a load one electrode of which is electrically connected to the one of the source and the drain of the transistor;

a first wiring electrically connected to the other terminal of the second switch;

a second wiring electrically connected to the other terminal of the fourth switch;

a third wiring electrically connected to the other electrode of the load; and a fourth wiring electrically connected to the other terminal of the fifth switch, wherein the first wiring is electrically connected to a circuit capable of supplying a first potential, wherein the second wiring is electrically connected to a circuit capable of supplying a second potential, wherein the third wiring is electrically connected to a circuit capable of supplying a third potential, wherein the fourth wiring is electrically connected to a circuit capable of supplying a fourth potential, wherein the first potential is lower than the third potential, and wherein the second potential is higher than the third potential.

18. The semiconductor device according to claim 17, wherein the first to fifth switches are transistors.

19. The semiconductor device according to claim 17, wherein the first to fifth switches are transistors having the same conductivity type.

20. The semiconductor device according to claim 17, further comprising a sixth switch one terminal of which is electrically connected to the one of the source and the drain of the transistor, and the other terminal of which is electrically connected to the one electrode of the load.

21. The semiconductor device according to claim 17, further comprising a seventh switch one terminal of which is electrically connected to the other of the source and the drain of the transistor, and the other terminal of which is electrically connected to a fifth wiring, wherein the fifth wiring is electrically connected to a circuit capable of supplying a fifth potential, and wherein the fifth potential is higher than the third potential.

22. The semiconductor device according to claim 17, wherein the load is a display element having a rectifying property.

23. A display module comprising the semiconductor device according to claim 17, wherein the display module comprises a flexible printed circuit.

* * * * *

UNITED STATES PATENT AND TRADEMARK OFFICE
CERTIFICATE OF CORRECTION

PATENT NO. : 8,710,505 B2
APPLICATION NO. : 13/556908
DATED : April 29, 2014
INVENTOR(S) : Hajime Kimura Page 1 of 2

It is certified that error appears in the above-identified patent and that said Letters Patent is hereby corrected as shown below:

In the Specification

Column 13, line 60, replace "fi" with --film--;

Column 17, line 61, replace "Gc1" with --Ge1--;

Column 18, line 2, replace "Gb1" with --Gbi--;

Column 26, line 19, after "and the node" insert --G,--;

Column 29, line 25, after "and the node" insert --G,--;

Column 33, line 18, replace "farm" with --form--;

Column 41, line 25, replace "103" with --10_3--;

Column 42, line 61, replace "fowled" with --formed--;

Column 46, line 6, replace "852n" with --852_n--;

Column 48, line 35, replace "In:Ga:Zn 1:1:0.5," with --In:Ga:Zn = 1:1:0.5,--;

Column 50, line 61, replace "founs" with --forms--;

Column 52, line 23, after "$In_2SnZn_2O_7(ZnO)_m$" delete ",";

Column 55, line 63, replace "micro crystalline" with --microcrystalline--;

Column 58, line 26, replace "photo sensor" with --photosensor--;

Signed and Sealed this
Sixteenth Day of December, 2014

Michelle K. Lee
*Deputy Director of the United States Patent and Trademark Office*

CERTIFICATE OF CORRECTION (continued)
U.S. Pat. No. 8,710,505 B2

In the Claims

Column 61, line 45, in claim 1 after "other" replace "tee urinal" with --terminal--.